US009293503B2

(12) United States Patent
Sakano et al.

(10) Patent No.: US 9,293,503 B2
(45) Date of Patent: Mar. 22, 2016

(54) SOLID-STATE IMAGING DEVICE, METHOD FOR DRIVING THE SAME, METHOD FOR MANUFACTURING THE SAME, AND ELECTRONIC DEVICE

(75) Inventors: Yorito Sakano, Kanagawa (JP); Keiji Mabuchi, Kanagawa (JP); Takashi Machida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 42 days.

(21) Appl. No.: 14/119,271

(22) PCT Filed: Jul. 5, 2012

(86) PCT No.: PCT/JP2012/004357
§ 371 (c)(1),
(2), (4) Date: Nov. 21, 2013

(87) PCT Pub. No.: WO2013/008425
PCT Pub. Date: Jan. 17, 2013

(65) Prior Publication Data
US 2014/0084143 A1 Mar. 27, 2014

(30) Foreign Application Priority Data

Jul. 12, 2011 (JP) .................................. 2011-153771
Aug. 3, 2011 (JP) .................................. 2011-169980

(51) Int. Cl.
*H01L 27/14* (2006.01)
*H01L 27/146* (2006.01)
(Continued)

(52) U.S. Cl.
CPC .... *H01L 27/14643* (2013.01); *H01L 27/14609* (2013.01); *H01L 27/14612* (2013.01);
(Continued)

(58) Field of Classification Search
None
See application file for complete search history.

(56) References Cited

U.S. PATENT DOCUMENTS 7,408,210 B2 * 8/2008 Ogura ............... H01L 27/14625
257/233
7,460,162 B2 * 12/2008 Koizumi ........... H01L 27/14603
257/431

(Continued)

FOREIGN PATENT DOCUMENTS

JP 11-177076 7/1999
JP 2009-165186 7/2009
(Continued)

OTHER PUBLICATIONS

International Search Report; Application No. PCT/2012/004357; Filed: Jul. 5, 2012. Completion of International Search Report: Sep. 21, 2012. (Form PCT/ISA/210).
(Continued)

*Primary Examiner* — Benjamin Sandvik
(74) *Attorney, Agent, or Firm* — Hazuki International, LLC

(57) ABSTRACT

A solid-state imaging device includes a photoelectric conversion section configured to generate photocharges and a transfer gate that transfers the photocharges to a semiconductor region. A method for driving a unit pixel includes a step of accumulating photocharges in a photoelectric conversion section and a step of accumulating the photocharges in a semiconductor region. A method of forming a solid-state imaging device includes implanting ions into a well layer through an opening in a mask, implanting additional ions into the well layer through an opening in another mask, and implanting other ions into the well layer through an opening in yet another mask. An electronic device includes the solid-state imaging device.

16 Claims, 77 Drawing Sheets

(51) Int. Cl.
*H04N 5/355* (2011.01)
*H04N 5/359* (2011.01)
*H04N 5/3745* (2011.01)
*H04N 5/353* (2011.01)

(52) U.S. Cl.
CPC .... *H01L27/14616* (2013.01); *H01L 27/14689* (2013.01); *H04N 5/3559* (2013.01); *H04N 5/3591* (2013.01); *H04N 5/37452* (2013.01); *H04N 5/353* (2013.01)

(56) References Cited

U.S. PATENT DOCUMENTS

| | | | |
|---|---|---|---|
| 8,575,533 B2* | 11/2013 | Yen | H01L 27/14609 250/208.1 |
| 8,917,341 B2* | 12/2014 | Sakano | H04N 5/37452 250/208.1 |
| 2005/0280054 A1* | 12/2005 | Park et al. | 257/290 |
| 2006/0065915 A1* | 3/2006 | Kuwazawa | 257/292 |
| 2006/0163684 A1* | 7/2006 | Nakamura et al. | 257/462 |
| 2006/0284054 A1* | 12/2006 | Asaba | H04N 5/361 250/214.1 |
| 2007/0131991 A1 | 6/2007 | Sugawa | |
| 2008/0179642 A1* | 7/2008 | Lee et al. | 257/292 |
| 2009/0021627 A1* | 1/2009 | Fossum | 348/308 |
| 2009/0251582 A1 | 10/2009 | Oike | |
| 2010/0134648 A1 | 6/2010 | Funatsu et al. | |
| 2010/0165167 A1* | 7/2010 | Sugiyama | H04N 5/3597 348/311 |
| 2011/0007196 A1* | 1/2011 | Yamashita | H01L 27/14609 348/294 |
| 2011/0019038 A1 | 1/2011 | Okuno | |
| 2011/0180860 A1* | 7/2011 | Yamada et al. | 257/291 |
| 2011/0241079 A1* | 10/2011 | Oike et al. | 257/225 |

FOREIGN PATENT DOCUMENTS

| | | |
|---|---|---|
| JP | 2009-268083 | 11/2009 |
| JP | 2010-183040 | 8/2010 |
| JP | 2011-029835 | 2/2011 |
| WO | WO-2005/083790 A1 | 9/2005 |

OTHER PUBLICATIONS

Written Opinion of the International Searching Authority; Application No. PCT/2012/004357; Filed: Jul. 5, 2012. Report Dated: Oct. 9, 2012. (Form PCT/ISA/220 and PCT/ISA/237).

\* cited by examiner

FIG. 65
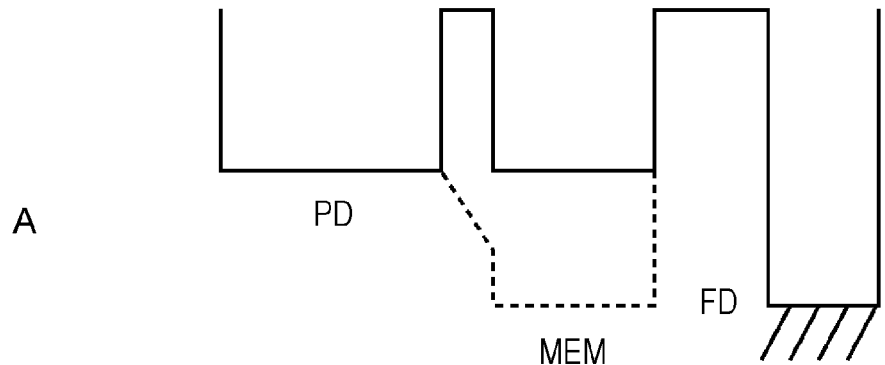
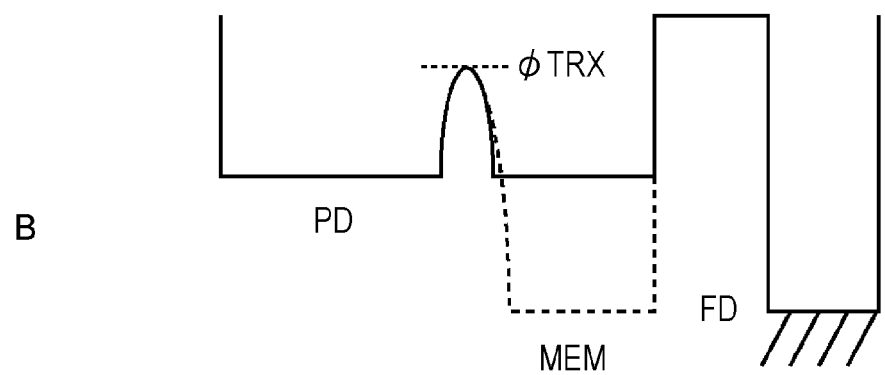

SOLID-STATE IMAGING DEVICE, METHOD FOR DRIVING THE SAME, METHOD FOR MANUFACTURING THE SAME, AND ELECTRONIC DEVICE

TECHNICAL FIELD

The present technology relates to a solid-state imaging device, a method for driving a solid-state imaging device, a method for manufacturing a solid-state imaging device, and an electronic device, and particularly relates to a solid-state imaging device, a method for driving a solid-state imaging device, a method for manufacturing a solid-state imaging device, and an electronic device, which performs the global exposure.

BACKGROUND ART

In a solid-state imaging device, for example, a CMOS image sensor, which is a kind of X-Y address-type solid-state imaging device, the operation of successively scanning and reading out photocharges generated by and accumulated in a photoelectric conversion section, pixel by pixel or row by row, is performed. In the case of the sequential scanning, in other words, if the rolling shutter is adopted as an electronic shutter, it is not possible to agree the start time and end time of exposure for accumulating photocharges in all pixels. Therefore, there is a problem with the sequential scanning that various distortions occur in an imaged image upon imaging a moving subject.

For sensing applications that require imaging of a subject that moves at high speeds and the simultaneity of an imaged image, which cannot tolerate this type of image distortion, a global shutter that executes the start and end of exposure at the same timing on all pixels in a pixel array section is adopted as an electronic shutter. In order to realize the global shutter, an embedded MOS capacitor, for example, is provided as a region to accumulate photocharges, that is, a photocharge accumulation section, apart from a photodiode being a photoelectric conversion section (refer to Patent Document 1, for example).

However, in order for an embedded MOS capacitor to receive all photocharges generated by photoelectric conversion in a photodiode and accumulated therein upon global shutter operation, the embedded MOS capacitor needs a saturation charge amount equal to or more than that of the photodiode. Conversely, considering them in the same unit pixel size, the area of the photodiode is significantly reduced since the embedded MOS capacitor exists in the unit pixel. Therefore, there is a problem that the saturation charge amount of the photodiode is reduced.

As a measure against it, proposed is a technology for accumulating photocharges generated by photoelectric conversion in a photodiode in both of the photodiode and an embedded MOS capacitor (refer to Patent Document 2, for example). According to the related art, the saturation charge amount is the sum of the saturation charge amounts of the photodiode and the embedded MOS capacitor.

CITATION LIST

Patent Document

Patent Document 1: Japanese Patent No. 3874135
Patent Document 2: Japanese Patent Application Laid-Open No. 2009-268083

SUMMARY OF THE INVENTION

Problems to be Solved by the Invention

However, even the related art disclosed in Patent Document 2 is significantly inferior in saturation charge amount compared with a CMOS image sensor without the global shutter function. This is because it is necessary to add not only a photocharge accumulation section (an embedded MOS capacitor in the case of the related art) but further a transistor in the unit pixel in order to realize the global exposure. This results in a reduction in the dynamic range of an image.

Moreover, apart from the related art that realizes the above global exposure, it is easily presumed to use not an embedded MOS capacitor but a capacitor having a higher capacitance value per unit area as a charge accumulation section. However, generally a large amount of leakage current flows from a capacitor having a high capacitance value per unit area, and there is a problem that the deterioration of properties in the dark such as dark current or white spots becomes conspicuous.

Furthermore, if there is variation in potential barriers of the overflow paths of pixels included in a solid-state imaging device in the above-mentioned pixel structure where a photodiode and a memory section are integrated via an overflow path, the quality of an imaged image is reduced. Therefore, required is to suppress the influence of variation in potential barriers of the overflow paths of pixels included in a solid-state imaging device, and improve the quality of an imaged image.

Hence, the present technology makes it possible to obtain an image with a wide dynamic range and low noise by use of the global exposure.

Effects of the Invention

According to a first or second aspect of the present technology, it is possible to obtain an image with a wide dynamic range and low noise by use of the global exposure.

According to third, fifth, and sixth aspects of the present technology, it is possible to obtain a high-quality image. Moreover, according to a fourth aspect of the present technology, it is possible to manufacture a solid-state imaging device that acquires a high-quality image.

BRIEF DESCRIPTION OF DRAWINGS

FIGS. 65A and 65B are views explaining considerations to the unit pixel in the embodiment.

MODE FOR CARRYING OUT THE INVENTION

Figure 1:
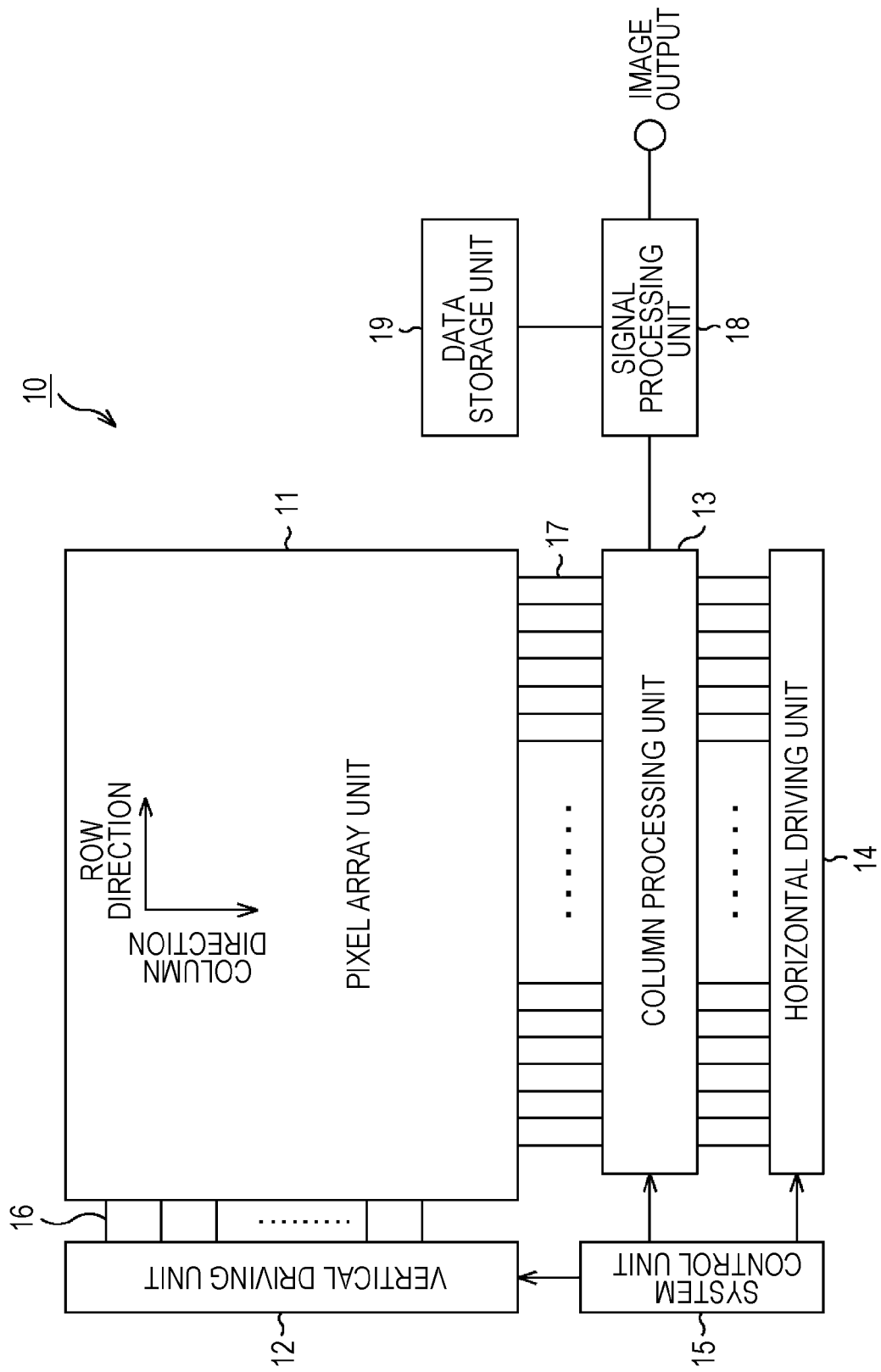
FIG. 1 is a system block diagram depicting the outline of the configuration of a CMOS image sensor to which the present technology is applied.

1. Solid-State Imaging Device to which the Present Technology is Applied 1-1. Basic System Configuration FIG. 1 is a system block diagram depicting the outline of the configuration of a solid-state imaging device to which the present technology is applied, for example, a CMOS image sensor being a kind of X-Y address-type solid-state imaging device. Here, the CMOS image sensor indicates an image sensor produced by applying or partially using a CMOS process.

A CMOS image sensor 10 according to the application example includes a pixel array unit 11 formed on an unillustrated semiconductor substrate (chip) and a peripheral circuit unit integrated on the same semiconductor substrate as the pixel array unit 11. The peripheral circuit unit is configured of, for example, a vertical driving unit 12, a column processing unit 13, a horizontal driving unit 14 and a system control unit 15.

The CMOS image sensor 10 further includes a signal processing unit 18 and a data storage unit 19. The signal processing unit 18 and the data storage unit 19 may be mounted on the same substrate as the CMOS image sensor 10 or may be disposed on a substrate different from the CMOS image sensor 10. Moreover, processes of the signal processing unit 18 and the data storage unit 19 may be performed by an external signal processing unit provided on a substrate different from that of the CMOS image sensor 10, for example, a DSP (Digital Signal Processor) circuit or software.

The pixel array unit 11 is configured such that unit pixels (hereinafter may also simply be described to as "pixel"), each unit pixel having a photoelectric conversion section for generating and accumulating photocharges in accordance with the amount of light received, are two-dimensionally disposed in a row direction and a column direction, that is, in a matrix. Here, the row direction indicates an arrangement direction of pixels in a pixel row (that is, a horizontal direction), and the column direction indicates an arrangement direction of pixels in a pixel column (that is, a vertical direction). Specific circuit configurations of a unit pixel and details of a pixel structure will be described later.

In the pixel array unit 11, a pixel driving line 16 is wired along the row direction for each pixel row for the pixel array of a matrix, and a vertical signal line 17 is wired along the column direction for each pixel column. The pixel driving line 16 transmits a drive signal for drive upon reading out a signal from a pixel. In FIG. 1, the pixel driving line 16 is shown as one wire; however, the number of wires is not limited to one. One end of the pixel driving line 16 is connected to an output terminal corresponding to each row of the vertical driving unit 12.

The vertical driving unit 12 is configured of a shift register, an address decoder and the like and drives all pixels of the pixel array unit 11 at the same time, or pixels in each row or the like at a time. In other words, the vertical driving unit 12 configures a driving unit that drives the pixels of the pixel array unit 11 together with the system control unit 15 that controls the vertical driving unit 12. Although the illustration of a specific configuration of the vertical driving unit 12 is omitted, the vertical driving unit 12 generally includes two scanning systems of a read scanning system and a sweep scanning system.

The read scanning system selectively scans the unit pixels of the pixel array unit 11 in turn, row by row, in order to read signals from the unit pixels. The signal read from the unit pixel is an analog signal. The sweep scanning system performs the sweep scanning on a row to be read on which the read scanning is to be performed by the read scanning system, preceding the read scanning only for a time of a shutter speed.

By the sweep scanning by the sweep scanning system, unnecessary charges are swept away from the photoelectric conversion sections of the unit pixels in the row to be read; accordingly, the photoelectric conversion sections are reset. Unnecessary charges are swept away (reset) by the sweep scanning system to perform what is called an electronic shutter operation. Here, the electronic shutter operation indicates the operation of discarding photocharges of the photoelectric conversion section and newly starting exposure (starting the accumulation of photocharges).

A signal read by the read operation by the read scanning system corresponds to the amount of light received after an immediately preceding read operation or electronic shutter operation. An exposure period of photocharges in a unit pixel is defined by the period from a read timing by an immediately preceding read operation or a sweep timing by an electronic shutter operation to a read timing by a current read operation.

Signals output from unit pixels in a pixel row selectively scanned by the vertical driving unit 12 are input, one pixel column at a time, to the column processing unit 13 through each of the vertical signal lines 17. The column processing unit 13 performs specified signal processing on the signals output from the pixels in the selected row through the vertical signal lines 17 for each pixel column of the pixel array unit 11, and temporarily holds the pixel signals after the signal processing.

Specifically, the column processing unit 13 performs at least noise removal processing, for example, CDS (Correlated Double Sampling; correlated double sampling) processing as the signal processing. By the CDS processing by the column processing unit 13, reset noise and fixed pattern noise that is unique to a pixel, such as variation in the threshold value of an amplifier transistor in the pixel, are removed. The column processing unit 13 may also have, in addition to the noise removal processing, an AD (analog-to-digital) conversion function, for example, to convert an analog pixel signal into a digital signal and output the digital signal.

The horizontal driving unit 14 is configured of a shift register, an address decoder and the like and selects unit circuits corresponding to the pixel columns of the column processing unit 13 in turn. By the selective scanning by the horizontal driving unit 14, the pixel signals on which the signal processing is performed by the column processing unit 13 for each unit circuit are output in turn.

The system control unit 15 is configured of a timing generator that generates various timing signals, and the like and performs the drive control of the vertical driving unit 12, the column processing unit 13, the horizontal driving unit 14 and the like, based on the various timings generated by the timing generator.

The signal processing unit 18 has at least a computation processing function and performs various signal processing, such as computation processing, on a pixel signal output from the column processing unit 13. Upon signal processing by the signal processing unit 18, the data storage unit 19 temporarily stores data necessary for the processing.

The CMOS image sensor 10 having the above configuration adopts the global exposure that executes the start and end of exposure on all the pixels in the pixel array unit 11 at the same timing. In other words, the CMOS image sensor 10 is capable of simultaneous exposure for all pixels. This global exposure is executed by being driven by the driving unit including the vertical driving unit 12 and the system control unit 15. The global shutter function of realizing the global exposure is a shutter operation suitable for sensing applications that require imaging of a subject that moves at high speeds and the simultaneity of an imaged image.

1-2. Other System Configurations

The CMOS image sensor 10 to which the present technology is applied is not limited to one having the above system configuration. The following system configurations can be cited as the other system configurations.

Figure 2:
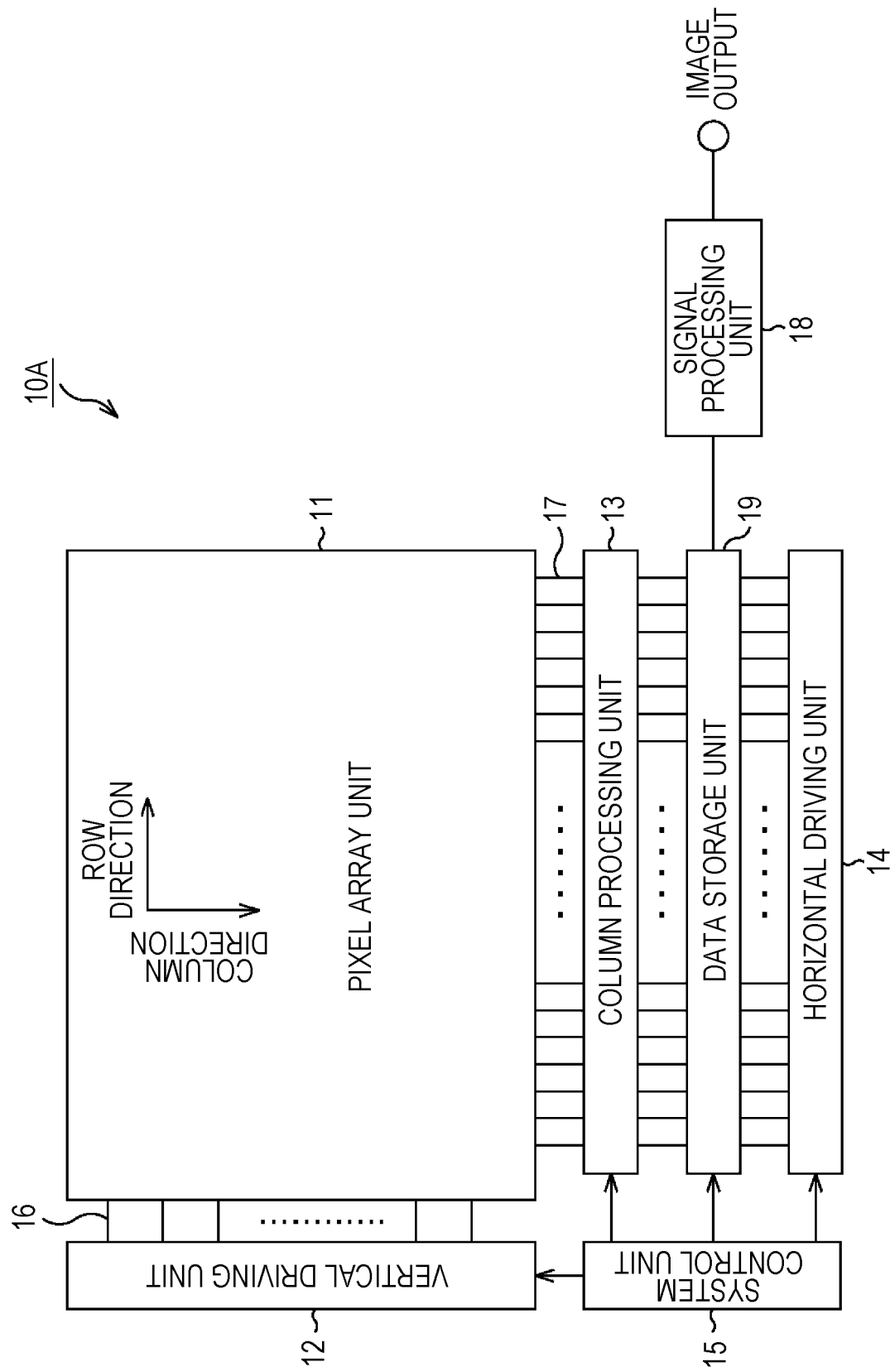
FIG. 2 is a (first) system block diagram depicting another system configuration of a CMOS image sensor to which the present technology is applied.

For example, as shown in FIG. 2, it is possible to cite a CMOS image sensor 10A having a system configuration where the data storage unit 19 is disposed in the stage subsequent to the column processing unit 13 to supply pixel signals output from the column processing unit 13 to the signal processing unit 18 through the data storage unit 19.

Figure 3:
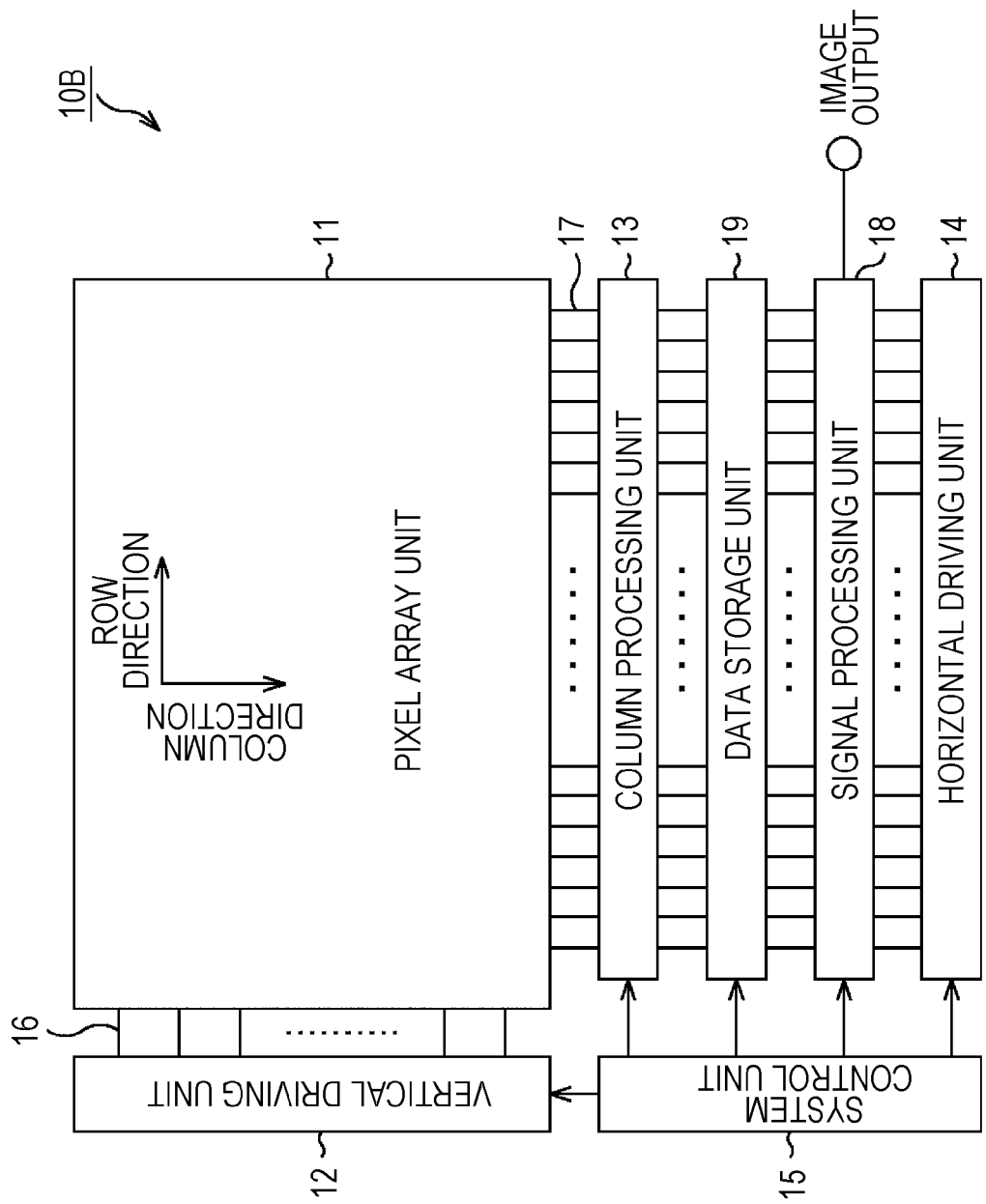
FIG. 3 is a (second) system block diagram depicting another system configuration of a CMOS image sensor to which the present technology is applied.

Furthermore, as shown in FIG. 3, it is possible to cite a CMOS image sensor 10B having a system configuration where the column processing unit 13 has an AD conversion function of performing AD conversion on each column of or each plurality of columns of the pixel array unit 11, and the data storage unit 19 and the signal processing unit 18 are provided in parallel to the column processing unit 13.

2. Description of Embodiment

In order to realize the global exposure, a solid-state imaging device (for example, a CMOS image sensor) according to an embodiment includes two of first and second charge accumulation sections in a unit pixel in order to secure a larger saturation charge amount without deteriorating the quality of an imaged image in the dark or in a low light condition, compared with the related art that realizes the global exposure. Additionally, an embedded MOS capacitor is used as the first charge accumulation section, and a capacitor having a higher capacitance value per unit area than the first charge accumulation section is used as the second charge accumulation section.

It is preferable that a magnitude relation of the saturation charge amounts should be set in the following manner for the first and second charge accumulation sections. In other words, it is preferable that the first charge accumulation section should have a saturation charge amount smaller than that of the photoelectric conversion section.

When the saturation charge amount of the first charge accumulation section is set to be smaller than the saturation charge amount of the photoelectric conversion section, the difference is compensated for by the second charge accumulation section. Therefore, it is necessary for the second charge accumulation section to have a saturation charge amount that is in total equal to or more than the saturation charge amount of the photoelectric conversion section when the saturation charge amount of the first charge accumulation section is added thereto.

As described above, two of the first and second charge accumulation sections are provided in a unit pixel, and an embedded MOS capacitor is used as the first charge accumulation section while a capacitor having a higher capacitance value per unit area than the first charge accumulation section is used as the second charge accumulation section; accordingly, the following operation and effect can be obtained.

In other words, it is possible to significantly increase a capacitance value that can accumulate photocharges, in other words, to secure a larger saturation charge amount, compared with a case of forming an embedded MOS capacitor over an area the same as the total area of the first and second charge accumulation sections. In addition, an embedded MOS capacitor is used for a signal in a low light condition and resists being influenced by the interface state, a defect or the like. Compared with the related art that realizes the global exposure, properties in the dark are not deteriorated. Accordingly, the quality of an image imaged in a low light condition is not deteriorated.

As a result, a CMOS image sensor having a global shutter function that exhibits characteristics being equal to those of a CMOS image sensor having the same unit pixel size and without a global shutter function can be realized. Moreover, a CMOS image sensor that promotes significant extension of the dynamic range, compared with a known CMOS image sensor having the same unit pixel size and the global shutter function can be realized.

2-1. Reason why Division of Charge Accumulation Section can Increase Total Capacitance Value of Charge Accumulation Sections In this manner, an embedded MOS capacitor is used as the first charge accumulation section, and a capacitor having a higher capacitance value per unit area than the first charge accumulation section is used as the second charge accumulation section; accordingly, it is possible to increase the total capacitance value of the charge accumulation sections. Here, a description will be given of the reason why the total capacitance value of the charge accumulation sections can be increased, taking a numerical value example.

For example, consideration is given to a case of forming a capacitor having an area of 1 $\mu m^2$. Assuming that the capacitance value per unit area of the first charge accumulation section is 1 $fF/\mu m^2$, the capacitance value per unit area of the second charge accumulation section is 10 $fF/\mu m^2$, and the entire capacitor having the area of 1 $\mu m^2$ is formed of the first charge accumulation section, then the capacitance value of the capacitor having the area of 1 $\mu m^2$ is 1 fF.

At this time, if half the area of 1 $\mu m^2$ is replaced by the second charge accumulation section, the capacitance value of the capacitor having the area of 1 $\mu m^2$ is 5.5 fF (=½ $\mu m^2 \times 1$ fF+½ $\mu m^2 \times 10$ fF). In other words, if half the area is replaced by the second charge accumulation section, the capacitance value of the capacitor having the area of 1 $\mu m^2$ is 5.5 times higher than the case where not replaced.

Furthermore, if three-fourths of the area of 1 $\mu m^2$ is replaced by the second charge accumulation section, the capacitance value of the capacitor having the area of 1 $\mu m^2$ is 7.75 fF, which is 7.75 times higher than the case where not replaced. Moreover, when half the area of 1 $\mu m^2$ is replaced by the second charge accumulation section, assuming that the capacitance value per unit area of the second charge accumulation section is 20 $fF/\mu m^2$, the capacitance value of the capacitor having the area of 1 $\mu m^2$ is 10.5 fF, which is 10.5 times higher than the case where not replaced.

On the other hand, generally a large amount of leakage current flows from a capacitor having a high capacitance value per unit area, and there is a problem with the second charge accumulation section that the deterioration of properties in the dark such as dark current or white spots becomes conspicuous. Hence, when the photocharges of all the pixels are simultaneously transferred from the photoelectric conversion section, photocharges in a low light condition are accumulated in the first charge accumulation section. Here, the "photocharges in a low light condition" indicate photocharges equal to or smaller than the saturation charge amount of the first charge accumulation section. The first charge accumulation section is formed of an embedded capacitor and therefore resists being influenced by the interface state, a defect or the like and is better in properties in the dark than the second charge accumulation section.

Moreover, photocharges in a high light condition are accumulated in both of the first charge accumulation section and the second accumulation capacitor. Here, the "photocharges in a high light condition" indicate photocharges that exceed the saturation charge amount of the first charge accumulation section. In a high light condition where a large amount of charge is handled, a high S/N can be secured and therefore it is unlikely that properties in the dark such as dark current or white spots have an influence. Therefore, even if the photocharges in a high light condition are accumulated in the second charge accumulation section from which a large amount of leakage current flows, the influence on image quality is extremely little.

As is clear from the above description, it is possible to secure a larger saturation charge amount by using an embedded MOS capacitor as the first charge accumulation section and using a capacitor having a higher capacitance value per unit area than the first charge accumulation section as the second charge accumulation section. Conversely, if the equal saturation charge amount is acceptable, a reduction in the unit pixel size can be promoted by the amount of space saved.

In addition, the quality of an image imaged in the dark or in a low light condition is not deteriorated by, upon simultaneously reading out all pixels, accumulating the photocharges in a low light condition in the first charge accumulation section that has good properties in the dark such as dark current or white spots while accumulating the photocharges in a high light condition in the second charge accumulation section that is not good in properties in the dark, compared with the related art that realizes the global exposure.

Examples of the capacitor having a higher capacitance value per unit area than the first charge accumulation section, in other words, the capacitor having a higher capacitance value per unit area than an embedded MOS capacitor include a surface-type MOS capacitor.

2-2. Description of Capacitor Having High Capacitance Value Per Unit Area

Here, a description will be given of a difference between an embedded MOS capacity configuring the first charge accumulation section and, for example, a surface-side MOS capacitor configuring the second charge accumulation section.

Figure 4:
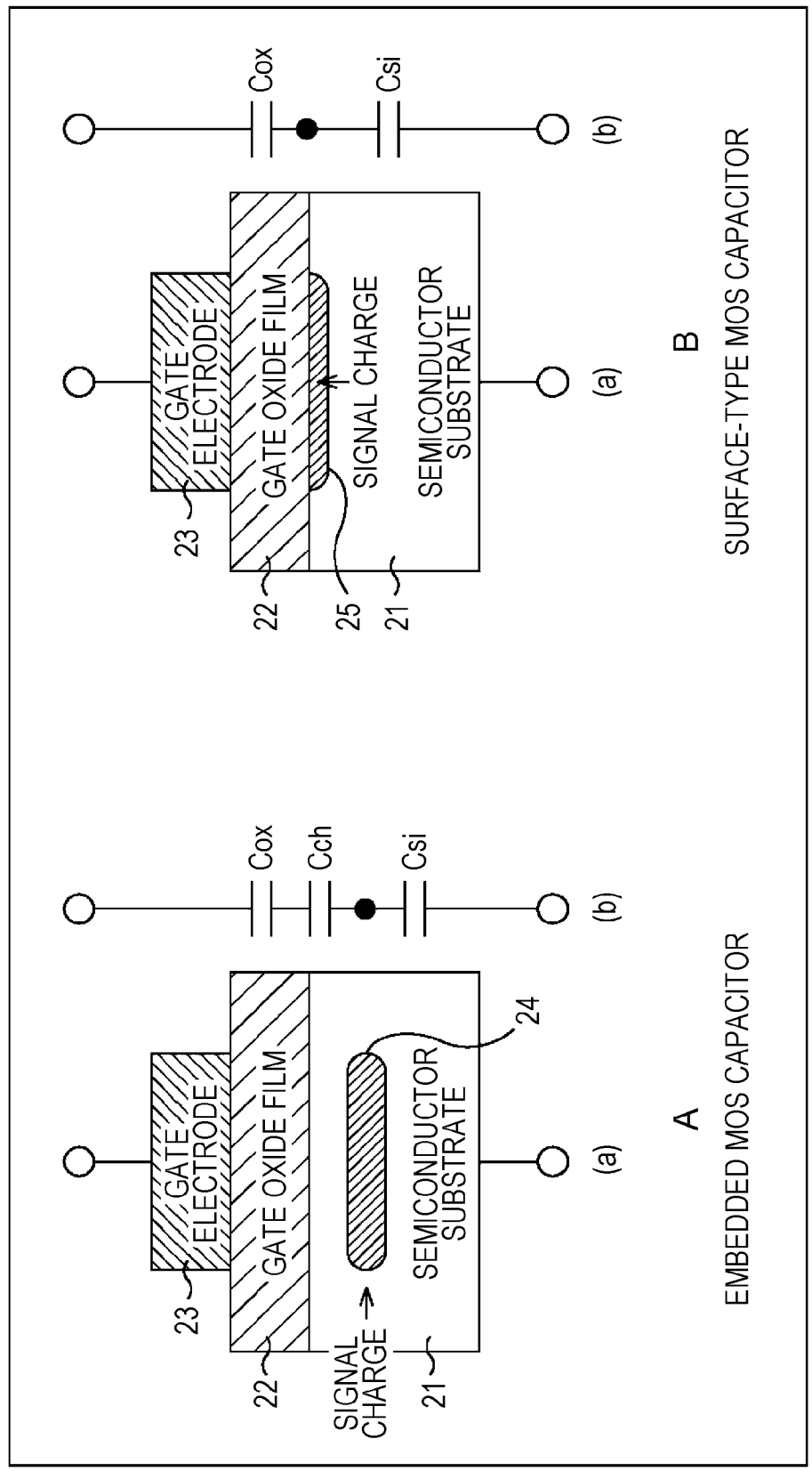
FIGS. 4A and 4B are explanatory views of an embedded MOS capacitor, and a surface side MOS capacitor.

FIGS. 4A and 4B depict an embedded MOS capacitor A and a surface-side MOS capacitor B. Moreover, in FIGS. 4A and 4B, (a) and (b) depict the cross-sectional structure of each MOS capacitor, and an equivalent circuit, respectively.

As shown in FIGS. 4A and 4B, a gate electrode 23 is disposed on a semiconductor substrate 21 via a gate oxide film 22 in any MOS capacitor. In the case of the embedded MOS capacitor A, a charge accumulation region 24 that accumulates signal charge is formed in the depth of the semiconductor substrate 21, and in the case of the surface-type MOS capacitor B, a charge accumulation region 25 is formed in the substrate surface of the semiconductor substrate 21.

In (b) of FIGS. 4A and 4B, Cox represents the capacitance value of the gate oxide film 22, Cch the capacitance value between the substrate surface and the charge accumulation region, and Csi the capacitance value between the charge accumulation region and the substrate, respectively.

(In Case of Embedded Capacitor)

Assuming that the capacitance value per unit area of the charge accumulation region 24 is Cb, then the capacitance value Cb is expressed by the following expression (1):

$$Cb = Cox \cdot Cch/(Cox + Cch) + Csi \qquad (1)$$
$$= Cox \cdot \{1/(1 + Cox/Cch)\} + Csi$$

Here, assuming that the capacitance value Csi between the charge accumulation region and the substrate is sufficiently low, then the expression (1) can be approximated by the following expression (2):

$$Cb \approx Cox \cdot \{1/(1+Cox/Cch)\} \qquad (2)$$

(In Case of Surface-Type Capacitor)

Assuming that the capacitance value per unit area of the charge accumulation region is Cs, then the capacitance value Cs is expressed by the following expression (3):

$$Cs = Cox + Csi \quad (3)$$

Here, assuming that the capacitance value Csi between the charge accumulation region and the substrate is sufficiently low, the capacitance value Cs can be approximated by the capacitance value Cox of the gate oxide film 22 as represented by the following expression (4):

$$Cs = Cox \quad (4)$$

In other words, the magnitude relation between the capacitance value Cb per unit area of the charge accumulation region 24 and the capacitance value Cs per unit area of the charge accumulation region 25 is Cb<Cs, and the capacitance value decreases by burying the charge accumulation region in the substrate, instead of the substrate surface. Conversely, the capacitance value increases by bringing the charge accumulation region from the inside of the substrate to the surface of the substrate.

(Description of Method for Increasing Capacitance Value Per Unit Area from Material Perspective)

The capacitance value Cox of the gate oxide film 22 per unit area is expressed by the following expression (5):

$$Cox = \epsilon ox / tox \quad (5)$$

where $\epsilon ox$ is the permittivity of the gate oxide film 22, and tox is the film thickness of the gate oxide film 22.

Although the film thickness tox of the gate oxide film 22 is important also from the viewpoint of the withstand voltage and the leakage amount, even if the film thickness is equal, it is possible to increase the capacitance value Cox per unit area by using a material having a high permittivity. Materials having a high permittivity include, for example, the following materials:

$Si_3N_4$: relative permittivity 7
$Ta_2O_5$: relative permittivity 26
$HfO_2$: relative permittivity 25
$ZrO_2$: relative permittivity 25

Since the product of the vacuum permittivity and the relative permittivity becomes the permittivity of each material, if the ratio of the relative permittivity to $SiO_2$ (the relative permittivity 3.9) is considered, it is possible to estimate an increase in the capacitance value per unit area. For example, if a surface type MOS capacitor is assumed and $Si_3N_4$ having the same film thickness is used instead of $SiO_2$, then the capacitance value per unit area is increased by 1.8 times, and if $Ta_2O_5$ is used, the capacitance value per unit area is increased by 6.7 times.

(Description of Method for Increasing Capacitance Value Per Unit Area from Structural Perspective)

Figure 5:
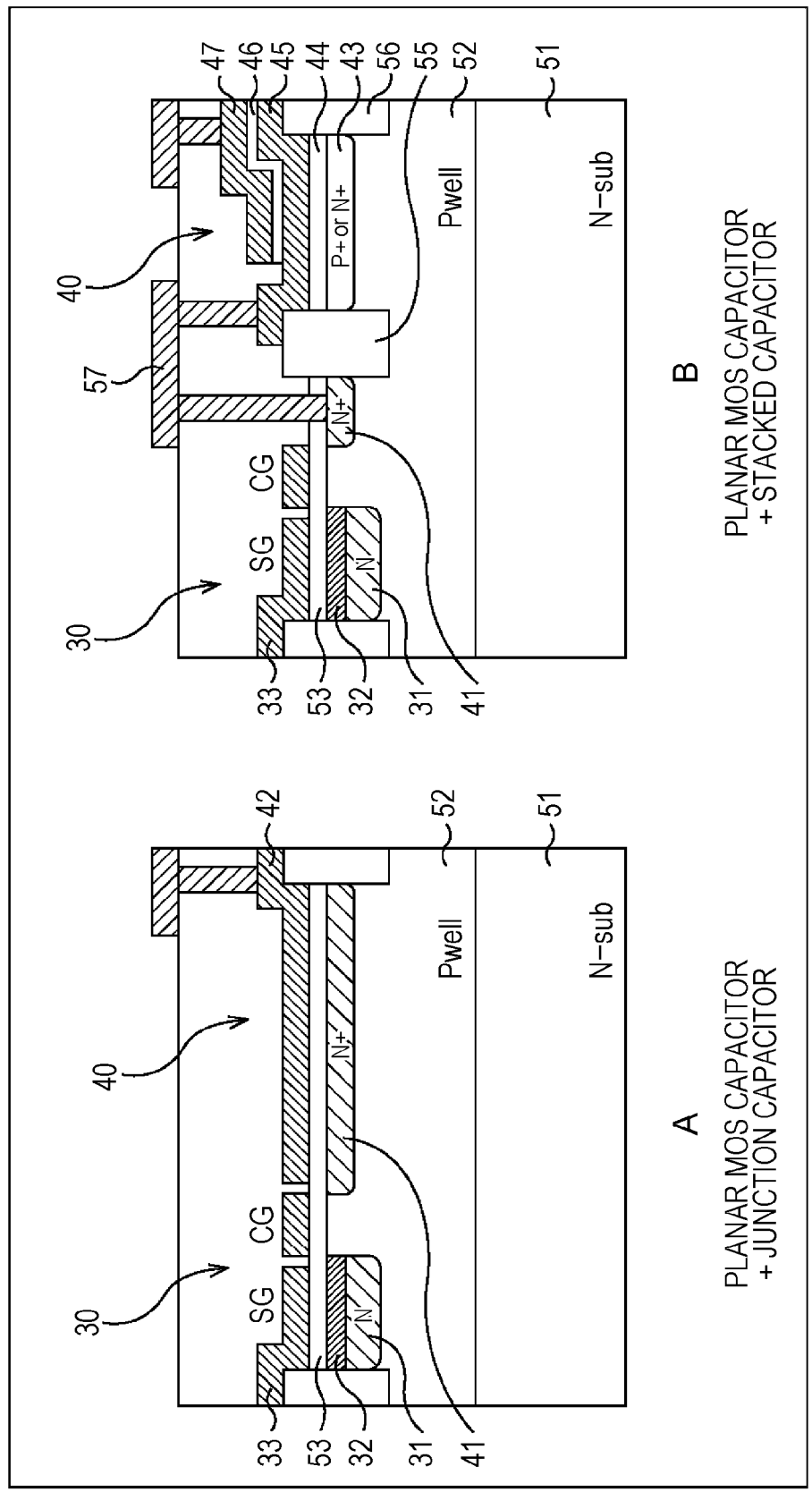
FIGS. 5A and 5B are explanatory views of the combinations of a plurality of capacitor structures.

Moreover, from the structural perspective, the capacitance value per unit area can be increased by combining a plurality of capacitor structures. Examples of the combination structure include structures shown in FIGS. 5A and 5B, in other words, a structure A where a planar MOS capacitor and a junction capacitor are combined, and a structure B where a planar MOS capacitor and a stacked capacitor are combined.

A description will firstly be given of the combination structure A. For example, a P-type well 52 is formed on an N-type semiconductor substrate 51. An N+-type semiconductor region 41 to serve as an intermediate electrode is formed on a surface layer portion of the P-type well 52 to form a junction MOS capacitor in between with the P-type well 52 to serve as a lower electrode. Furthermore, an upper electrode 42 is disposed on the substrate surface via an insulating film 53 to form a planar MOS capacitor in parallel with the junction MOS capacitor. In short, a second charge accumulation section 40 is formed in parallel connection between a planar MOS capacitor and a junction capacitor.

Next, a description will be given of the combination structure B. A first charge accumulation section 30 is the same planar MOS capacitor as in the case of the combination structure A. The second charge accumulation section 40 includes a planar MOS capacitor formed in a region partitioned by element isolation insulating films 55 and 56, and a stacked capacitor formed in parallel connection in a further upper layer.

Specifically, a P+- (or N+-) type semiconductor region 43 to serve as a lower electrode is formed in the surface layer portion of the P-type well 52, and an intermediate electrode 45 is formed on the semiconductor region 43 via a capacitor insulating film 44. This structure is the structure of a planar MOS capacitor. Furthermore, an upper electrode 47 is formed on the intermediate electrode 45 via a capacitor insulating film 46. This structure is the structure of a stacked capacitor. The intermediate electrode 45 is electrically connected to the N+-type semiconductor region 41 by a wire 57.

According to the combination structure B, in other words, according to the combination structure of a planar MOS capacitor and a stacked capacitor, it is possible to form a capacitor having a higher capacitance value per unit area.

(Other Structural Examples of Second Charge Accumulation Section)

FIGS. 6A, 6B, 7A and 7B depict other structural examples of the second charge accumulation section 40. In FIGS. 6A, 6B, 7A and 7B, the same reference signs are assigned to denote portions equivalent to those in FIGS. 5A and 5B.

Figure 6:
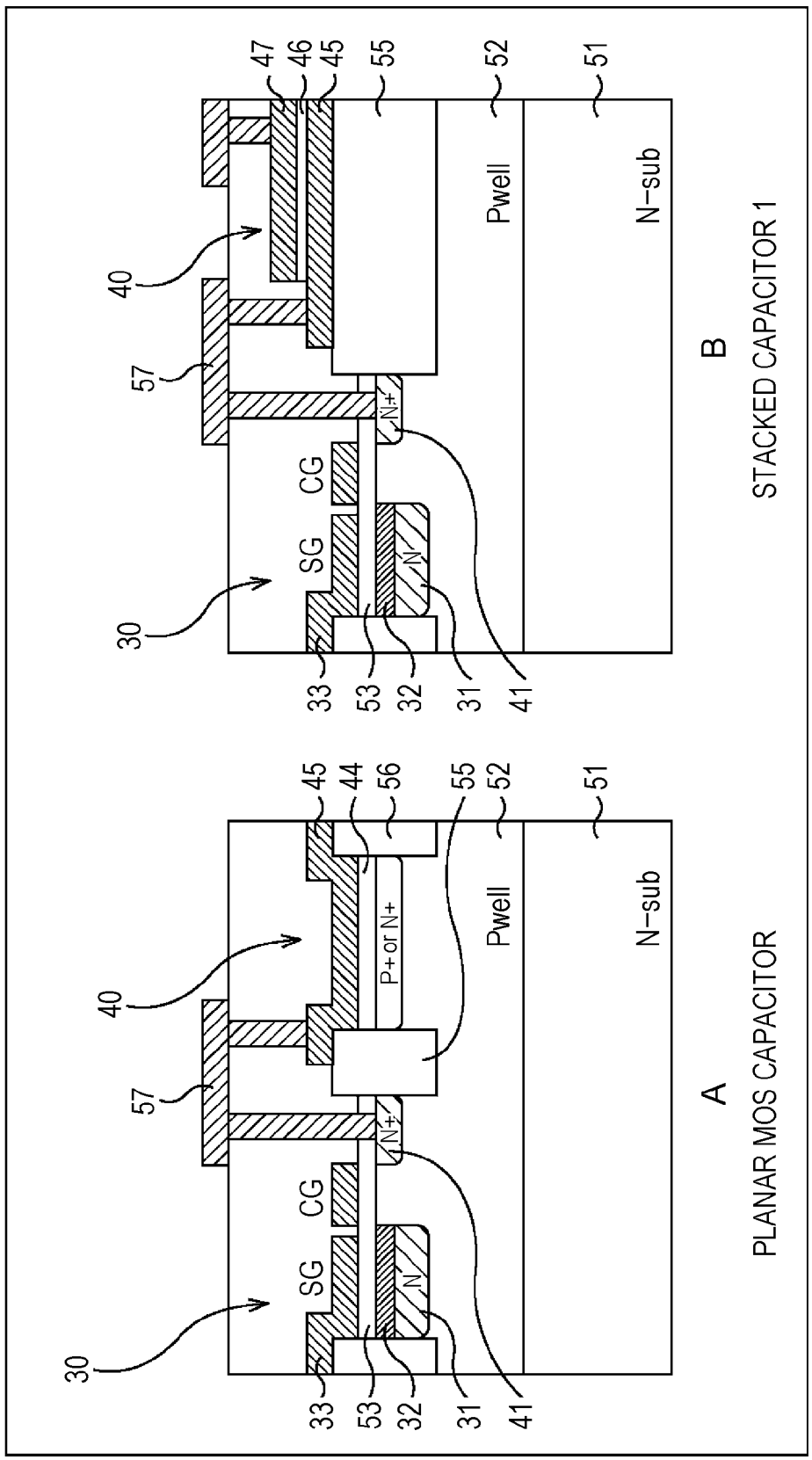
FIGS. 6A and 6B are (first) cross-sectional views depicting other configuration examples of a second charge accumulation section.

FIG. 6A is a cross-sectional view depicting the structure of a planar MOS capacitor. The planar MOS capacitor configuring the second charge accumulation section 40 has a structure where the P+- (or N+-) type semiconductor region 43 to serve as a lower electrode is formed in the surface layer portion of the P-type well 52 and the upper electrode 45 is formed on the semiconductor region 43 via the capacitor insulating film 44.

FIG. 6B is a cross-sectional view depicting the structure of a stacked capacitor 1. The stacked capacitor 1 configuring the second charge accumulation section 40 has a structure where the lower electrode 45 is formed on the element isolation insulating film 55 and the upper electrode 47 is formed on the lower electrode 45 via the capacitor insulating film 46.

Figure 7:
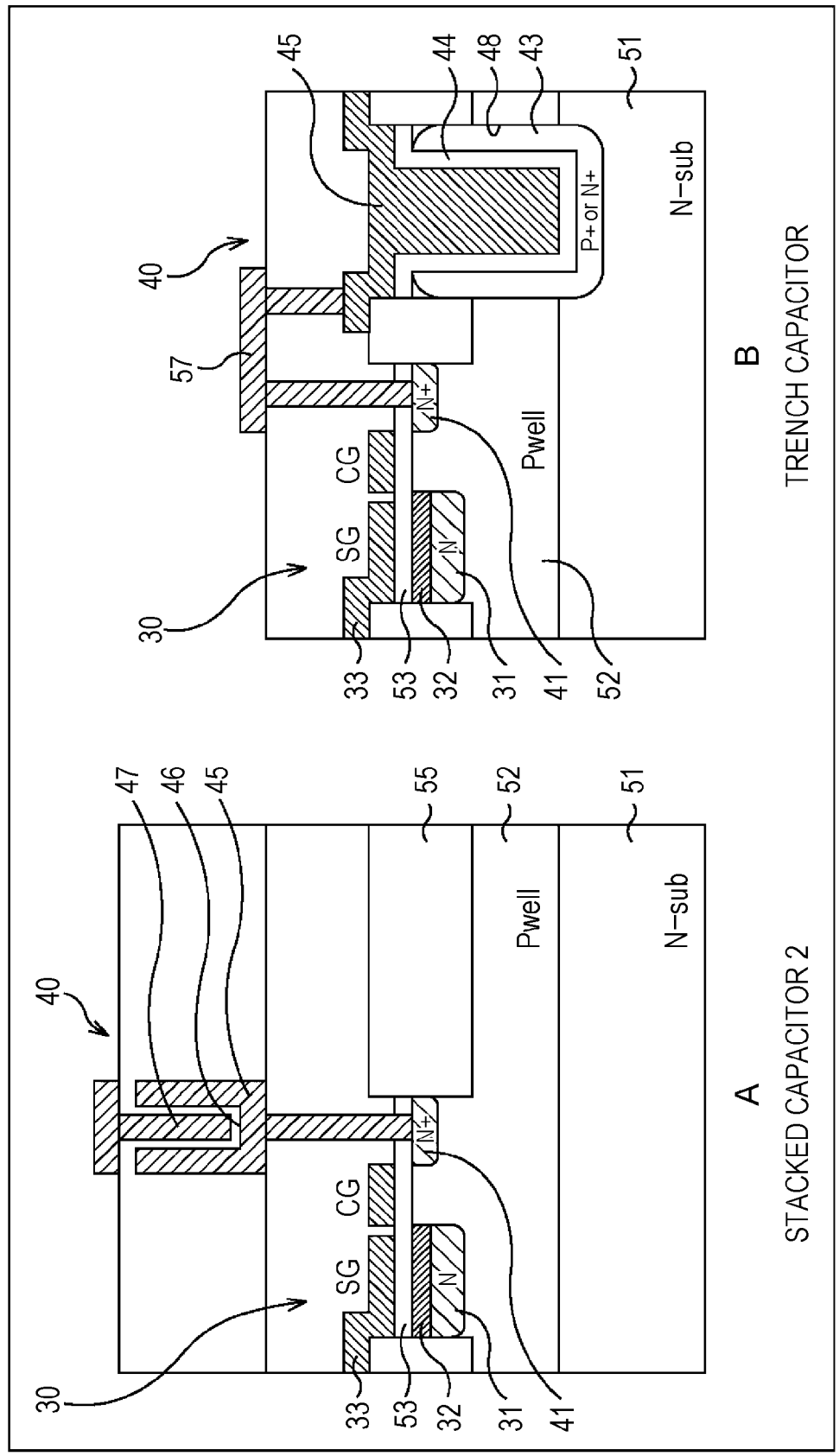
FIGS. 7A and 7B are (second) cross-sectional views depicting other configuration examples of the second charge accumulation section.

FIG. 7A is a cross-sectional view depicting the structure of a stacked capacitor 2. The stacked capacitor 2 configuring the second charge accumulation section 40 has a structure where the lower electrode 45 having a U-shaped cross section is electrically connected to the N+-type semiconductor region 41 and the upper electrode 47 is inserted inside the lower electrode 45 via the capacitor insulating film 46.

In the case of the structure of the stacked capacitor 2, a power supply voltage is applied to the upper electrode 47, or the upper electrode 47 is grounded. According to the stacked capacitor 2 including the lower electrode 45 having a U-shaped cross section and the upper electrode 47 embedded inside the intermediate electrode 45, it is advantageous to have a larger opposing area to contribute to a capacitance than a normal stacked capacitor, for example, the stacked capacitor 1.

FIG. 7B is a cross-sectional view depicting the structure of a trench capacitor. The trench capacitor configuring the second charge accumulation section 40 is formed such that a trench 48 is formed in a manner of penetrating the P-type well 52 through to a substrate 51 and the capacitor is formed in the trench 48.

Specifically, the trench capacitor has a structure where the N+- (or P+-) type semiconductor region 43 to serve as a lower electrode is formed in an inner wall of the trench 48, an inner wall of the semiconductor region 43 is covered with the capacitor insulating film 44, and the upper electrode 45 is embedded via the capacitor insulating film 44.

Furthermore, the second charge accumulation section 40 is configured of a planar MOS capacitor, a junction capacitor, a stacked capacitor or a trench capacitor, in which a part or the whole of the capacitor insulating film is configured of a material having a higher permittivity than that of a silicon oxide film, or a combination thereof. Materials having a higher permittivity than a silicon oxide film ($SiO_2$) include $Si_3N_4$, $Ta_2O_5$, $HfO_2$, $ZrO_2$.

As described above, the description has been given of examples of the structure of the second charge accumulation section 40 based on FIGS. 6A, 6B, 7A and 7B. However, the structure of the second charge accumulation section 40 is not limited to these structural examples, and it is possible to adopt various methods that have been developed until now in order to increase capacitance with a memory capacitor of a DRAM.

3. Example 1

A description will hereinafter be given of a specific example of a unit pixel including the first charge accumulation section 30 and the second charge accumulation section 40 in a pixel.

Throughout the specification, the first charge accumulation section 66 corresponds to the above-mentioned first charge accumulation section 30 and the second charge accumulation section 67 corresponds to the above-mentioned second charge accumulation section 40.

(Circuit Configuration of Unit Pixel 60A)

Figure 8:
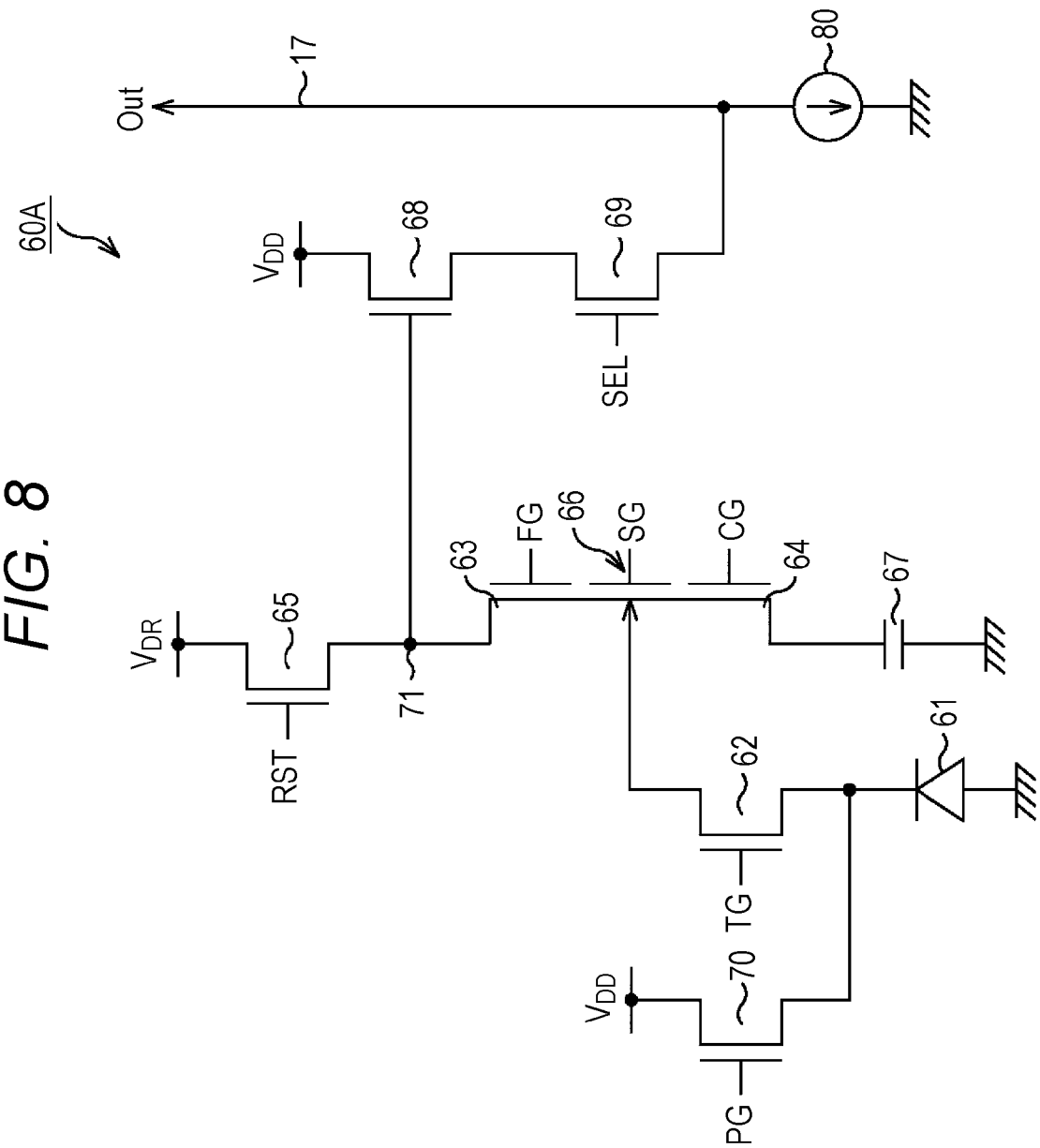
FIG. 8 is a circuit diagram depicting a circuit configuration of a unit pixel.

FIG. 8 is a circuit diagram depicting a circuit configuration of a unit pixel 60A to which the present technology is applied. As shown in FIG. 8, the unit pixel 60A includes, for example, a photodiode 61 having a p-n junction as a photoelectric conversion section that receives light to generate and accumulate photocharges. The photodiode 61 generates and accumulates photocharges in accordance with the amount of light received.

The unit pixel 60A further includes, for example, a first transfer gate section 62, a second transfer gate section 63, a third transfer gate section 64, a reset gate section 65, a first charge accumulation section 66, a second charge accumulation section 67, an amplifier transistor 68, a select transistor 69 and a charge drain gate section 70.

In the unit pixel 60A having the above configuration, the first and second charge accumulation sections 66 and 67 correspond to the above-mentioned first and second charge accumulation sections 30 and 40. In other words, from the perspective of a circuit, the first charge accumulation section 66 is provided, as an embedded MOS capacitor, between the first transfer gate section 62 and the second transfer gate section 63. A drive signal SG (hereinafter also referred to as the transfer signal SG) is applied to a gate electrode of the first charge accumulation section 66. The second charge accumulation section 67 is configured of a capacitor having a higher capacitance value per unit area than the first charge accumulation section 66. The details of the layouts and cross-sectional structures of the first and second charge accumulation sections 66 and 67 will be described later.

As the pixel driving line 16 in FIG. 1, a plurality of driving lines is wired to the unit pixels 60A in each pixel row, for example. Various drive signals TG, SG, FG, CG, RST, SEL and PG are supplied from the vertical driving unit 12 in FIG. 1 through the plurality of driving lines of the pixel driving line 16. In the above configuration, the transistors are NMOS transistors and therefore these drive signals TG, SG, FG, CG, RST, SEL and PG are pulse signals that become active at a high level (for example, a power supply voltage $V_{DD}$), and become non-active at a low level (for example, a negative potential).

The drive signal TG is applied to a gate electrode of the first transfer gate section 62 as a transfer signal. From the perspective of a circuit, the first transfer gate section 62 is connected to between the photodiode 61 and the first charge accumulation section 66. When the drive signal TG (hereinafter also referred to as the transfer signal TG) becomes active, the first transfer gate section 62 then establishes electrical continuity in response thereto and accordingly transfers the photocharges accumulated in the photodiode 61 to the first charge accumulation section 66. The photocharges transferred by the first transfer gate section 62 are temporarily accumulated in the first charge accumulation section 66.

The drive signal FG is applied to a gate electrode of the second transfer gate section 63 as a transfer signal. From the perspective of a circuit, the second transfer gate section 63 is connected to between the first charge accumulation section 66 and a floating diffusion section (hereinafter described as the "FD section") 71 to which a gate electrode of the amplifier transistor 68 is connected. The FD section 71 converts photocharge into an electric signal, for example, a voltage signal and outputs the signal. When the drive signal FG (hereinafter also referred to as the transfer signal FG) becomes active, the second transfer gate section 63 then establishes electrical continuity in response thereto and accordingly transfers the photocharges accumulated in the first charge accumulation section 66 to the FD section 71.

The drive signal CG is applied to a gate electrode of the third transfer gate section 64 as a transfer signal. From the perspective of a circuit, the third transfer gate section 64 is connected to between the first charge accumulation section 66 and the second charge accumulation section 67. When the drive signal CG (hereinafter also referred to as the transfer signal CG) becomes active, the third transfer gate section 64 then establishes electrical continuity in response thereto and accordingly couples the potentials of the first charge accumulation section 66 and the second charge accumulation section 67.

The drive signal RST is applied to a gate electrode of the reset gate section 65 as a reset signal. From the perspective of a circuit, one source/drain region of the reset gate section 65 is connected to a reset voltage $V_{DR}$, and the other source/drain region thereof is connected to the FD section 71, respectively. When the drive signal RST (hereinafter also referred to as the reset signal RST) becomes active, the reset gate section 65 then establishes electrical continuity in response thereto and accordingly resets the potential of the FD section 71 to the level of the reset voltage $V_{DR}$.

From the perspective of a circuit, the gate electrode of the amplifier transistor 68 is connected to the FD section 71, and a drain electrode thereof is connected to the power supply voltage $V_{DD}$, and the amplifier transistor 68 serves as an input section of a read circuit that reads the photocharge obtained by the photoelectric conversion by the photodiode 61, what is called a source follower circuit. In other words, a source electrode of the amplifier transistor 68 is connected to the vertical signal line 17 via the select transistor 69, and the amplifier transistor 68 configures the source follower circuit with a constant current source 80 connected to one end of the vertical signal line 17.

The drive signal SEL is applied to a gate electrode of the select transistor 69 as a selection signal. From the perspective of a circuit, the select transistor 69 is connected to between the source electrode of the amplifier transistor 68 and the vertical signal line 17. When the drive signal SEL (hereinafter also referred to as the selection signal SEL) becomes active, the select transistor 69 then establishes electrical continuity in response thereto and accordingly brings the unit pixel 60A to a selected state and connects a pixel signal output from the amplifier transistor 68 to the vertical signal line 17.

The drive signal PG is applied to a gate electrode of the charge drain gate section 70 as a charge drain control signal. From the perspective of a circuit, the charge drain gate section 70 is connected to between the photodiode 61 and a charge drain section (for example, the power supply voltage $V_{DD}$). When the drive signal PG (hereinafter also referred to as the charge drain control signal PG) becomes active, the charge drain gate section 70 then establishes electrical continuity in response thereto and accordingly selectively drains a preset specified amount or all of the photocharges accumulated in the photodiode 61, from the photodiode 61 to the charge drain section.

The charge drain gate section 70 is provided for the following purpose. In other words, the purpose is for avoiding the saturation of the photodiode 61 with photocharges and the overflow of the photocharges that exceed the saturation charge amount to the first and second charge accumulation sections 66 and 67 and the surrounding pixels, which are caused by bringing the charge drain gate section 70 into conduction in a period during which photocharges are not accumulated.

(Pixel Structure of Unit Pixel 60A)

Figure 9:
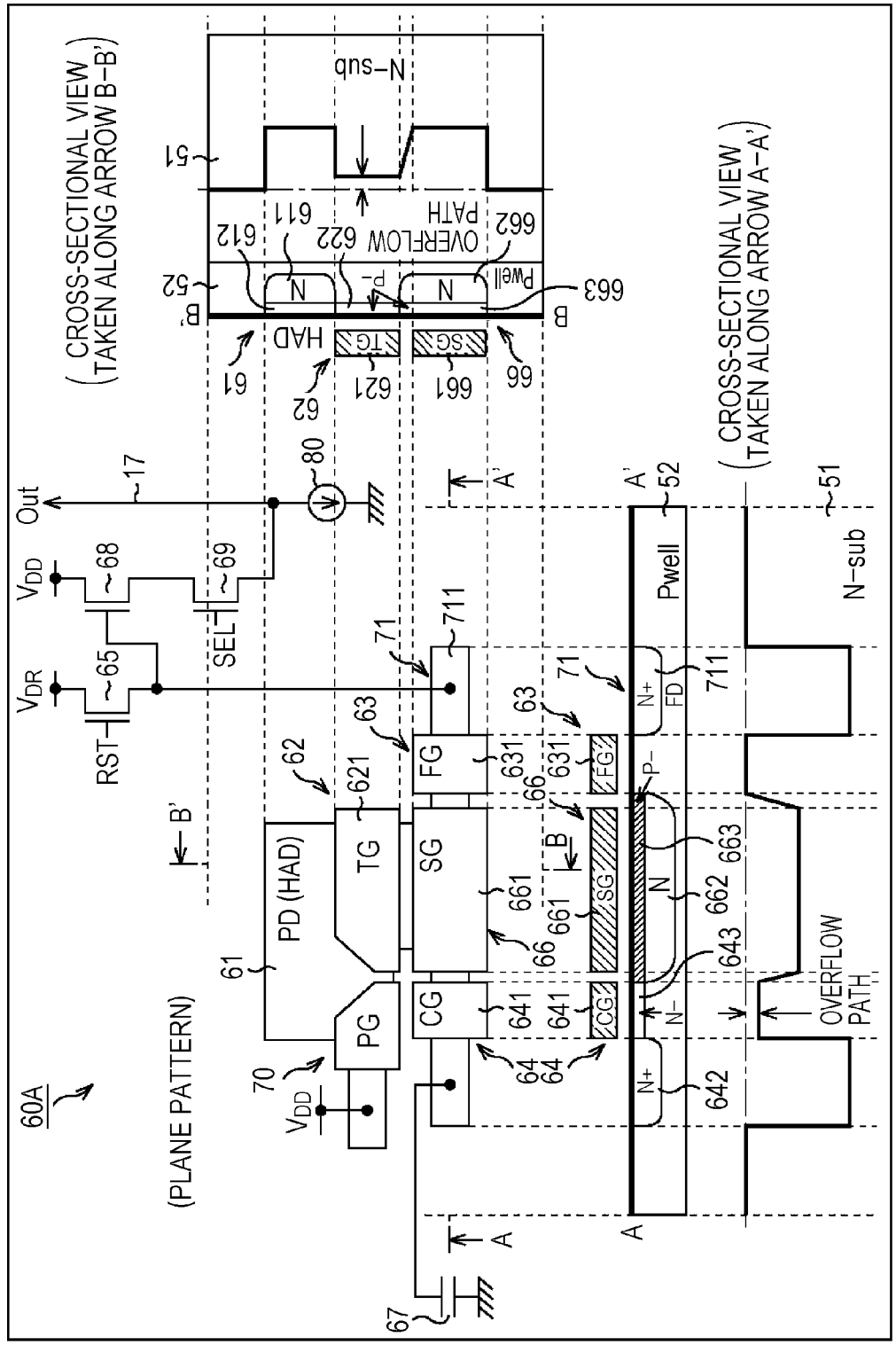
FIG. 9 is a schematic view depicting a pixel structure of the unit pixel.

FIG. 9 is a schematic diagram depicting a pixel structure of the unit pixel 60A, and the same reference numbers are assigned in FIG. 9 to denote portions equivalent to those in FIG. 8. FIG. 9 depicts a plane pattern of a pixel layout and cross sections of the plane pattern, taken along arrow A-A' and arrow B-B', respectively.

In FIG. 9, as is clear from the cross-sectional view taken along arrow B-B', the photodiode (PD) 61 has the structure of a diode having a p-n junction, where an N-type semiconductor region 611 is formed in the P-type well 52 on the semiconductor substrate 51. The photodiode 61 includes a P-type semiconductor region 612 formed in a surface layer portion thereof and accordingly is an embedded photodiode (what is called an HAD (Hole Accumulation Diode) sensor structure) where a depletion end is away from the interface.

The first transfer gate section 62 includes a gate electrode 621 disposed on the substrate surface via a gate insulating film (not shown), and a P--type semiconductor region 622 formed in the substrate surface layer portion. The P--type semiconductor region 622 has the potential beneath the gate electrode 621 slightly deeper than the case where the semiconductor region 622 is not formed. Consequently, as is clear from the cross-sectional view taken along arrow B-B', the P--type semiconductor region 622 forms an overflow path that transfers, to the first charge accumulation section 66, photocharges equal to or more than the specified amount, which overflow from the photodiode 61, or specifically, photocharges exceeding the saturation charge amount of the photodiode 61.

The first charge accumulation section 66 includes a gate electrode 661 disposed on the substrate surface via a gate insulating film (not shown) and is formed as an embedded MOS capacitor beneath the gate electrode 661. In other words, the first charge accumulation section 66 is configured of an embedded MOS capacitor including an N-type semiconductor region 662 formed in the P-type well 52 beneath the gate electrode 661 and a P--type semiconductor region 663 formed in a surface layer portion thereof.

The second transfer gate section 63 includes a gate electrode 631 disposed on the substrate surface via a gate insulating film (not shown). The second transfer gate section 63 has the N-type semiconductor region 662 of the first charge accumulation section 66 as one source/drain region, and an N+-type semiconductor region 711 to serve as the FD section 71 as the other source/drain region.

Therefore, the unit pixel 60A has a pixel structure where the first charge accumulation section 66 is formed, as an embedded MOS capacitor, beneath the gate electrode 661 formed adjacently to the first and second transfer gate sections 62 and 63.

The third transfer gate section 64 includes a gate electrode 641 disposed on the substrate surface via a gate insulating film (not shown). The third transfer gate section 64 has the N-type semiconductor region 662 of the first charge accumulation section 66 as one source/drain region, and an N+-type semiconductor region 642 formed in the substrate surface layer portion as the other source/drain region.

The N+-type semiconductor region 642 of the third transfer gate section 64 is electrically connected to one end of the second charge accumulation section 67. The other end of the second charge accumulation section 67 is connected to a negative side power supply (for example, a ground).

The second transfer gate section 63, the gate electrode 661 of the first charge accumulation section 66, and the third transfer gate section 64 operate to couple or divide the potentials of the FD section 71, the first charge accumulation section 66, and the second charge accumulation section 67.

Moreover, the third transfer gate section 64 has a structure where an N--type semiconductor region 643 is formed in a surface layer portion of a channel portion. The N--type semiconductor region 643 has the potential beneath the gate electrode 641 slightly deeper than the case where the semiconductor region 643 is not formed. Consequently, as is clear from the cross-sectional view taken along arrow A-A', the N--type semiconductor region 643 forms an overflow path that transfers, to the second charge accumulation section 67, the photocharges exceeding the saturation charge amount of the first charge accumulation section 66.

Here, it is important that the overflow paths formed beneath the first and third transfer gate sections 62 and 64 should be formed such that the photocharges accumulated in the first charge accumulation section 66 do not leak to the photodiode 61 and are transferred to the second charge accumulation section 67.

In this manner, the unit pixel 60A has the overflow path beneath the gate electrode 641 of the third transfer gate section 64; accordingly, it is possible to accumulate the photocharges overflowing from the photodiode 61 in a high light condition also in the second charge accumulation section 67. Specifically, even if the third transfer gate section 64 is not conducting, photocharges equal to or more than the specified amount, which overflow from the first charge accumulation section 66, can be transferred to the second charge accumulation section 67 and accumulated in the second charge accumulation section 67. Consequently, it is possible to set the saturation charge amount of the first charge accumulation section to be smaller than the saturation charge amount of the photodiode 61.

(Circuit Operation of Unit Pixel 60A)

Next, a description will be given of a circuit operation of the unit pixel 60A with reference to a timing chart of FIG. 10 and potential diagrams of FIGS. 11 to 18.

Figure 10:
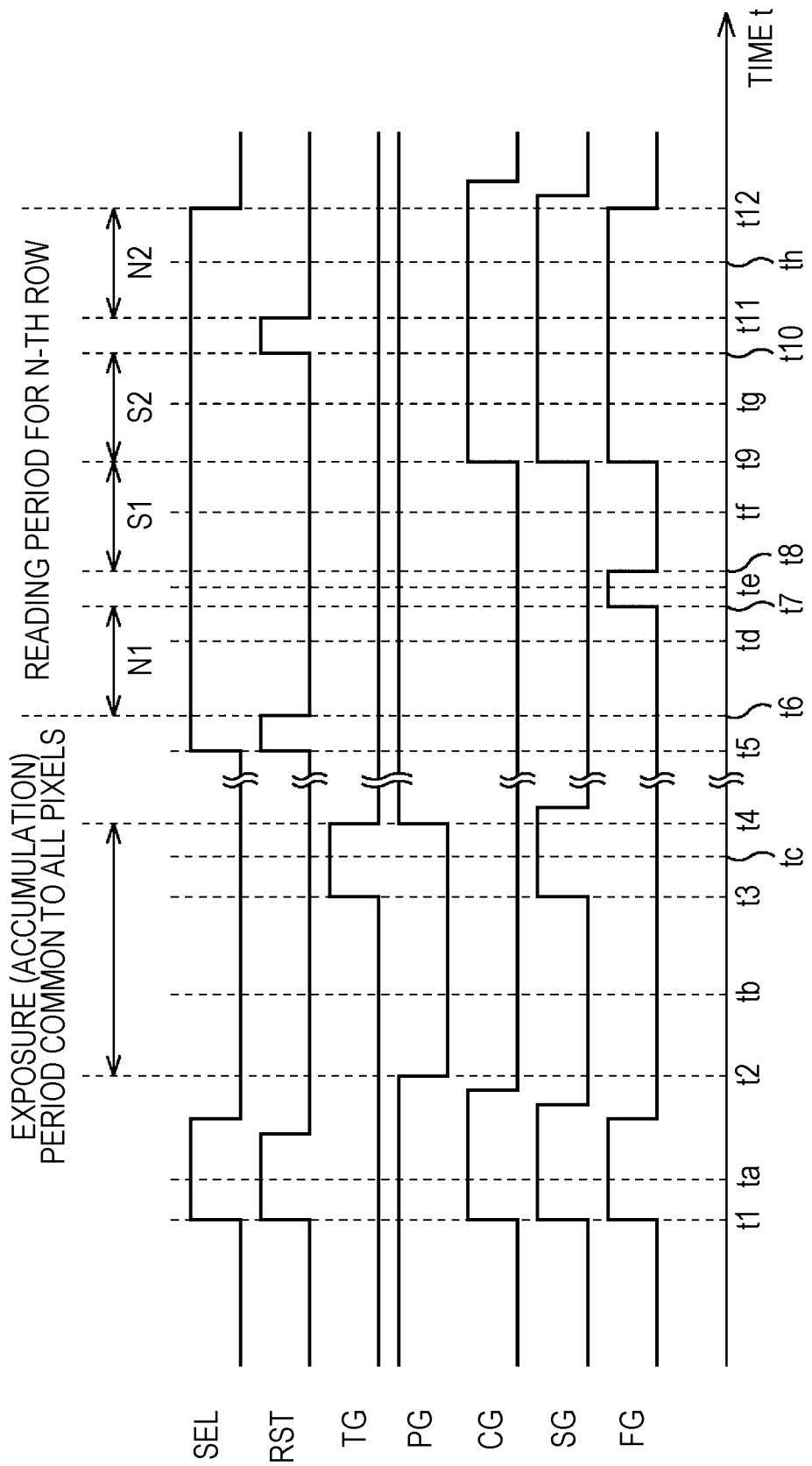
FIG. 10 is a timing chart provided for a description of a circuit operation of the unit pixel.

FIG. 10 depicts a timing chart of the selection signal SEL, the reset signal RST, the transfer signal TG, the charge drain control signal PG, the transfer signal CG, the transfer signal SG, and the transfer signal FG of the unit pixel 60A. Moreover, FIGS. 11 to 18 depict the states of the potential of the unit pixel 60A in the N-th row at times ta to th of the timing chart of FIG. 10, respectively.

Firstly, at time t1, while the charge drain control signal PG stays active, the selection signal SEL, the reset signal RST, the transfer signal CG, the transfer signal SG and the transfer signal FG simultaneously become active in all the pixels. Consequently, the select transistor 69, the reset gate section 65, the third transfer gate section 64, the gate electrode 661 of the first charge accumulation section 66, the second transfer gate section 63, and the charge drain gate section 70 establish electrical continuity.

Figure 11:
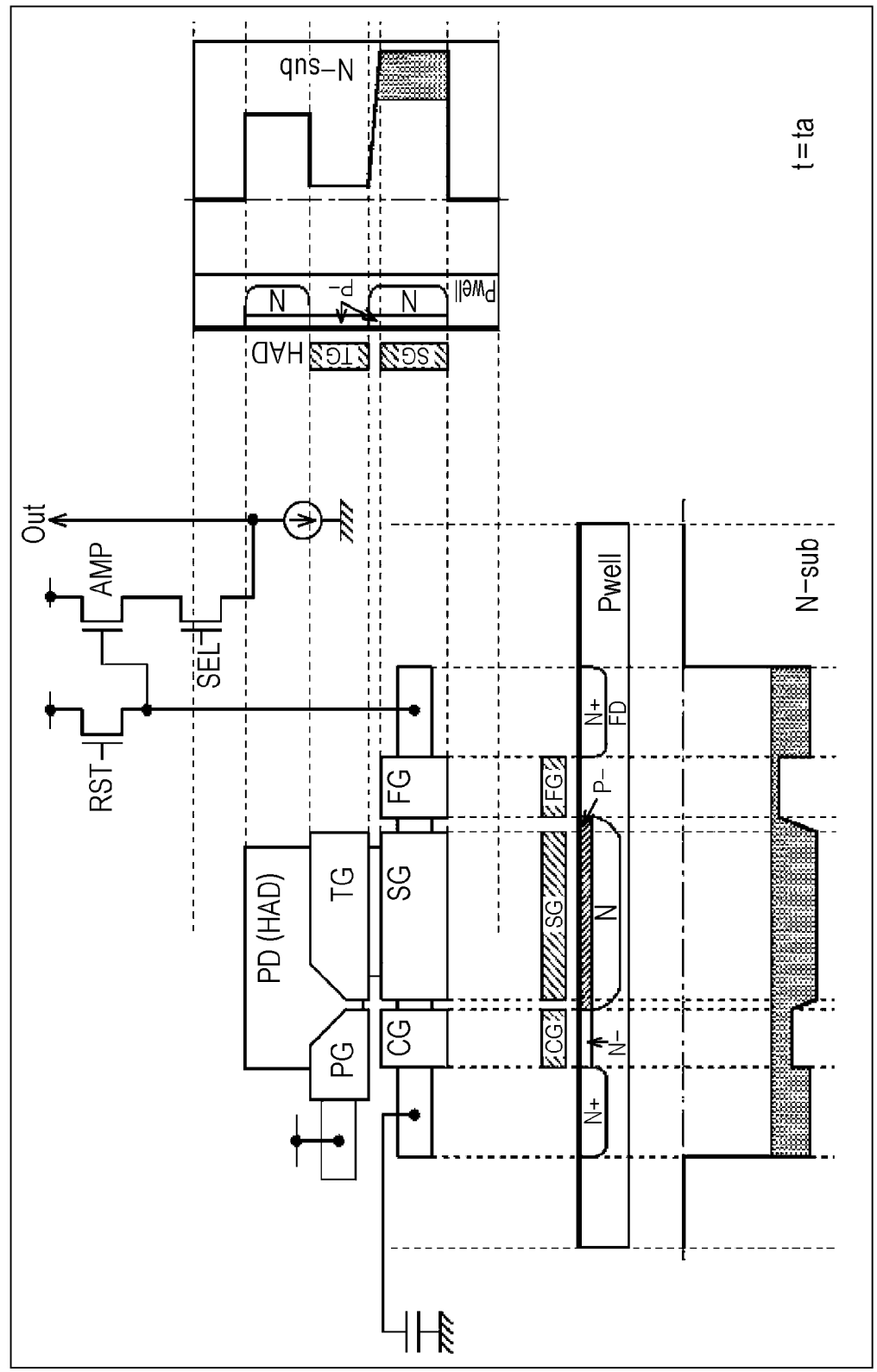
FIG. 11 is a (first) potential diagram provided for a description of the circuit operation of the unit pixel.

FIG. 11 depicts the state of the potential of the unit pixel 60A at time to between time t1 and time t2. In this manner, the potentials of the FD section 71, the first charge accumulation section 66 and the second charge accumulation section 67 are coupled and the coupled region is reset.

Subsequently, the reset signal RST, the selection signal SEL, the transfer signal FG, the transfer signal SG and the transfer signal CG simultaneously become non-active in this order in all the pixels. At time t2, the charge drain control signal PG then simultaneously become non-active in all the pixels. Consequently, the exposure period common to all the pixels begins.

Figure 12:
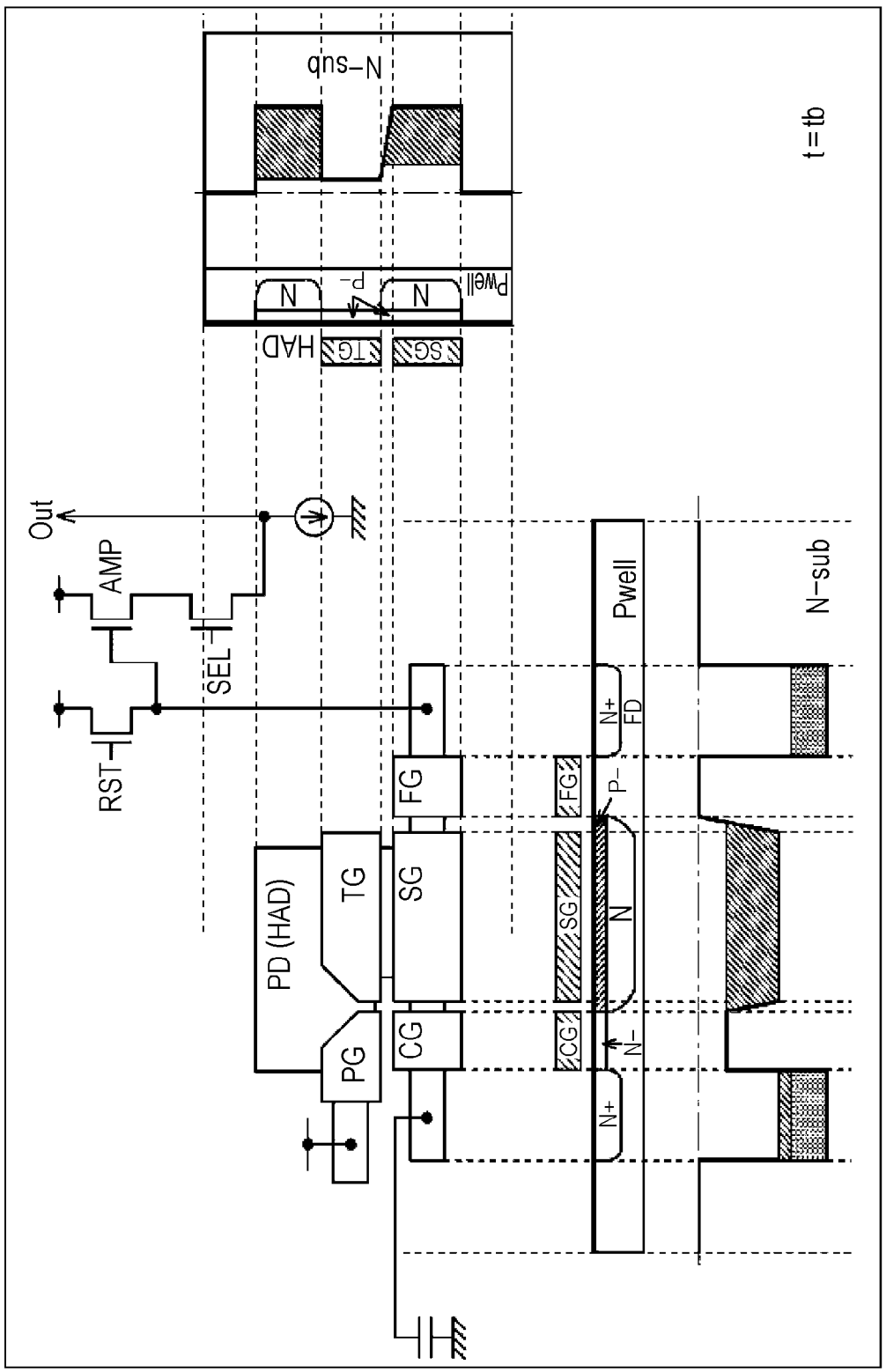
FIG. 12 is a (second) potential diagram provided for a description of the circuit operation of the unit pixel.

FIG. 12 depicts the state of the potential of the unit pixel 60A at time tb between time t2 and time t3. In this manner, while photocharges are accumulated in the photodiode 61, if in a high light condition, photocharges overflowing from the photodiode 61 are accumulated in the first charge accumulation section 66 via the overflow path of the first transfer gate section 62. Furthermore, if the first charge accumulation section 66 is saturated, the photocharges overflowing from the first charge accumulation section 66 are accumulated in the second charge accumulation section 67 via the overflow path of the third transfer gate section 64. If in a low light condition, photocharges are accumulated only in the photodiode 61.

Next, at time t3, the transfer signal TG and the transfer signal SG become active and the first transfer gate section 62 and the gate electrode 661 of the first charge accumulation section 66 establish electrical continuity.

Figure 13:
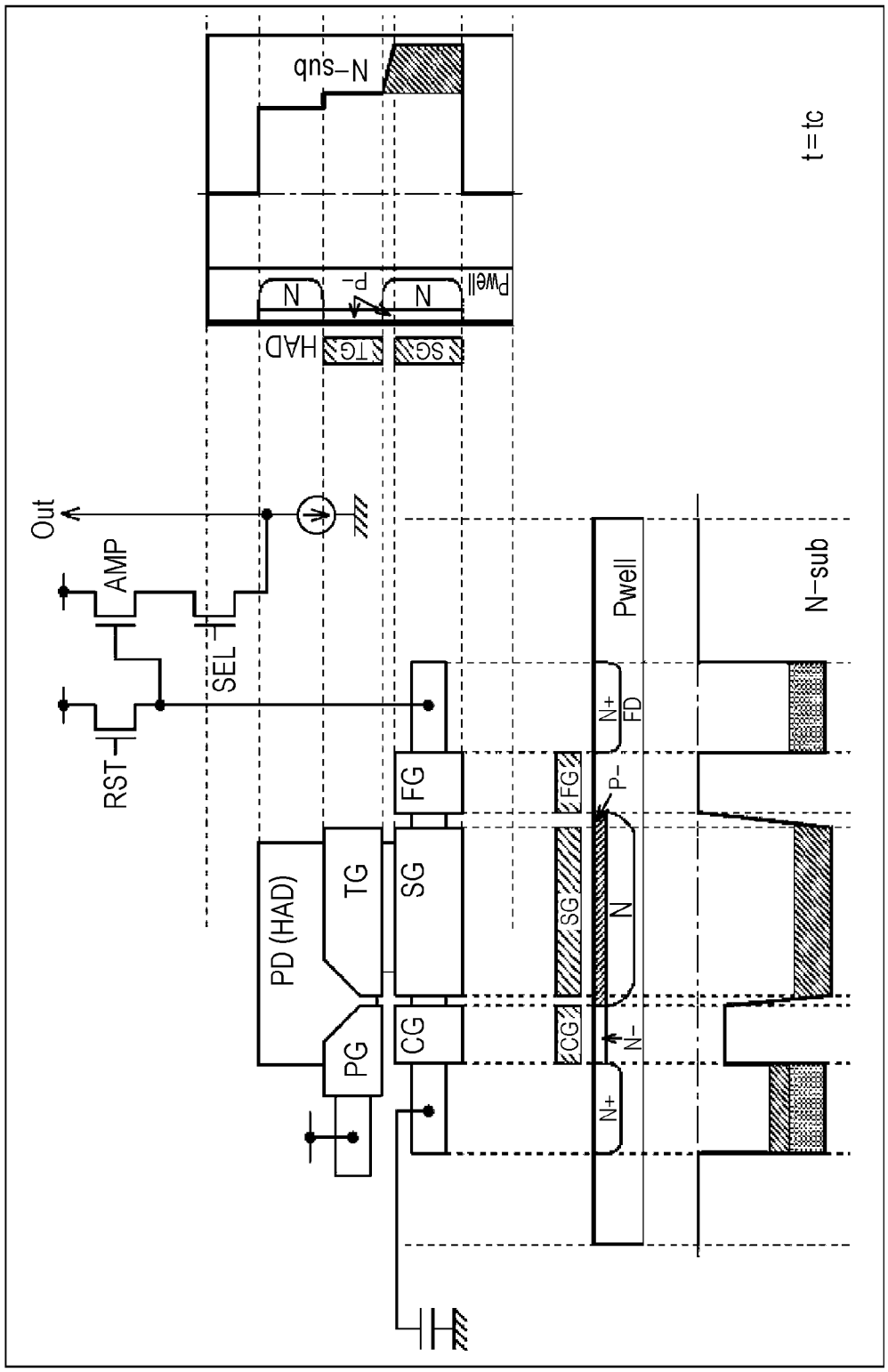
FIG. 13 is a (third) potential diagram provided for a description of the circuit operation of the unit pixel.

FIG. 13 depicts the state of the potential of the unit pixel 60A at time tc between time t3 and time t4. In this manner, the photocharges accumulated in the photodiode 61 are transferred to the first charge accumulation section 66 and accumulated in the first charge accumulation section 66.

Next, at time t4, in all the pixels, the transfer signal TG becomes non-active and at the same time the charge drain control signal PG becomes active. The first transfer gate section 62 then breaks electrical continuity and at the same time the charge drain gate section 70 establishes electrical continuity. Consequently, the exposure period common to all the pixels ends.

Subsequently, the transfer signal SG also becomes non-active, and the gate electrode 661 of the first charge accumulation section 66 breaks electrical continuity and therefore the potential of the first charge accumulation section 66 is restored to its original level. At this time, if the accumulated charge amount of the first charge accumulation section 66 exceeds the saturation charge amount, the photocharges overflowing from the first charge accumulation section 66 are transferred to the second charge accumulation section 67 via the overflow path of the third transfer gate section 64.

After the exposure period common to all the pixels ends, the accumulated photocharges are then read in turn, row by row.

Specifically, at time t5, the selection signal SEL in the N-th row becomes active, and the select transistor 69 in the N-th row establishes electrical continuity and therefore the unit pixel 60A in the N-th row is brought to a selected state. At the same time, the reset signal RST becomes active and the reset gate section 65 establishes electrical continuity and therefore the FD section 71 is reset. At time t6, the reset signal RST then becomes non-active.

Figure 14:
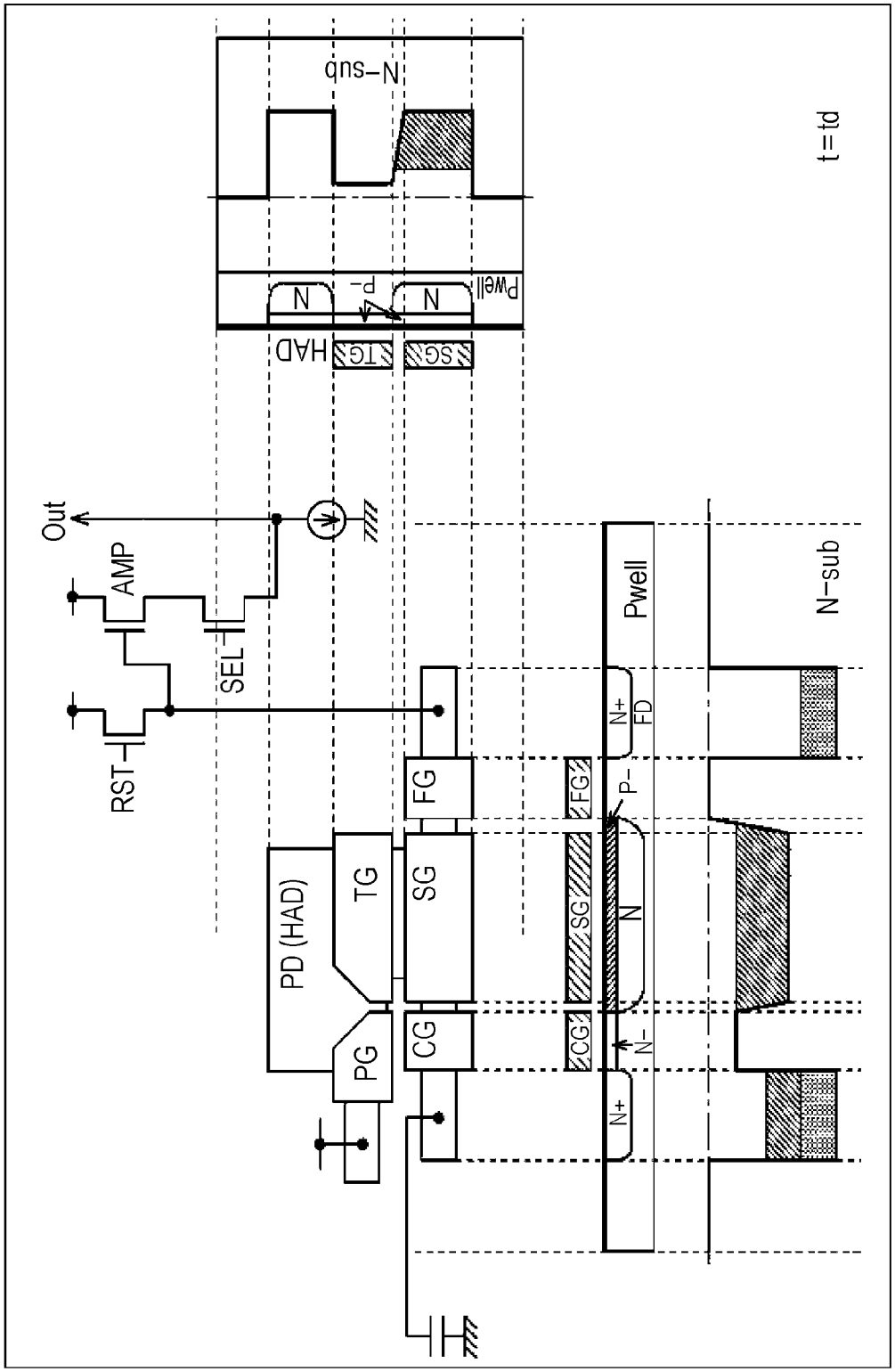
FIG. 14 is a (fourth) potential diagram provided for a description of the circuit operation of the unit pixel.

FIG. 14 depicts the state of the potential of the unit pixel 60A at time td between time t6 and time t7. The potential of the FD section 71 in this state is output as a first reset level N1 to the vertical signal line 17 through the amplifier transistor 68 and the select transistor 69.

Next, at time t7, the transfer signal FG becomes active and therefore the second transfer gate section 63 establishes electrical continuity.

Figure 15:
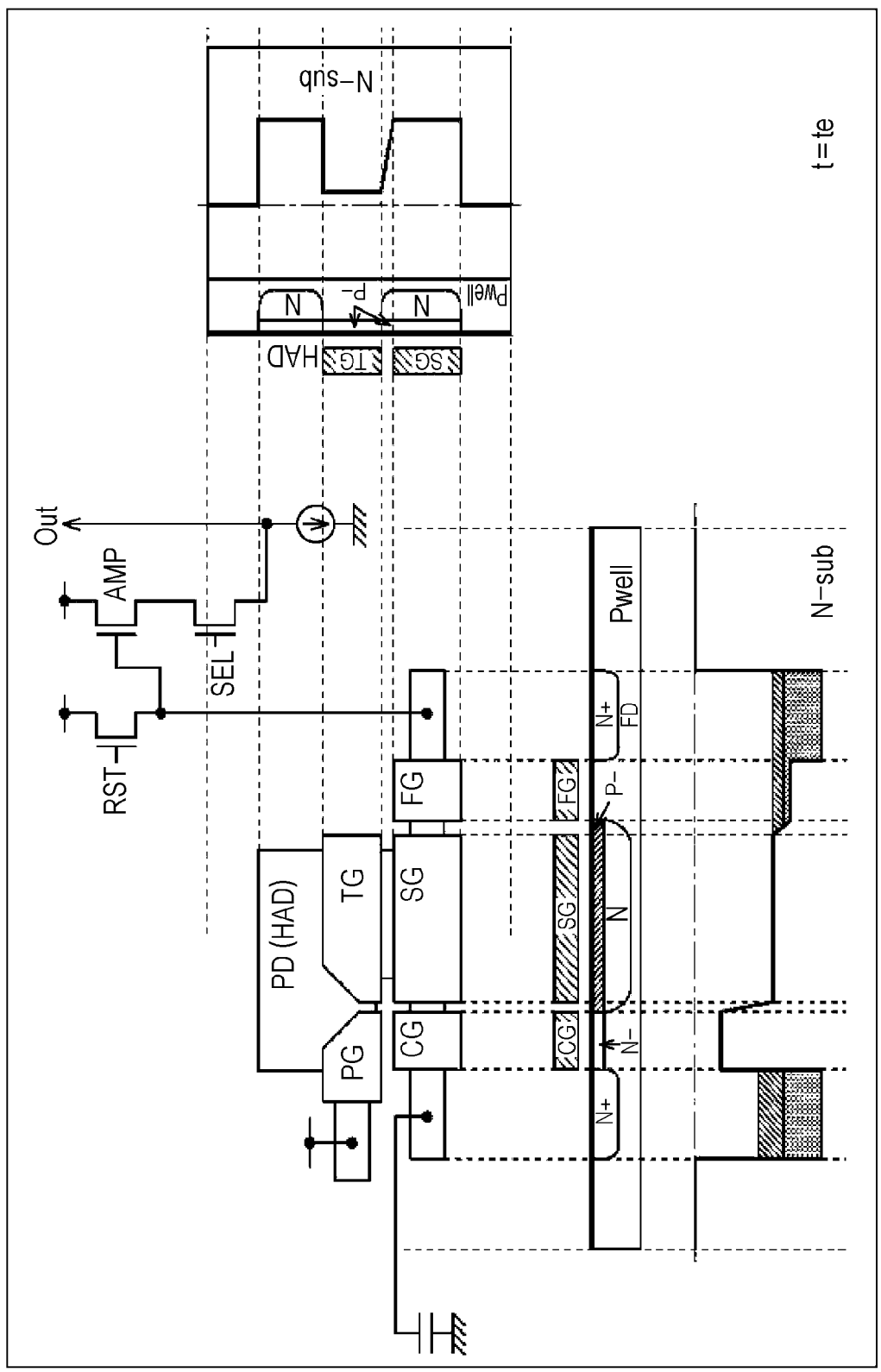
FIG. 15 is a (fifth) potential diagram provided for a description of the circuit operation of the unit pixel.

FIG. 15 depicts the state of the potential of the unit pixel 60A at time te between time t7 and time t8. In this manner, the photocharges accumulated in the first charge accumulation section 66 are transferred to the FD section 71.

Next, at time t8, the transfer signal FG becomes non-active, and the second transfer gate section 63 breaks electrical continuity.

Figure 16:
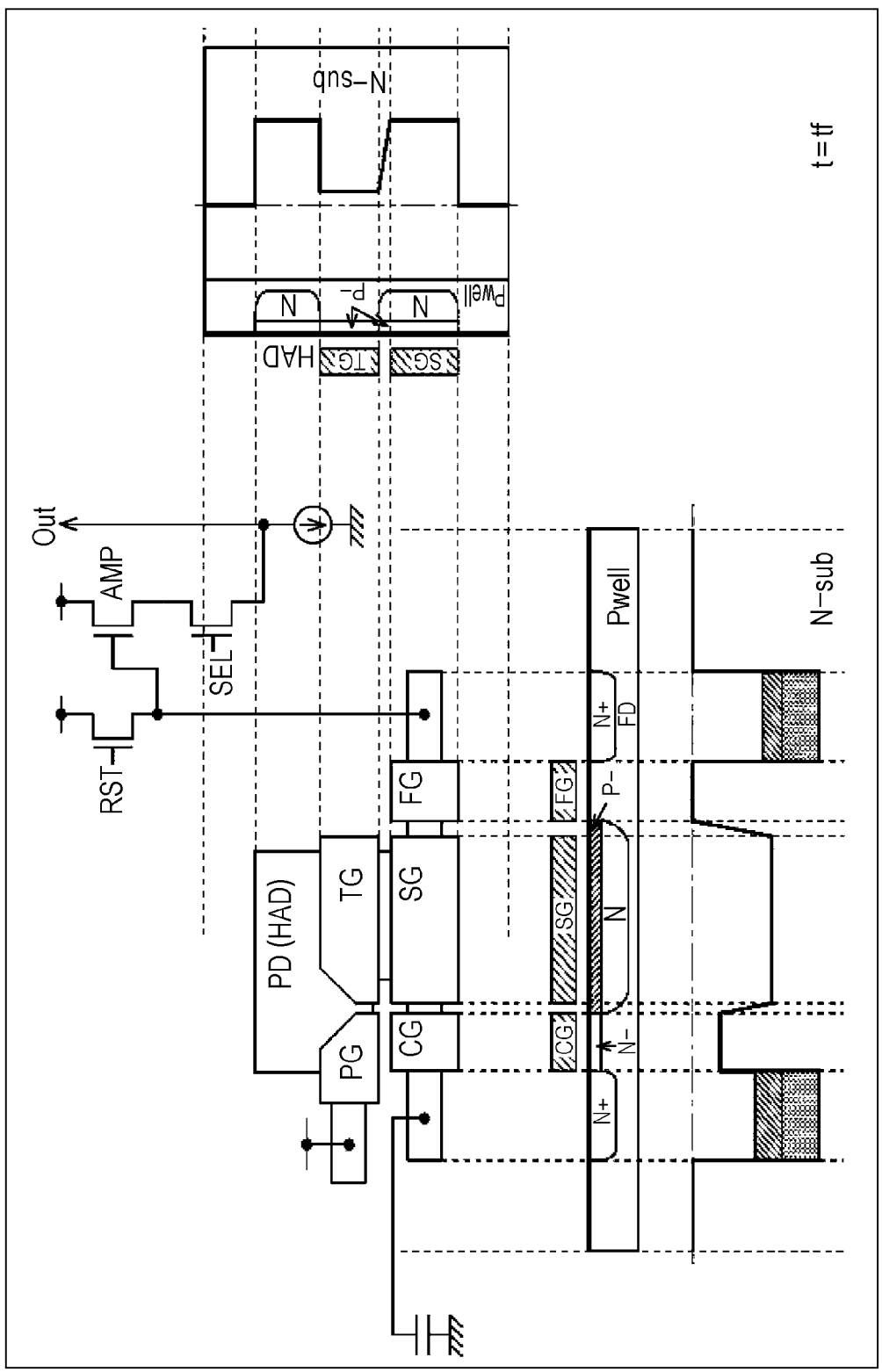
FIG. 16 is a (sixth) potential diagram provided for a description of the circuit operation of the unit pixel.

FIG. 16 depicts the state of the potential of the unit pixel 60A at time tf between time t8 and time t9. The potential of the FD section 71 in this state is output, as a first signal level S1 in accordance with the accumulated charge amount of the first charge accumulation section 66, to the vertical signal line 17 through the amplifier transistor 68 and the select transistor 69.

Next, at time t9, the transfer signals CG, SG and FG simultaneously become active, and the third transfer gate section 64, the gate electrode 661 of the first charge accumulation section 66 and the second transfer gate section 63 establish electrical continuity all together.

Figure 17:
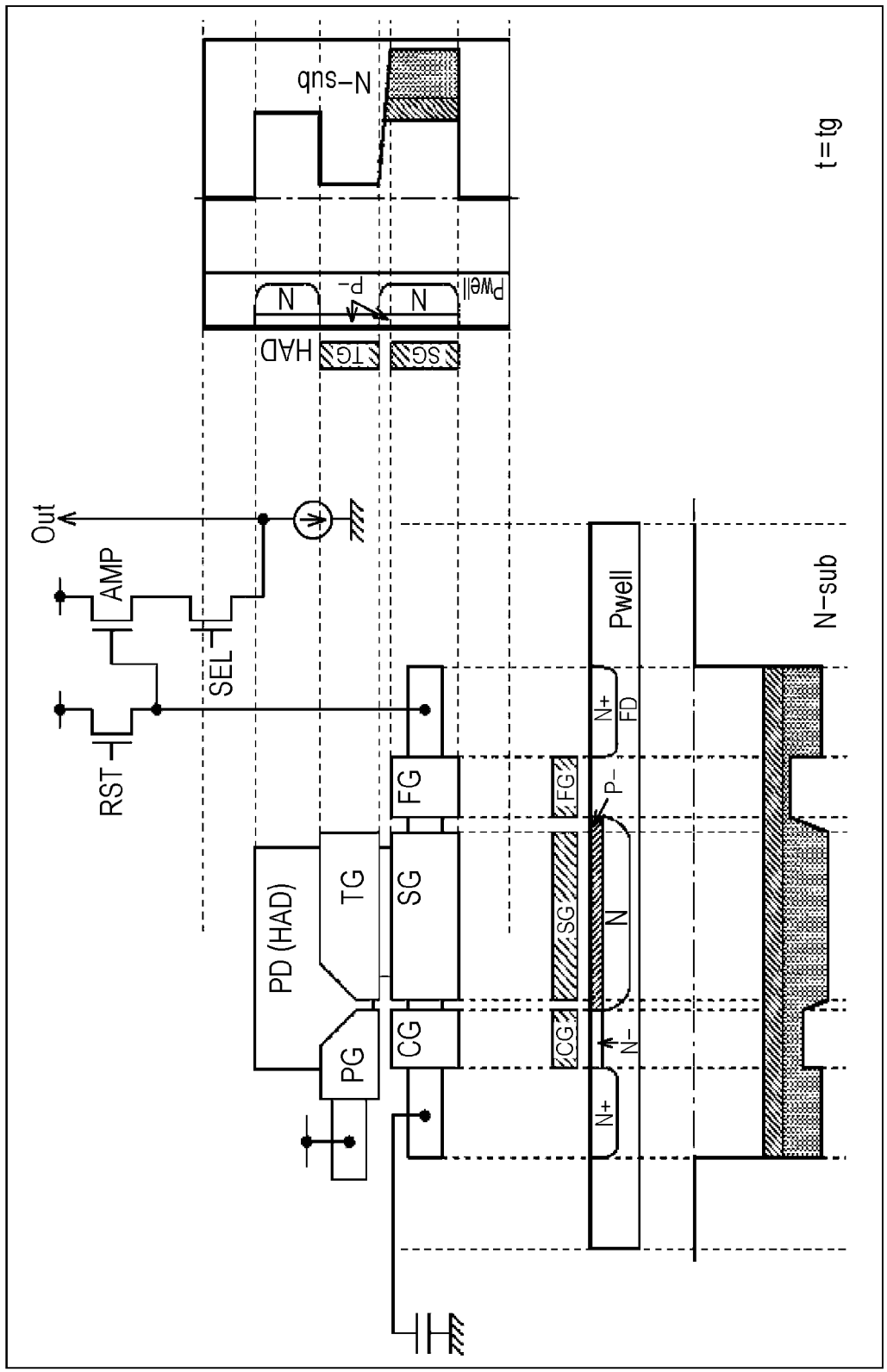
FIG. 17 is a (seventh) potential diagram provided for a description of the circuit operation of the unit pixel.

FIG. 17 depicts the state of the potential of the unit pixel 60A at time tg between time t9 and time t10. In this manner, the potentials of the FD section 71, the first charge accumulation section 66 and the second charge accumulation section 67 are coupled and photocharges are accumulated in across the entire coupled area. The photocharges are output as a second signal level S2 to the vertical signal line 17 through the amplifier transistor 68 and the select transistor 69.

Next, at time t10, the reset signal RST becomes active, and the reset gate section 65 establishes electrical continuity. Consequently, the area where the potentials of the FD section 71, the first charge accumulation section 66 and the second charge accumulation section 67 are coupled is reset.

Next, at time t11, the reset signal becomes non-active, and the reset gate section 65 breaks electrical continuity.

Figure 18:
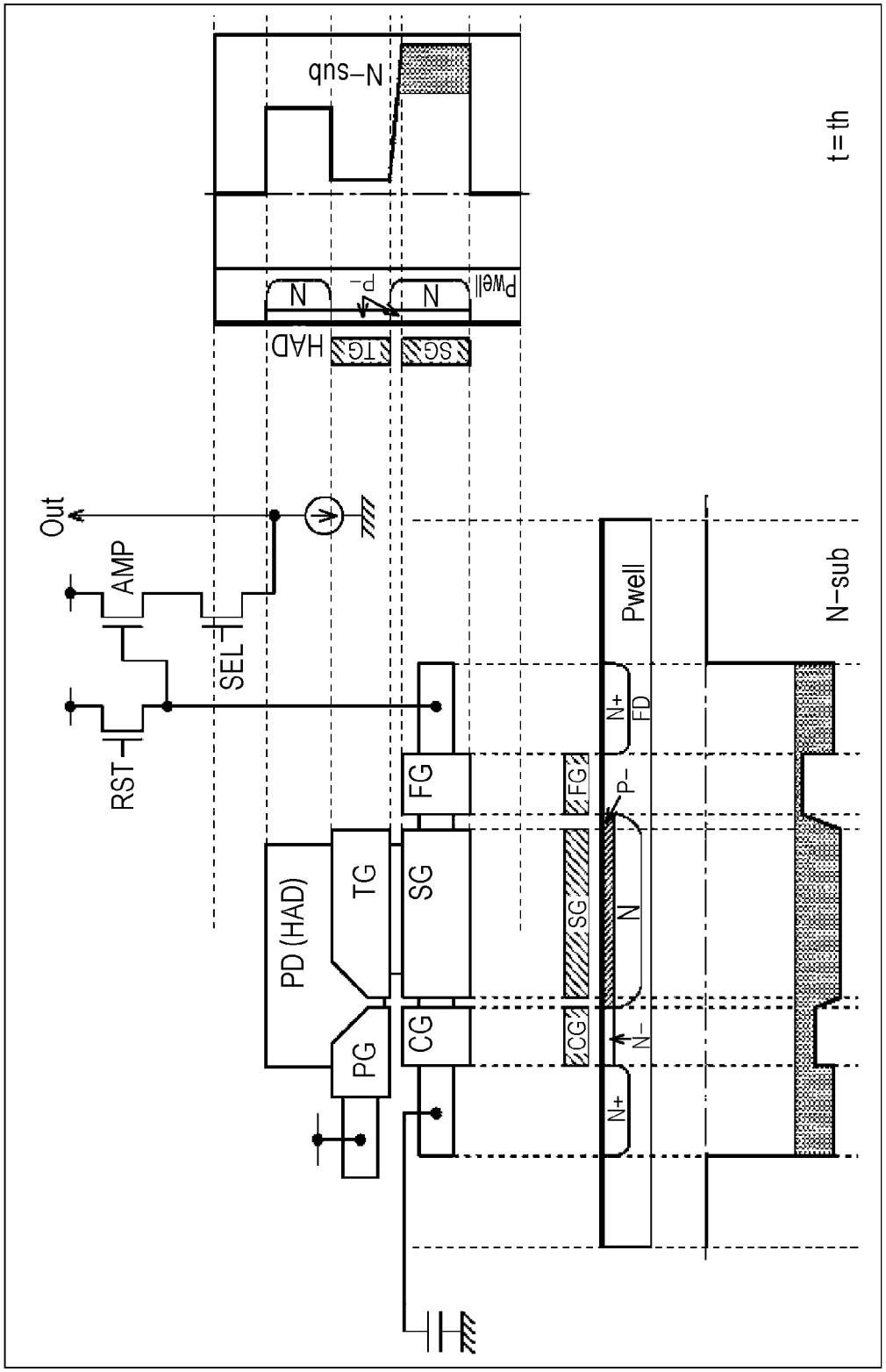
FIG. 18 is a (eighth) potential diagram provided for a description of the circuit operation of the unit pixel.

FIG. 18 depicts the state of the potential of the unit pixel 60A at time th between time t11 and time t12. The potential of the area where the potentials are coupled in this state is output as a second reset level N2 to the vertical signal line 17 through the amplifier transistor 68 and the select transistor 69.

Next, at time t12, the selection signal SEL in the N-th row becomes non-active, and the select transistor 69 in the N-th row breaks electrical continuity and therefore the unit pixel 60A in the N-th row is brought to a non-selected state.

Subsequently, the transfer signal FG, the transfer signal SG and the transfer signal CG are brought to the non-active state in this order, and the second transfer gate section 63, the gate electrode 661 of the first charge accumulation section 66, and the third transfer gate section 64 break electrical continuity.

The reason why the transfer signal FG, the transfer signal SG and the transfer signal CG are brought to the non-active state in this order is to accumulate, in the second charge accumulation section 67, channel charges accumulated in the substrate surface in the state where the gate electrode 661 of the first charge accumulation section 66 is conducting. Differently from the FD section 71, the second charge accumulation section 67 is not reset alone; accordingly, there is no concern such as that an offset occurs in a pixel signal by resetting the channel charges.

With the above-mentioned series of circuit operations, the first reset level N1, the first signal level S1, the second signal level S2, and the second reset level N2 are output in turn from the unit pixel 60A to the vertical signal line 17. Specified signal processing is performed, in the signal processing unit in the subsequent stage, on the first reset level N1, the first signal level S1, the second signal level S2, and the second reset level N2, which are output in turn in this manner. The details of the signal processing will be described later.

As described above, according to the unit pixel 60A, it is possible to secure a larger saturation charge amount by using an embedded MOS capacitor as the first charge accumulation section 66 and using a capacitor having a higher capacitance value per unit area than the first charge accumulation section 66 as the second charge accumulation section 67. Conversely, if the equal saturation charge amount is acceptable, a reduction in the unit pixel size can be promoted by the amount of space saved.

In addition, upon simultaneously reading out all the pixels, the photocharges in a low light condition are accumulated in the first charge accumulation section 66 that is good in properties in the dark while the photocharges in a high light condition are accumulated in the second charge accumulation section 67 that is not good in properties in the dark. Therefore, compared with the related art that realizes the global exposure, the quality of an image imaged in the dark or in a low light condition is not deteriorated.

(Modification 1)

Figure 19:
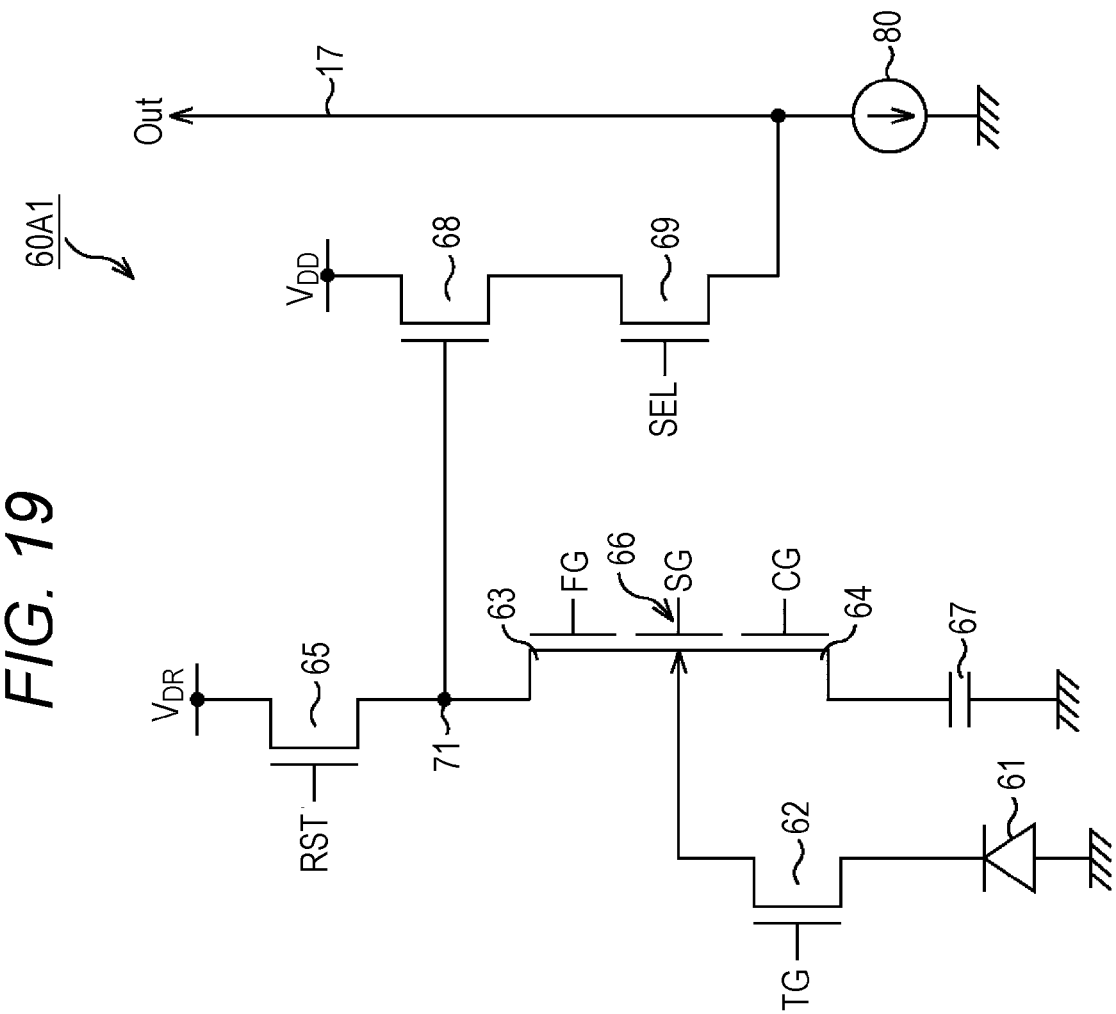
FIG. 19 is a circuit diagram depicting a circuit configuration of Modification 1 of the unit pixel.

FIG. 19 is a circuit diagram depicting a circuit configuration of a unit pixel 60A1 according to Modification 1 of the unit pixel 60A, and the same reference signs are assigned in the drawing to denote portions equivalent to those in FIG. 8.

The unit pixel 60A1 according to Modification 1 is different from the unit pixel 60A in the respect that the charge drain gate section 70 is omitted.

For example, if, during a period for which photocharges are not accumulated, the saturation of the photodiode 61 is prevented in another method or there is no possibility of the photodiode 61 being saturated with photocharges, it is possible to omit the charge drain gate section 70 in this manner.

(Modification 2)

Figure 20:
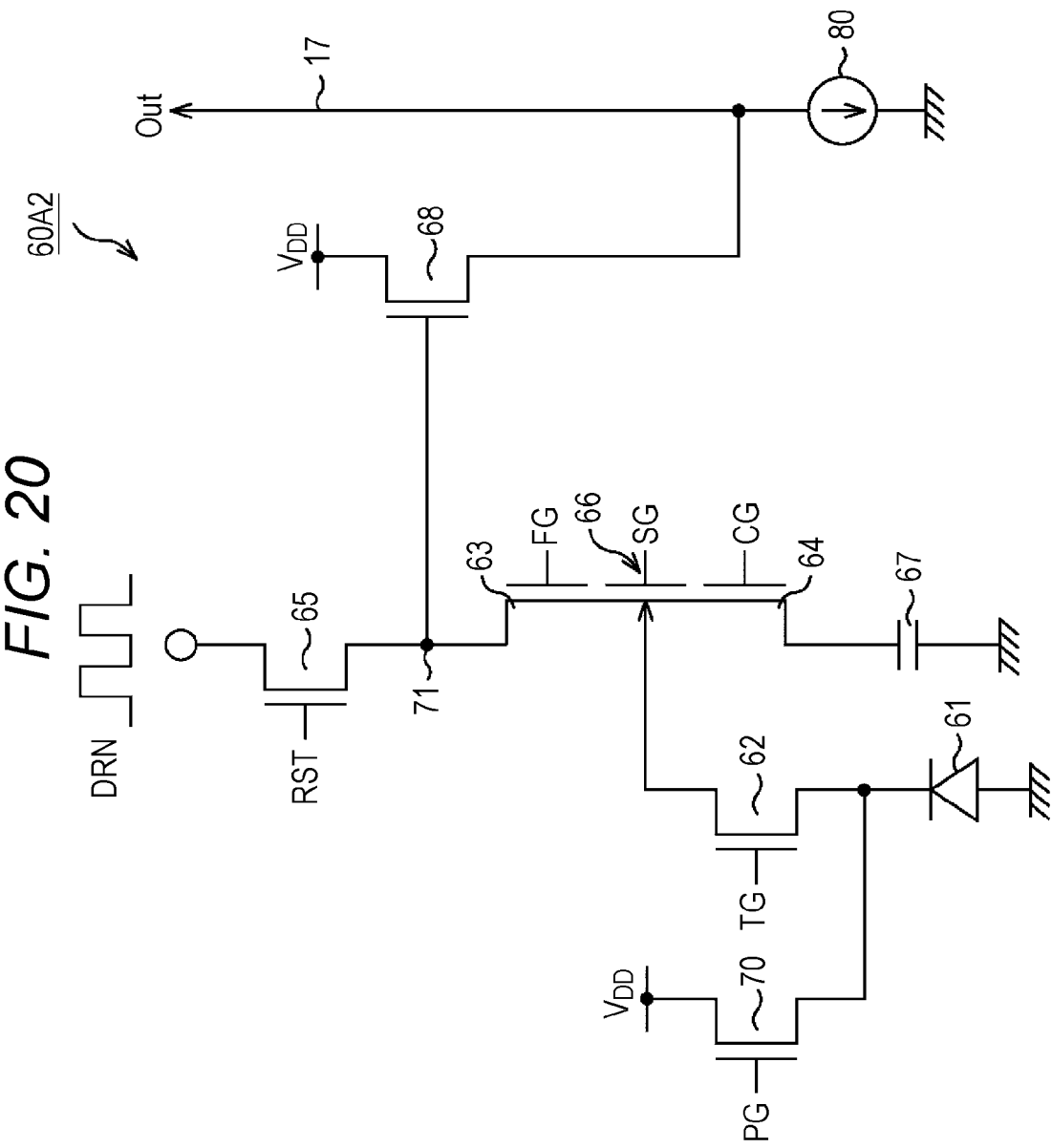
FIG. 20 is a circuit diagram depicting a circuit configuration of Modification 2 of the unit pixel.

FIG. 20 is a circuit diagram depicting a circuit configuration of a unit pixel 60A2 according to Modification 2 of the unit pixel 60A, and the same reference signs are assigned in the drawing to denote portions equivalent to those in FIG. 8.

The unit pixel 60A2 according to Modification 2 is different from the unit pixel 60A in the respect that the select transistor 69 is omitted. Additionally, the unit pixel 60A2 realizes the function of selecting a pixel with the select transistor 69 by making a drain voltage DRN to be applied to the drain electrode of the reset gate section 65 variable.

Specifically, high voltage is applied to the drain electrode of the reset gate section 65 as the drain voltage DRN; accordingly, the amplifier transistor 68 becomes active to perform the operation of outputting a signal. In other words, the amplifier transistor 68 operates as a select transistor in cooperation with the switching operation of the drain voltage DRN. There is an advantage to be able to decrease the number of circuit elements configuring the unit pixel 60 by one element per pixel, by omitting the select transistor 69.

Figure 21:
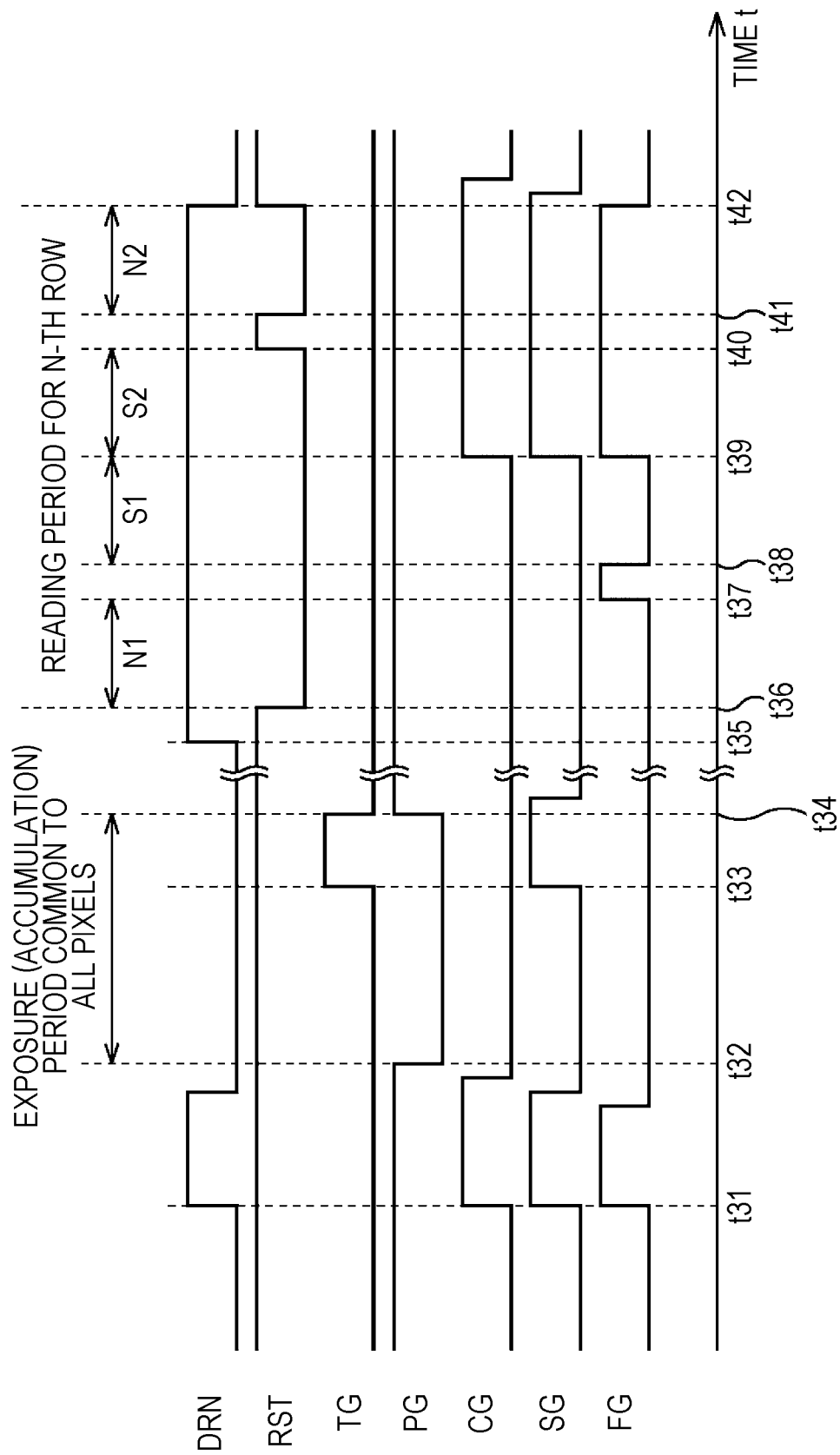
FIG. 21 is a timing chart provided for a description of a circuit operation of Modification 2 of the unit pixel.

FIG. 21 is a timing chart depicting the states of the signals in terms of the circuit operation of the unit pixel 60A2, similarly to FIG. 10.

The circuit operation is basically the same as the case of the circuit operation of the unit pixel 60A and only the timing of the reset signal RST is different.

(Pixel Sharing)

In the unit pixels 60A, 60A1, and 60A2, circuit elements configuring a pixel can be shared between a plurality of pixels.

Figure 22:
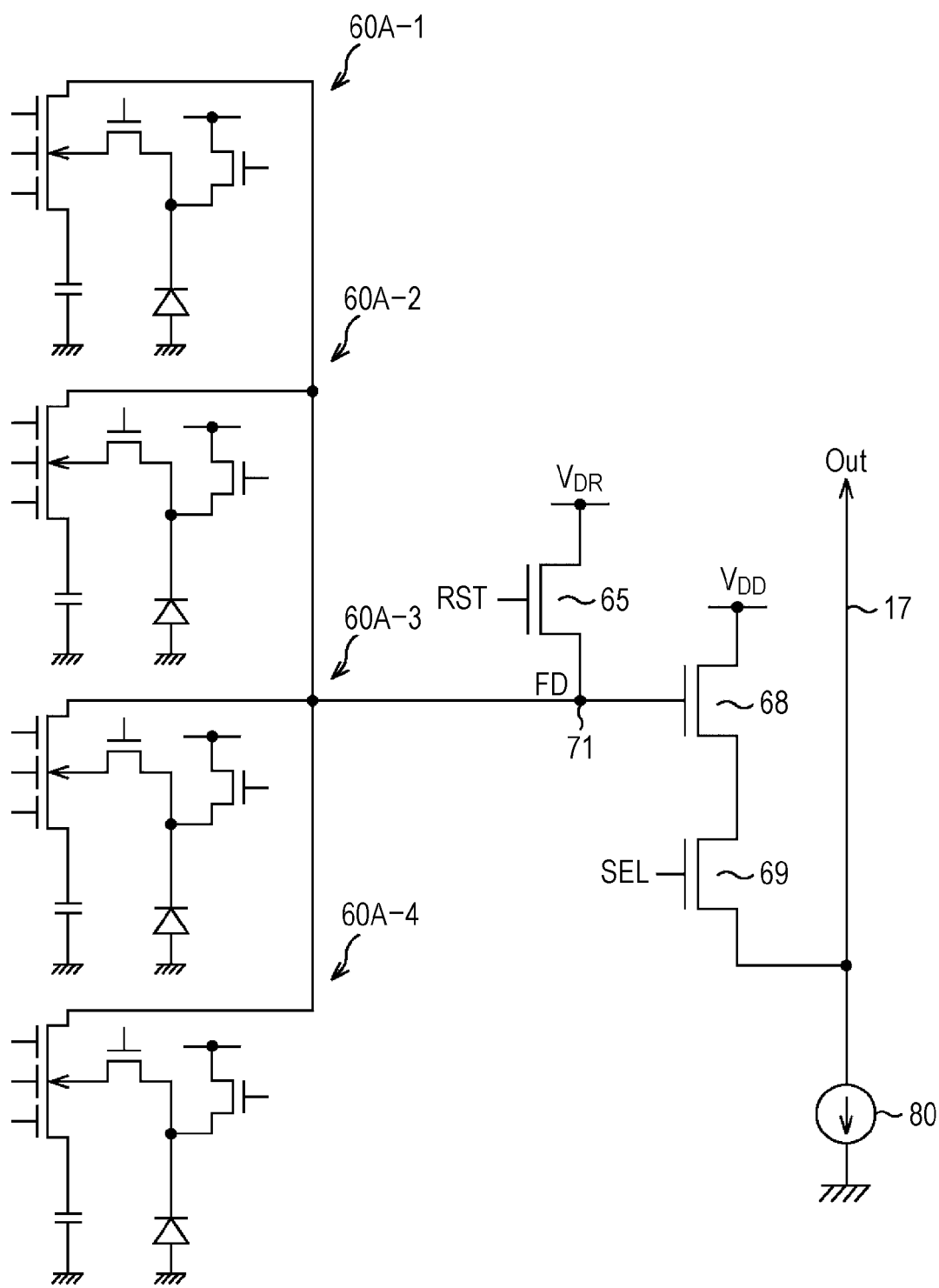
FIG. 22 is a circuit diagram depicting a circuit configuration according to Specific Example 1 of pixel sharing.

FIG. 22 is a circuit diagram depicting a circuit configuration according to Specific Example 1 of pixel sharing. Here, cited as an example is a case of sharing a part of pixel constituent elements between four pixels 60A-1 to 60A-4 that are adjacent to one another. However, the number of sharing pixels is not limited to four pixels. Moreover, as the relationship of the adjacent four pixels 60A-1 to 60A-4, the sharing may take place, for example, between four pixels including two pixels in the row direction and two pixels in the column direction, or between four pixels in the column direction.

In Specific Example 1, cited as an example is pixel sharing of a case of the pixel configuration of the unit pixel 60A. The circuit elements after the FD section 71 including the reset gate section 65, in other words, three circuit elements of the reset gate section 65, the amplifier transistor 68, and the select transistor 69 are shared between the four pixels.

Figure 23:
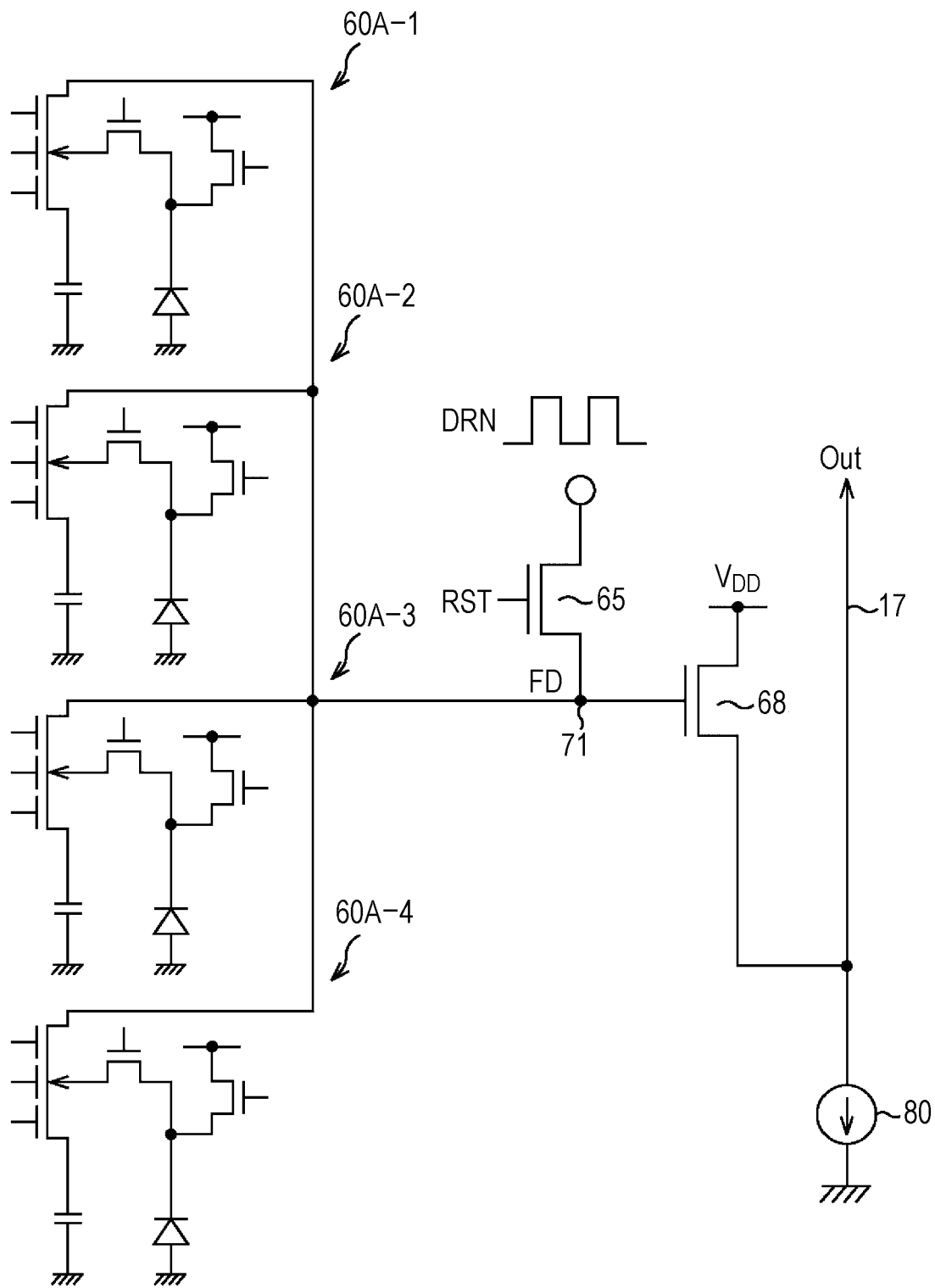
FIG. 23 is a circuit diagram depicting a circuit configuration according to Specific Example 2 of pixel sharing.

FIG. 23 is a circuit diagram depicting a circuit configuration according to Specific Example 2 of pixel sharing. Also here, cited as an example is a case of supplying a part of pixel constituent elements between the four pixels 60A-1 to 60A-4 that are adjacent to one another. However, the number of sharing pixels is not limited to four pixels. Moreover, as the relationship of the adjacent four pixels 60A-1 to 60A-4, the sharing may take place, for example, between four pixels including two pixels in the row direction and two pixels in the column direction, or between four pixels in the column direction.

In Specific Example 2, cited as an example is pixel sharing of a case of the pixel configuration of the unit pixel 60A2 according to Modification 2. The circuit elements after the FD section 71 including the reset gate section 65, in other words, two circuit elements of the reset gate section 65 and the amplifier transistor 68 are shared between the four pixels.

In this manner, the use of the technology of sharing circuit elements between a plurality of pixels makes it possible to promote the space saving of a unit pixel size in addition to obtaining the operation and effect similar to those of the unit pixel 60A. In addition, it is possible to secure a larger saturation charge amount due to the space saving. Conversely, if the equal saturation charge amount is acceptable, a reduction in the unit pixel size can be promoted by the amount of space saved.

Figure 24:
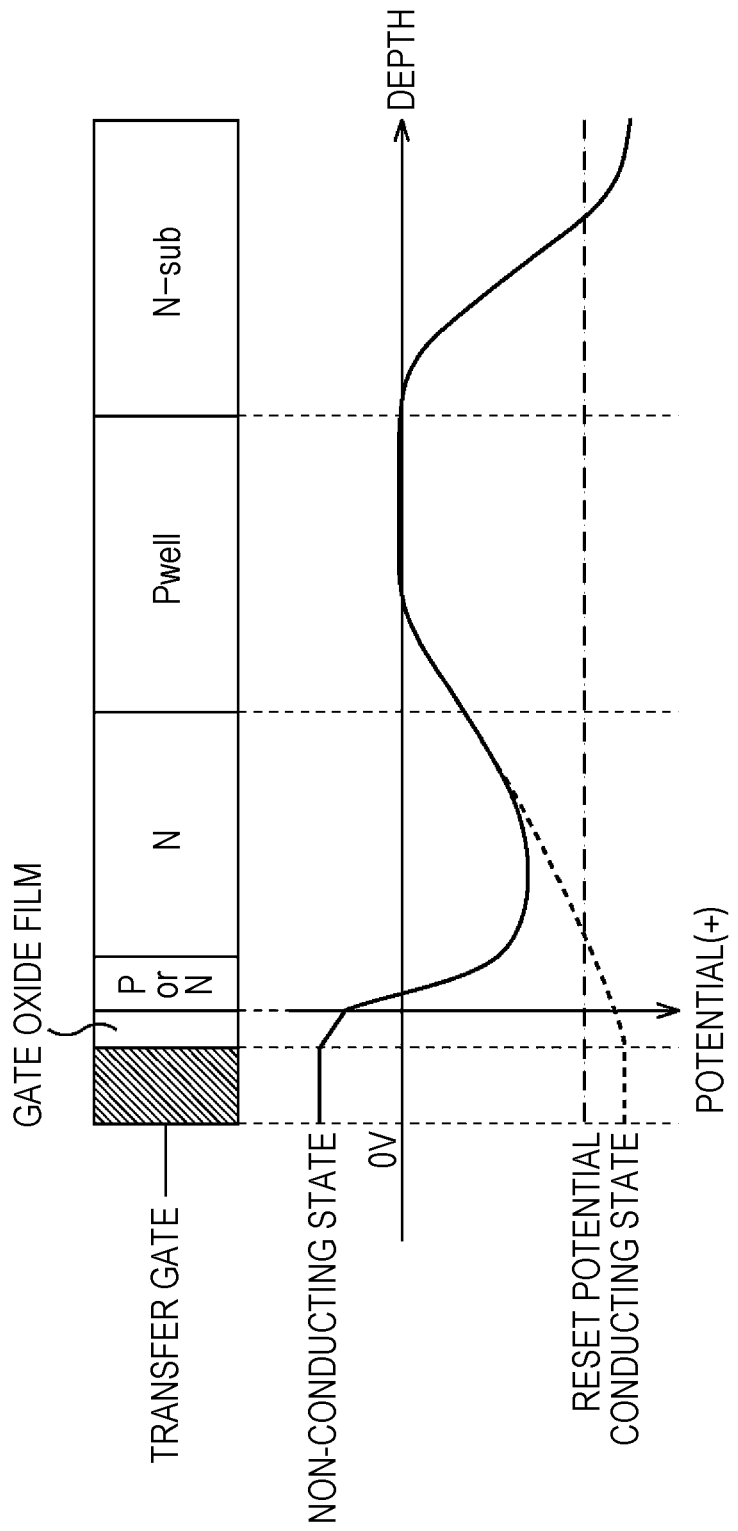
FIG. 24 is a potential diagram in a substrate depthwise direction, provided for a description of requirements for pinning a substrate surface and coupling the potentials of a FD section, a first charge accumulation section and the second charge accumulation section.

Here, a description will be given of the potentials of the first to third transfer gate sections 62 to 64, and the gate electrode 661 of the first charge accumulation section 66. FIG. 24 is a potential diagram in a substrate depthwise direction, provided for a description of requirements for pinning at the substrate surface and coupling the potentials of the FD section 71, the first charge accumulation section 66 and the second charge accumulation section 67.

The potentials of the gate electrodes in the non-conducting state of the first to third transfer gate sections 62 to 64 and the gate electrode 661 of the first charge accumulation section 66 are set to a potential to bring the substrate surface to a pinned state (for example, a negative potential) regardless of the conductive layer immediately below the gate oxide film. The substrate surface is brought to a pinned state in this manner, and it is possible to obtain an improved effect of properties in the dark such as dark current or white spots.

The potential of the substrate surface in the conducting state of the second and third transfer gate sections 63 and 64 and the gate electrode 661 of the first charge accumulation section 66 is set in a manner of being a higher potential than the reset voltage $V_{DR}$, in other words, a potential applied to the drain of the reset gate section 65. This makes it possible to couple the potentials of the FD section 71, the first charge accumulation section 66 and the second charge accumulation section 67.

4. Description of Noise Removal Processing and Computation Processing

The first reset level N1, the first signal level S1, the second signal level S2, and the second reset level N2 are output in this order to the vertical signal line 17 from the unit pixel 60A and the unit pixels according to the modifications thereof, which are described above. In the signal processing units in the subsequent stages, for example, the column processing unit 13 and the signal processing unit 18, which are shown in FIGS. 1 to 3, specified noise removal processing and signal processing are performed on the first reset level N1, the first signal level S1, the second signal level S2 and the second reset level N2. A description will hereinafter be given of noise removal processing in the column processing unit 13 and computation processing in the signal processing unit 18, the units being in the subsequent stages.

Firstly, a description will be given of a process in a CDS circuit embedded in the column processing unit 13 as noise removal means, for example. A CDS circuit having a known circuit configuration can be used, and a circuit configuration thereof does not matter.

Figure 25:
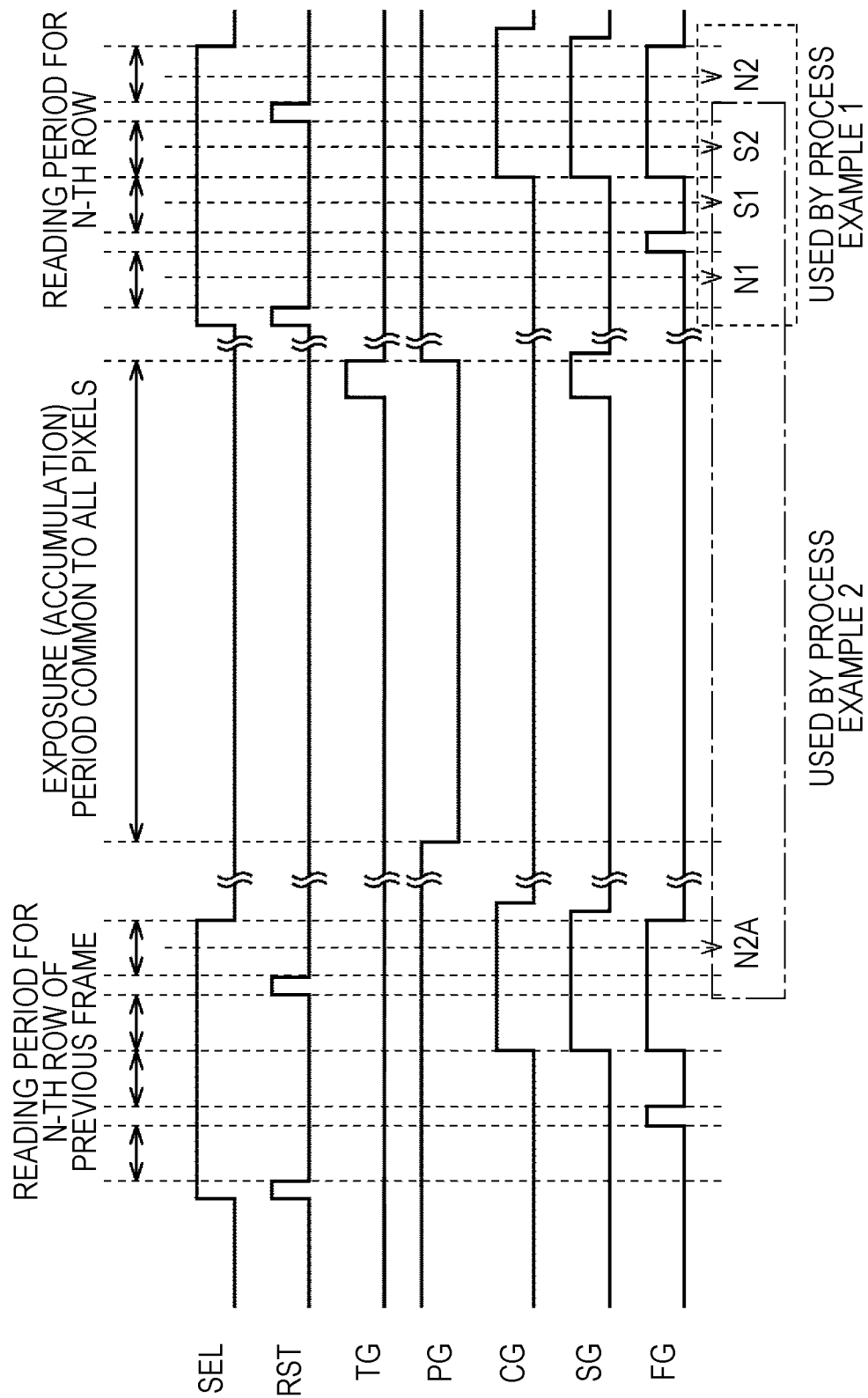
FIG. 25 is a timing chart provided for descriptions of signal processing in cases of Process Example 1 and Process Example 2 in a signal processing unit.

FIG. 25 depicts a timing chart provided for descriptions of the noise removal processing in the column processing unit 13 of the cases of Process Example 1 and Process Example 2.

Process Example 1

Firstly, a difference between the voltage signal S1 based on the photocharges transferred to the FD section 71 upon reading out a signal and the voltage signal N1 based on the reset level before the photocharges are transferred to the FD section 71 is taken. Furthermore, a difference between the voltage signal S2 based on the photocharges accumulated in the FD section 71, the first charge accumulation section 66 and the second charge accumulation section 67 and the voltage signal N2 based on the reset level after the FD section 71, the first charge accumulation section 66 and the second charge accumulation section 67 are reset is taken. Assuming that the first difference is SN1, and the second difference is SN2, then SN1=S1−N1 and SN2=S2−N2.

In this manner, in Process Example 1, the CDS processing that removes reset noise and fixed pattern noise that is unique to a pixel, such as variation in the threshold value of an amplifier transistor in a pixel, is performed on the signals S1 and N1 output first. The CDS processing that removes fixed pattern noise that is unique to a pixel, such as variation in the threshold value of an amplifier transistor in the pixel, but does not remove reset noise is performed on the signals S2 and N2 output later. However, it is computation processing that does not require the use of a frame memory; accordingly, there is an advantage to promote the simplification of a circuit configuration and cost reduction.

Process Example 2

In Process Example 2, storage means, for example, a frame memory is required to use the information of the previous frame. Therefore, the computation processing of Process Example 2 is performed, for example, by using the data storage unit 19 as storage means in the signal processing unit 18 or using a frame memory in an external DSP circuit.

Specifically, a difference between the voltage signal S1 based on the photocharges transferred to the FD section 71 upon reading out a signal and the voltage signal N1 based on the reset level before the photocharges are transferred to the FD section 71 is taken first. Next, a difference between the voltage signal S2 based on the photocharges accumulated in the FD section 71, the first charge accumulation section 66 and the second charge accumulation section 67 and a voltage signal N2A of the previous frame is taken. The voltage signal N2A is a signal based on the reset level after the photocharges accumulated in the FD section 71, the first charge accumulation section 66 and the second charge accumulation section 67 for the previous frame are reset. Assuming that the first difference is SN1 and the second difference is SN2, then SN1=S1−N1 and SN2=S2−N2A.

In this manner, in Process Example 2, the CDS processing that removes reset noise and fixed pattern noise that is unique to a pixel, such as variation in the threshold value of an amplifier transistor in the pixel, is performed also on the signals S2 and N2 output later. In the case of Process Example 2, although storage means such as a frame memory is required, there is an advantage that it is possible to significantly suppress reset noise compared with Process Example 1.

Process Example 3

Next, a description will be given of computation processing in the signal processing unit 18. Firstly, if the first difference falls within a specified range, the rate of the first difference to the second difference is calculated as a gain for each pixel, for each plurality of pixels, for each color, for each specific pixel in a shared pixel unit or uniformly for all the pixels, to create a gain table. The product of the second difference and the gain table is calculated as a computed value of the second difference.

Here, assuming that the first difference is SN1, the second difference is SN2, a gain is G, and the computed value of the second difference SN2 is SN2', it is possible to obtain the gain G and the computed value SN2' of the second difference SN2 based on the following expressions (6) and (7):

$$G = SN1/SN2 \quad\quad\quad (6)$$
$$= (Cfd + Cgs + Ccap)/Cfd$$
$$SN2' = G \times SN2 \quad\quad\quad (7)$$

where Cfd is the capacitance value of the FD section 71, Cgs is the capacitance value of the first charge accumulation section 66 and Ccap is the capacitance value of the second charge accumulation section 67, and the gain G is equivalent to the capacitance ratio.

Figure 26:
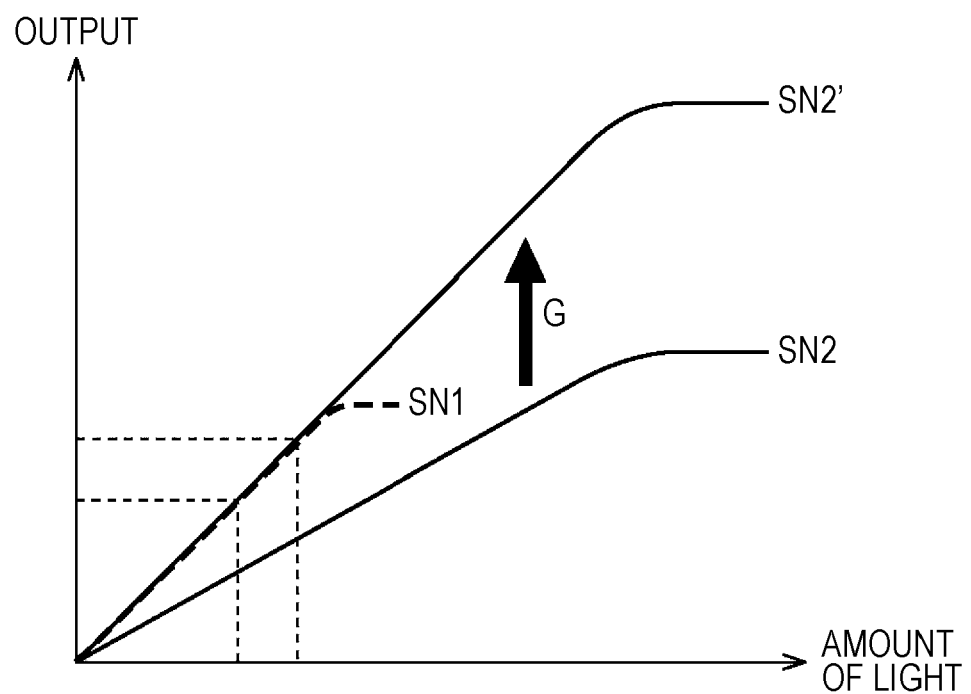
FIG. 26 is a (first) characteristic diagram of an incident light amount-output, provided for a description of signal processing in a case of Process Example 3.

FIG. 26 depicts the relationships of the first difference SN1, the second difference SN2 and the computed value SN2' of the second difference SN2 to an incident light amount.

Figure 27:
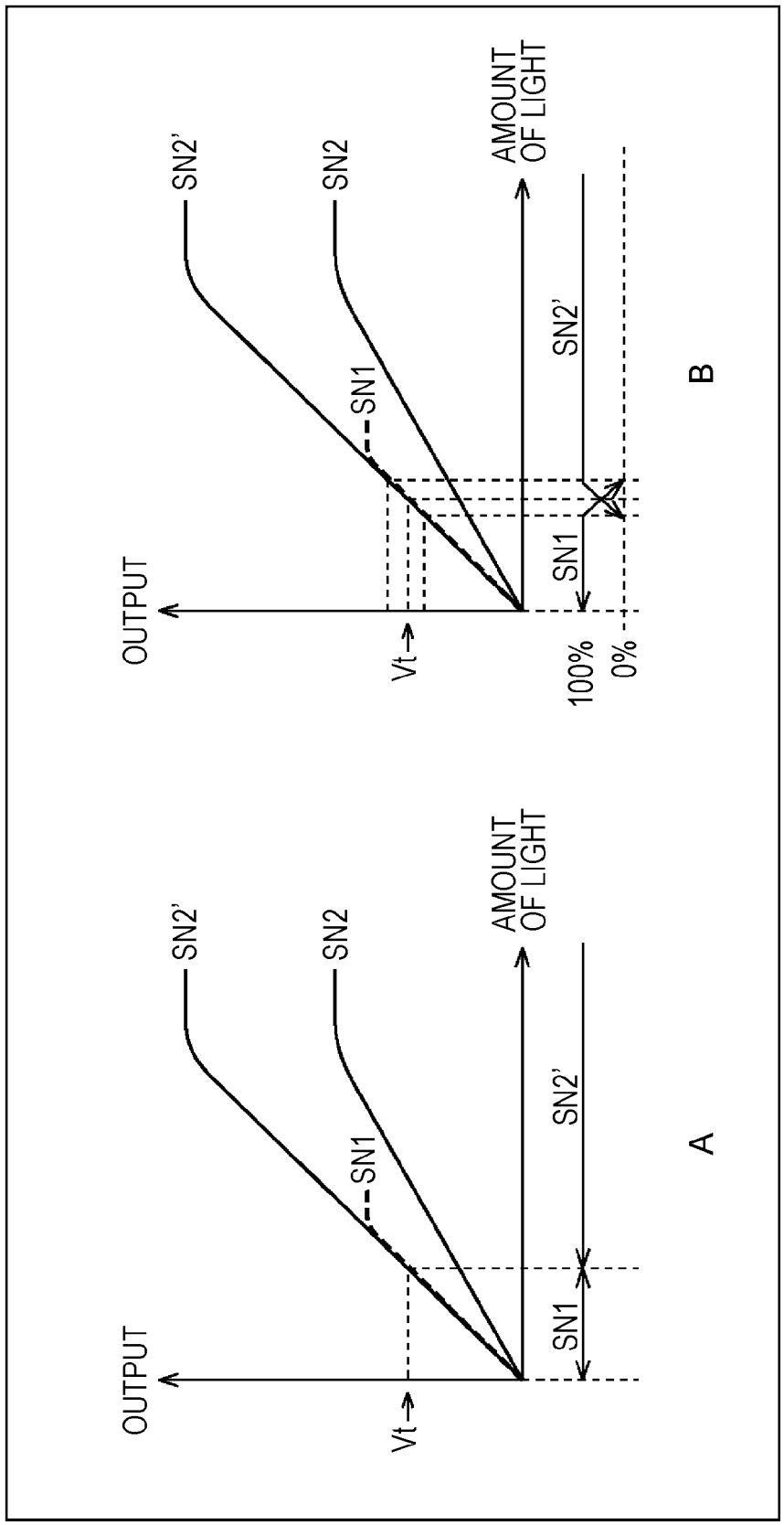
FIGS. 27A and 27B are (second) characteristic diagrams of an incident light amount-output, provided for a description of the case of Process Example 3.

Next, as shown in FIG. 27A, a preset specified threshold value Vt is used. The specified threshold value Vt is preset in an area where the first difference SN1 in the light response characteristic is before saturated and the light response characteristic is linear.

If the first difference SN1 does not exceed the specified threshold value Vt, the first difference SN1 is output as a pixel signal SN of a pixel targeted to be processed. In other words, if SN1<Vt, SN=SN1 (SN1 is substituted for SN). If the first difference SN1 exceeds the specified threshold value Vt, the computed value SN2' of the second difference SN2 is output as the pixel signal SN of a pixel targeted to be processed. In other words, if Vt≤SN1, SN=SN2' (SN2' is substituted for SN).

Process Example 4

In the following computation processing, as shown in FIG. 27B, the value of the first difference SN1 and the computed value SN2' of the second difference SN2 are combined in the preset ratio within a specified range in which the first difference SN1 falls, and are output as the pixel signal SN.

For example, as shown below, the combination ratio of the first difference SN1 and the computed value SN2' of the second difference SN2 is changed in stages in a range around the specified threshold value Vt set as a reference. As described above, the specified threshold value Vt is a preset value in the area where the first difference SN1 in the light response characteristic is before saturated and the light response characteristic is linear.

If SN1<SN1×0.90, SN=SN1.
If Vt×0.90≤SN1<Vt×0.94,
SN=0.9×SN1+0.1×SN2'.
If Vt×0.94≤SN1<Vt×0.98,
SN=0.7×SN1+0.3×SN2'.
If Vt×0.98≤SN1<Vt×1.02,
SN=0.5×SN1+0.5×SN2'.
If Vt×1.02≤SN1<Vt×1.06,
SN=0.3×SN1+0.7×SN2'.
If Vt×1.06≤SN1<Vt×1.10,
SN=0.1×SN1+0.9×SN2'.
If Vt×1.10≤SN1, SN=SN2'.

Such computation processing is performed to make it possible to switch from a signal in a low light condition to a signal in a high light condition more smoothly.

5. Reference

Figure 28:
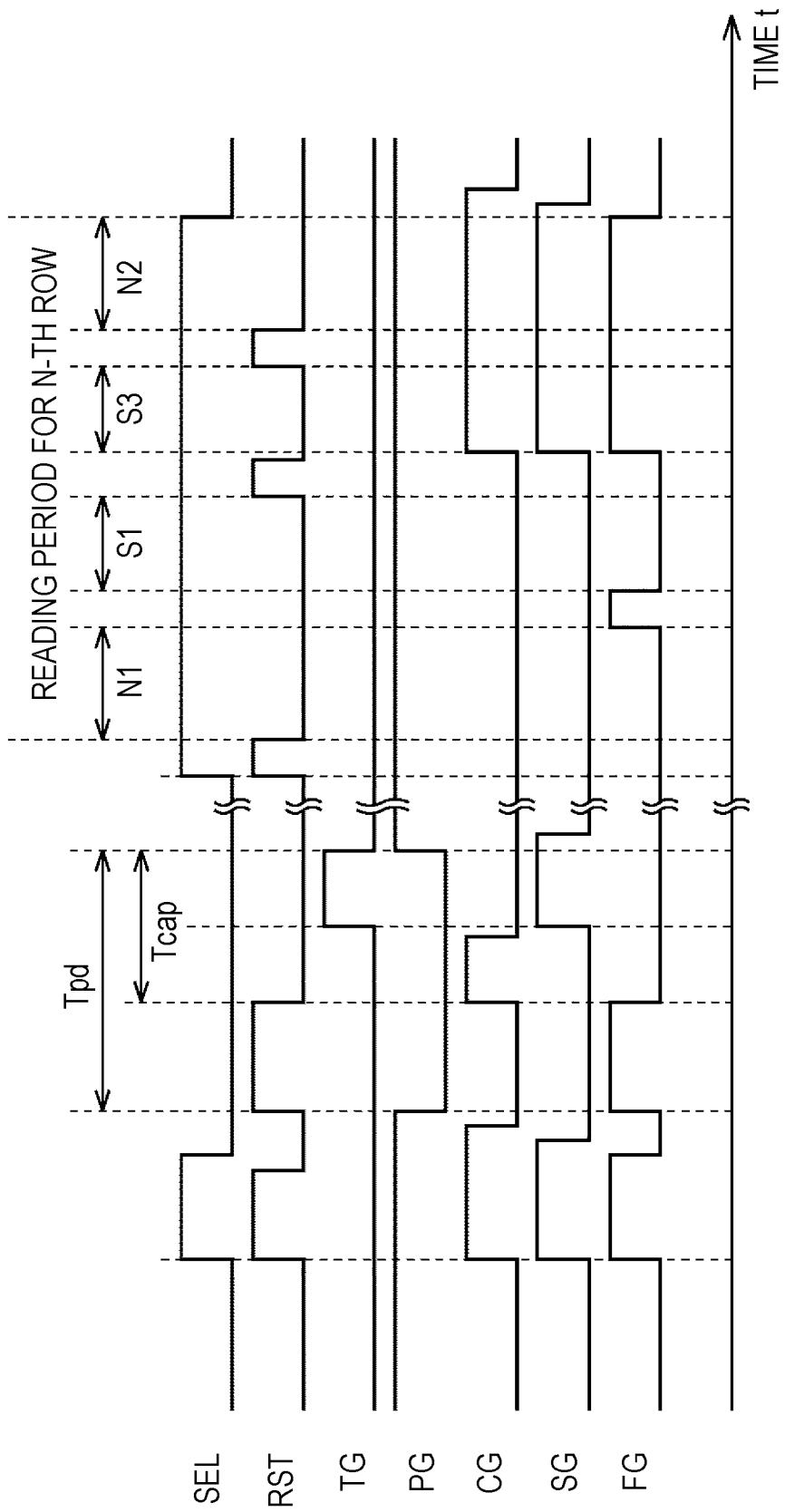
FIG. 28 is a timing chart provided for a description of a circuit operation of the unit pixel according to Modification.

The embodiment described above is mainly characterized in that two of the charge accumulation sections 66 and 67 are provided in a unit pixel, and the second charge accumulation section 67 is formed of a capacitor having a higher capacitance value per unit area than the first charge accumulation section 66. However, even if the capacitance values per unit area of two of the charge accumulation sections 66 and 67 are equal, it is possible to obtain an effect that enables the extension of the dynamic range. This will be described with reference to FIG. 28.

In the exposure period of the photodiode 61, the second transfer gate section 63 is brought into conduction during a period set in a specified ratio to the exposure period of the photodiode 61 and accordingly the photocharges equal to or more than the specified amount, which overflow from the photodiode 61, are to be drained.

Here, assume that the exposure period of the photodiode 61 is Tpd, and the period during which the photocharges overflowing from the photodiode 61 are accumulated in the second charge accumulation section 67 is Tcap. The unit pixel is operated in accordance with the timing chart shown in FIG. 28, and the exposure period Tcap of the second charge accumulation section 67 is restricted. The operation makes it possible to compress information on the high light side, and at least extend the dynamic range as in that the capacitance value of the second charge accumulation section 67 is substantially equal to that of the first charge accumulation section 66.

After a noise component and a signal component in a low light condition are read, the FD section 71 is once reset and the photocharges overflowing from the photodiode 61 and being accumulated in the second accumulation section 67 are read as a signal on a high light side. Differently from the other examples, since the FD section 71 is once reset, a signal on a high light side does not include the photocharges accumulated in the first charge accumulation section 66.

Assume that, upon reading out a signal, a voltage signal based on the photocharges transferred to the FD section 71 is S1, a voltage signal based on the reset level before the photocharges are transferred to the FD section 71 is N1, and the first difference is SN1. Moreover, assume that a voltage signal based on the photocharges accumulated in the FD section 71, the first charge accumulation section 66 and the second charge accumulation section 67 of when the FD section 71 is reset immediately before reading out is S3. Furthermore, assume that a voltage signal at the reset level or a level corresponding to resetting of the FD section 71, the first charge accumulation section 66 and the second charge accumulation section 67 is N2, the third difference is SN3, a gain is G, and the computed value of the third difference SN3 is SN3'. Accordingly, it is possible to compute as follows:

$$SN1 = S1 - N1$$
$$SN3 = S3 - N2$$
$$G = SN1/SN3$$
$$\phantom{G} = (Cfd + Csg + Ccap)/Cfd$$
$$SN3' = G \times SN3 \times Tpd/Tcap$$

Assuming that a specified threshold value that is preset in an area where the first difference SN1 in the light response characteristic is before saturated and the light response characteristic is linear is Vt, and the pixel signal of a pixel targeted to be processed is SN, then the pixel signal SN is output as follows:
If SN1<Vt, SN=SN1 (SN1 is substituted for SN).
If Vt≤SN1, SN=SN3' (SN3' is substituted for SN).

6. Modification 6-1. Example to Accumulate Photocharges Only in Photodiode 61

In the above example and modifications, the photocharges overflowing from the photodiode 61 in a high light condition are accumulated in the first charge accumulation section 66 via the overflow path of the first transfer gate section 62, and are further accumulated in the second charge accumulation section 67 via the overflow path of the third transfer gate section 64. In other words, the embodiment is characterized in that the photocharges overflowing from the photodiode 61 in a high light condition are accumulated in the photodiode 61 as well as are accumulated also in the first and second charge accumulation sections 66 and 67 in addition to the photodiode 61.

Figure 29:
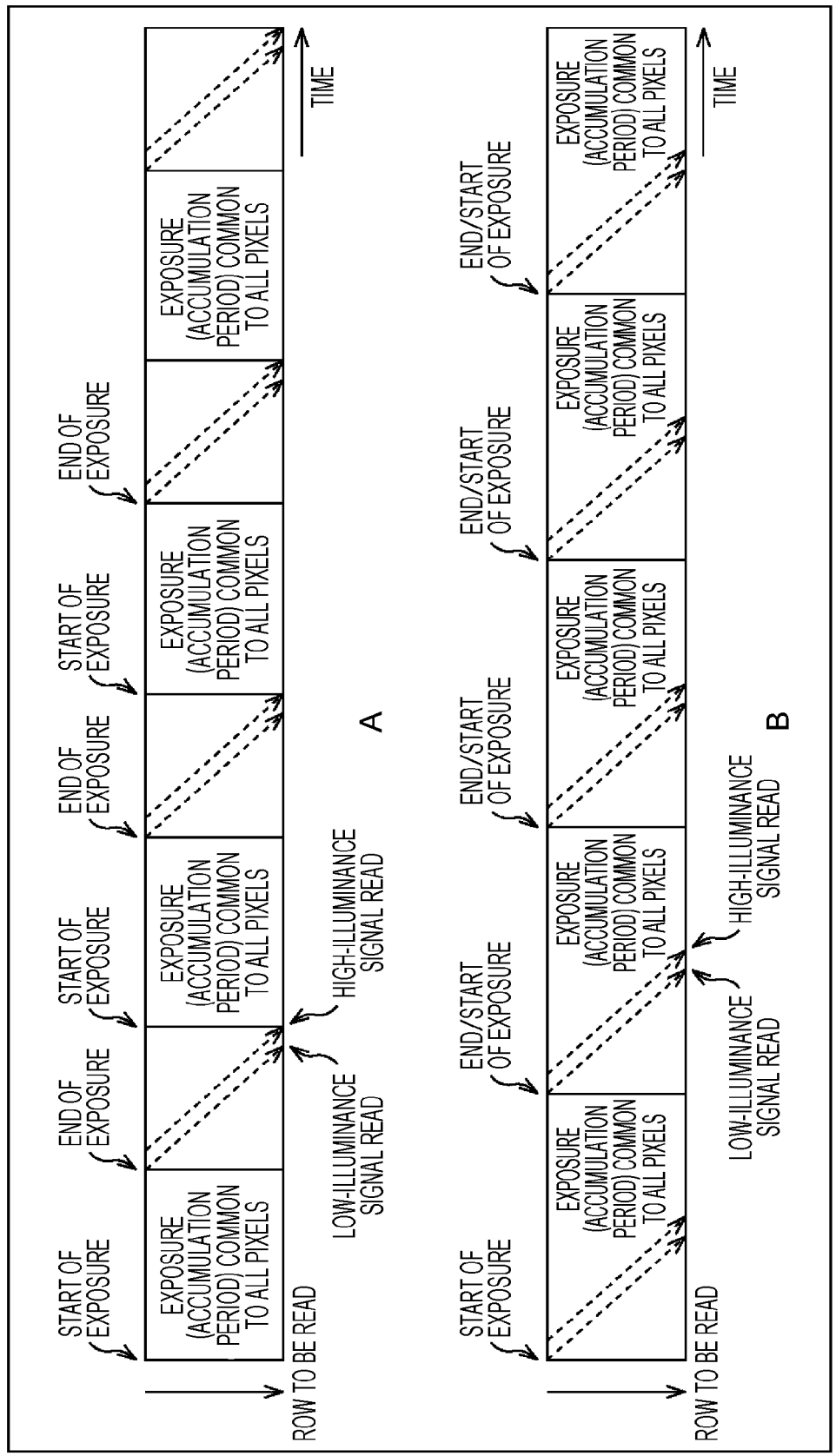
FIGS. 29A and 29B are operation explanatory views of the unit pixel according to Reference.

However, as is clear from the operation explanatory view of FIG. 29A, it is not possible to carry out the exposure during the read period of photocharges in the above-mentioned pixel structure. Hence, a pixel structure where photocharges are accumulated only in the photodiode 61 is proposed as a modification.

Also in this case, the essence of the present technology where photocharges after being read from the photodiode 61 are accumulated, selectively using the first charge accumulation section 66 and the second charge accumulation section 67 is unchanged. In other words, after photocharges are read from the photodiode 61, photocharges overflowing from the first charge accumulation section 66 are accumulated in the second charge accumulation section 67. In order to do so, an overflow path between the first charge accumulation section 66 and the second charge accumulation section 67 is naturally necessary.

In this manner, as shown in the operation explanatory view of FIG. 29B, the adoption of the pixel structure where photocharges are accumulated only in the photodiode 61 makes it possible to carry out the exposure during the read period of photocharges; accordingly, it is possible to realize seamless operation without a break in the exposure period upon imaging moving images. However, since photocharges are accumulated only in the photodiode 61, the dynamic range is restricted by the saturation charge amount of the photodiode 61. Accordingly, the significant extension of the dynamic range cannot be expected.

However, photocharges are accumulated, selectively using the first charge accumulation section 66 and the second charge accumulation section 67, which is the essence of the present technology, and therefore it is possible to reduce the total area of the charge accumulation sections that accumulate photocharges. Therefore, it is possible to expand the area of the photodiode 61 by a reduction in the total area; accordingly, it is possible to indirectly extend the dynamic range.

6-2. Example to Switch Circuit Operation Between at Short Time Exposure and at Long Time Exposure As described above, on the one hand the second charge accumulation section 67 is high in the area efficiency of a capacitor, but on the other hand a large amount of leakage current flows therefrom. Additionally, photocharges are accumulated in the second charge accumulation section 67 also during the exposure period; accordingly, the longer the exposure period is, the more the image quality is deteriorated by the leakage current.

Hence, for example, the circuit operation of a unit pixel may be switched between the cases where the exposure time is short and where long. Specifically, the above-mentioned circuit operation is performed at short time exposure. On the other hand, at long time exposure, for example, the accumulated photocharges may be regularly read during the exposure period to not accumulate the photocharges in the second charge accumulation section 67 but accumulate the photocharges only in the photodiode 61 and the first charge accumulation section 66.

(Configuration Example to Realize Circuit Operation at Long Time Exposure)

Figure 30:
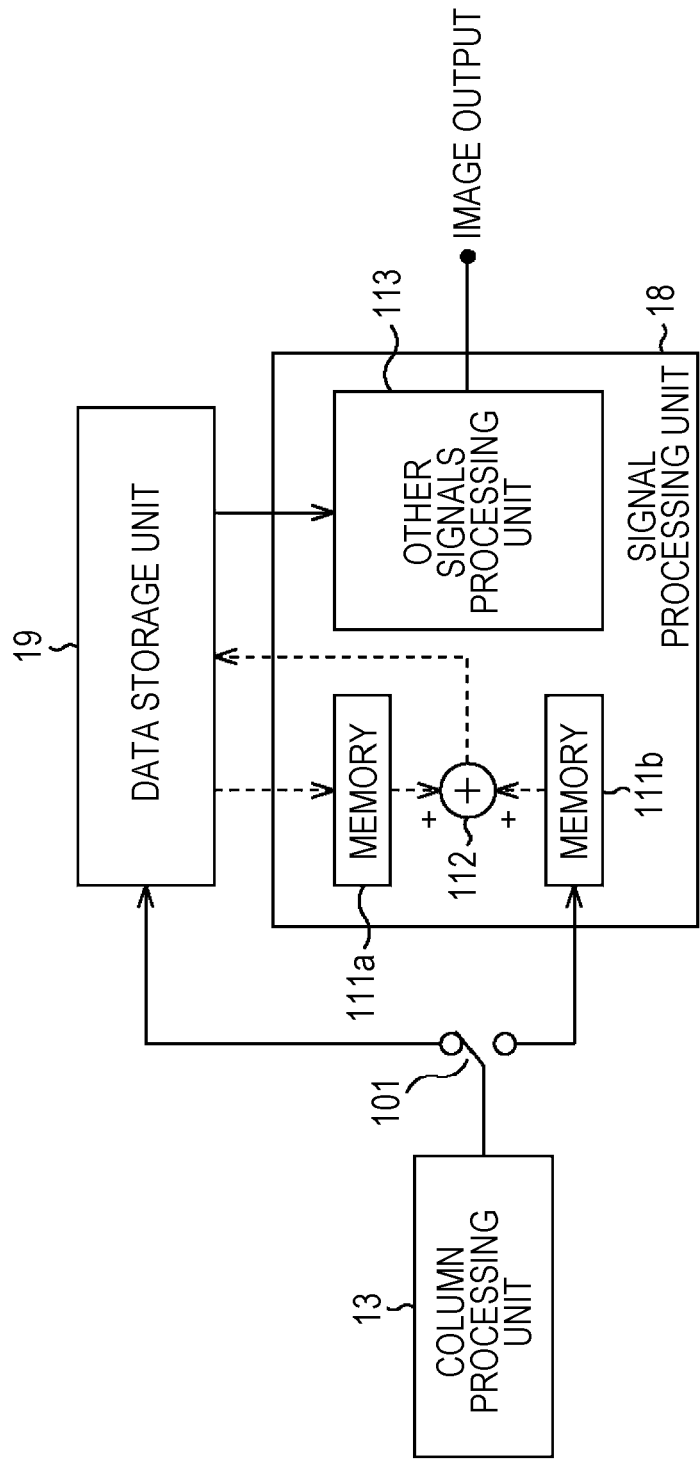
FIG. 30 depicts a configuration example of the periphery of a column processing unit, the signal processing unit and a data storage unit, for realizing a circuit operation at long time exposure.

FIG. 30 depicts a configuration example of the periphery of the column processing unit 13, the signal processing unit 18, and the data storage unit 19, for realizing the circuit operation at long time exposure.

A switch 101 is provided between the column processing unit 13, and the signal processing unit 18 and the data storage unit 19. The switching of the state of the switch 101 makes it possible to switch the destination to supply a pixel signal output from the column processing unit 13 to either of the signal processing unit 18 and the data storage unit 19.

Moreover, the signal processing unit 18 includes memories 111*a* and 111*b*, an addition unit 112, and an other signals processing unit 113.

The memory 111*a* stores a pixel signal supplied from the data storage unit 19, and the memory 111*b* stores a pixel signal supplied from the column processing unit 13 via the switch 101. The addition unit 112 adds the pixel signal stored in the memory 111*a* and the pixel signal stored in the memory 111*b*, and the added pixel signal is supplied to the data storage unit 19.

The memories 111*a* and 111*b* each have a capacitance that can hold a pixel signal equivalent to at least one pixel and, for example, their capacitances are set to a capacitance that can hold pixel signals equivalent to one line.

The other signals processing unit 113 performs the other various signal processing on the pixel signal stored in the data storage unit 19.

(Example of Circuit Operation of Unit Pixel 60A at Long Time Exposure)

Next, a description will be given of an example of the circuit operation of the unit pixel 60A at long time exposure with reference to timing charts of FIGS. 31 and 32 and potential diagrams of FIGS. 33 to 36.

Figure 31:
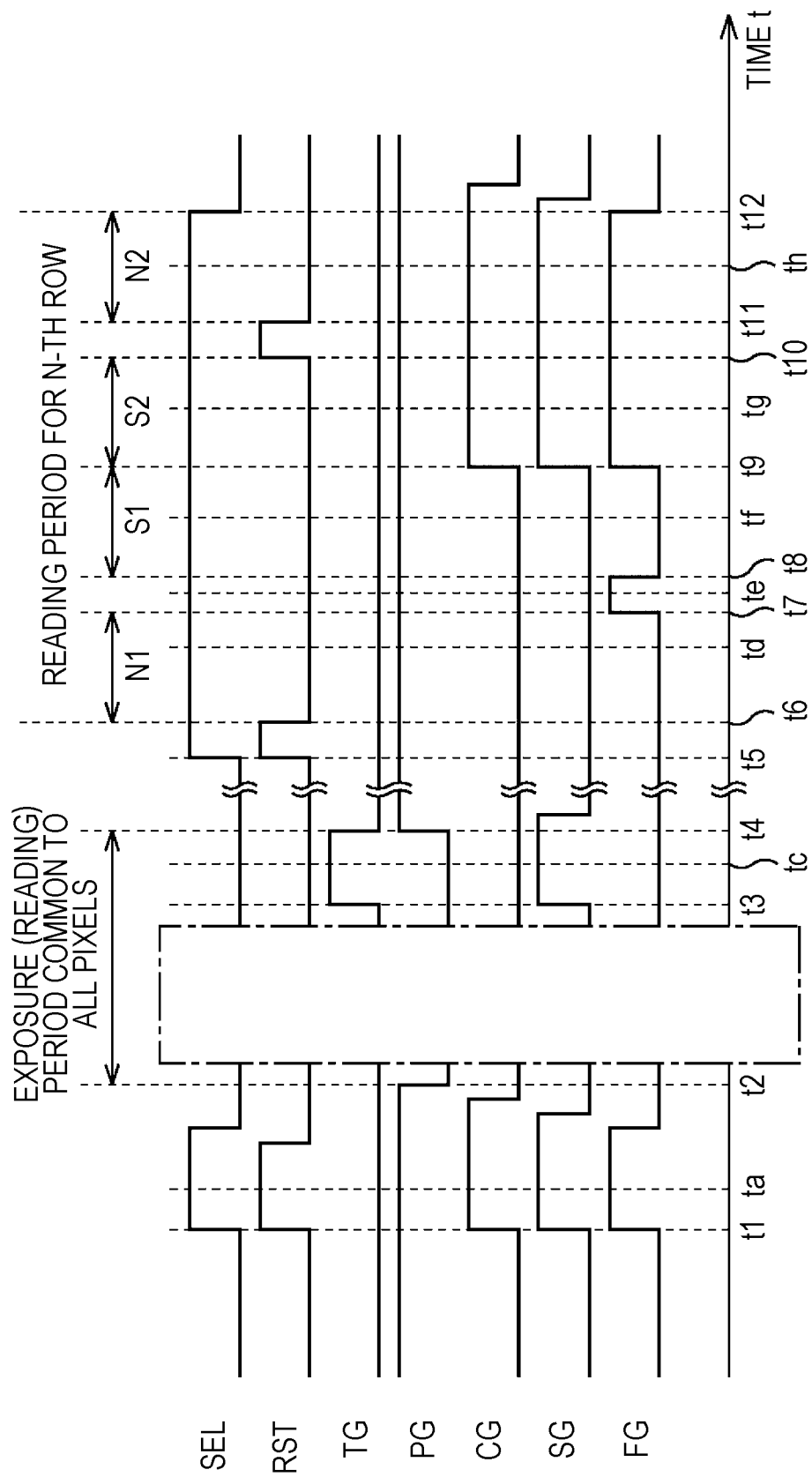
FIG. 31 is a (first) timing chart provided for a description of a circuit operation of the unit pixel at long time exposure.

FIG. 31 depicts the timing chart of the selection signal SEL, the reset signal RST, the transfer signal TG, the charge drain control signal PG, the transfer signal CG, the transfer signal SG, and the transfer signal FG of the unit pixel 60A at long time exposure. Moreover, FIG. 32 depicts a detailed timing chart of the period encircled by the box of the alternate long and short dash line of FIG. 31. Furthermore, FIGS. 33 to 36 depict the states of the potential of the unit pixel 60A in the N-th row at times Ta to $Td_1$ in FIG. 32, respectively.

Figure 32:
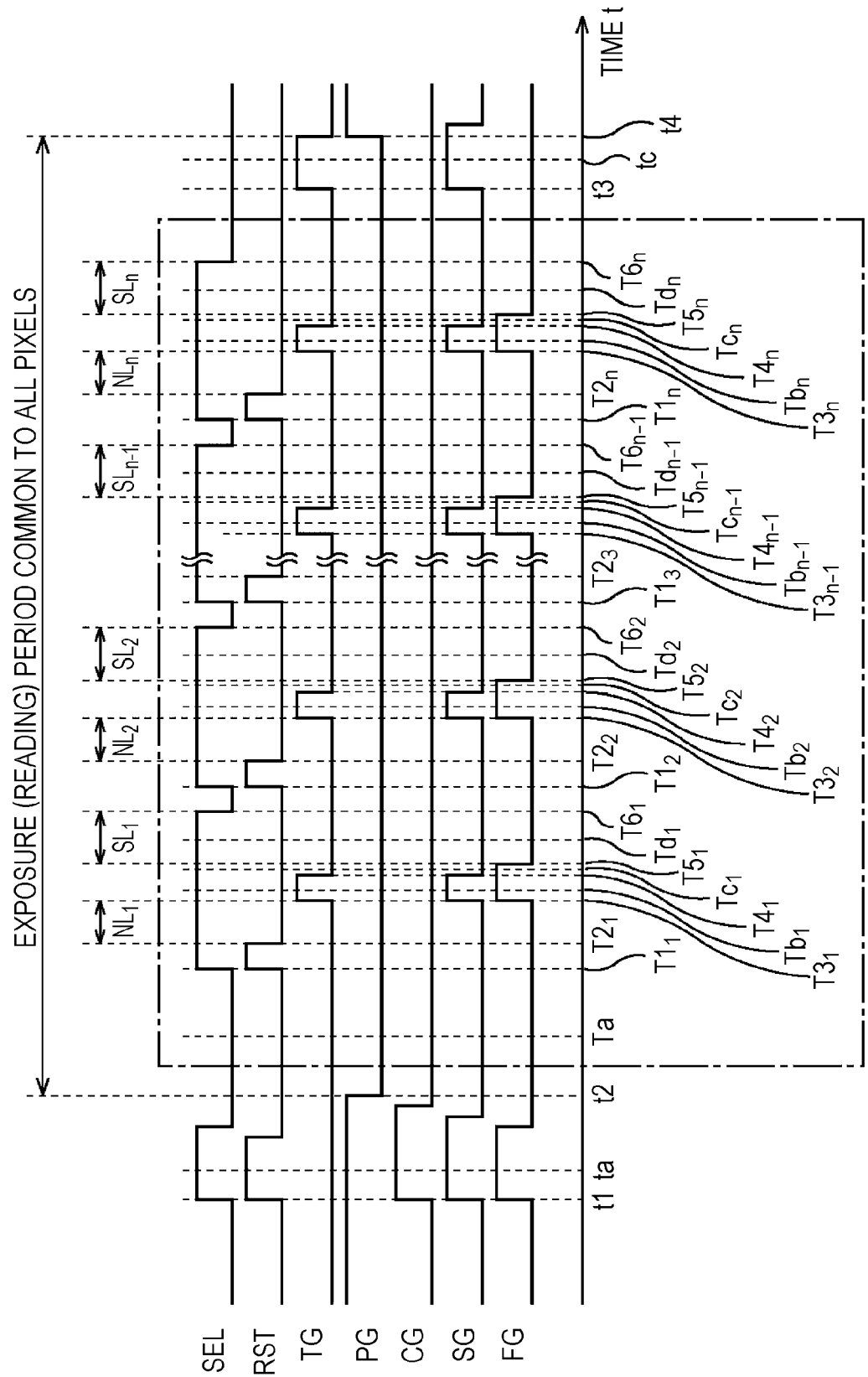
FIG. 32 is a (second) timing chart provided for a description of the circuit operation of the unit pixel at long time exposure.

The circuit operation during the period encircled by the box of the alternate long and short dash line in FIGS. 31 and 32, in other words, the period from time t2 to time t3 are different between at short time exposure and at long time exposure. A description will hereinafter be given of the circuit operation during this period.

Figure 33:
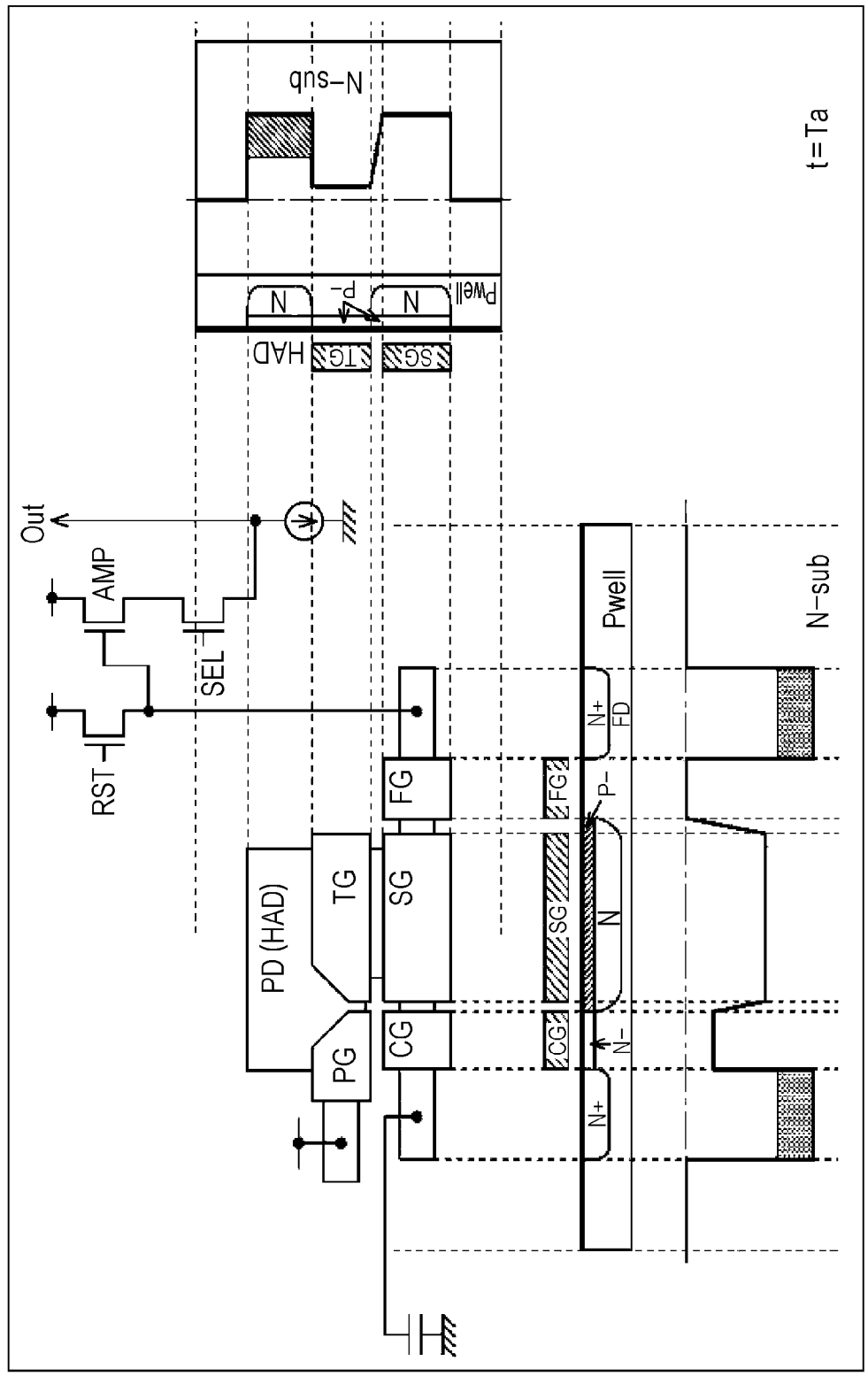
FIG. 33 is a (first) potential diagram provided for a description of the circuit operation of the unit pixel at long time exposure.

FIG. 33 depicts the state of the potential of the unit pixel 60A at time Ta between time t2 and time $T1_1$. In this manner, photocharges are accumulated in the photodiode 61. Moreover, if in a high light condition, photocharges overflowing from the photodiode 61 are accumulated in the first charge accumulation section 66 via the overflow path of the first transfer gate section 62. If in a low light condition, photocharges are accumulated only in the photodiode 61.

At time $T1_1$, the selection signal SEL in the N-th row becomes active, and the select transistor 69 in the N-th row establishes electrical continuity; accordingly, the unit pixel 60A in the N-th row is brought to a selected state. At the same time, the reset signal RST becomes active and the reset gate section 65 establishes electrical continuity and accordingly the FD section 71 is reset. At time $T2_1$, the reset signal RST then becomes non-active.

At a time between time $T2_1$ and time $T3_1$, the potential of the FD section 71 is output as a reset level NL1 to the vertical signal line 17 through the amplifier transistor 68 and the select transistor 69.

Next, at time $T3_1$, the transfer signal TG, the transfer signal SG and the transfer signal FG become active, and the first transfer gate section 62, the gate electrode 661 of the first charge accumulation section 66 and the second transfer gate section 63 establish electrical continuity.

Figure 34:
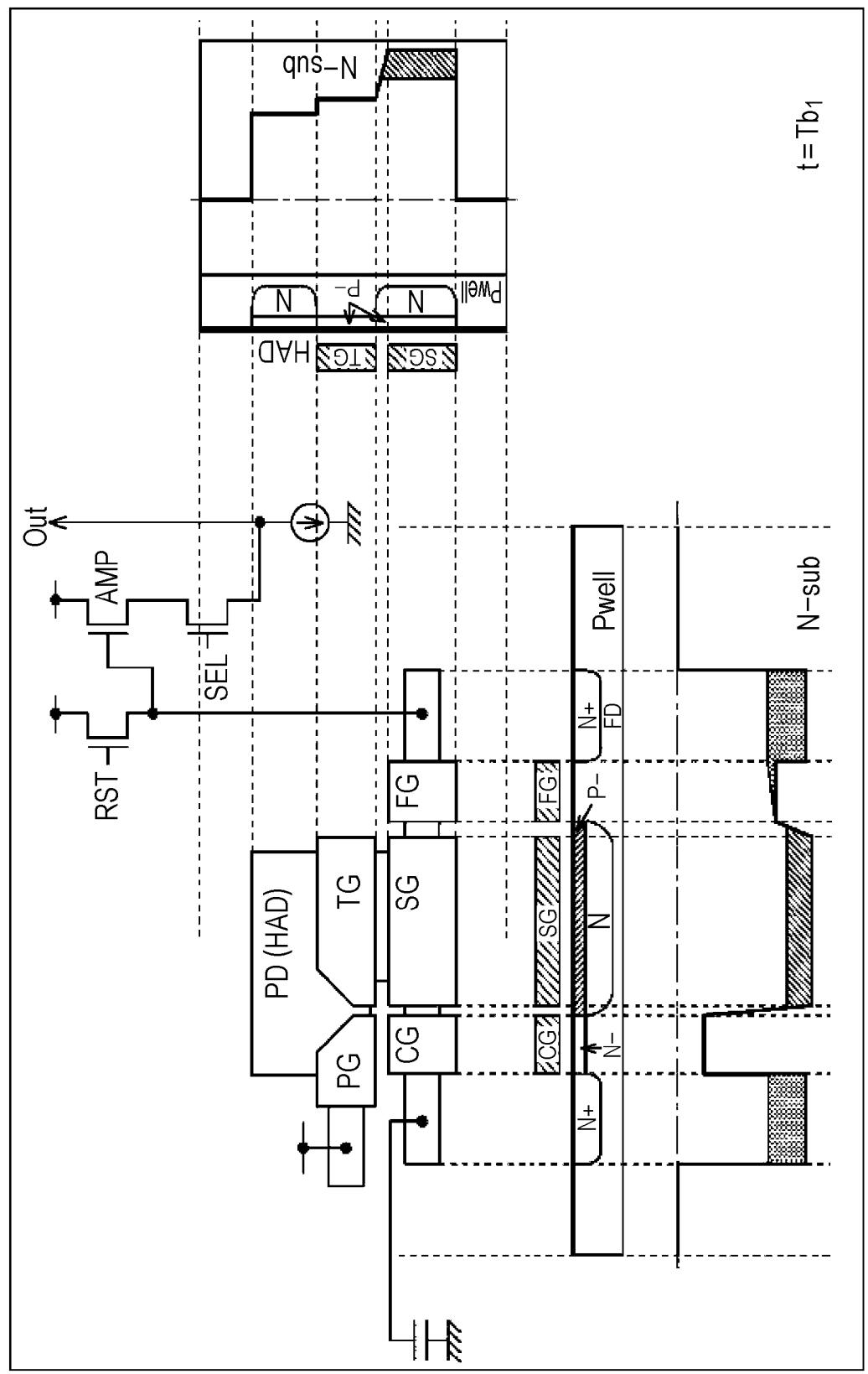
FIG. 34 is a (second) potential diagram provided for a description of the circuit operation of the unit pixel at long time exposure.

FIG. 34 is a view depicting the state of the potential of the unit pixel 60A at time $Tb_1$ between time $T3_1$ and time $T4_1$. In this manner, the potentials of the FD section 71 and the first charge accumulation section 66 are coupled and the photocharges accumulated in the photodiode 61 during a period from time t2 to time $T3_1$ are transferred to the coupled region. Moreover, the photocharges generated in the photodiode 61 between time $T3_1$ and time $T4_1$ are also transferred to the coupled region.

For a time from time t2 to time $T3_1$, the accumulated charge amount is set in a manner of not exceeding the total of the saturation charge amounts of the photodiode 61 and the first charge accumulation section 66. Therefore, during this period, photocharges may overflow from the photodiode 61 to be accumulated in the first charge accumulation section 66 via the overflow path of the first transfer gate section 62; however, photocharges do not further overflow from the first charge accumulation section 66 to be accumulated in the second charge accumulation section 67 via the overflow path of the third transfer gate section 64.

Next, at time $T4_1$, the transfer signal TG and the transfer signal SG become non-active, and the first transfer gate section 62 and the gate electrode 661 of the first charge accumulation section 66 break electrical continuity. The first transfer gate section 62 then breaks electrical continuity; accordingly, photocharges are resumed to be accumulated in the photodiode 61.

Figure 35:
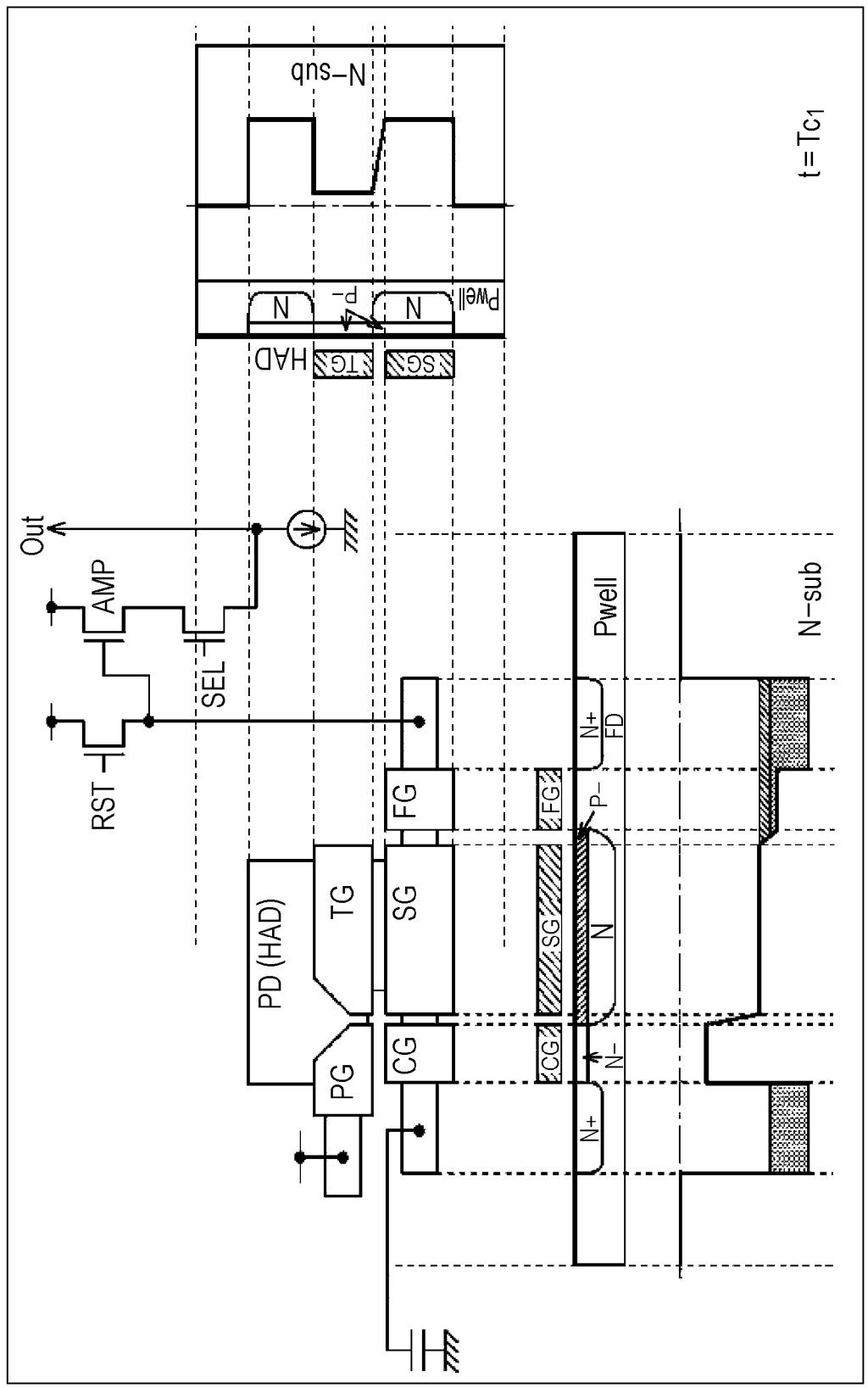
FIG. 35 is a (third) potential diagram provided for a description of the circuit operation of the unit pixel at long time exposure.

FIG. 35 is a view depicting the state of the potential of the unit pixel 60A at time $Tc_1$ between time $T4_1$ and time $T5_1$. In this manner, all the photocharges transferred from the photodiode 61 to the area where the potentials of the FD section 71 and the first charge accumulation section 66 are coupled are transferred to the FD section 71.

Next, at time $T5_1$, the transfer signal FG becomes non-active, and the second transfer gate section 63 breaks electrical continuity.

Figure 36:
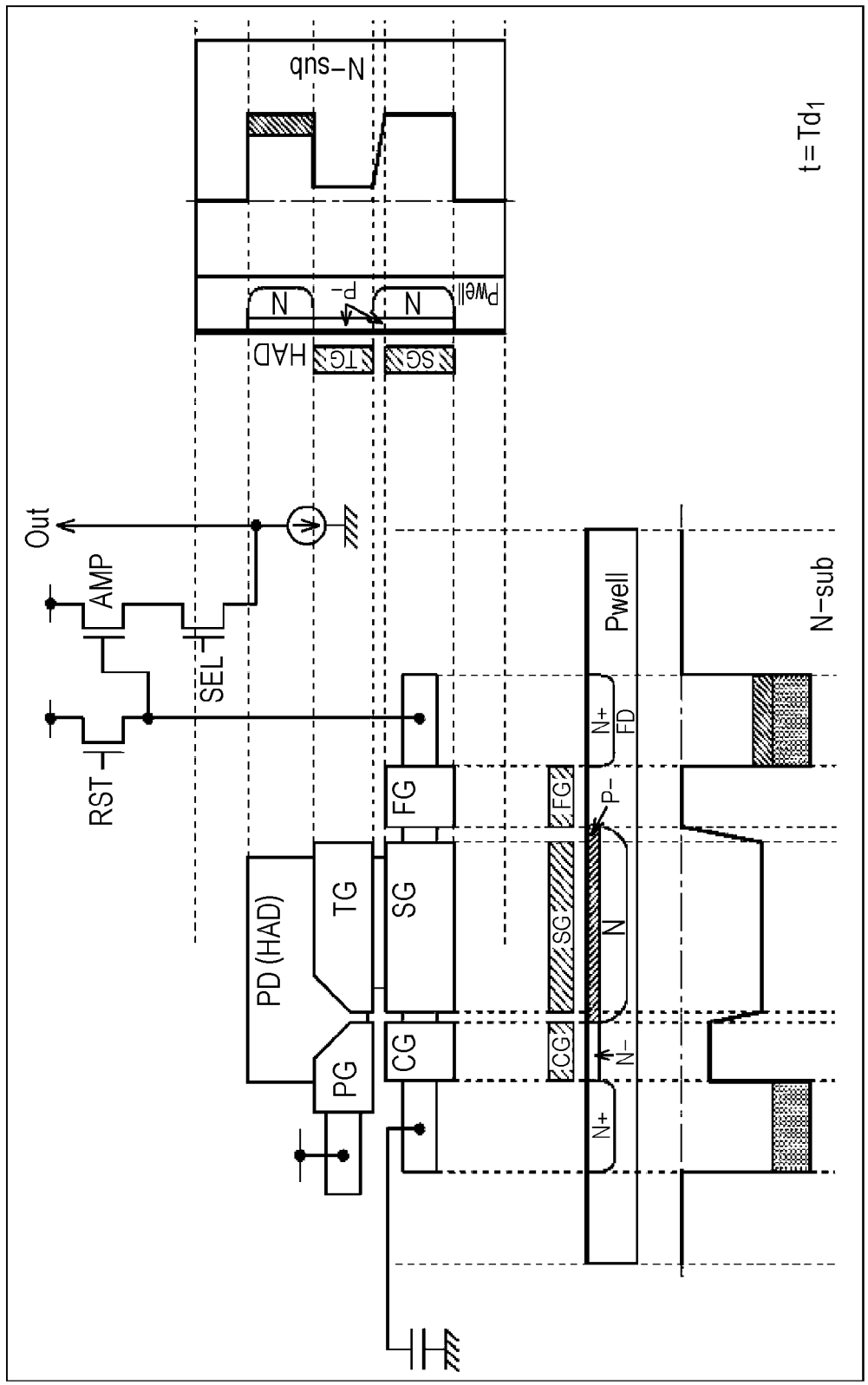
FIG. 36 is a (fourth) potential diagram provided for a description of the circuit operation of the unit pixel at long time exposure.

FIG. 36 is a view depicting the state of the potential of the unit pixel 60A at time $Td_1$ between time $T5_1$ and time $T6_1$. The potential of the FD section 71 in this state is output to the vertical signal line 17 through the amplifier transistor 68 and the select transistor 69 as a signal level SL1 in accordance with the accumulated charge amounts of the photodiode 61 and the first charge accumulation section 66 for a period from time t2 to time $T4_1$.

The column processing unit 13 takes a difference between the signal level SL1 and the signal level NL1. The difference value SNL1 (=SL1−NL1) is then supplied by the column processing unit 13 to the data storage unit 19 via the switch 101 to be held therein.

Next, at time $T6_1$, the selection signal SEL becomes non-active, and the select transistor 69 in the N-th row breaks electrical continuity; accordingly, the unit pixel 60A in the N-th row is brought to a non-selected state.

These processes are performed row by row, and as a result, image data made from the difference value SNL1 of each pixel is held in the data storage unit 19.

Next, at times $T1_2$ to $T6_2$, operations similar to those at times $T1_1$ to $T6_1$ are performed, and a reset level NL2 and a signal level SL2 are output in this order to the vertical signal line 17 through the amplifier transistor 68 and the select transistor 69.

For a time from time $T4_1$ to time $T3_2$, during which photocharges are accumulated in the photodiode 61, the accumulated charge amount is set in a manner of not exceeding the total of the saturation charge amounts of the photodiode 61 and the first charge accumulation section 66, similarly to the time from time t2 to time $T3_1$.

The column processing unit 13 takes a difference between the signal level SL2 and the signal level NL2. The difference value SNL2 (=SL2−NL2) is then supplied by the column processing unit 13 to the memory 111b via the switch 101 to be held therein.

On the other hand, the difference value SNL1 of a corresponding unit pixel 60A is supplied by the data storage unit 19 to the memory 111a to be held therein. The addition unit 112 adds the difference value SNL1 held in the memory 111a and the difference value SNL2 held in the memory 111b the memory 111b, and causes the data storage unit 19 to hold an integrated value SNLa.

These processes are performed row by row, and as a result, image data made from the integrated value SNLa of each pixel is held in the data storage unit 19.

Next, at times $T1_3$ to $T6_3$, operations similar to those at times $T1_1$ to $T6_1$ are performed, and a reset level NL3 and a signal level SL3 are output in this order to the vertical signal line 17 through the amplifier transistor 68 and the select transistor 69.

For a time from $T4_2$ to time $T3_3$ during which photocharges are accumulated in the photodiode 61, the accumulated charge amount is set in a manner of not exceeding the total of the saturation charge amounts of the photodiode 61 and the first charge accumulation section 66, similarly to the time from time t2 to time $T3_1$.

The column processing unit 13 takes a difference between the signal level SL3 and the signal level NL3. A difference value SNL3 (=SL3−NL3) is then supplied by the column processing unit 13 to the memory 111b via the switch 101 to be held therein.

On the other hand, the integrated value SNLa of a corresponding unit pixel 60A is supplied by the data storage unit 19 to the memory 111a to be held therein. The addition unit 112 adds the integrated value SNLa held in the memory 111a and the difference value SNL3 held in the memory 111b, and causes the data storage unit 19 to hold the integrated value SNLa.

These processes are performed row by row, and as a result, image data made from the integrated value SNLa of each pixel is held in the data storage unit 19.

Subsequently, similar processes are performed at times $T1_4$ to T6n. In other words, intermediate read to output the amount of photocharges accumulated in the unit pixel 60A as an electric signal (pixel signal) is performed n times at intervals of time when the accumulated charge amount does not exceed the total of the saturation charge amounts of the photodiode 61 and the first charge accumulation section 66 during the exposure period for all the pixels while maintaining the exposure, and the integrated value SNLa in accordance with the accumulated charge amount of each pixel is obtained.

Furthermore, at times t3 to t12, processes similar to those at short time exposure are performed. As a result, the reset level N1, the first signal level S1, the second signal level S2, and the reset level N2 are output in this order to the vertical signal line 17 through the amplifier transistor 68 and the select transistor 69.

A pixel signal of each pixel is then generated based on the integrated value SNLa held in the data storage unit 19, and the signal levels S1 and S2, and the reset levels N1 and N2.

(Modification of Circuit Operation of Unit Pixel 60A at Long Time Exposure)

Figure 37:
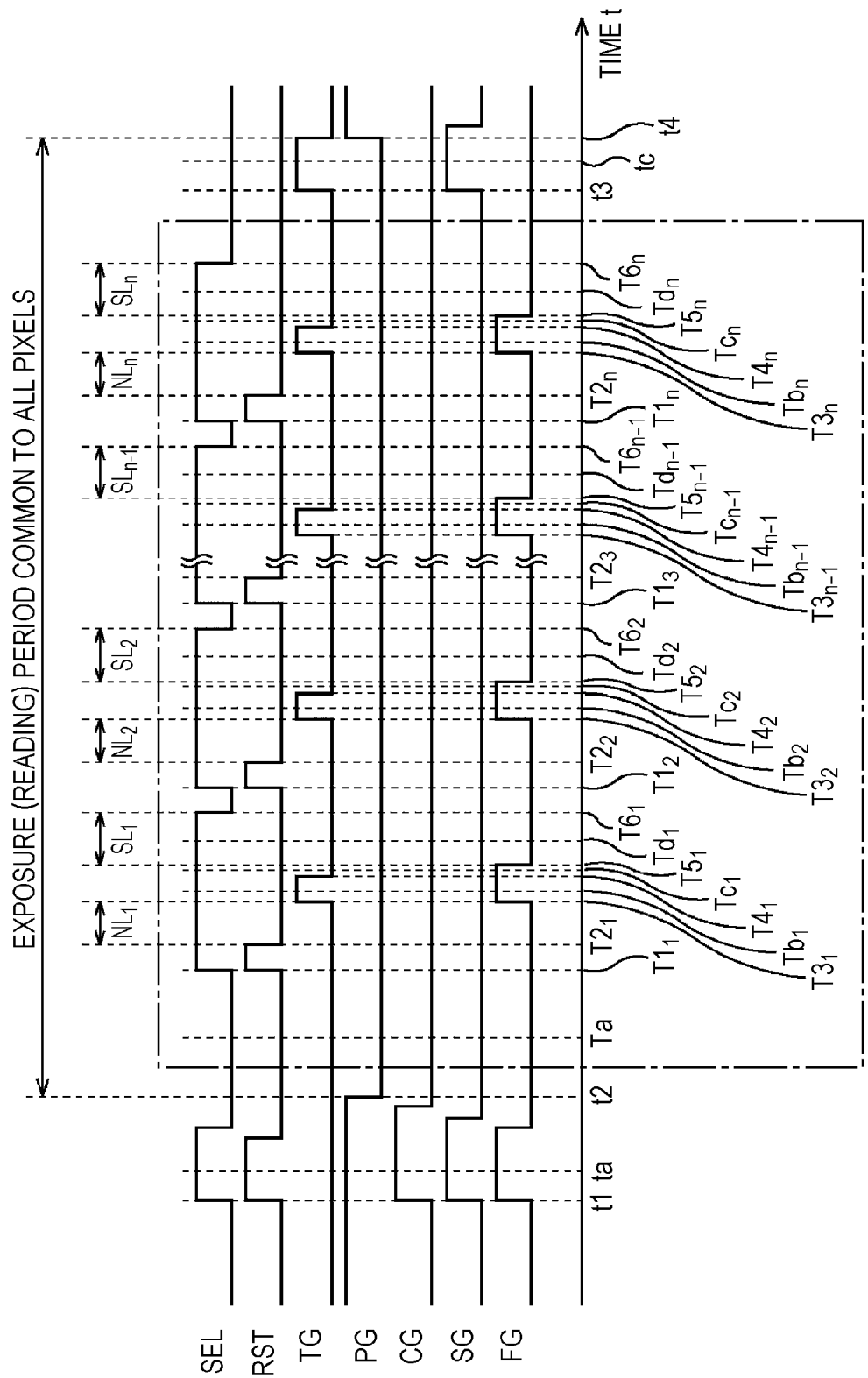
FIG. 37 is a modification of the timing chart provided for a description of the circuit operation of the unit pixel at long time exposure.

FIG. 37 depicts a modification of the detailed timing chart of the period encircled by the box of the alternate long and short dash line of FIG. 31.

The timing chart of FIG. 37 is different from the above-mentioned timing chart of FIG. 32 in the respect that the transfer signal SG does not become active and stays non-active during the period from time t2 to t3. In other words, when the photocharges accumulated in the photodiode 61 are transferred to the FD section 71 via the first charge accumulation section 66, the gate electrode 661 of the first charge accumulation section 66 stays in a non-conducting state.

If the potential of the photodiode 61 at the time of depletion is sufficiently shallower than the potential of the first charge accumulation section 66 at the time of depletion, such an operation can be performed.

(Example of Circuit Configuration of Unit Pixel 60A2 at Long Time Exposure)

Figure 38:
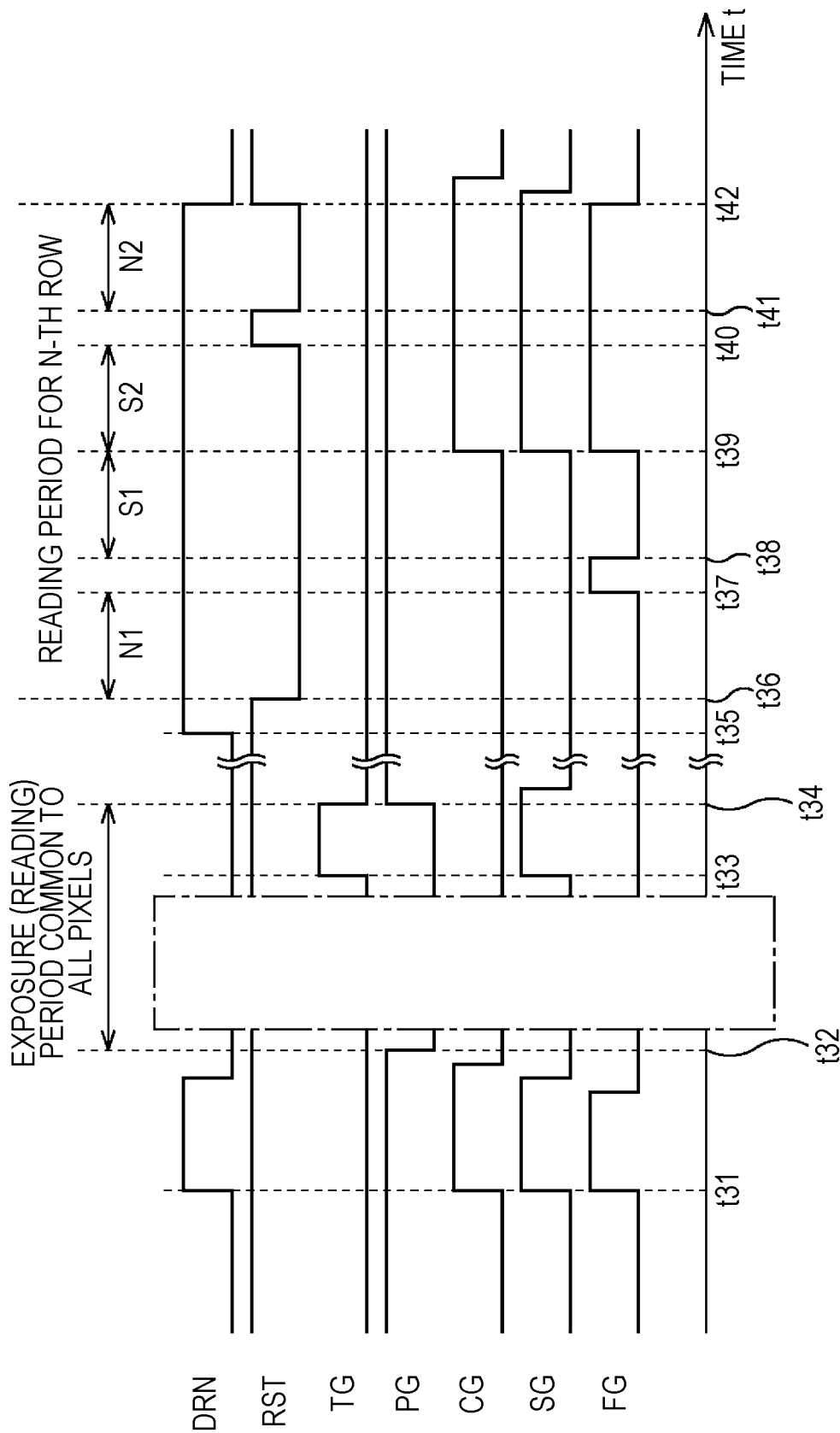
FIG. 38 is a (first) timing chart provided for a description of a circuit operation of Modification 2 of a unit pixel at long time exposure.
Figure 39:
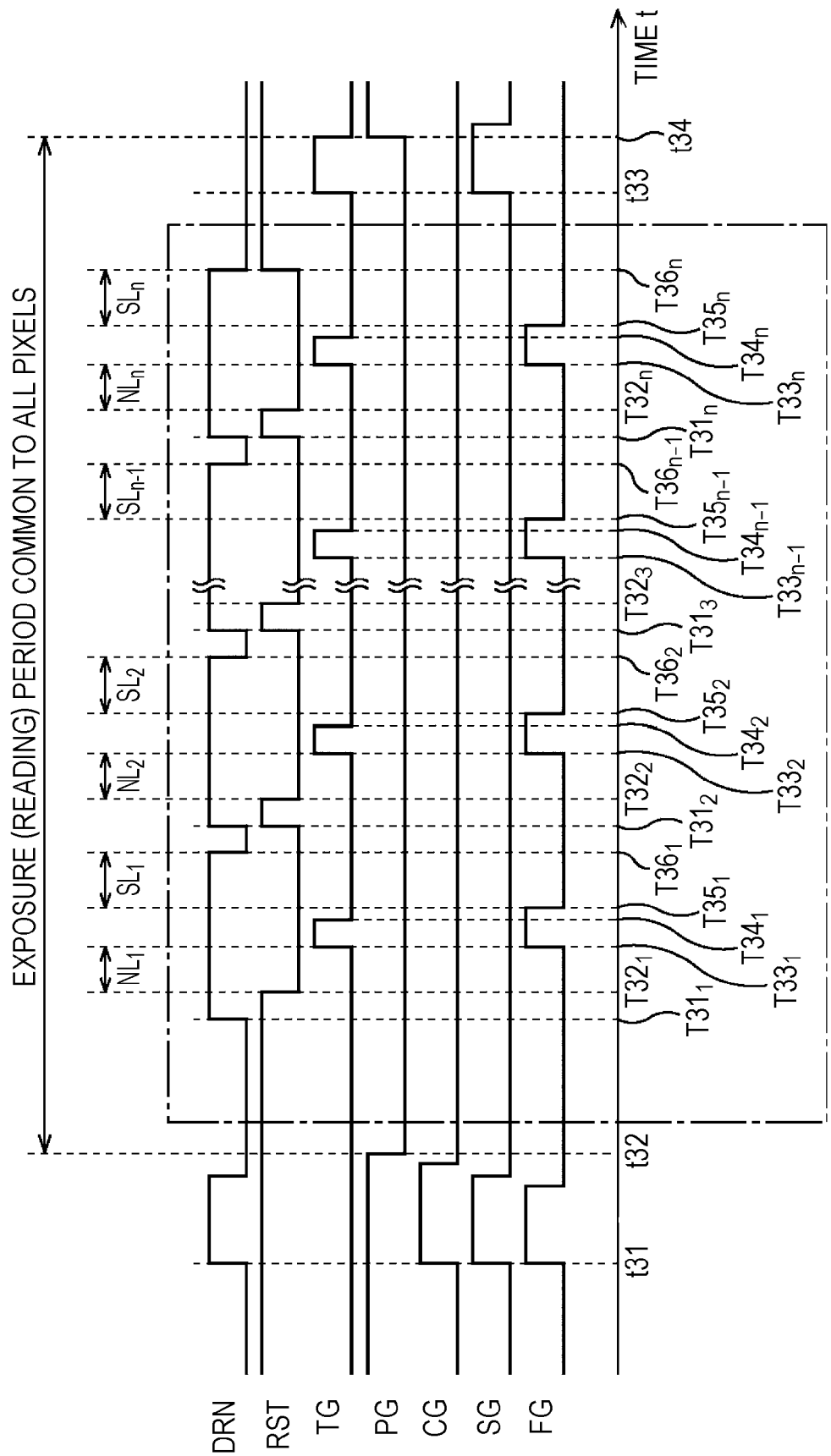
FIG. 39 is a (second) timing chart provided for a description of the circuit operation of Modification 2 of the unit pixel at long time exposure.

FIGS. 38 and 39 are timing charts depicting the circuit operation, at long time exposure, of the unit pixel 60A2 (FIG. 20) according to Modification 2 of the unit pixel 60A. FIG. 39 depicts a detailed timing chart of the period encircled by the box of the alternated long and short dash line of FIG. 38.

The timing chart FIG. 39 is different from the timing chart of FIG. 32 in the respect that the transfer signal SG does not become active and stays non-active during the exposure period common to all the pixels, similarly to the timing chart of FIG. 37.

(Timing to Switch Between Circuit Operation at Short Time Exposure and Circuit Operation at Long Time Exposure)

Here, the timing to switch between the circuit operation at short time exposure and the circuit operation at long time exposure will be discussed.

In order to prevent the dynamic range from decreasing due to the circuit operation at long time exposure, it is necessary to set the number n (natural number) of intermediate read during the exposure period in a manner of meeting the following conditional expression (8):

$$Qs \leq Qm \times n \quad (8)$$

Here, Qs represents the saturation charge amount of the unit pixel 60A in the circuit operation at short time exposure, and Qm represents the maximum charge amount that can be read from the unit pixel 60A by one intermediate read. In other words, the number n of intermediate read needs to be set such that the intermediate read is repeated n times and accordingly the photocharge amount that can be read from the unit pixel 60A becomes equal to or more than the saturation charge amount Qs of the unit pixel 60A.

The following expression (9) is a modification of the expression (8):

$$n \geq Qs/Qm \quad (9)$$

Both of the saturation charge amount Qs and the maximum charge amount Qm are determined by the device characteristics of the CMOS image sensor 10 including the unit pixel 60A. As a result, the condition of the number n of intermediate read is determined by the expression (9), and the number n of intermediate read can be set in advance within a range of the obtained condition.

On the other hand, assuming that the exposure time of an imaging device including the CMOS image sensor 10 is Te, and the time required for intermediate read for one frame is Tm, then it is necessary for the exposure time Te, the required time Tm and the number n of intermediate read to meet the following conditional expression (10):

$$Tm \leq Te/n \quad (10)$$

Therefore, if the exposure time Te meets the following expression (11), it is possible to switch to the circuit operation at long time exposure.

$$Te \geq n \times Tm \quad (11)$$

For example, a driving unit of the CMOS image sensor 10 may automatically switch the circuit operation between at short time exposure and at long time exposure based on whether or not the exposure time Te meets the conditional expression (11). Otherwise, the circuit operation may be fixed to the one at short time exposure if the exposure time Te meets the conditional expression (11), and the circuit operation may be switched by a user's operation if the exposure time Te meets the conditional expression (11).

As described above, in the circuit operation at long time exposure, photocharges are accumulated and read without accumulating photocharges in the second charge accumulation section 67 from which a large amount of leakage current flows and without overflowing photocharges. Therefore, for example, switching the circuit operation of a unit pixel in accordance with the exposure time makes it possible to obtain an image with a wide dynamic range and low noise regardless of the exposure period.

The case where the dynamic range decreases is assumed; however, the circuit operation at short time exposure and the circuit operation at the long time exposure may be set to be able to be switched by a user's operation regardless of the exposure time Te.

6-3. Example to Omit Second Charge Accumulation Section 67

Moreover, it is also possible to delete the second charge accumulation section 67 from a unit pixel and use the FD section 71 as the second charge accumulation section. In other words, it is also possible to transfer and accumulate photocharges overflowing from the first charge accumulation section 66 to and in the FD section 71.

(Circuit Structure of Unit Pixel 60B)

Figure 40:
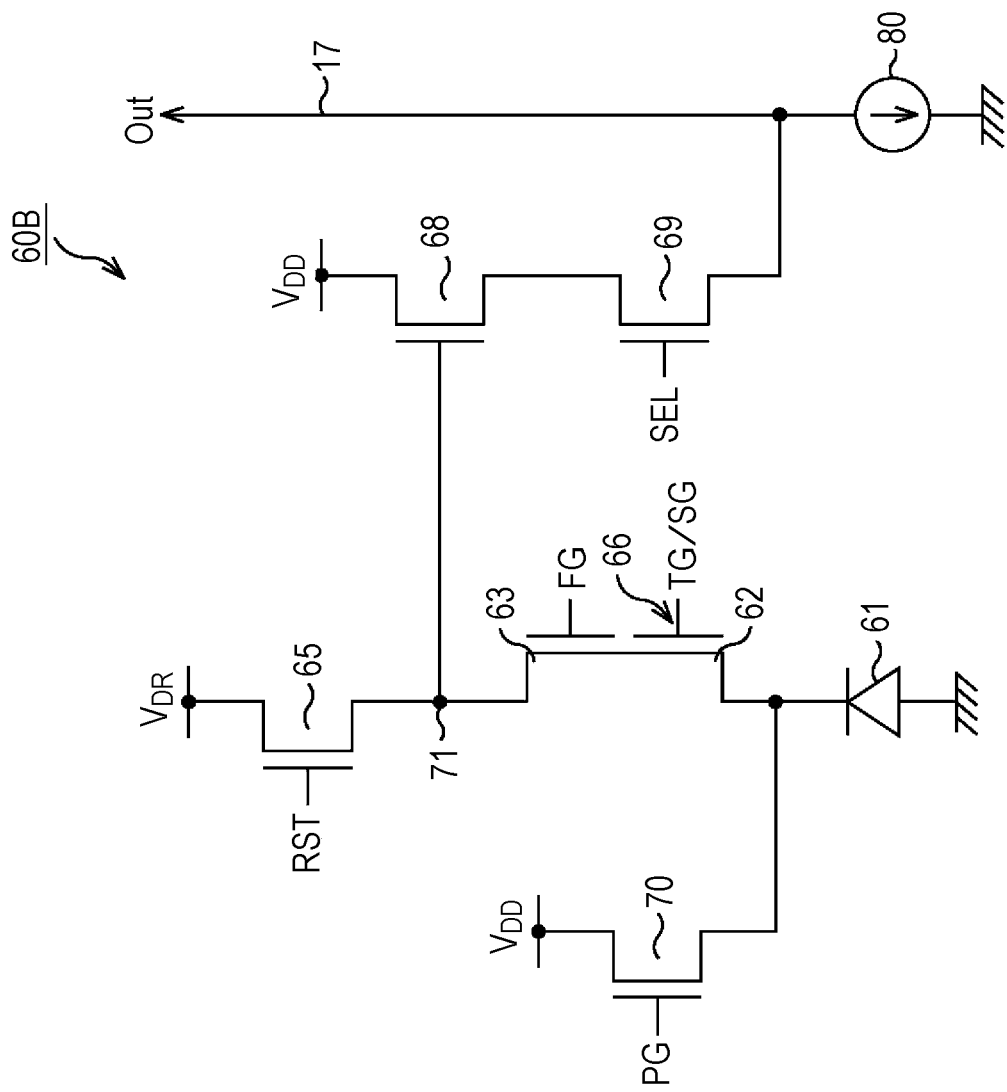
FIG. 40 is a circuit diagram depicting a circuit configuration of a unit pixel where the second charge accumulation section is omitted.

FIG. 40 is a circuit diagram depicting a circuit configuration of a unit pixel 60B where the second charge accumulation section 67 is omitted. As shown in FIG. 40, the unit pixel 60B includes, for example, the photodiode 61 having a p-n junction as a photoelectric conversion section that receives light to generate and accumulate photocharges, similarly to the unit pixel 60A. The photodiode 61 generates and accumulates photocharges in accordance with the amount of light received.

The unit pixel 60B further includes, for example, the first transfer gate section 62, the second transfer gate section 63, the reset gate section 65, the first charge accumulation section 66, the amplifier transistor 68, the select transistor 69, and the charge drain gate section 70.

In the unit pixel 60B having the above configuration, the first charge accumulation section 66 corresponds to the above-mentioned first charge accumulation section. In other words, the first charge accumulation section 66 is configured of an embedded MOS capacitor.

As the pixel driving line 16 in FIG. 1, a plurality of driving lines is wired to the unit pixels 60B in each pixel row, for example. Various drive signals TG/SG, FG, RST, SEL and PG are supplied from the vertical driving unit 12 in FIG. 1 through the plurality of driving lines of the pixel driving line 16. In the above configuration, the transistors are NMOS transistors and therefore these drive signals TG/SG, FG, RST, SEL and PG are pulse signals that become active at a high level (for example, the power supply voltage $V_{DD}$), and become non-active at a low level (for example, the negative potential).

The drive signal TG/SG is applied to the gate electrode of the first transfer gate section 62 as a transfer signal. From the perspective of a circuit, one source/drain region of the first transfer gate section 62 is connected to the photodiode 61. When the drive signal TG/SG becomes active, the first transfer gate section 62 then establishes electrical continuity in response thereto and accordingly transfers the photocharges accumulated in the photodiode 61 to the first charge accumulation section 66. The photocharges transferred by the first transfer gate section 62 are temporarily accumulated in the first charge accumulation section 66.

The drive signal FG is applied to the gate electrode of the second transfer gate section 63 as a transfer signal. From the perspective of a circuit, the second transfer gate section 63 is connected to between the first charge accumulation section 66 and the FD section 71 to which the gate electrode of the amplifier transistor 68 is connected. The FD section 71 converts photocharge into an electric signal, for example, a voltage signal and outputs the signal. When the drive signal FG becomes active, the second transfer gate section 63 then establishes electrical continuity in response thereto and accordingly transfers the photocharges accumulated in the first charge accumulation section 66 to the FD section 71.

The drive signal RST is applied to the gate electrode of the reset gate section 65 as a reset signal. From the perspective of a circuit, one source/drain region of the reset gate section 65 is connected to the reset voltage $V_{DR}$, and the other source/drain region thereof is connected to the FD section 71, respectively. When the drive signal RST becomes active, the reset gate section 65 then establishes electrical continuity in response thereto and accordingly resets the potential of the FD section 71 to the level of the reset voltage $V_{DR}$.

From the perspective of a circuit, the gate electrode of the amplifier transistor 68 is connected to the FD section 71, and the drain electrode thereof is connected to the power supply voltage $V_{DD}$, and the amplifier transistor 68 serves as an input section of a read circuit that reads the photocharge obtained by the photoelectric conversion by the photodiode 61, what is called a source follower circuit. In other words, a source electrode of the amplifier transistor 68 is connected to the vertical signal line 17 via the select transistor 69, and the amplifier transistor 68 configures the source follower circuit with a constant current source 80 connected to one end of the vertical signal line 17

The drive signal SEL is applied to the gate electrode of the select transistor 69 as a selection signal. From the perspective of a circuit, the select transistor 69 is connected to between the source electrode of the amplifier transistor 68 and the vertical signal line 17. When the drive signal SEL becomes active, the select transistor 69 then establishes electrical continuity in response thereto and accordingly brings the unit pixel 60A to a selected state and connects a pixel signal output from the amplifier transistor 68 to the vertical signal line 17.

The drive signal PG is applied to the gate electrode of the charge drain gate section 70 as a charge drain control signal. From the perspective of a circuit, the charge drain gate section 70 is connected to between the photodiode 61 and a charge drain section (for example, the power supply voltage $V_{DD}$). When the drive signal PG becomes active, the charge drain gate section 70 then establishes electrical continuity in response thereto and accordingly selectively drains a preset specified amount or all of the photocharges accumulated in the photodiode 61, from the photodiode 61 to the charge drain section.

The charge drain gate section 70 is provided for the following purpose. In other words, the purpose is for avoiding the saturation of the photodiode 61 with photocharges and the overflow of the photocharges that exceed the saturation charge amount to the first charge accumulation section 66, the FD section 71 and the surrounding pixels, which are caused by bringing the charge drain gate section 70 into conduction in a period during which photocharges are not accumulated.
(Pixel Structure of Unit Pixel 60B)

Figure 41:
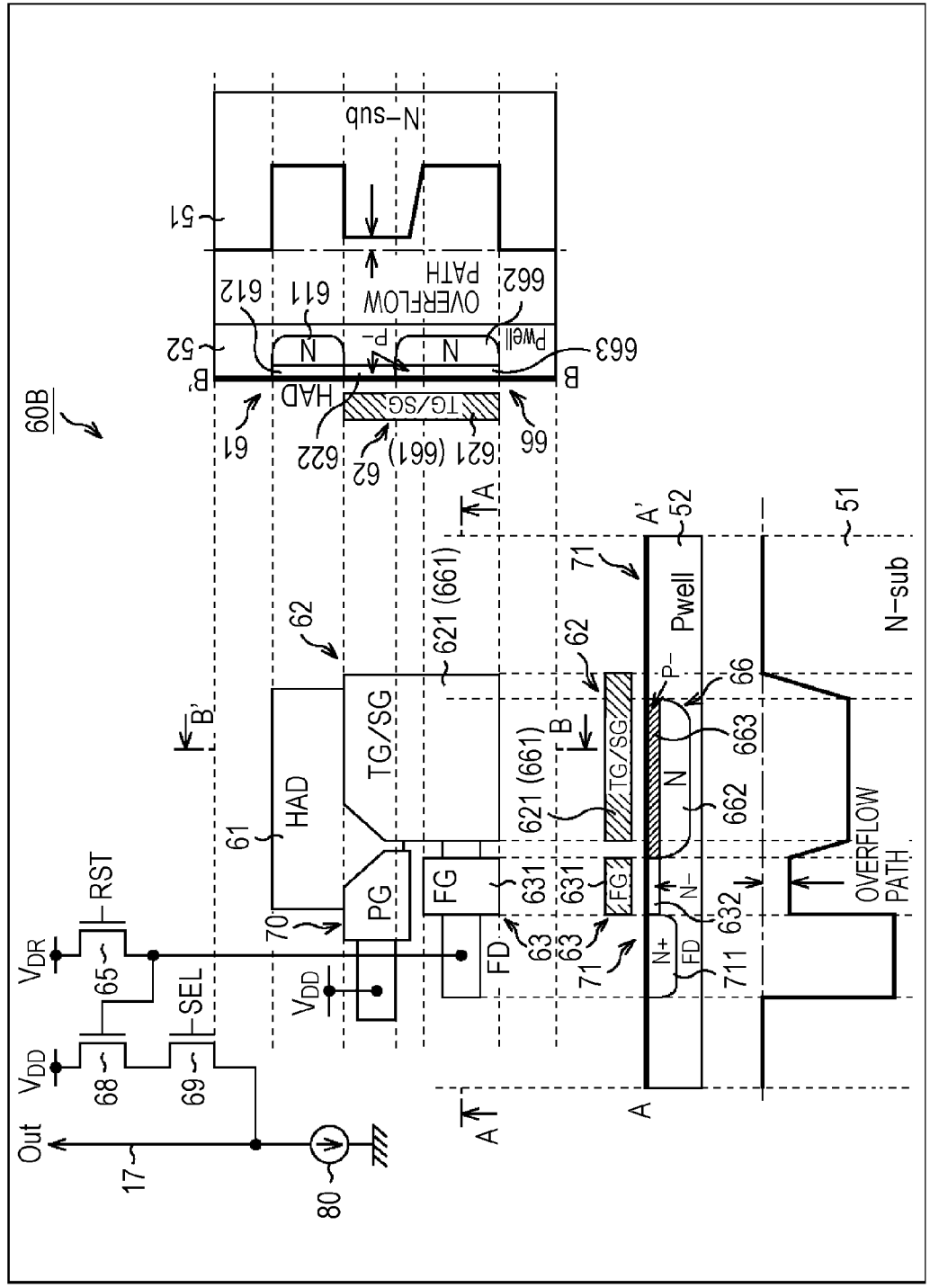
FIG. 41 is a schematic view depicting a pixel structure of the unit pixel where the second charge accumulation section is omitted.

FIG. 41 is a schematic diagram depicting a pixel structure of the unit pixel 60B, and the same reference signs are assigned in the drawing to denote portions equivalent to those in FIG. 40. FIG. 41 depicts a plane pattern of a pixel layout and cross sections of the plane pattern taken along arrow A-A' and arrow B-B', respectively.

In FIG. 41, as is clear from the cross-sectional view taken along arrow B-B', the photodiode (PD) 61 has the structure of a diode having a p-n junction, where the N-type semiconductor region 611 is formed in the P-type well 52 on the semiconductor substrate 51. The photodiode 61 includes the P-type semiconductor region 612 formed in the surface layer portion thereof and accordingly is an embedded photodiode (what is called an HAD (Hole Accumulation Diode) sensor structure) where a depletion end is away from the interface.

The first transfer gate section 62 includes the gate electrode 621 disposed on the substrate surface via a gate insulating film (not shown), and the P--type semiconductor region 622 formed in the substrate surface layer portion. The P--type semiconductor region 622 has the potential beneath the gate electrode 621 slightly deeper than the case where the semiconductor region 622 is not formed. Consequently, as is clear from the cross-sectional view taken along arrow B-B', the P--type semiconductor region 622 forms an overflow path that transfers, to the first charge accumulation section 66, photocharges equal to or more than the specified amount, which overflow from the photodiode 61, or specifically, photocharges exceeding the saturation charge amount of the photodiode 61.

Moreover, the gate electrode 621 of the first transfer gate section 62 also serves as the gate electrode 661 of the first charge accumulation section 66. Put another way, the gate electrode 621 of the first transfer gate section 62 and the gate electrode 661 of the first charge accumulation section 66 are integrally formed.

The first charge accumulation section 66 includes the gate electrode 661 that also serves as the gate electrode 621 of the first transfer gate section 62 and is formed beneath the gate electrode 661 as an embedded MOS capacitor. In other words, the first charge accumulation section 66 is configured of an embedded MOS capacitor including the N-type semiconductor region 662 formed in the P-type well 52 beneath the gate electrode 661 and the P--type semiconductor region 623 formed in the surface layer portion thereof.

The second transfer gate section 63 includes the gate electrode 631 disposed on the substrate surface via a gate insulating film (not shown). The second transfer gate section 63 has the N-type semiconductor region 662 of the first charge accumulation section 66 as one source/drain region, and an N+-type semiconductor region 711 to serve as the FD section 71 as the other source/drain region.

The second transfer gate section 63 and the gate electrode 661 of the first charge accumulation section 66 operate to couple or divide the potentials of the FD section 71 and the first charge accumulation section 66.

Moreover, the second transfer gate section 63 has the structure where an N--type semiconductor region 632 is formed in the surface layer portion of a channel portion. The N--type semiconductor region 632 has the potential beneath the gate electrode 631 slightly deeper than the case where the semiconductor region 632 is not formed. Consequently, as is clear from the cross-sectional view taken along arrow A-A', the N--type semiconductor region 632 forms an overflow path that transfers, to the FD section 71, photocharges equal to or more than the specified amount, which overflow from the first charge accumulation section 66, or specifically, photocharges equal to or more than the saturation charge amount of the first charge accumulation section 66.

Here, it is important that the overflow paths formed beneath the first and second transfer gate sections 62 and 63 should be formed such that the photocharges accumulated in the first charge accumulation section 66 do not leak to the photodiode 61 and are transferred to the FD section 71.

In this manner, the unit pixel 60B has the overflow path beneath the gate electrode 631 of the second transfer gate section 63; accordingly, it is possible to accumulate the photocharges overflowing from the photodiode 61 in a high light condition also in the FD section 71. Specifically, even if the second transfer gate section 63 is not conducting, it is possible to transfer, to the FD section 71, photocharges equal to or more than the specified amount, which overflow from the first charge accumulation section 66, and accumulate the photocharges in the FD section 71. Consequently, it is possible to set the saturation charge amount of the first charge accumulation section to be smaller than the saturation charge amount of the photodiode 61.

(Circuit Operation of Unit Pixel 60B)

Next, a description will be given of a circuit operation of the unit pixel 60B with reference to a timing chart of FIG. 42 and potential diagrams of FIGS. 43 to 50.

Figure 42:
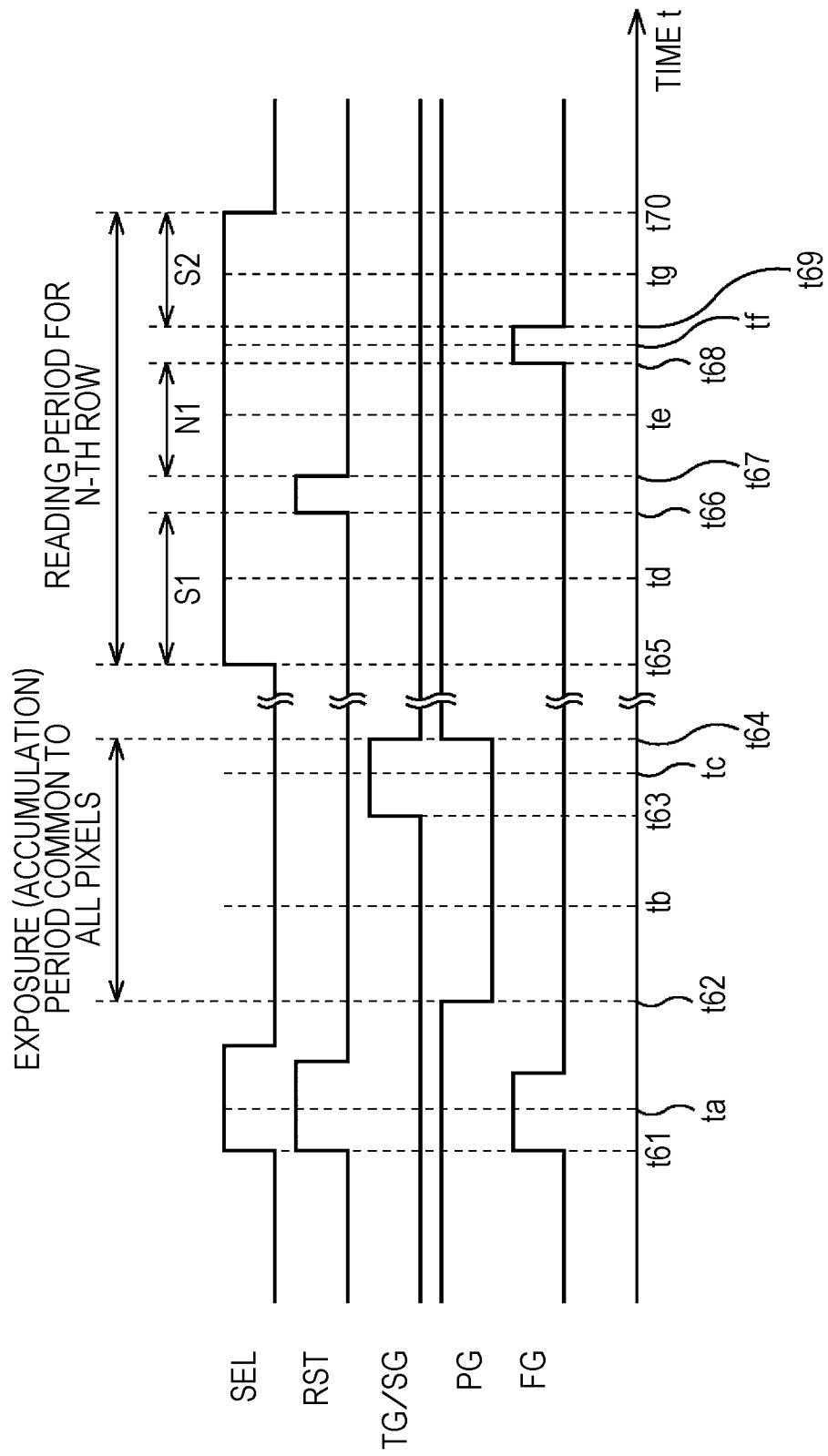
FIG. 42 is a timing chart provided for a description of a circuit operation of the unit pixel where the second charge accumulation section is omitted.

FIG. 42 depicts a timing chart of the selection signal SEL, the reset signal RST, the transfer signal TG/SG, the charge drain control signal PG and the transfer signal FG of the unit pixel 60B. Moreover, FIGS. 43 to 50 depict the states of the potential of the unit pixel 60B in the N-th row at times ta to tg of the timing chart of FIG. 42, respectively.

Firstly, at time t61, while the charge drain control signal PG stays active, the selection signal SEL, the reset signal RST and the transfer signal FG simultaneously become active in all the pixels. Consequently, the select transistor 69, the reset gate section 65, the second transfer gate section 63, and the charge drain gate section 70 establish electrical continuity.

Figure 43:
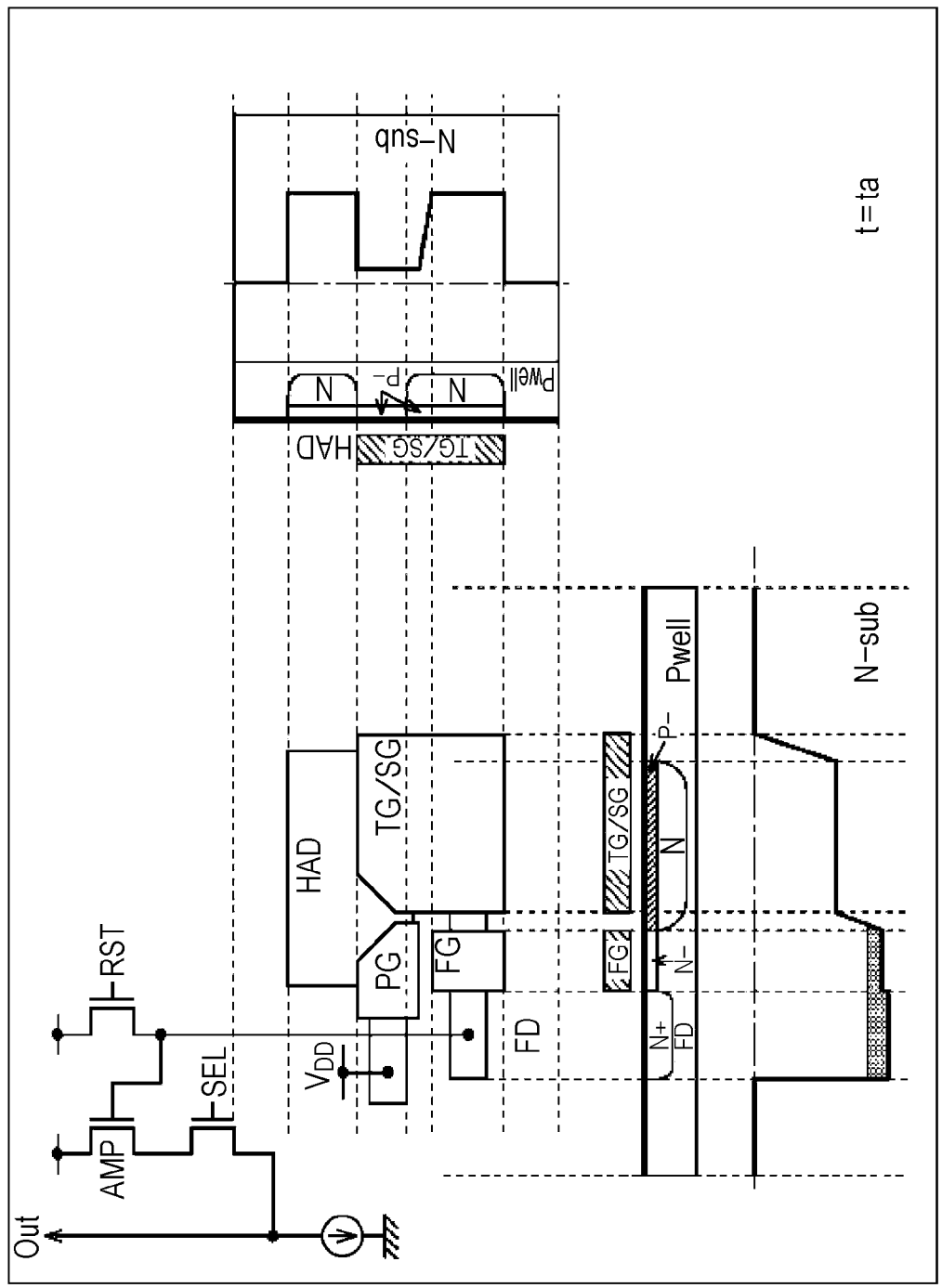
FIG. 43 is a (first) potential diagram provided for a description of the circuit operation of the unit pixel where the second charge accumulation section is omitted.

FIG. 43 depicts the state of the potential of the unit pixel 60B at time to between time t61 and time t62. In this manner, the potentials of the FD section 71 and the first charge accumulation section 66 are coupled and the coupled region is reset.

Subsequently, the transfer signal FG, the reset signal RST, and the selection signal SEL simultaneously become non-active in this order in all the pixels. At time t62, the charge drain control signal PG then simultaneously become non-active in all the pixels. Consequently, the exposure period common to all the pixels begins.

Figure 44:
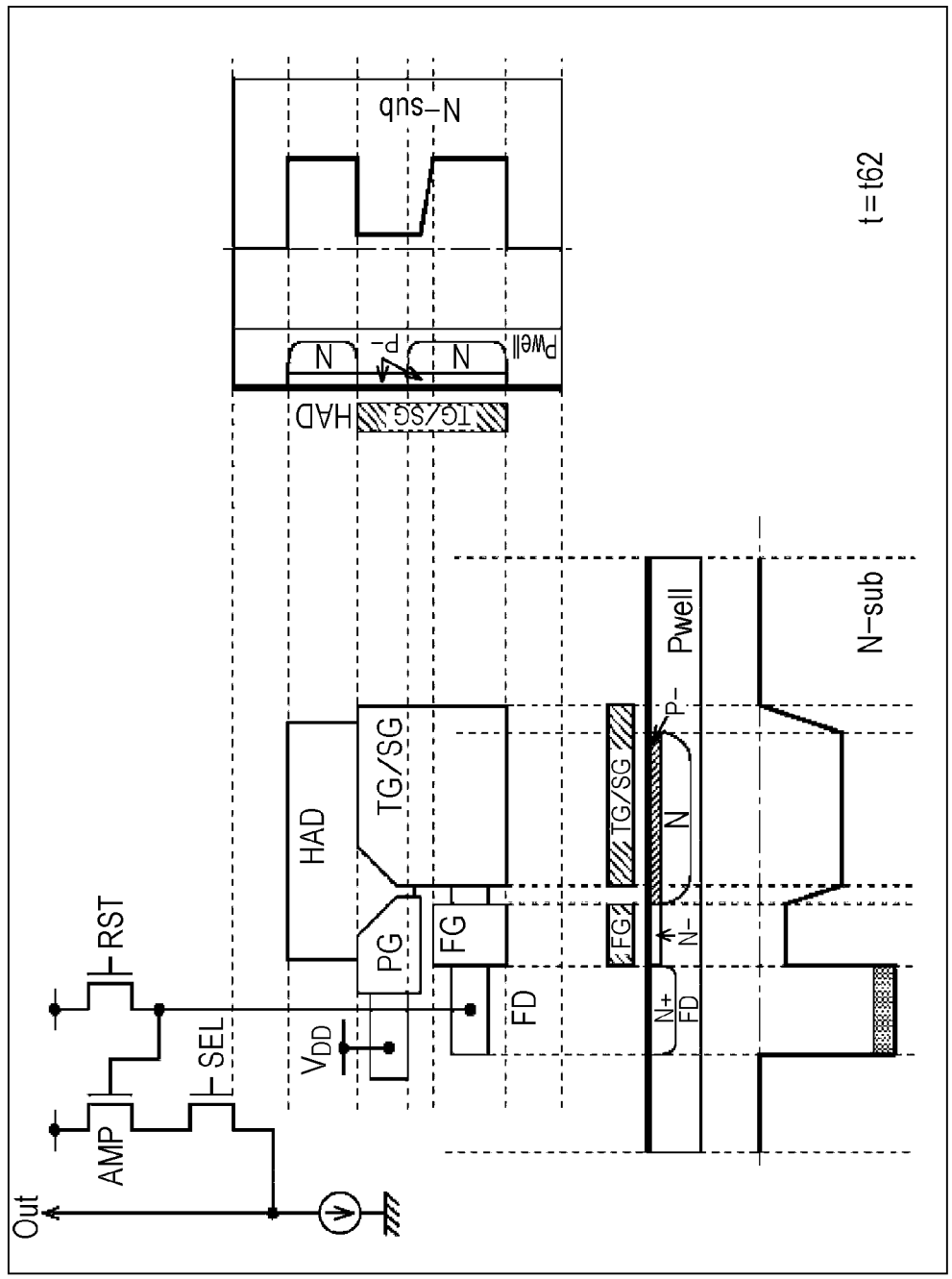
FIG. 44 is a (second) potential diagram provided for a description of the circuit operation of the unit pixel where the second charge accumulation section is omitted.

FIG. 44 depicts the state of the potential of the unit pixel 60B at time t62. At this time, photocharges are not accumulated in the photodiode 61 and the first charge accumulation section 66.

Figure 45:
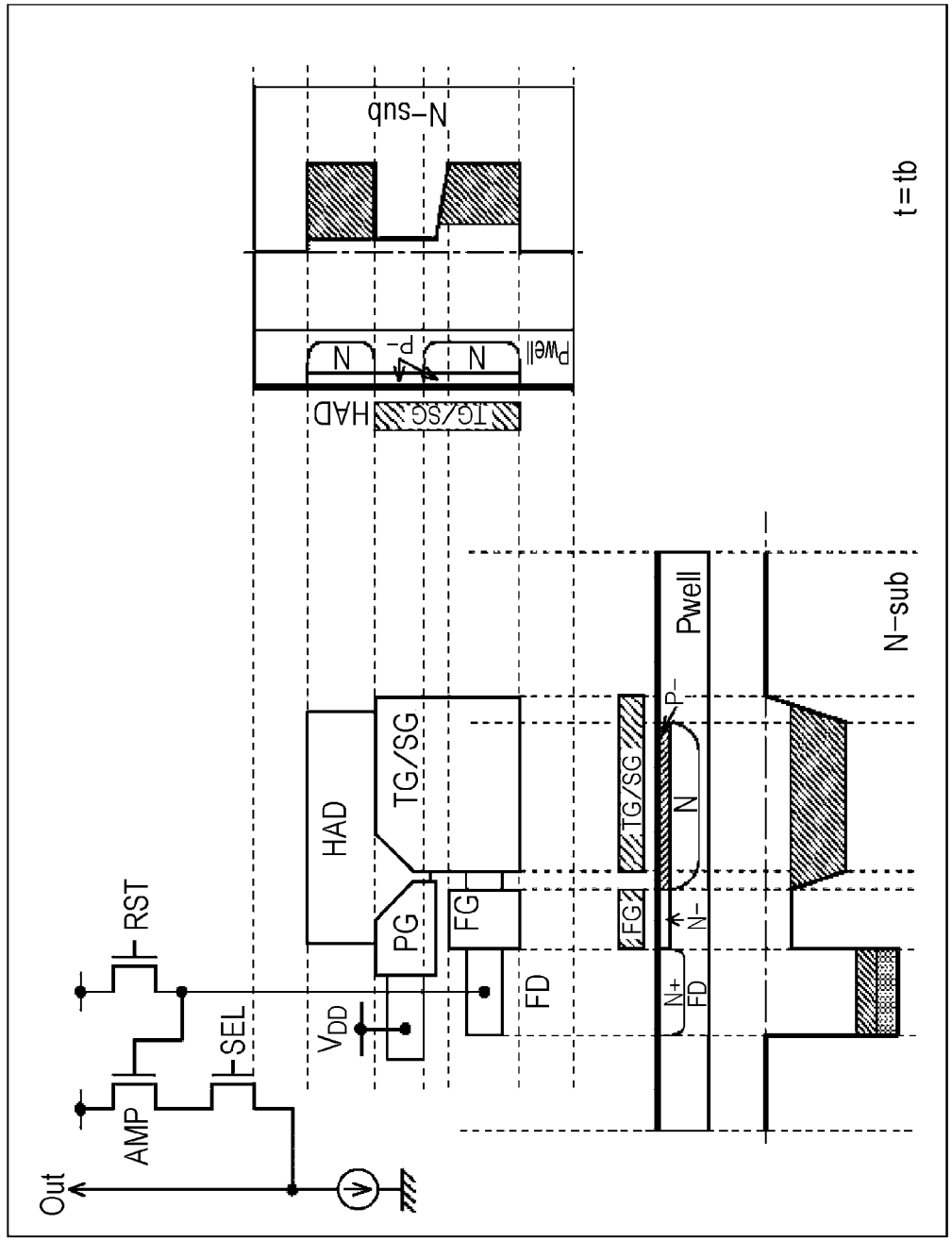
FIG. 45 is a (third) potential diagram provided for a description of the circuit operation of the unit pixel where the second charge accumulation section is omitted.

FIG. 45 depicts the state of the potential of the unit pixel 60B at time tb between time t62 and time t63. In this manner, while photocharges are accumulated in the photodiode 61, if in a high light condition, photocharges overflowing from the photodiode 61 are accumulated in the first charge accumulation section 66 via the overflow path of the first transfer gate section 62. Furthermore, if the first charge accumulation section 66 is saturated, the photocharges overflowing from the first charge accumulation section 66 are accumulated in the FD section 71 via the overflow path of the second transfer gate section 63. If in a low light condition, photocharges are accumulated only in the photodiode 61.

Next, at time t63, the transfer signal TG/SG becomes active and the first transfer gate section 62 and the gate electrode 661 of the first charge accumulation section 66 establish electrical continuity.

Figure 46:
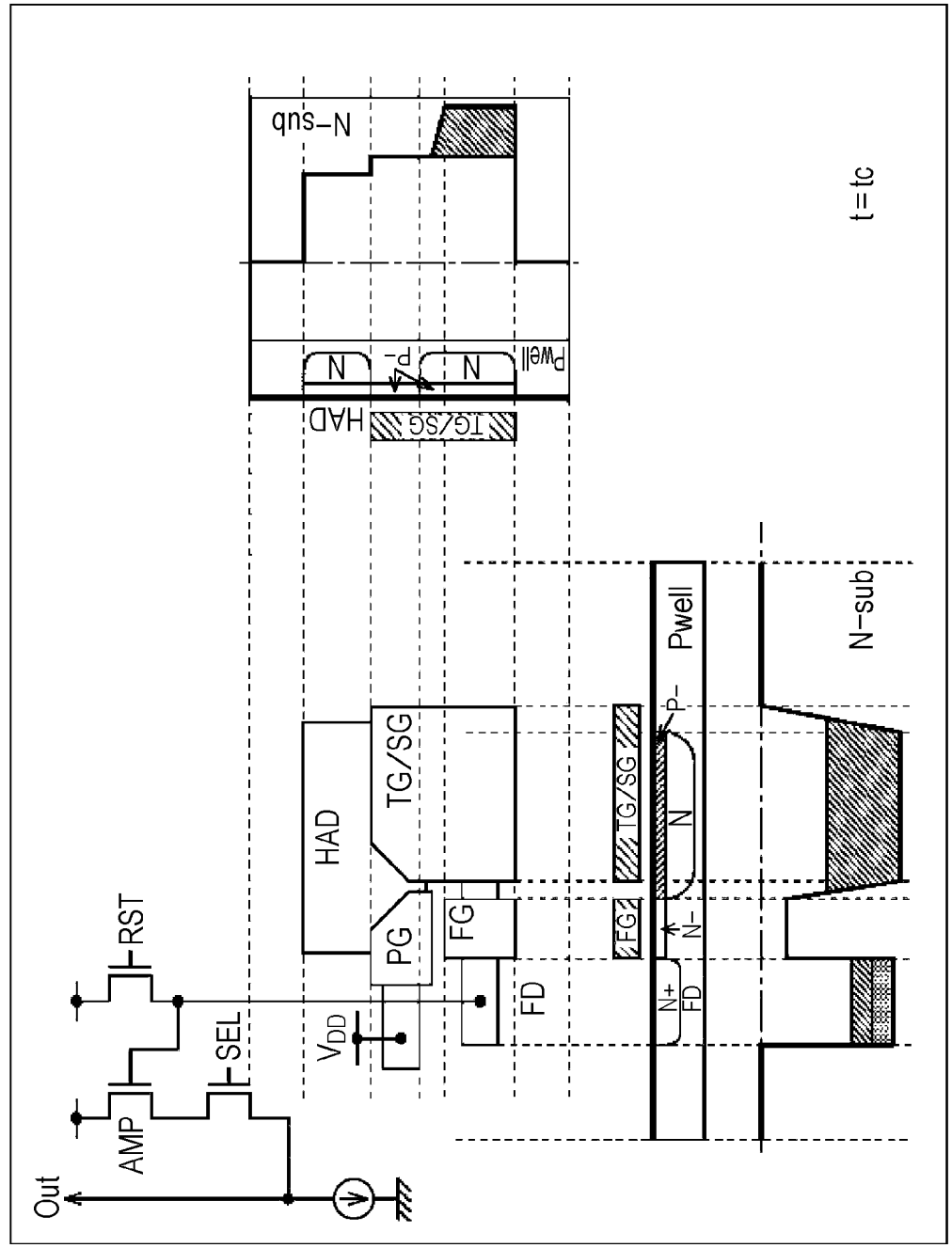
FIG. 46 is a (fourth) potential diagram provided for a description of the circuit operation of the unit pixel where the second charge accumulation section is omitted.

FIG. 46 depicts the state of the potential of the unit pixel 60B at time tc between time t63 and time t64. In this manner, the photocharges accumulated in the photodiode 61 are transferred to the first charge accumulation section 66 and are accumulated in the first charge accumulation section 66.

Next, at time t64, the transfer signal TG/SG simultaneously becomes non-active in all the pixels and at the same time the charge drain control signal PG becomes active. The first transfer gate section 62 and the gate electrode 661 of the first charge accumulation section 66 then break electrical continuity, and the potential of the first charge accumulation section 66 is restored to its original level and the charge drain gate section 70 establishes electrical continuity. Consequently, the exposure period common to all the pixels ends. Moreover, if the accumulated charge amount of the first charge accumulation section 66 exceeds the saturation charge amount, the photocharges overflowing from the first charge accumulation section 66 are accumulated in the FD section 71 via the overflow path of the second transfer gate section 63.

After the exposure period common to all the pixels ends, the accumulated photocharges are read in turn, row by row.

Specifically, at time t65, the selection signal SEL in the N-th row becomes active, and the select transistor 69 in the N-th row establishes electrical continuity and therefore the unit pixel 60A in the N-th row is brought to a selected state.

Figure 47:
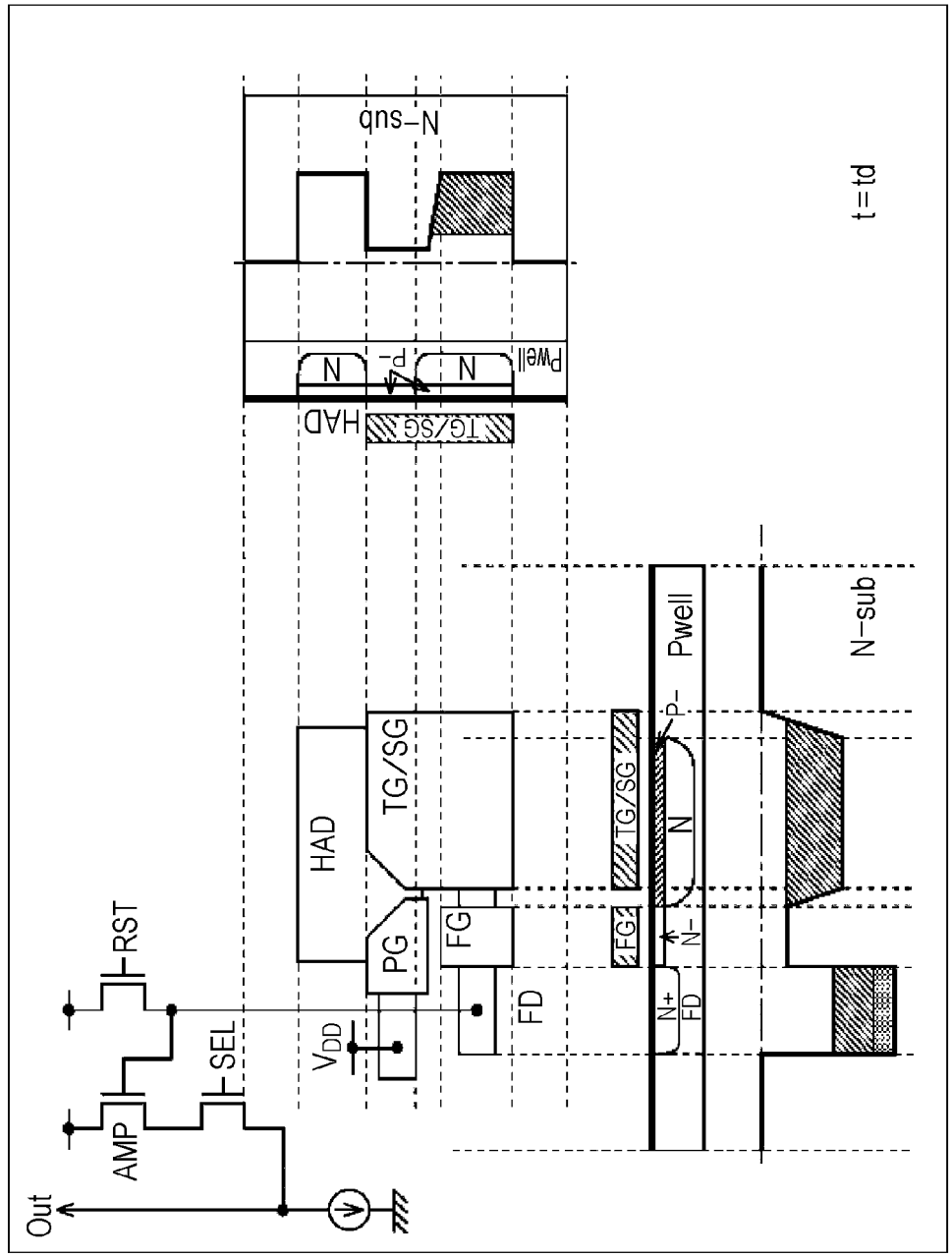
FIG. 47 is a (fifth) potential diagram provided for a description of the circuit operation of the unit pixel where the second charge accumulation section is omitted.

FIG. 47 depicts the state of the potential of the unit pixel 60B at time td between time t65 and time t66. The potential of the FD section 71 in this state is output to the vertical signal line 17 through the amplifier transistor 68 and the select transistor 69, as the first signal level 51 in accordance with the charge amount that exceeds the saturation charge amount of the first charge accumulation section 66.

Next, at time t66, the reset signal RST becomes active, and the reset gate section 65 establishes electrical continuity. Consequently, the FD section 71 is reset. At time t67, the reset signal RST becomes non-active, and the reset gate section 65 breaks electrical continuity.

Figure 48:
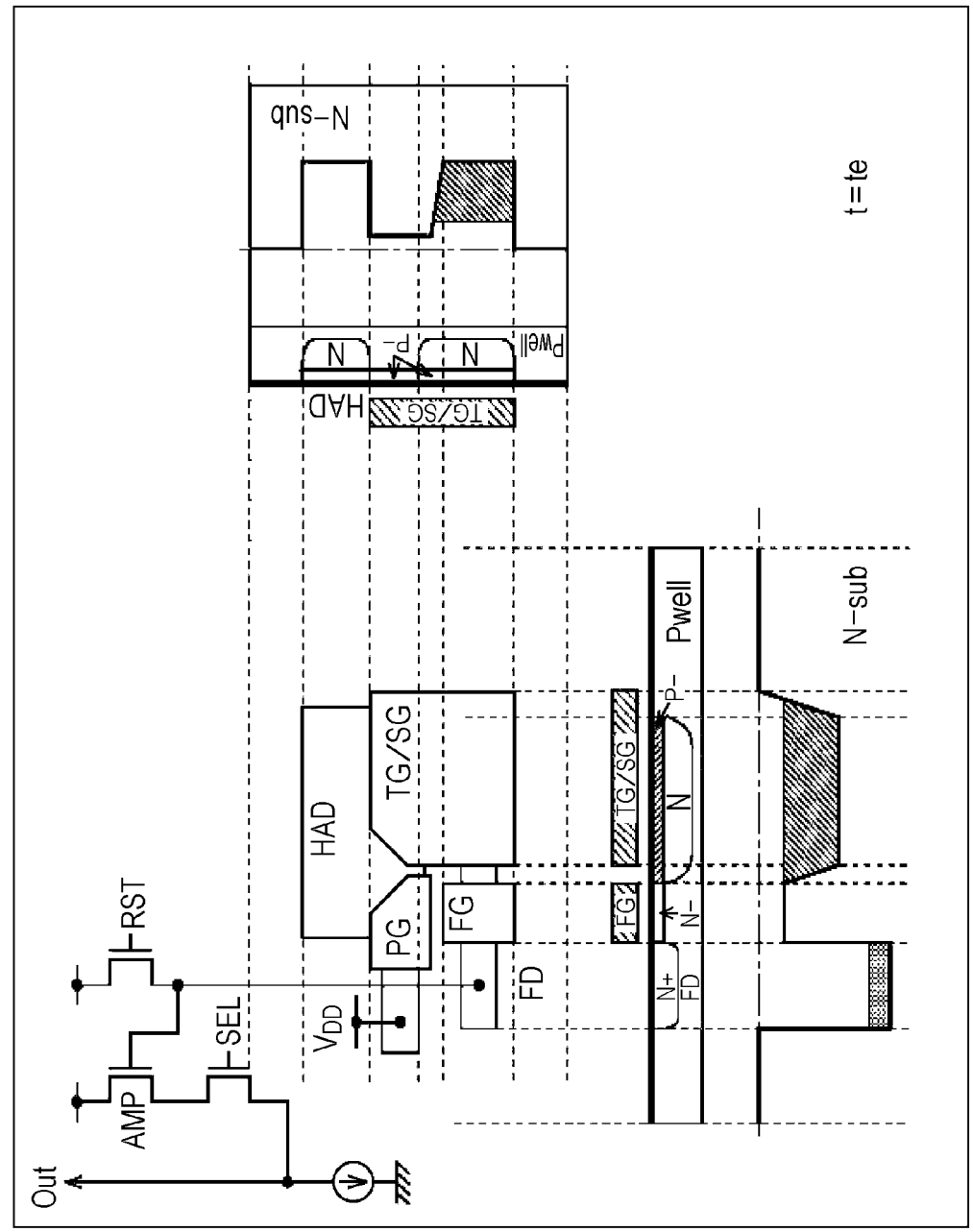
FIG. 48 is a (sixth) potential diagram provided for a description of the circuit operation of the unit pixel where the second charge accumulation section is omitted.

FIG. 48 depicts the state of the potential of the unit pixel 60B at time to between time t67 and time t68. The potential of the FD section 71 in this state is output as the reset level N1 to the vertical signal line 17 through the amplifier transistor 68 and the select transistor 69.

Next, at time t68, the transfer signal FG becomes active, and the second transfer gate section 63 establishes electrical continuity.

Figure 49:
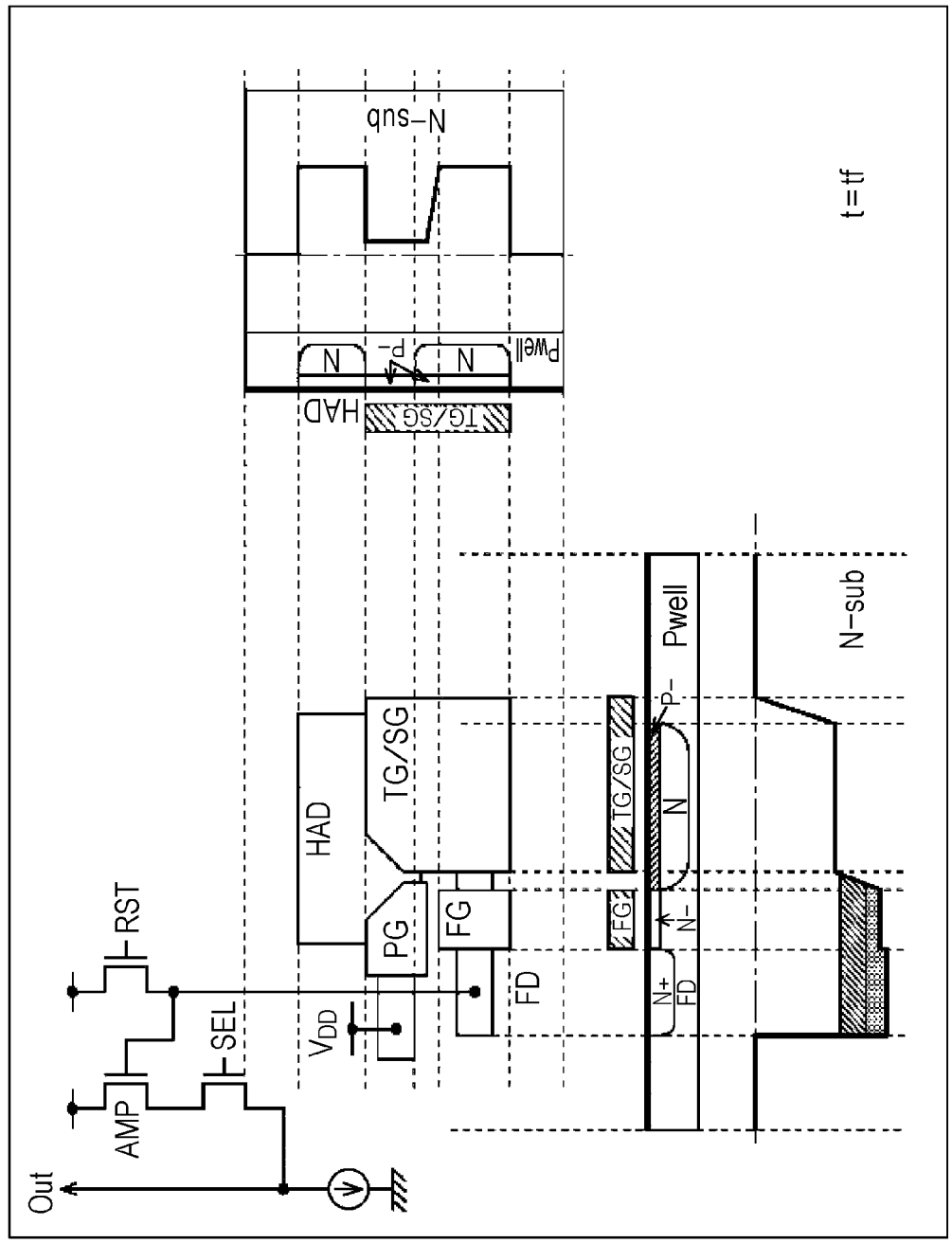
FIG. 49 is a (seventh) potential diagram provided for a description of the circuit operation of the unit pixel where the second charge accumulation section is omitted.

FIG. 49 depicts the state of the potential of the unit pixel 60B at time tf between time t68 and time t69. In this manner, the potentials of the FD section 71 and the first charge accumulation section 66 are coupled to transfer photocharges from the first charge accumulation section 66 to the FD section 71.

Next, at time t69, the transfer signal FG becomes non-active, and the second transfer gate section 63 breaks electrical continuity.

Figure 50:
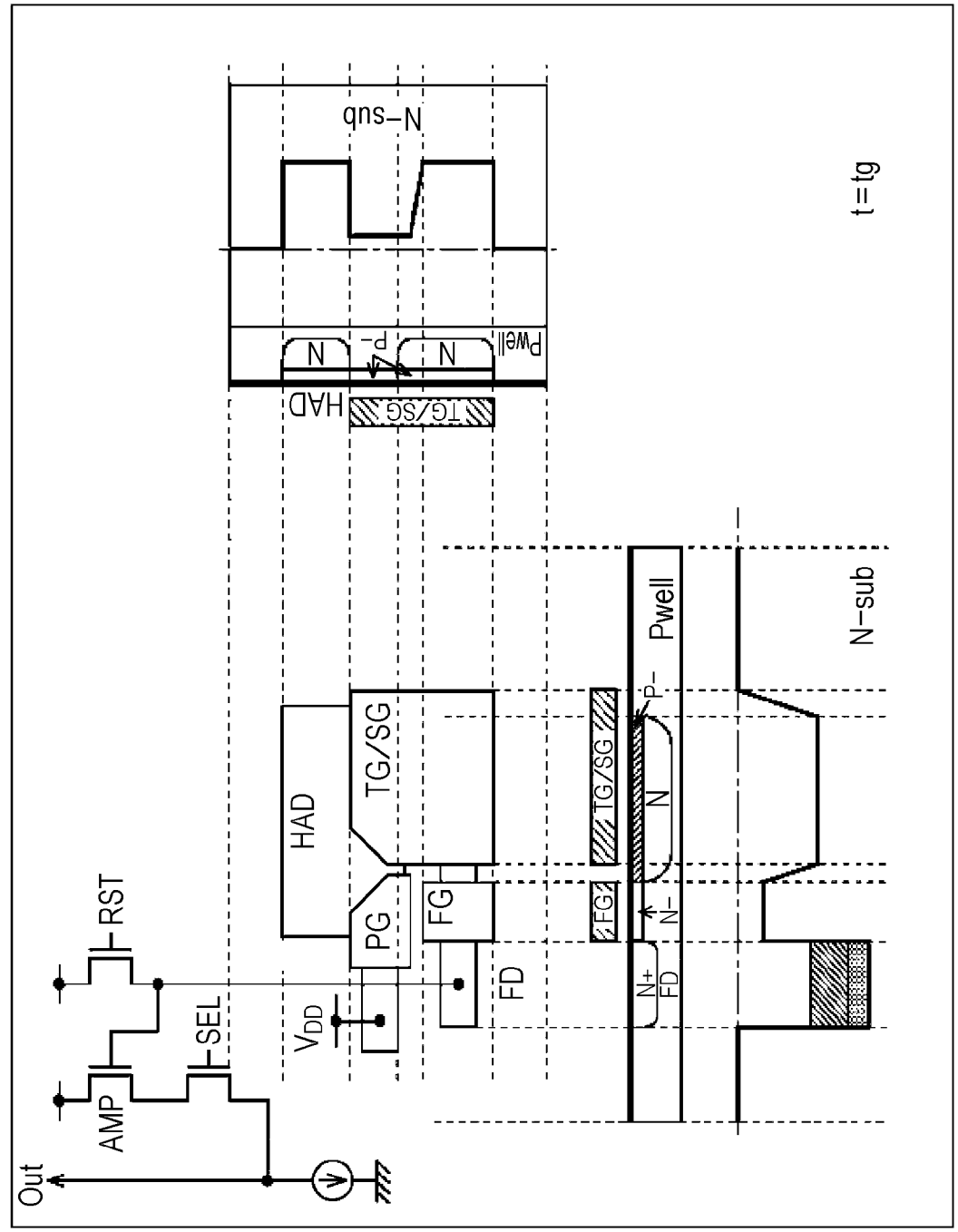
FIG. 50 is a (eighth) potential diagram provided for a description of the circuit operation, at long time exposure, of the unit pixel where the second charge accumulation section is omitted.

FIG. 50 depicts the state of the potential of the unit pixel 60B at time tg between time t69 and time t70. The potential of the FD section 71 in this state is output to the vertical signal line 17 through the amplifier transistor 68 and the select transistor 69, as the second signal level S2 in accordance with the accumulated charge amount of the first charge accumulation section 66.

Next, at time t70, the selection signal SEL in the N-th row becomes non-active, and the select transistor 69 in the N-th row breaks electrical continuity and therefore the unit pixel 60A in the N-th row is brought to a non-selected state.

With the above-mentioned series of circuit operations, the first signal level S1, the reset level N1 and the second signal level S2 are output in turn from the unit pixel 60B to the vertical signal line 17.

For example, in the column processing unit 13, noise removal processing is then performed by taking a difference between the first signal level S1 and the reset level N1 and a difference between the reset level N1 and the second signal level S2. At this time, for example, if a difference between the first signal level S1 and the reset level N1 is taken, the reset level N1 of the previous frame may be used.

In this manner, according to the unit pixel 60B, the omission of the second charge accumulation section 67 makes it possible to expand the area of the photodiode 61 and secure a larger saturation charge amount of the photodiode 61. Otherwise, it is possible to expand the area of the first charge accumulation section 66 and secure a larger saturation charge amount of the first charge accumulation section 66. Conversely, if the equal saturation charge amount is acceptable, a reduction in the unit pixel size can be promoted by the amount of space saved.

In addition, upon simultaneously reading out all the pixels, the photocharges in a low light condition are accumulated in the first charge accumulation section 66 that is good in properties in the dark while the photocharges in a high light condition are accumulated in the FD section 71 that is not good in properties in the dark. Therefore, compared with the related art that realizes the global exposure, the quality of an image imaged in the dark or in a low light condition is not deteriorated.

(Circuit Operation of Unit Pixel 60B at Long Time Exposure)

It is possible also in the unit pixel 60B to realize a circuit operation at long time exposure, which is similar to that of the unit pixel 60A. In other words, at long time exposure, the accumulated photocharges are regularly read during the exposure period and accordingly it is possible to accumulate photocharges only in the photodiode 61 and the first charge accumulation section 66 without accumulating photocharges in the FD section 71.

Here, a description will be given of the circuit operation of the unit pixel 60B at long time exposure with reference to timing charts of FIGS. 51 and 52 and potential diagrams of FIGS. 53 to 56.

Figure 51:
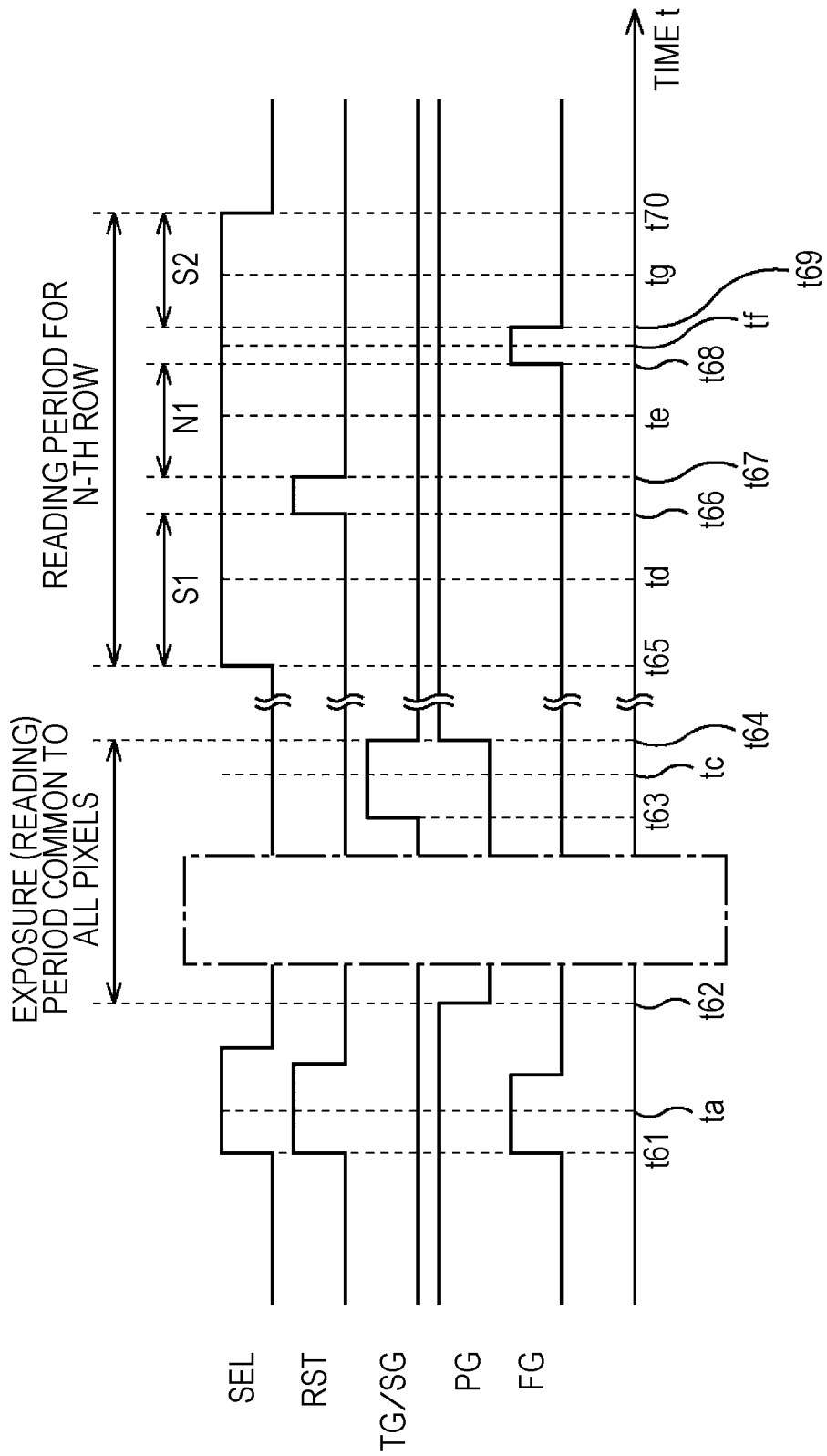
FIG. 51 is a (first) timing chart provided for a description of the circuit operation, at long time exposure, of the unit pixel where the second charge accumulation section is omitted.

FIG. 51 depicts a timing chart of the selection signal SEL, the reset signal RST, the transfer signal TG/SG, the charge drain control signal PG and the transfer signal FG of the unit pixel 60B. Moreover, FIG. 52 depicts a detailed timing chart of the period encircled by the box of the alternate long and short dash line of FIG. 51. Furthermore, FIGS. 53 to 56 depict the states of the potential of the unit pixel 60B at times Ta to $Td_1$ of FIG. 52, respectively.

Figure 52:
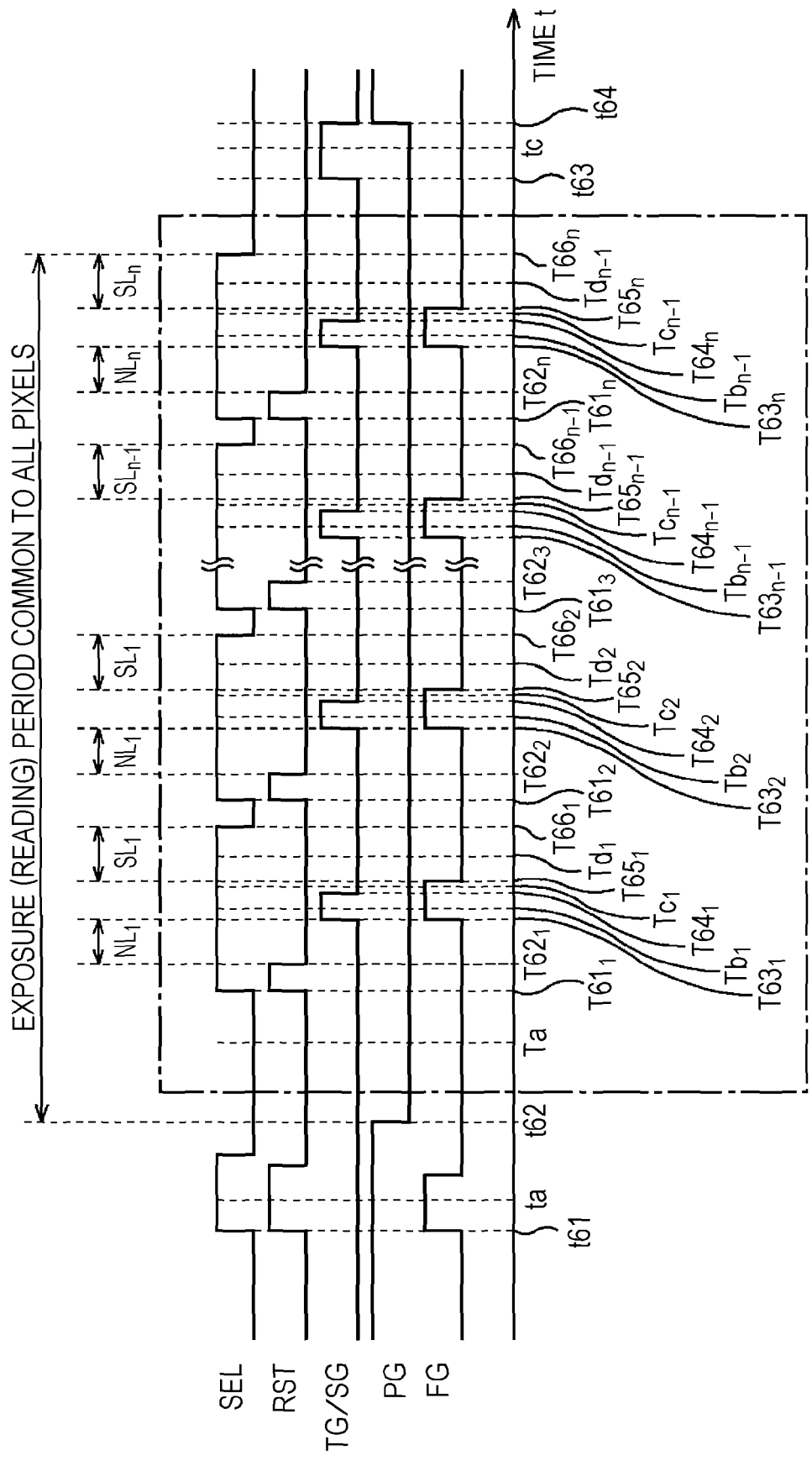
FIG. 52 is a (second) timing chart provided for a description of the circuit operation, at long time exposure, of the unit pixel where the second charge accumulation section is omitted.
Figure 53:
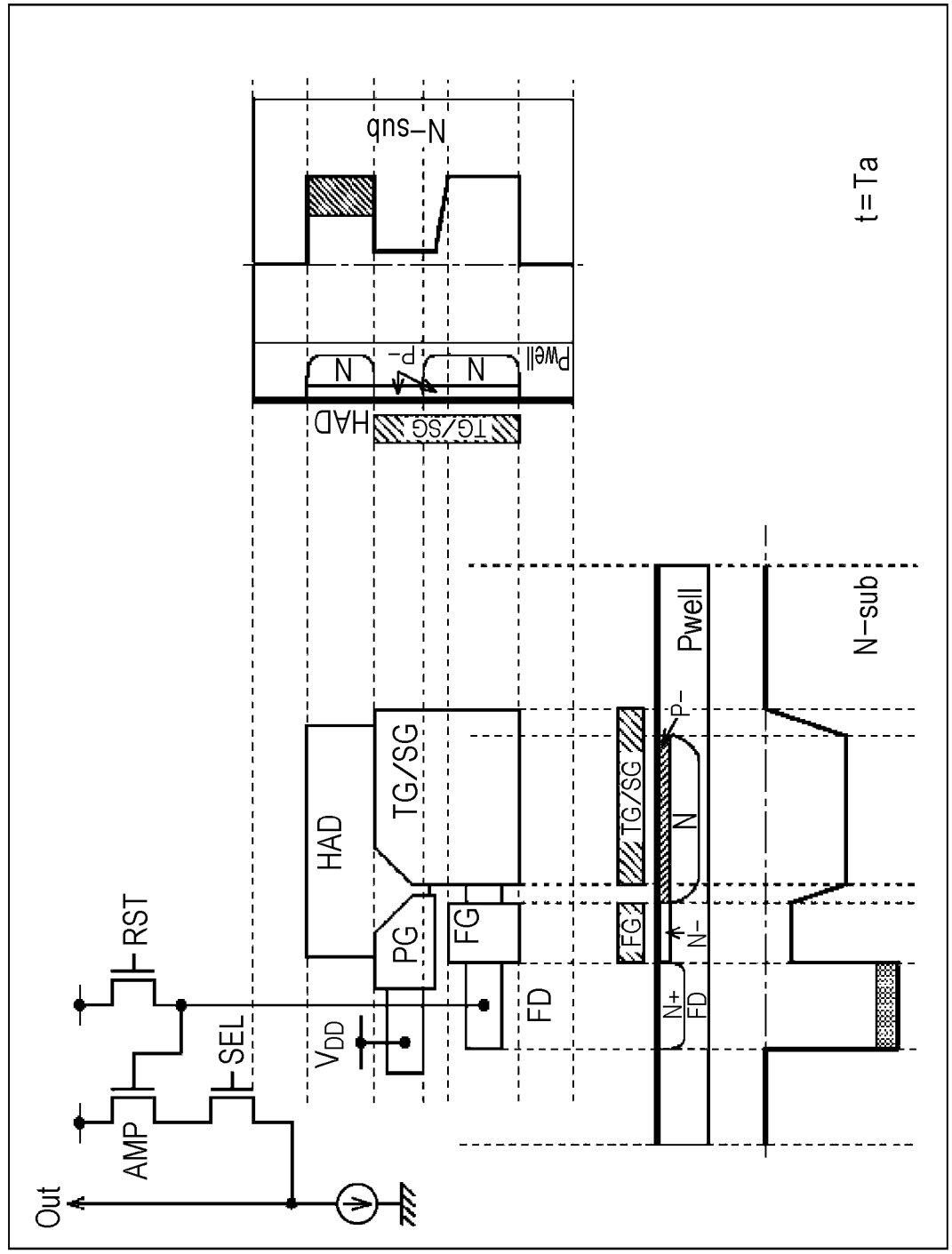
FIG. 53 is a (first) potential diagram provided for a description of the circuit operation, at long time exposure, of the unit pixel where the second charge accumulation section is omitted.

The circuit operation during the period encircled by the box of the alternate long and short dash line of FIGS. 51 and 52, in other words, during the period from time t62 to time t63 is different between at short time exposure and at long time exposure. A description will hereinafter be given of the circuit operation during this period.

FIG. 52 depicts the state of the potential of the unit pixel 60B at time Ta between time t62 and time $T61_1$.

At time $T61_1$, the selection signal SEL in the N-th row becomes active, and the select transistor 69 in the N-th row establishes electrical continuity; accordingly, the unit pixel 60A in the N-th row is brought to a selected state. At the same time, the reset signal RST becomes active and the reset gate section 65 establishes electrical continuity and therefore the FD section 71 is reset. At time $t62_1$, the reset signal RST becomes non-active.

At a time between time $T62_1$ and time $T63_1$, the potential of the FD section 71 is output as the reset level NL1 to the vertical signal line 17 through the amplifier transistor 68 and the select transistor 69.

Next, at time $T63_1$, the transfer signal TG/SG and the transfer signal FG become active, and the first transfer gate section 62, the gate electrode 661 of the first charge accumulation section 66 and the second transfer gate section 63 establish electrical continuity.

Figure 54:
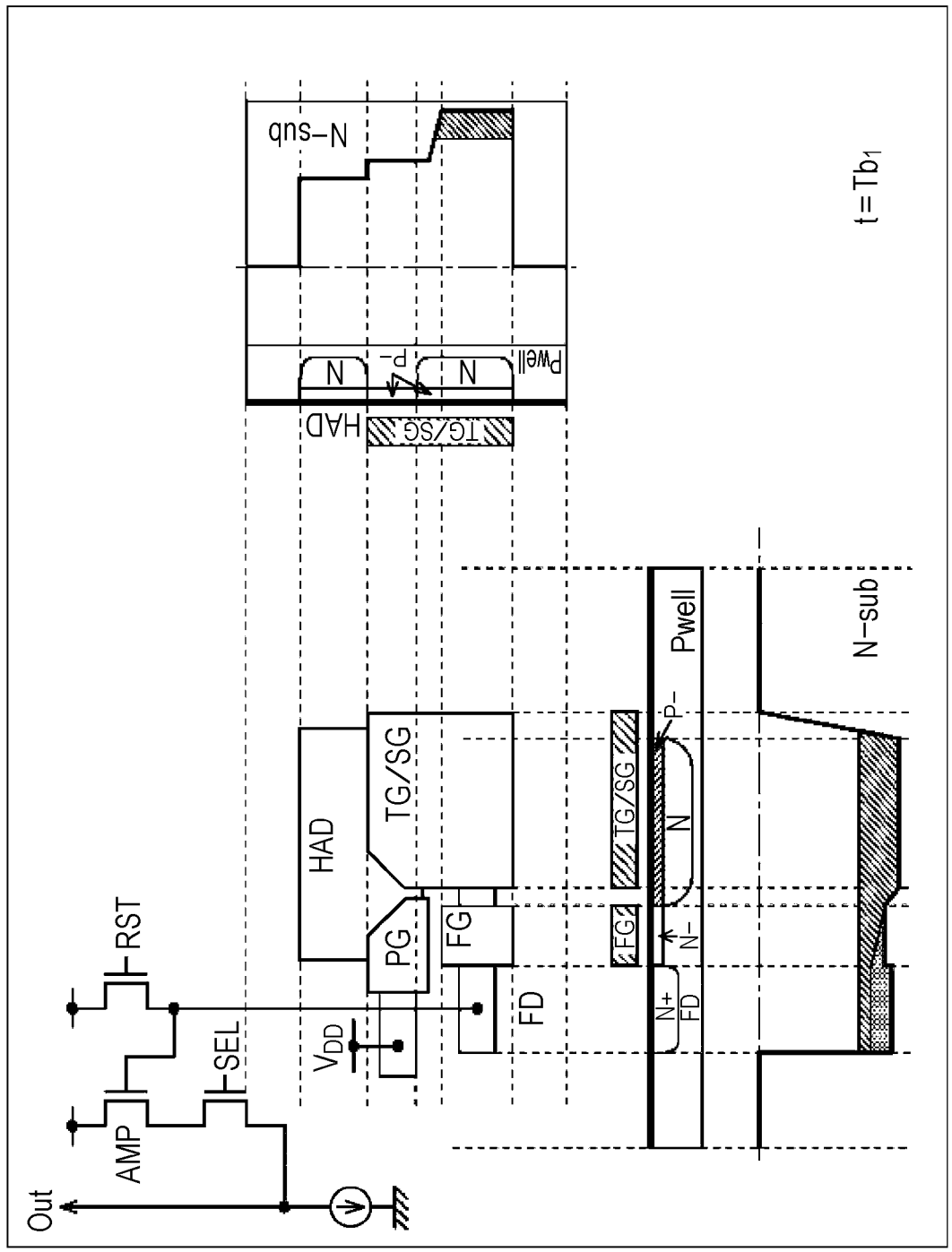
FIG. 54 is a (second) potential diagram provided for a description of the circuit operation, at long time exposure, of the unit pixel where the second charge accumulation section is omitted.

FIG. 54 is a view depicting the state of the potential of the unit pixel 60B at time $Tb_1$ between time $T63_1$ and time $T64_1$. In this manner, the potentials of the FD section 71 and the first charge accumulation section 66 are coupled and the photocharges accumulated in the photodiode 61 are transferred to the coupled region. Moreover, the photocharges generated in the photodiode 61 between time $T63_1$ and time $T64_1$ are also transferred to the coupled region.

For a time from time t62 to time $T63_1$, the accumulated charge amount is set in a manner of not exceeding the total of the saturation charge amounts of the photodiode 61 and the first charge accumulation section 66. Therefore, during this period, photocharges may overflow from the photodiode 61 to be accumulated in the first charge accumulation section 66 via the overflow path of the first transfer gate section 62; however, photocharges do not further overflow from the first charge accumulation section 66 to be accumulated in the FD section 71 via the overflow path of the second transfer gate section 63.

Next, at time $T64_1$, the transfer signal TG/SG becomes non-active, and the first transfer gate section 62 and the gate electrode 661 of the first charge accumulation section 66 break electrical continuity. The first transfer gate section 62 then breaks electrical continuity; accordingly, photocharges are resumed to be accumulated in the photodiode 61.

Figure 55:
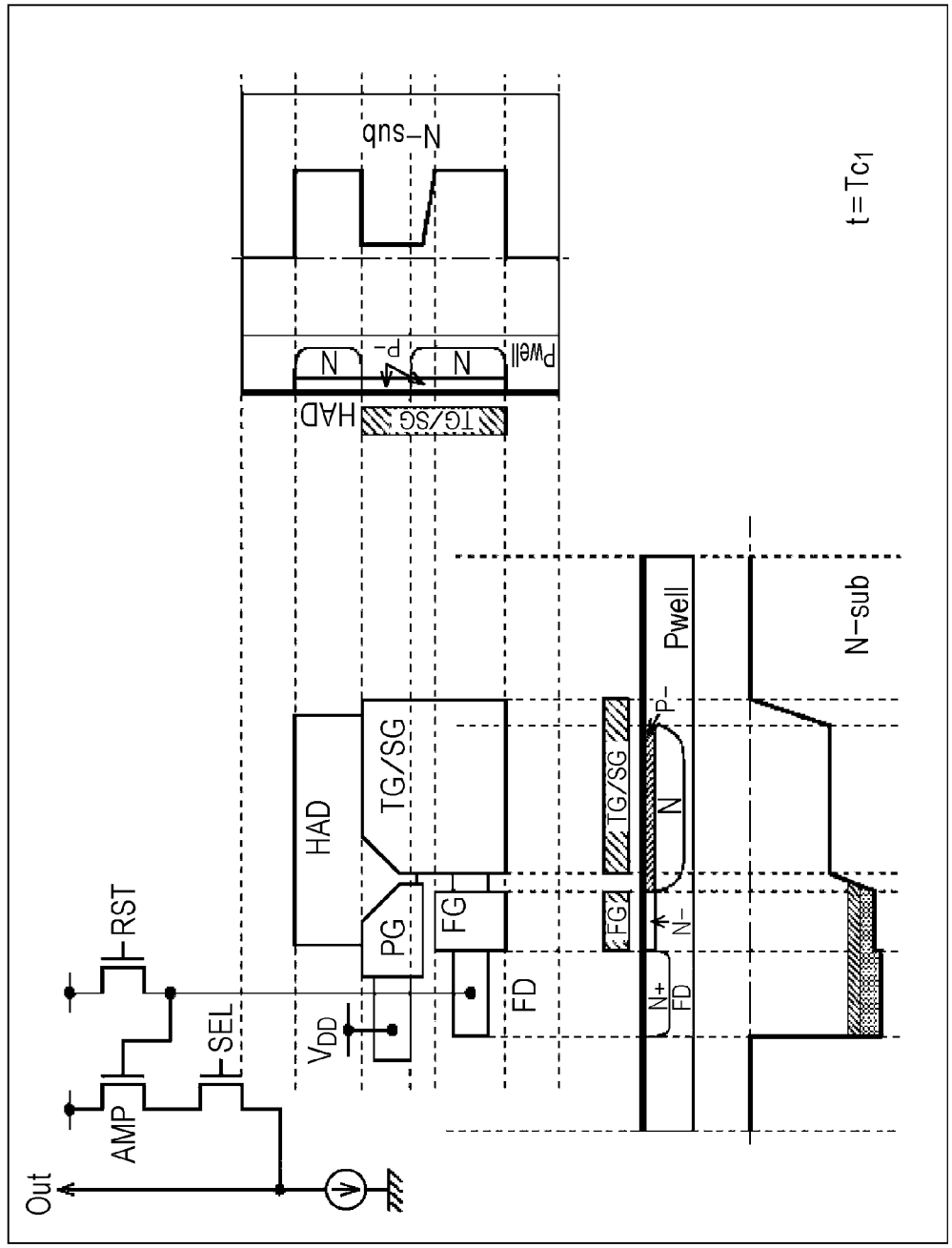
FIG. 55 is a (third) potential diagram provided for a description of the circuit operation, at long time exposure, of the unit pixel where the second charge accumulation section is omitted.

FIG. 55 is a view depicting the state of the potential of the unit pixel 60A at time $Tc_1$ between time $T64_1$ and time $T65_1$. In this manner, all the photocharges transferred to the area where the potentials of the FD section 71 and the first charge accumulation section 66 are coupled are transferred to the FD section 71.

Next, at time $T65_1$, the transfer signal FG becomes non-active, and the second transfer gate section 63 breaks electrical continuity.

Figure 56:
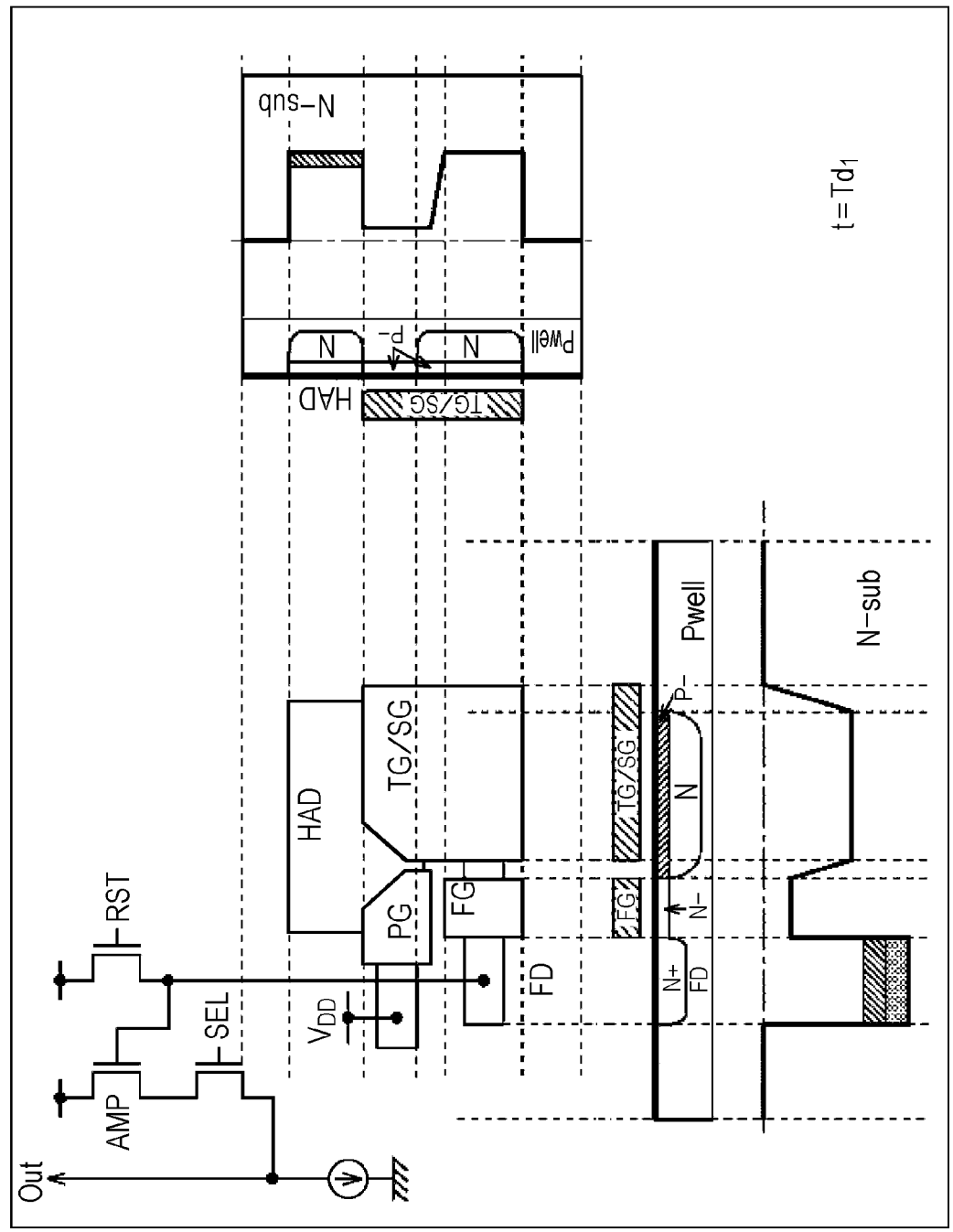
FIG. 56 is a (fourth) potential diagram provided for a description of the circuit operation, at long time exposure, of the unit pixel where the second charge accumulation section is omitted.

FIG. 56 is a view depicting the state of the potential of the unit pixel 60B at time $Td_1$ between time $T65_1$ and time $T66_1$. The potential of the FD section 71 in this state is output to the vertical signal line 17 through the amplifier transistor 68 and the select transistor 69, as the second signal level SL2 in accordance with the accumulated charge amount of the photodiode 61.

Next, at time $T66_1$, the selection signal SEL becomes non-active, and the select transistor 69 in the N-th row breaks electrical continuity; accordingly, the unit pixel 60A in the N-th row is brought to a non-selected state.

Subsequently, similar processes to those at times $T61_1$ to $T66_1$ are repeated n−1 times at times $T61_2$ to $T66_n$. As a result, the reset level NL2, the third signal level SL2, . . . , the reset level NLn, and the signal level SLn are output in this order to the vertical signal line 17 through the amplifier transistor 68 and the select transistor 69.

Similarly to the case of the unit pixel 60A, whenever the intermediate read is performed, an integrated value corresponding to the accumulated charge amount of each pixel is calculated.

As described above, in the circuit operation at long time exposure, photocharges are accumulated and read also in the unit pixel 60B without accumulating photocharges in the FD section 71 from which a large amount of leakage current flows and without overflowing photocharges, similarly to the unit pixel 60A. Therefore, for example, switching the circuit operation of a unit pixel in accordance with the exposure time makes it possible to obtain an image with a wide dynamic range and low noise regardless of the exposure period.

6-4. Other Modifications

Moreover, although the description has been given in the above embodiment, taking, as an example, the case of applying the present technology to a CMOS image sensor where unit pixels are disposed in a matrix, the present technology is not limited to the application to a CMOS image sensor. In other words, the present technology can be applied to a general solid-state imaging device of the X-Y address type where the unit pixels are two-dimensionally disposed in a matrix.

Moreover, the present technology can be applied not only to a solid-state imaging device that detects the distribution of the amount of incident visible light and images the distribution as an image, but also to a general solid-state imaging device that images the distribution of the amount of incident infrared rays, X rays, particles or the like as an image.

A solid-state imaging device may be formed into one chip or may be formed into a module where an imaging unit and a signal processing unit or an optical system are packaged all together, the module having an imaging function.

Moreover, all pixels in the present technology indicate all of pixels of a portion that appears on an image and a dummy pixel and the like are excluded. Moreover, in the present technology, as long as the time lag and the distortion of an image are small to the extent that does not cause a problem, it is also possible to scan for each plurality of rows (for example, several tens of rows) at high speeds instead of the simultaneous operation for all pixels. Furthermore, in the present technology, it is also possible to apply the global shutter operation not only to all pixels that appear in an image but also to a specified plurality of rows.

Furthermore, the conductive type of device structure of a unit pixel, which is described above, is merely an example, and an N type and a P type can be the other way around. The potentials of the above-mentioned units or the magnitude relation of the potential may be opposite, depending on whether a majority carrier that moves in a unit pixel is a hole or electron.

Moreover, the present technology can take the following structure, for example.

A solid-state imaging device includes a photoelectric conversion section configured to generate photocharges and a transfer gate that transfers the photocharges to a semiconductor region. A method for driving a unit pixel includes a step of accumulating photocharges in a photoelectric conversion section and a step of accumulating the photocharges in a semiconductor region. A method of forming a solid-state imaging device includes implanting ions into a well layer through an opening in a mask, implanting additional ions into the well layer through an opening in another mask, and implanting other ions into the well layer through an opening in yet another mask. An electronic device includes the solid-state imaging device.

7. Example 2

7-1 Structure of Known Unit Pixel

Prior to giving a description of the structure of a unit pixel 320 adopted for the CMOS image sensor 10 of FIG. 1, a description will be given of the structure of a unit pixel 220 disclosed in Patent Document 1 (Japanese Patent Application Laid-Open No. 2009-268083) in order to easily understand the problems with the CMOS image sensor 10 to be solved.
(Structure of Unit Pixel 220)

Figure 57:
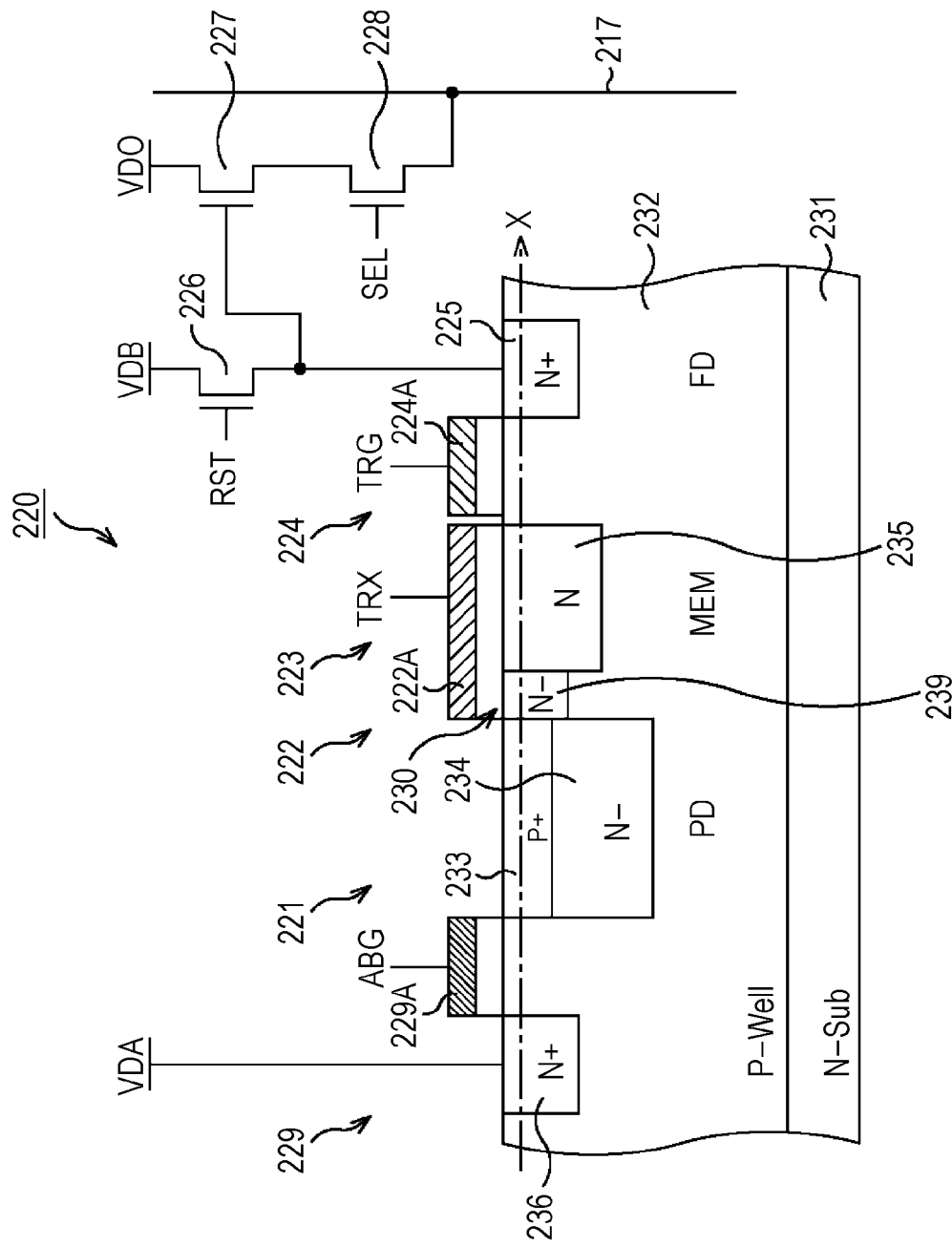
FIG. 57 is a view depicting the structure of a known unit pixel.

FIG. 57 is a view depicting the structure of the unit pixel 220 described in Patent Document 1.

The unit pixel 220 has a structure of mounting a charge holding region (hereinafter described as the "memory section") for holding (accumulating) photocharges to be transferred from a photoelectric conversion element apart from a floating diffusion region (capacitor). A detailed description will hereinafter be given of the unit pixel 220.

The unit pixel 220 includes a photodiode (PD) 221 as a photoelectric conversion element. The photodiode 221 is an embedded photodiode formed by forming a P-type layer 233 on a substrate surface side in a P-type well layer 232 formed on an N-type substrate 231 and burying an N-type buried layer 234.

The unit pixel 220 includes a first transfer gate 222, a memory section (MEM) 223, a second transfer gate 224, and a floating diffusion region (FD: Floating Diffusion) 225, in addition to the embedded photodiode 221. The memory section 223 and the floating diffusion region 225 are shielded from light. The floating diffusion region 225 may hereinafter also be referred to as the FD section 225.

The first transfer gate 222 transfers charges photoelectrically converted in the embedded photodiode 221 and accumulated therein by applying a transfer pulse TRX to a gate electrode 222A. The memory section 223 is formed of an N-type buried channel 235 formed beneath the gate electrode 222A and accumulates charges transferred by the first transfer gate 222 from the photodiode 221. Since the memory section 223 is formed of the buried channel 235, it is possible to suppress the occurrence of dark current at the Si—SiO$_2$ interface and therefor it is possible to contribute to an improvement in image quality In the memory section 223, the gate electrode 222A is disposed thereon and the transfer pulse TRX is applied to the gate electrode 222A; accordingly, it is possible to perform modulation on the memory section 223. In other words, the transfer pulse TRX is applied to the gate electrode 222A to deepen the potential of the memory section 223. Consequently, the saturation charge amount of the memory section 223 can be increased more than a case of not performing modulation.

Moreover, an N− impurity diffusion region (OFB) 239 is provided beneath the gate electrode 222A in a boundary area between the photodiode 221 and the memory section 223. The N− impurity diffusion region 239 forms a potential barrier φTRX that allows photocharges generated in the photodiode 221 to overflow to the memory section 223 even in a state where a sufficient voltage that turns off the first charge transfer gate 222 is applied if charges equal to or more than a specified amount are accumulated in the photodiode 221. Put another way, an overflow path (intermediate transfer path) 230 that allows photocharges generated in the photodiode 221 to overflow to the memory section 223 even in a state where a sufficient voltage that turns off the first transfer gate 222 is applied is formed. Moreover, the gate electrode 222A also includes a function as a complete transfer path that transfers all the charges accumulated in the photodiode 221 to the memory section 223 by the transfer pulse TRX being applied thereto. Here, the sufficient voltage that turns off the first transfer gate 222 is a voltage having a magnitude that forms an inversion layer in the Si surface. A P− impurity diffusion region 239 may be provided instead of the N− impurity diffusion region 239.

The second transfer gate 224 transfers the charges accumulated in the memory section 223 by the transfer pulse TRG being applied to the gate electrode 224A. The FD section 225 is a charge voltage conversion section formed of an N-type layer and converts the charges transferred by the second transfer gate 224 from the memory section 223 into a voltage.

The unit pixel 220 further includes a reset transistor 226, an amplifier transistor 227 and a select transistor 228. Here, N-channel MOS transistors are, for example, used for the reset transistor 226 to the select transistor 228. However, the combination of conductive types of the reset transistor 226 to the select transistor 228, which are illustrated here, is merely an example, and the combination is not limited to them.

The reset transistor 226 is connected to between a power supply VDB and the FD section 225, and resets the FD section 225 by a reset pulse RST being applied to an gate electrode thereof. A drain electrode of the amplifier transistor 227 is connected to a power supply VDO, a gate electrode thereof is connected to the FD section 225, and the amplifier transistor 227 reads voltage across the FD section 225.

For example, a drain electrode of the select transistor 228 is connected to a source electrode of the amplifier transistor 227, a source electrode thereof is connected to a vertical signal line 217, respectively, and the select transistor 228 selects the unit pixel 220 from which a signal is to be read by a selection pulse SEL being applied to a gate electrode thereof. It is also possible to adopt a configuration where the select transistor 228 is connected to between the power supply VDO and the drain electrode of the amplifier transistor 227.

In terms of the reset transistor 226 to the select transistor 228, one or a plurality of them can also be omitted or shared between a plurality of pixels depending on the method for reading out a signal.

The unit pixel 220 further includes a charge drain section 229 for draining away the accumulated charges of the photodiode 221. The charge drain section 229 drains the charges of the photodiode 221 to a drain section 236 of an N-type layer by a control pulse ABG being applied to a gate electrode 229A at the start of exposure. The charge drain section 229 further operates to prevent the saturation of the photodiode 221 and the overflow of charges during a read period after the end of exposure. A specified voltage VDA is applied to the drain section 236.

(Potential of Gate Electrode of Memory Section 223)

Here, a description will be given of the potential of the gate electrode 222A of the memory section 223 as a charge holding region.

In FIG. 57, the potential of the gate electrode of the memory section 223 as a charge holding region is set to a potential to bring a pinned state during a period for which at least either of the first transfer gate 222 and the second transfer gate 224, for example, the first transfer gate 222 is brought to a non-conducting state. More specifically, when the first transfer gate 222 or the second transfer gate 224 or both are brought to a non-conducting state, a voltage applied to the gate electrodes 222A and 224A is set to a voltage that brings a pinned state that can accumulate carriers in the Si surface directly beneath the gate electrodes.

As in the example, if a transistor forming a transfer gate is an N-type, when the first transfer gate 222 is brought to a non-conducting state, a voltage to be applied to the gate electrode 222A is set to a voltage that makes the potential of the P-type well layer 232 more negative than a ground GND. Although not illustrated, if a transistor forming a transfer gate is a P-type, the P-type well layer becomes an N-type well layer, and a voltage is set such that the potential of the N-type well layer is higher than the power supply voltage VDD.

The reason why a voltage to be applied to the gate electrode 222A is set to a voltage that brings a pinned state that can accumulate carriers in the Si surface immediately beneath the gate electrode when the first transfer gate 222 is brought to a non-conducting state is as follows:

In FIG. 57, assuming that the potential of the gate electrode 222A of the first transfer gate 222 is equal to that of the P-type well layer 232 (for example, 0 V), carriers generated from crystal defects in the Si surface may be accumulated in the memory section 223 to generate dark current and therefore an image quality may be deteriorated. Accordingly, in FIG. 57, an off (OFF) potential of the gate electrode 222A formed on the memory section 223 is set to a more negative potential, for example, −2.0 V, than that of the P-type well layer 232. Consequently, in the embodiment, it is possible during the charge holding period to generate holes (holes: Hole) in the Si surface of the memory section 223 and couple electrons (electrons: Electron) generated in the Si surface again. As a result, it is possible to reduce dark current.

In FIG. 57, since the gate electrode 224A of the second transfer gate 224 exists at the end of the memory section 223, it is possible to similarly suppress dark current generated at the end of the memory section 223 by also setting the gate electrode 224A to a negative potential.

The unit pixel 220 of FIG. 57 is characterized by using the overflow path 230 formed in the boundary area between the photodiode 221 and the memory section 223 as means for accumulating charges generated in a low light condition in the photodiode 221 with priority.

Figure 58:
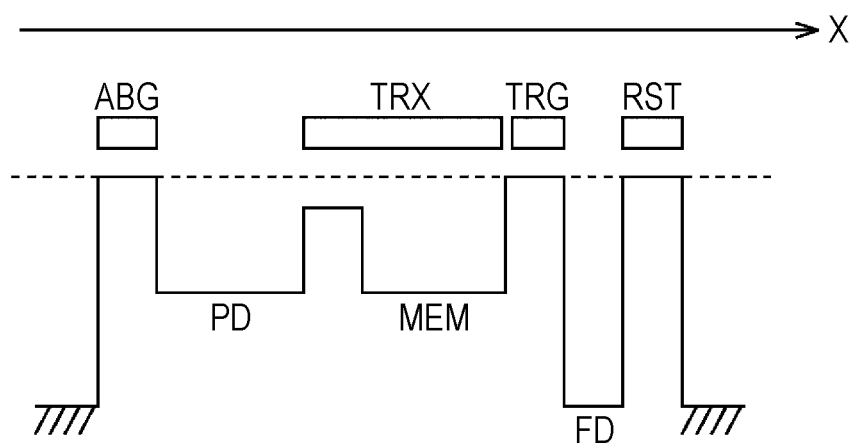
FIG. 58 is a potential diagram in the X direction in FIG. 57.

FIG. 58 depicts a potential diagram in the X direction of FIG. 57.

As is clear from the potential diagram in the X direction of FIG. 58, the N− impurity diffusion region 239 is provided in the boundary area between the photodiode 221 and the memory section 223 to decrease the potential of the boundary area. The portion where the potential decreases serves as the overflow path 230. Charges generated in the photodiode 221 and exceeding the potential of the overflow path 230 automatically leak to the memory section 223 to be accumulated in the memory section 223. Put another way, the generated charges equal to or less than the potential of the overflow path 230 are accumulated in the photodiode 221.

Here, the overflow path 230 has a function as an intermediate charge transfer section. In other words, in the exposure period during which all of a plurality of pixels simultaneously perform an imaging operation, the overflow path 230 as an intermediate charge transfer section transfers, to the memory section 223, charges generated by photoelectric conversion in the photodiode 221 and exceeding a specified charge amount determined by the potential of the overflow path 230.

(Operation of Accumulating Photocharges)

Figure 59:
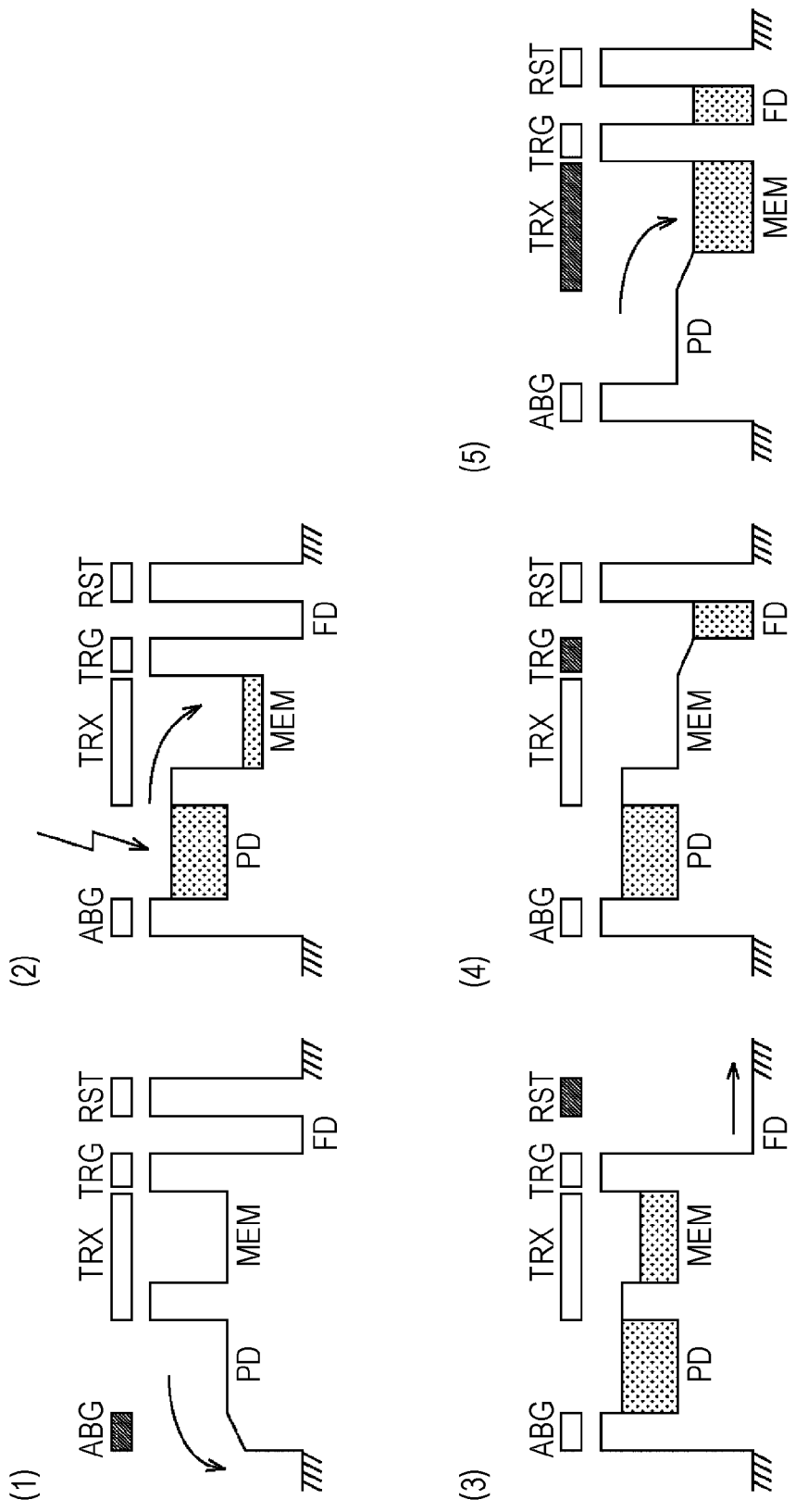
FIGS. 59(1) to 59(5) are views explaining an exposure operation.

A description will be given of operation from the start of exposure (start of accumulation) to the end of exposure (end of accumulation) with reference to FIGS. 59(1) to 59(5) and 60(1) to 60(5). FIGS. 59(1) to 59(5) depict the movements of the transfer of photocharges of when the brightness of the incident light is equal to or higher than specified brightness and the accumulated amount of photocharges is large, in other words, when the incident light is bright.

Firstly, (1) the control pulse ABG is applied to the gate electrode 229A to turn on the charge drain section 229 and drain the charges of the photodiode 221.

(2) The charge drain section 229 is turned off again, and photocharges generated in the photodiode 221 in accordance with the brightness of the incident light are accumulated in the photodiode 221 to start exposure. The charges accumulated in the photodiode 221 cross the potential barrier $\phi$TRX of the transfer path between the photodiode 221 and the memory section 223 (via the overflow path 230) to be accumulated in the memory section 223.

(3) The photocharges in accordance with the intensity of the incident light are accumulated in the photodiode 221 and the memory section 223. At the end of the exposure, the reset transistor 226 is turned on, and the charges of the FD section 225 are drained away (the reset operation).

(4) The transfer pulse TRG is applied to turn on the second transfer gate 224, and the charges accumulated in the memory section 223 are transferred to the FD section 225.

(5) Next, the transfer pulse TRX is applied to turn on the first transfer gate 222, and the charges accumulated in the photodiode 221 are transferred to the memory section 223.

Figure 60:
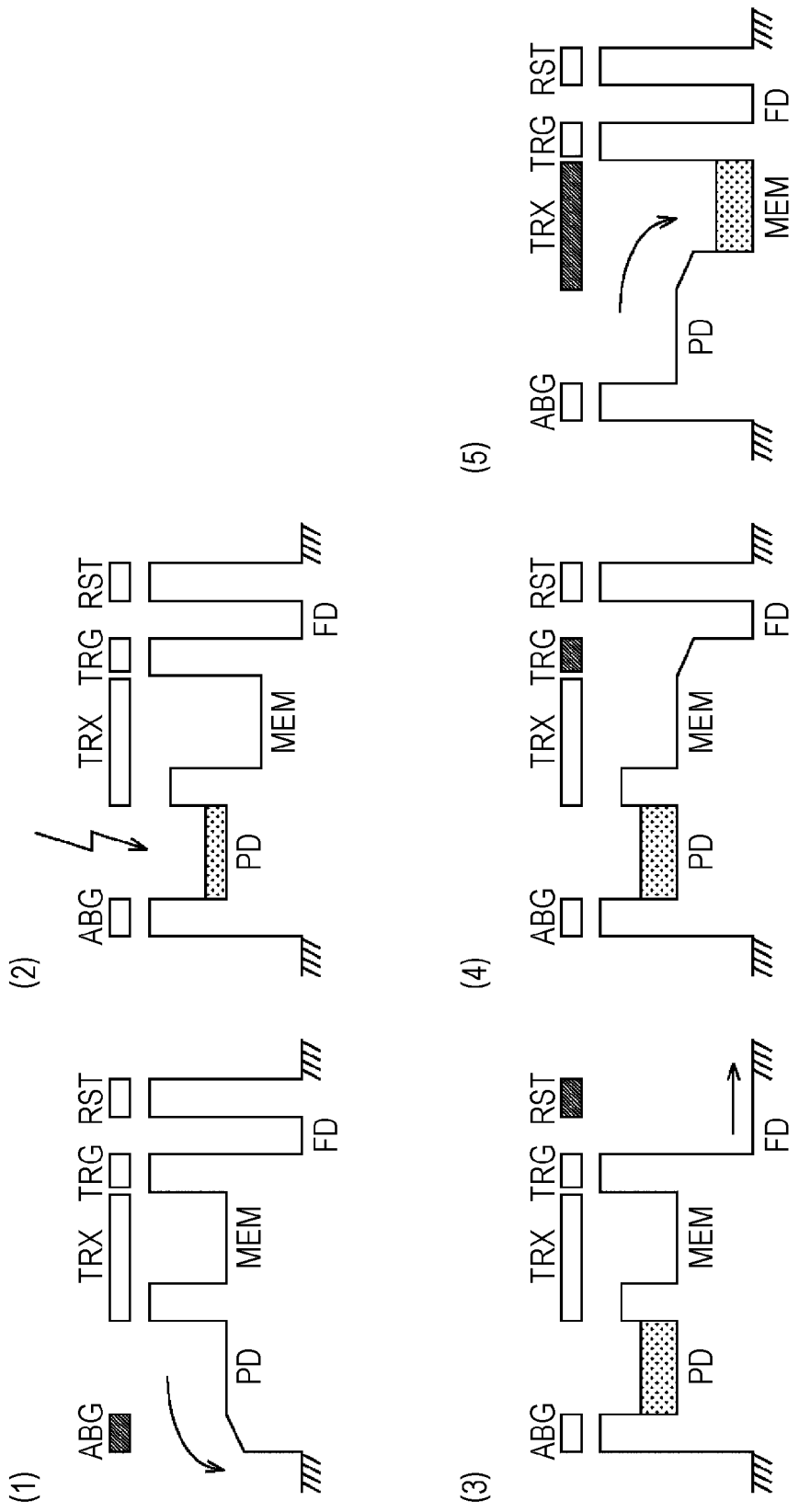
FIGS. 60(1) to 60(5) are views explaining an exposure operation.

The next FIGS. 60(1) to 60(5) depict the movements of the transfer of photocharges of when the brightness of the incident light is lower than specified brightness and the accumulated amount of photocharges is small, in other words, when the incident light is dark.

The drive is similar to that of FIGS. 59(1) to 59(5) also in the case where the incident light is dark. FIGS. 60(1) to 60(5) are different from FIGS. 59(1) to 59(5) in the respect that photocharges in accordance with the intensity of the incident light are accumulated only in the photodiode 221 as shown in FIGS. 59(2) and 59(3) since the incident light is dark. Put another way, if the incident light is dark, the accumulated charges do not cross the potential barrier $\phi$TRX of the transfer path. Therefore, (4) the application of the transfer pulse TRG does not cause charges to be transferred by the second transfer gate 224 to the FD section 225, but (5) the application of the transfer pulse TRX causes all the charges to be held by the first transfer gate 222 in the memory section 223.

Figure 61:
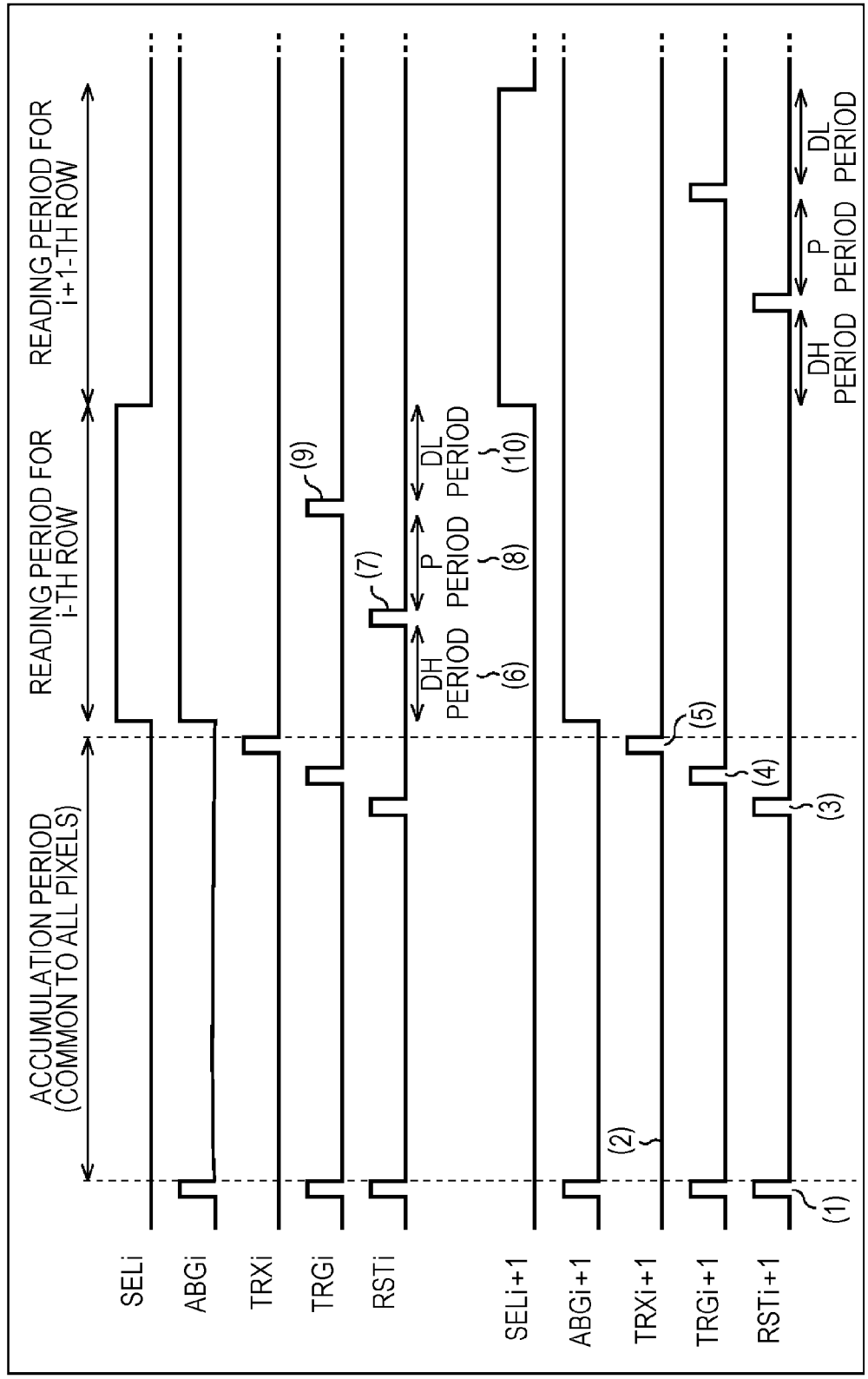
FIG. 61 is a timing chart depicting a method for driving the unit pixel.

FIG. 61 is a timing chart depicting a method for driving the unit pixel 220 of FIG. 57. In FIG. 61, (1) to (5) are operations corresponding to FIGS. 59(1) to 59(5) and 60(1) to 60(5), which are described above; accordingly, the description will be omitted.

With the transfer operations up to (5) at the end of exposure, charges are held in the memory section 223 and the FD section 225. As described above, no charge is held in the FD section 225 in a dark pixel.

(6) In a DH period, the charges accumulated in the FD section 225 are read as a first signal voltage via the amplifier transistor 227.

(7) The reset transistor 226 is turned on, and the charges of the FD section 225 are drained away.

(8) In a P period, the reset level of the FD section 225 is read.

(9) The transfer pulse TRG is applied to turn on the second transfer gate 224, and the charges held in the memory section 223 are transferred to the FD section 225.

(10) In a DL period, the charges of the FD section 225 are read as a second signal voltage via the amplifier transistor 227.

The first and second signal voltages can obtain the effect of noise removal by computing a difference from the reset voltage read in the P period. At this time, kTC noise by the reset operation is superimposed on the signal voltage held in the FD section 225; however, kTC noise is removed from the signal voltage held in the memory section 223. The signal is held in the FD section 225 only when the incident light is bright, and since a large amount of signal charges is obtained, light shot noise becomes a dominant noise component, and the deterioration of image quality due to kTC noise can be ignored. For example, the light shot noise generated in a signal charge of 10,000e- is e-rms, and the SN ratio is 40.00 dB. The kTC noise can be obtained by $\sqrt{(kT/C)}$ and is 25.4 e-rms. Assuming that k is the Boltzmann coefficient, $1.38 \times 10^{-23}$ (J/K), T is a temperature of 300 (K), and C is a general capacitance of the FD section 225, for example, 4 fF. The total of the light shot noise and the kTC noise is 103.2 e-rms, and the SN ratio is 39.73 dB, and the difference is slight.

On the other hand, if the incident light is dark and the amount of signal charges is small, all charges are held in the memory section 223, and it is possible to remove the kTC noise by computing a difference from the reset signal.

Moreover, as is clear from using both of the photodiode 221 and the memory section 223 for the accumulation during the exposure period, the maximum accumulable charge amount is equal to that of the pixel structure without the memory section 223 installed. Consequently, the unit pixel 220 of FIG. 57 can solve conspicuous deterioration of image quality due to the kTC noise, and further enables the simultaneous global exposure operation on all pixels without reducing the maximum accumulable charge amount.

(Prerequisite for Avoiding Breakdown of Output Image)

Here, a description will be given of a prerequisite for avoiding the breakdown of an output image in the unit pixel 220 of FIG. 57.

Assuming that signal charges accumulated in accordance with the intensity of the incident light are Qsig, charges transferred by the second transfer gate 224 to the FD section 225 are Qh, and charges transferred by the first transfer gate 222 to the memory section 223 are Q1, then the signal charges Qsig=the charges Qh+the charges Q1. Here, as described with reference to FIGS. 60(1) to 60(5), if the incident light is dark and the accumulated charges do not cross the potential barrier $\phi$TRX between the photodiode 221 and the memory section 223, then Qh=0.

Furthermore, assuming that a maximum value of the charges Q1 determined by the potential barrier $\phi$TRX is Qp, if the incident light is bright and the accumulated charges being Qsig>Qp is obtained, then the charges Qh obtained by Qh=Qsig−Qp are transferred by the second transfer gate 224 to the FD section 225 to be held. At this time, assume that the potential barrier $\phi$TRX varies, and a pixel of $\phi$TRX+$\Delta\phi$TRX exists. Assuming that the amount of change of the charges Qp by the difference of the potential barrier $\Delta\phi$TRX is $\Delta$Qp, if the accumulated charges Qsig exceed Qp+$\Delta$Qp, the accumulation in the memory section 223 starts and the charges Qh become the charges Qh>0 and are held in the FD section 225.

In other words, if the signal charges Qsig the charges Qp+the amount of change $\Delta$Qp, the charges Q1=the signal charges Qsig, and the charges Qh=0. Both outputs are added to have the charges Qh+the charges Q1=the signal charges Qsig and obtain a correct signal. On the other hand, also if the signal charges Qsig>the charges Qp+the amount of change ΔQp, the charges Qh and Q1 are the charges Qh=the signal charges Qsig−(the charges Qp+the amount of change ΔQp), and are read as the charges Q1=the charges Qp+the amount of change ΔQp, and both outputs are added. Accordingly, the charges Qh+the charges Q1=the signal charges Qsig, similarly, to obtain a correct signal. Especially if the output of the charges Q1 is sufficiently smaller than the charges Qp, it is possible to avoid the superimposition of noise by adding the charges Qh.

In this manner, if the charges Q1 (≤Qp) accumulated in the photodiode 221 after the charges Qh are transferred by the second transfer gate 224 have a charge amount that the memory section 223 can hold after being transferred by the first transfer gate 222 to the memory section 223, variation in the potential barrier φTRX does not break down an output image.

Here, if the maximum charges that the memory section 223 can hold are Qm, the condition is that the maximum charges Qm≥the charges Qp in order to obtain an output image without breakdown. If the area of the memory section 223 is expanded and the area of the photodiode 221 is reduced, it is easy to have a relationship to the potential barrier φTRX of the maximum charges Qm≥the charges Qp. However, in reality, the area of the opening is increased by increasing the area of the photodiode 221 to make the sensitivity better, or the range of a signal with low noise, on which the kTC noise is not superimposed, can be extended by increasing the charges Qp, and the like, and therefore it is important to achieve higher image quality by maximizing the charges Qp while maintaining the relationship of the maximum charges Qm≥the charges Qp.

Especially, if the signal charges Qsig≤the charges Qp, it is preferable that the charges Qh should not be added to the charges Q1 and output to prevent noise from being superimposed; however, if the charges Qh≈0, addition is necessary and accordingly it is necessary to judge whether to add a minimum value of the charges Qp as a threshold value. In other words, if there exists a pixel having the charges Qp−the amount of change ΔQp as a minimum value due to large variation in the potential barrier φTRX, then there is a problem to narrow a signal region with low noise, where noise of the charges Qh is not superimposed. Moreover, since it is necessary to meet the charges Qm≥the charges Qp, if there exists a pixel where the charges Qp+the amount of change ΔQp as a maximum value, then it is necessary to increase the charges Qm, and there is a problem that the charges Qp are reduced with the expansion of the memory section 223 and the reduction of the photodiode 221.

Therefore, a reduction in variation of the potential barrier φTRX is necessary to improve the sensitivity with the maximization of the area of the photodiode 221 and achieve higher quality of an output image with the maximization of the low noise signal range.

7-2 Problems to Be Solved

However, as in the unit pixel 220 of FIG. 57, if the potential barrier φTRX is formed by the transfer path of the first transfer gate 222 between the photodiode 221 and the memory section 223, there is a limit to a reduction in variation of the potential barrier φTRX for the following reason.

It is preferable to design an interval L (hereinafter appropriately referred to as the L length), shown in FIG. 62A, of the impurity diffusion region (OFB) 239 forming the potential barrier φTRX as narrow as possible to maximize the accumulated charges Qp of the photodiode 221 and the maximum charge amount Qm of the memory section 223.

Figure 62:
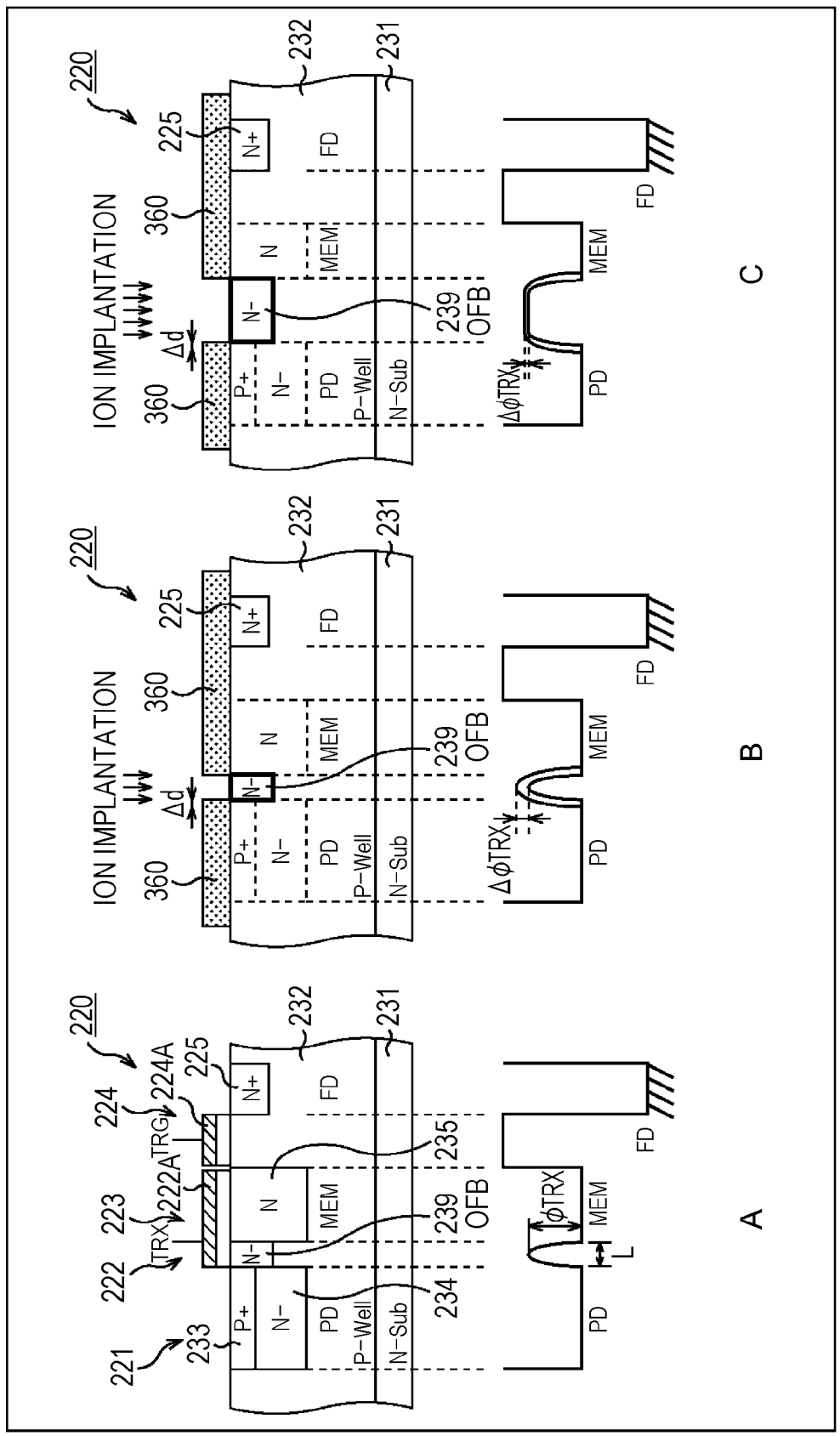
FIGS. 62A to 62C are views explaining problems to be solved.

However, as shown in FIG. 62B, the L length of the impurity diffusion region 239 is designed to be narrow; accordingly, a variation Δd in the width of a resist by a resist mask 360 provided at the time of ion implantation greatly influence a variation ΔφTRX in the potential barrier φTRX. In other words, if the L length of the impurity diffusion region 239 is designed to be narrow to secure the areas of the photodiode 221 and the memory section 223, the density of the impurities of the impurity diffusion region 239 changes greatly due to a change in the variation Δd in the width of a resist and it also causes a large change in the variation ΔφTRX in the potential barrier φTRX.

In contrast, as shown in FIG. 62C, if the L length of the impurity diffusion region 239 is designed to be wide, it is possible to suppress the variation ΔφTRX in the potential barrier φTRX; however, the areas of the photodiode 221 and the memory section 223 are largely reduced. Therefore, from the perspective of the maximization of the accumulated charges Qp of the photodiode 221 and of the maximum charge amount Qm of the memory section 223, it is difficult to extend the length of the transfer path (L length) in the structure where the first transfer gate 222 serves as both of the intermediate transfer path (overflow path 230) and the complete transfer path.

Moreover, the impurity diffusion region (OFB) 239 that forms the overflow path 230 designed to fall in a state of depletion before the charge accumulation is modulated by the charge accumulation of the photodiode 221.

Figure 63:
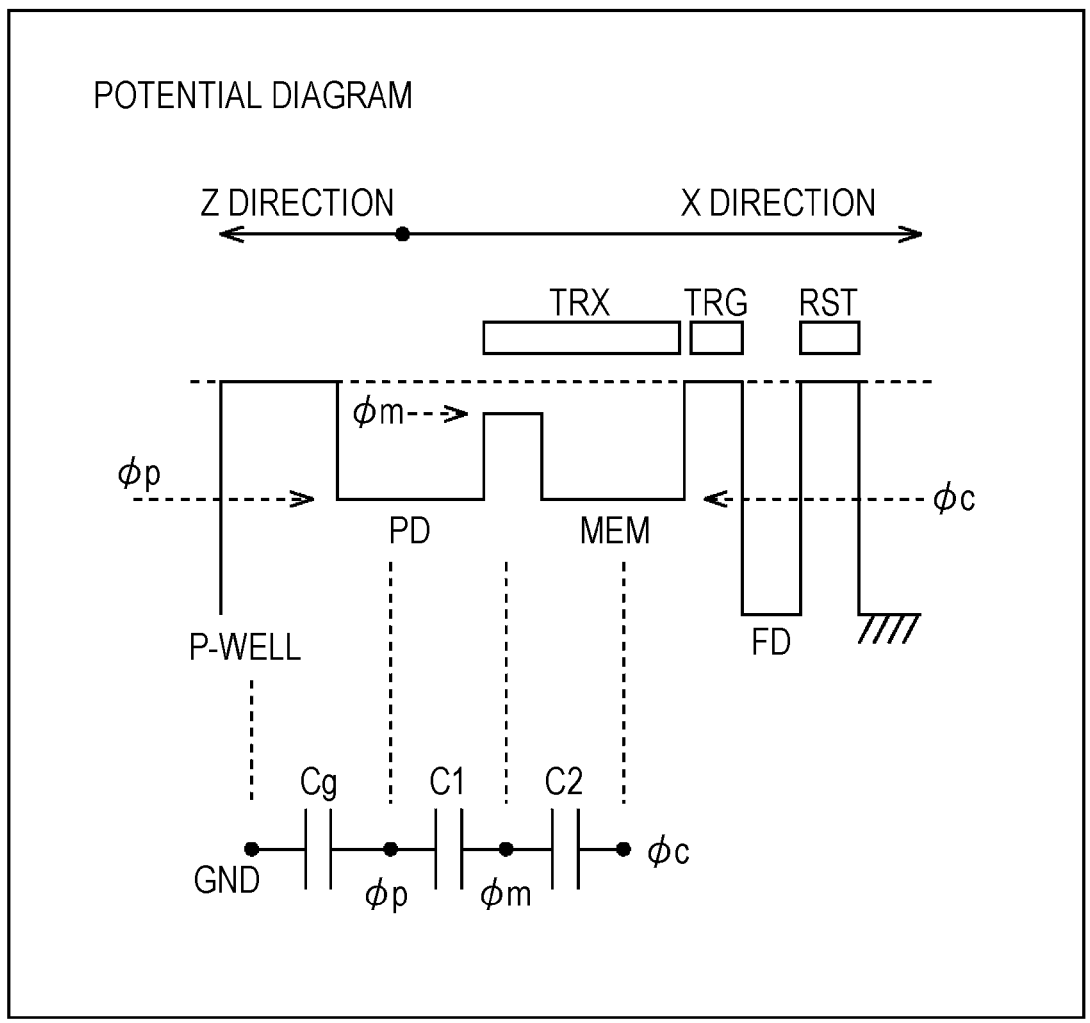
FIG. 63 is a view explaining a problem to be solved.

For example, as shown in FIG. 63, assuming that the capacitance between the photodiode 221 and the potential barrier φTRX is C1, the other capacitance of the photodiode 221 is Cg, and the capacitance between the memory section 223 and the potential barrier φTRX is C2, then the capacitance Cp to accumulate charges is expressed as Cp=Cg+C1·C2/(C1+C2). In this case, if the charges of ΔQsig are accumulated in the photodiode 221, the potential φp of the photodiode 221 changes by Δφ=ΔQsig/Cp. At this time, the potential barrier φTRX is modulated by ΔφTRX(p)=(C1/(C1+C2))·Δφp. In other words, ΔφTRX(p) represents the modulation of the potential barrier φTRX by a change in the potential of the photodiode by the charge accumulation of the photodiode 221.

It is more preferable that the variation ΔφTRX(p) in the potential barrier φTRX caused by the barrier modulation by the charge accumulation of the photodiode 221 is also reduced. However, it is necessary to bring the deepest point of the potential of the photodiode 221 close to the complete transfer path in order to increase the transfer efficiency of the complete transfer path. Therefore, the unit pixel 220 of FIG. 57 has a structure that is difficult to obtain the effect of reducing the modulation amount ΔφTRX(p) of the potential barrier φTRX due to a reduction in the capacitance C1 between the photodiode 221 and the potential barrier φTRX.

In this manner, it is difficult in the unit pixel 220 of FIG. 57 to reduce the modulation amount ΔφTRX(p) of the potential barrier φTRX by the charge accumulation of the photodiode 221. Accordingly, the amount of change ΔQp among (the charges Qp+the amount of change ΔQp) that should be considered as the maximum value of the charges Qp upon meeting the maximum charges Qm the charges Qp is increased. As a result, it becomes necessary to additionally increase the maximum charges Qm.

7-3 Unit Pixel of the Embodiment

Structure of Unit Pixel 320

Figure 64:
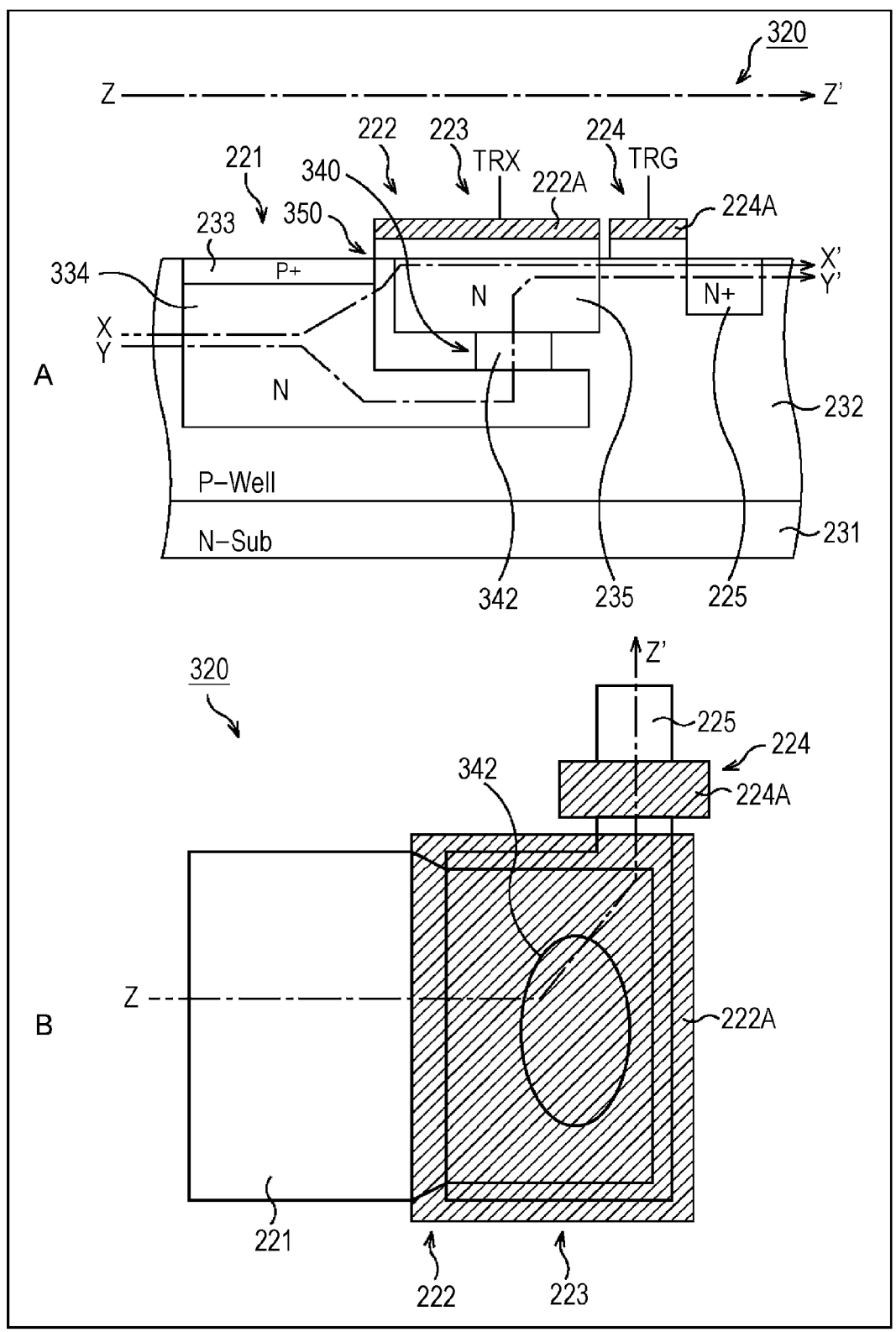
FIGS. 64A and 64B are views depicting the structure of the unit pixel adopted in the CMOS image sensor of FIG. 1.

Hence, in order to improve the limit to a reduction in variation of the unit pixel 220 of FIG. 57, in other words, in order to promote a reduction in variation of the potential barrier φTRX and a reduction of the modulation amount ΔφTRX(p) of the potential barrier φTRX, the CMOS image sensor 10 in the embodiment adopts a structure to make an intermediate transfer path robust, shown in FIGS. 64A and 64B.

In other words, FIGS. 64A and 64B depict the structure of the unit pixel 320 adopted in the CMOS image sensor 10. FIG. 64A is a cross-sectional view of the unit pixel 320, taken along arrow Z-Z' shown in FIG. 64B, and FIG. 64B is a plan view depicting the configuration of the unit pixel 320.

In the unit pixel 320, an N-type buried layer 334 of the photodiode 221 is formed in a manner of extending beneath the memory section 223 (on the deeper side of the substrate). Put another way, the N-type buried layer 334 is formed into an L shape in a cross section shown in FIG. 64A. The region of the N-type buried layer 334 of the photodiode 221, which extends to the memory section 223 side, substantially overlaps with the gate electrode 222A of the memory section 223 as shown in FIG. 64B.

In the unit pixel 320, an impurity diffusion region 342 is formed in the boundary area between an undersurface of the buried channel 235 of the memory section 223 and a top surface of the N-type buried layer 334 extending beneath the memory section 223; accordingly, an intermediate transfer path 340 is provided. Therefore, the intermediate transfer path 340 is not controlled (modulated) by the first transfer gate 222.

In this manner, the impurity diffusion region 342 is formed in the boundary area between the undersurface of the buried channel 235 and the top surface of the N-type buried layer 334; accordingly, it is possible to suppress leakage of the incident light to the impurity diffusion region 342, for example, compared with a case where the impurity diffusion region 342 is formed in the boundary area between the side surfaces of the buried channel 235 and the N-type buried layer 334.

Moreover, the intermediate transfer path 340 is formed only by the distribution of impurities in a depth direction; accordingly, variation caused by a line width and the lamination of masks is reduced and therefore it is possible to reduce variation in the potential barrier φTRX.

Put another way, it is possible to stably form the potential barrier φTRX that determines a specified charge amount that the accumulated charges of the photodiode 221 overflow into the memory section 223, due to the density of the impurities of the impurity diffusion region 342 that forms the intermediate transfer path 340.

As described above, in the unit pixel 320, it is possible to reduce change in the potential barrier φTRX, which is caused by the misalignment of a mask, variation in the width of a resist, the diffusion of the impurities from the highly-dense impurity diffusion region, the position and potential of the electrode of the first transfer gate 222, and the accumulated charge amount of the photodiode 221.

On the other hand, a complete transfer path 350 is formed on the surface side, similarly to the unit pixel 220 of FIG. 57. Therefore, the transfer pulse TRX is applied to the first transfer gate 222 to perform complete transfer via the complete transfer path 350.

Since the intermediate transfer path 340 and the complete transfer path 350 are isolated and it is possible to form the potential barrier φTRX that is stable due to the density of the impurities of the impurity diffusion region 342, it is possible to achieve an improvement in the sensitivity by maximizing the area of the photodiode 221, and higher quality of an output image by maximizing the low noise signal range, without decreasing the transfer efficiency of complete transfer.

As shown in FIG. 64B, the impurity diffusion region 342 may be disposed in a position further away from the photodiode 221 than the illustrated position or may be disposed in a manner of being away from the deepest point of the potential of the photodiode 221, in addition to being disposed in the vicinity of the center of the memory section 223, from a plan point of view. The impurity diffusion region 342 to serve as the intermediate transfer path 340 is disposed in a position away from the photodiode 221 in this manner; accordingly, it is possible to further reduce leakage of the incident light.

(Considerations for Designing Unit Pixel 320)

However, the following considerations need to be given to the unit pixel 320 having the structure to make the intermediate transfer path robust, shown in FIGS. 64A and 64B.

A description will be given of a problem that may arise in the unit pixel 320 having the structure to make the intermediate transfer path robust with reference to FIGS. 65A and 65B and 66A to 66C.

FIGS. 65A and 65B depict potential diagrams of the intermediate transfer path and the complete transfer path of when the overflow path 230 as the intermediate transfer path of the unit pixel 220 shown in FIG. 57 is simply rearranged to beneath the memory section 223 (in the depth direction). FIG. 65A depicts the potential diagram of the complete transfer path in the cross section taken along arrow X-X' of FIG. 64A, and FIG. 65B depicts the potential diagram of the intermediate transfer path in the cross section taken along arrow Y-Y' of FIG. 64A.

It is sufficient if the complete transfer path of FIG. 65A can completely deplete the photodiode 221 when the first transfer gate 222 is turned on. Therefore, the overflow path 230 of the unit pixel 220 shown in FIG. 57 is unnecessary and therefore a barrier between the photodiode 221 and the memory section 223 is formed to be higher than that of when the overflow path 230 is provided.

On the other hand, the potential barrier φTRX of the intermediate transfer path of FIG. 65B corresponds to the overflow path 230 of the unit pixel 220 shown in FIG. 57 and accordingly is formed to be lower than the complete transfer path of when the first transfer gate 222 is turned off. However, the intermediate transfer path is not controlled by the first transfer gate 222; accordingly, the potential barrier φTRX does not change even when the first transfer gate 222 is turned on. Moreover, the deepest point of the potential of the photodiode 221 is formed in an area close to the complete transfer path in order to increase the transfer efficiency of complete transfer; accordingly, the distance to the intermediate transfer path naturally becomes farther. Consequently, the modulation amount ΔφTRX(p) of the potential barrier φTRX dependent on the accumulated charge amount of the photodiode 221 can be reduced.

As described above, the structure to make the intermediate transfer path robust extends the distance between the deepest point of the potential of the photodiode 221 and the intermediate transfer path becomes farther; accordingly, it is possible to reduce the modulation amount ΔφTRX(p) of the potential barrier φTRX by the charge accumulation of the photodiode 221. However, conversely, the intermediate transfer path becomes close to the deepest point of the potential of the memory section 223; accordingly, a modulation amount ΔϕTRX(m) of the potential barrier ϕTRX in relation to the charge accumulation of the memory section 223 may become relatively large. In this case, the charges Qh to be transferred by the second transfer gate 224 to the FD section 225 are reduced (compared with an amount expected from the area of a pixel).

A more detailed description will be given with reference to FIGS. 66A to 66C.

Figure 66:
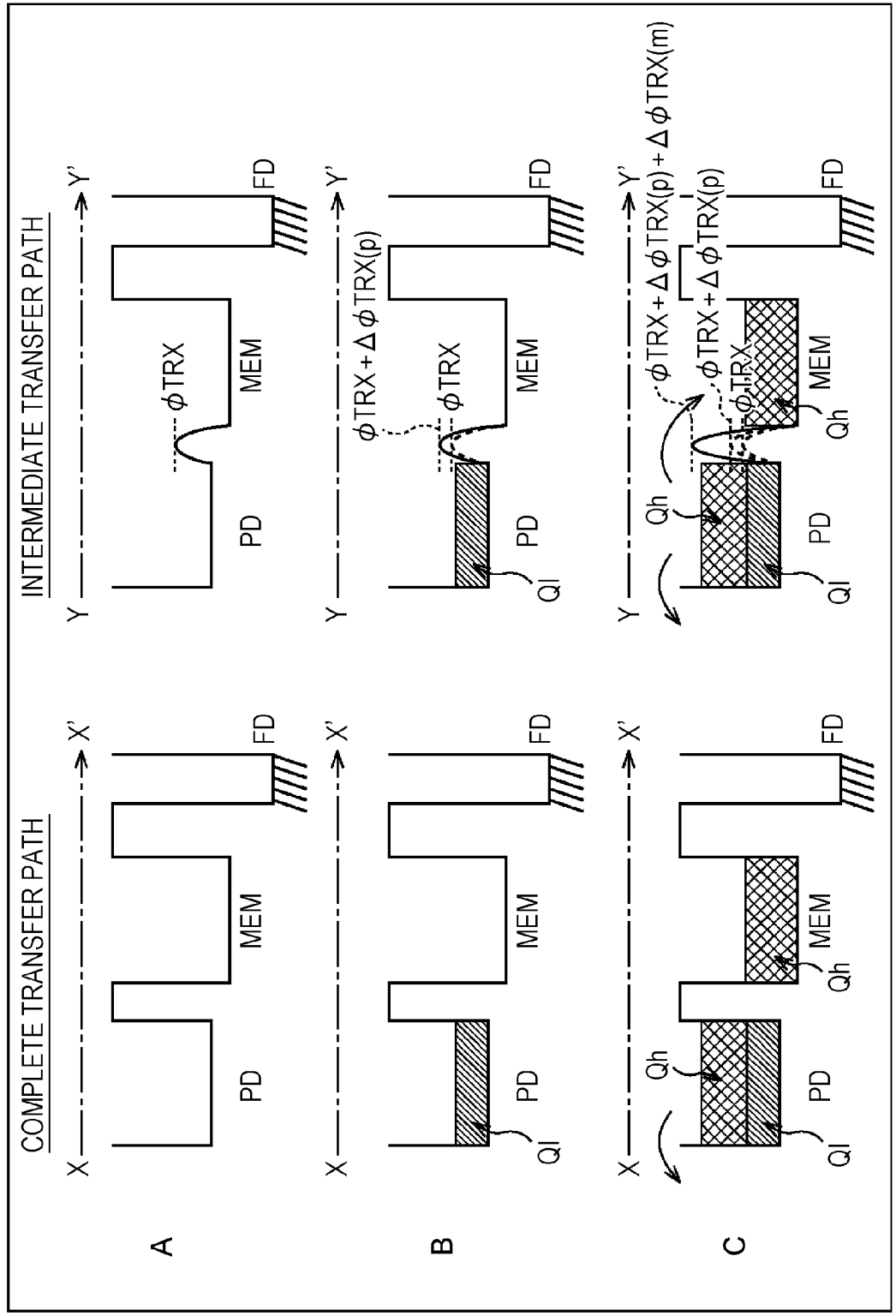
FIGS. 66A to 66C are views explaining considerations to the unit pixel in the embodiment.

FIG. 66A depicts a depletion state where charges are not accumulated in either of the photodiode 221 and the memory section 223, and is the same state as the states shown in FIGS. 65A and 65B.

In the depletion state where charges are not accumulated in either of the photodiode 221 and the memory section 223, the height (potential barrier) of the intermediate transfer path is ϕTRX.

FIG. 66B depicts a state where charges photoelectrically converted from incident light are accumulated (only) in the photodiode 221.

With the charge accumulation of the photodiode 221, the intermediate transfer path is modulated, and a height thereof is ϕTRX+ΔϕTRX(p). Assume that the modulation amount ΔϕTRX(p) is changed by the amount of charges accumulated in the photodiode 221, and ΔϕTRX(p) shown in FIG. 66B is a modulation amount in a state where charges are accumulated up to the maximum amount in the photodiode 221 alone. ϕTRX+ΔϕTRX(p) is sufficiently lower (smaller) than the heights of the barriers of the other paths, viewed from the photodiode 221; accordingly, the photoelectric conversion is further performed in the photodiode 221 in the state of FIG. 66B, and if charges are generated, all the generated charges overflow to the memory section 223 side. Consequently, if the charges Q1 and the charges Qh are added in the end, the linearity of a signal in relation to the amount of light is maintained.

FIG. 66C depicts a state where the charges further photoelectrically converted and generated in the photodiode 221 from the state of FIG. 66B overflow into the memory section 223.

The charges overflowing from the photodiode 221 are accumulated in the memory section 223. The height ϕTRX of the intermediate transfer path is further modulated by the accumulated charges in the memory section 223, which results in ϕTRX+ΔϕTRX(p)+ΔϕTRX(m). Here, ΔϕTRX(m) is a modulation amount of the potential barrier ϕTRX in relation to the charge accumulation of the memory section 223. The problem at this time is that the modulation amount ΔϕTRX(m) of the potential barrier ϕTRX in relation to the charge accumulation of the memory section 223 is large. In other words, since the intermediate transfer path is formed on the deeper side in the depth direction in relation to the memory section 223, the distance between the intermediate transfer path and the deepest point of the potential of the memory section 223 is close. In addition, since the intermediate transfer path is floating, it is easy to be modulated by potential change by the charge accumulation of the memory section 223. Accordingly, the height of the potential barrier becomes as high as ϕTRX+ΔϕTRX(p)+ΔϕTRX(m), and the potential differences from the other barriers, viewed from the photodiode 221, become small. As a result, a phenomenon where the accumulated charge amount of the memory section 223 starts overflowing into other than the memory section 223 before reaching a charge amount that can be intrinsically accumulated in the memory section 223. Here, the charge amount that can be intrinsically accumulated in the memory section 223 indicates an area including an empty area of the memory section 223 above the charges accumulated in the memory section 223, which is shown in FIG. 66C. If the overflow path from the photodiode 221 to other than the memory section 223 is generated in the state where there is the empty area, it is not possible to make full use of the accumulation capability that the memory section 223 intrinsically has. As a result, the linearity of a signal in relation to the amount of light collapses, and the signal range (saturation signal amount) that can be actually used becomes narrow.

In order to simply solve the problem, it is considered to increase the potential differences between the intermediate transfer path and the other paths by either method of (1) making barriers of other than the intermediate transfer path viewed from the photodiode 221 still higher and (2) lowering the intermediate transfer path. However, the two measures are not available for the following reasons. Considering (1), since signals are originally prevented from overflowing (blooming) between adjacent pixels, the barriers of the other buses are formed to be sufficiently high; accordingly, it is usually impossible to further increase their heights. Moreover, considering (2), since the charges Q1 accumulated in the photodiode 221 alone are reduced, the FD section 225 (the charges Qh) is to be used from a region whose amount of signal is small; accordingly, S/N is deteriorated and therefore it is not possible to simply make a selection thereof.

Figure 67:
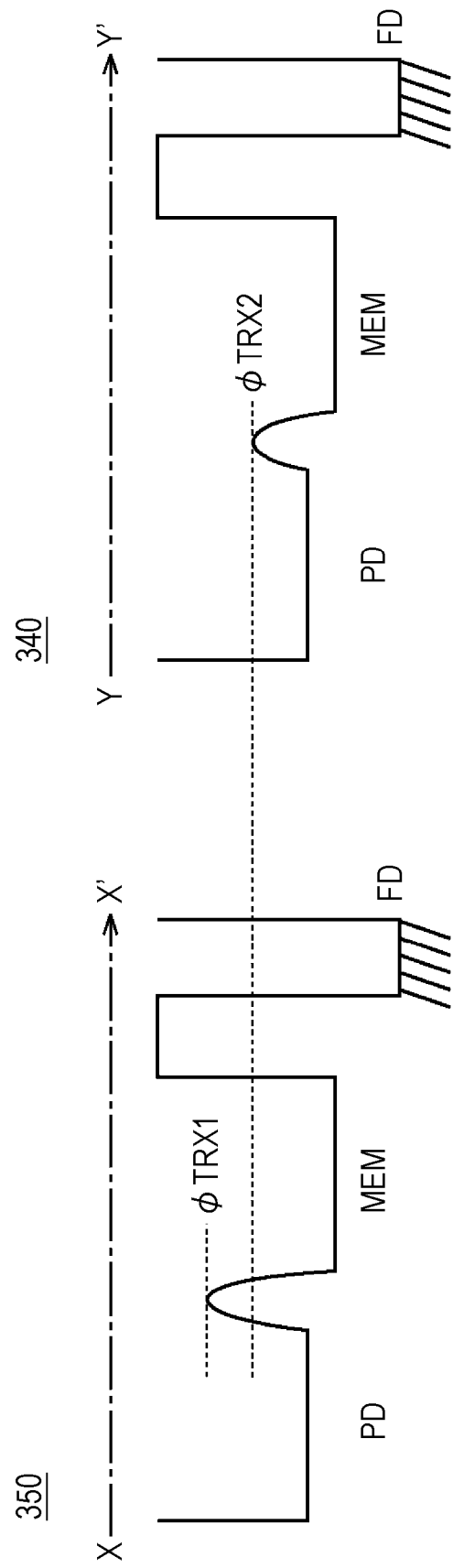
FIG. 67 is a potential diagram of the unit pixel in the embodiment.

Hence, the unit pixel 320 of the CMOS image sensor 10 adopts a structure shown in FIG. 67.

FIG. 67 depicts potential diagrams of the complete transfer path 350 (the first transfer path) in the cross section taken along arrow X-X' of FIG. 64A and the intermediate transfer path 340 (the second transfer path) in the cross section taken along arrow Y-Y' of FIG. 64A, in the unit pixel 320 of the CMOS image sensor 10.

As shown in FIG. 67, the height of a barrier of the complete transfer path 350, in other words, the height of a potential barrier ϕTRX1 is higher than the height of a barrier of the intermediate transfer path 340, in other words, the height of a potential barrier ϕTRX2. However, the height of the barrier of the complete transfer path 350 is lower than the heights of barriers of paths other than the transfer path from the photodiode 221 to the memory section 223. Therefore, if the intermediate transfer path 340 does not exist, all the charges accumulated in the photodiode 221 overflow into the memory section 223 via the complete transfer path 350. Conversely, if the intermediate transfer path 340 does not exist, the height of the barrier of the complete transfer path 350 (the height of the potential barrier ϕTRX1) is formed such that all the charges accumulated in the photodiode 221 overflow into the memory section 223 via the complete transfer path 350.

If the heights of the barriers of the complete transfer path 350 and the intermediate transfer path 340 are expressed in potential, the potential of the complete transfer path 350 is formed to be lower than the potential of the intermediate transfer path 340 and be higher than the potentials of the barriers of other than the transfer path from the photodiode 221 to the memory section 223.

The complete transfer path 350 has a structure to be sandwiched between the photodiode 221 and the memory section 223; accordingly, upon forming the intermediate transfer path 340, a difference in density between the density of the impurities of the memory section 223 being a charge transfer destination and the density of the impurities of the impurity diffusion region 342 to form the potential barrier ϕTRX2 is reduced, and barrier controllability in the impurity diffusion region 342 by impurity diffusion of the memory section 223 is not impaired.

Barriers of the paths other than the transfer path from the photodiode 221 to the memory section 223 include, for example, a barrier of a path from the photodiode 221 to the charge drain section 229, which is a barrier on the left side of the photodiode 221 in FIG. 67.

(Operation of Accumulating Photocharges in Unit Pixel 320)

A description will be given of the operation of accumulating photocharges in the unit pixel 320 formed as shown in FIG. 67 with reference to FIGS. 68A to 68C. The states shown in FIGS. 68A to 68C correspond to the states of FIGS. 66A to 66C.

Figure 68:
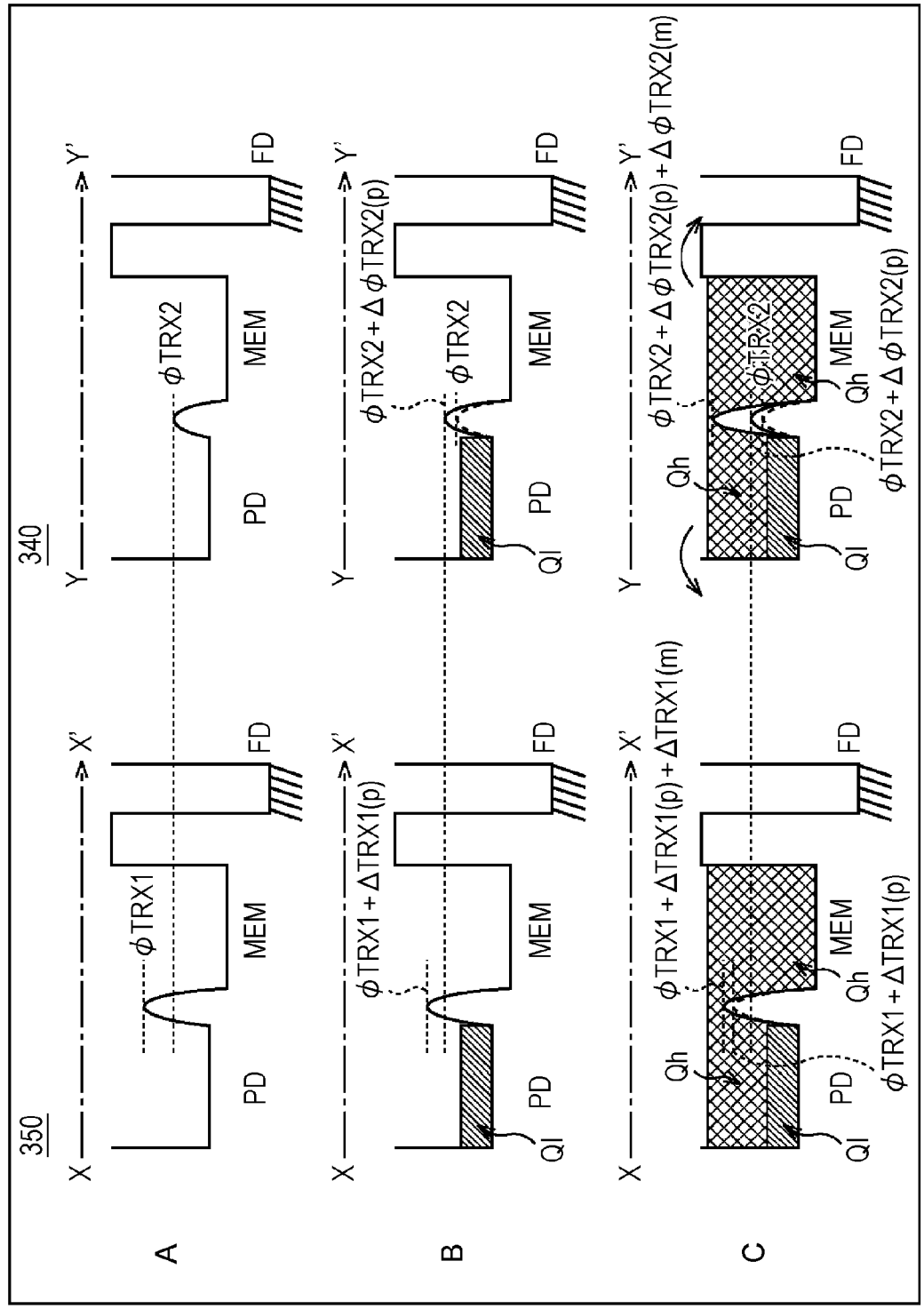
FIGS. 68A to 68C are views explaining the operation of accumulating photocharges in the unit pixel in the embodiment.

FIG. 68A depicts a depletion state where charges are not accumulated in either of the photodiode 221 and the memory section 223, and is the same state as the state shown in FIG. 67.

FIG. 68B depicts a state where charges photoelectrically converted from incident light are accumulated (only) in the photodiode 221.

With the charge accumulation of the photodiode 221, the complete transfer path 350 and the intermediate transfer path 340 are modulated, and heights thereof result in $\phi TRX1+\Delta\phi TRX1(p)$ and $\phi TRX2+\Delta\phi TRX2(p)$, respectively. The height $\phi TRX2+\Delta\phi TRX2(p)$ of the barrier of the intermediate transfer path 340 is formed to be lower than the height $\phi TRX1+\Delta\phi TRX1(p)$ of the barrier of the complete transfer path 350. Accordingly, if charges equal to or more than a specified amount are generated in the photodiode 221, firstly the charges overflow from the photodiode 221 to the memory section 223 via the intermediate transfer path 340.

The charges Q1 accumulated in the photodiode 221 are limited to the height $\phi TRX2$ of the barrier of the intermediate transfer path 340. The height $\phi TRX2$ of the barrier of the intermediate transfer path 340 can be formed in a manner of resisting the modulation by the accumulation of the photodiode 221 and being robust from the perspective of a process (is not influenced by variation in the mask line width and lamination). Therefore, it is possible to design the charges Q1 sufficient for the need.

FIG. 68C depicts a state where charges overflowing from the photodiode 221 are accumulated in the memory section 223.

If the charges overflowing from the photodiode 221 are accumulated in the memory section 223, the height $\phi TRX2$ of the barrier of the intermediate transfer path 340 susceptible to modulation in relation to the accumulation of the memory section 223 is progressively increased. In other words, the height of the barrier of the intermediate transfer path 340 is increased by the modulation amount $\Delta\phi TRX2(m)$ in relation to the accumulation to the memory section 223, which results in $\phi TRX2+\Delta\phi TRX2(p)+\Delta\phi TRX2(m)$.

However, the barrier of the complete transfer path 350 resists modulation in relation to the accumulation of the memory section 223, compared with the barrier of the intermediate transfer path 340. Accordingly, even if the intermediate transfer path 340 is modulated, and the height thereof is increased to $\phi TRX2+\Delta\phi TRX2(p)+\Delta\phi TRX2(m)$, then the complete transfer path 350 functions as an overflow path. In other words, after a certain amount of charges is accumulated in the memory section 223, the height $\phi TRX1+\Delta\phi TRX1(p)+\Delta\phi TRX1(m)$ of the barrier of the complete transfer path 350 becomes lower than the height of $\phi TRX2+\Delta\phi TRX2(p)+\Delta\phi TRX2(m)$ of the barrier of the intermediate transfer path 340. Consequently, after the certain amount of charges is accumulated in the memory section 223, all the charges generated in the photodiode 221 overflow into the memory section 223 via the complete transfer path 350.

Therefore, the unit pixel 320 of FIG. 67 can prevent overflowing from the photodiode 221 to other than the memory section 223 before the memory section 223 is saturated since the modulation amount $\Delta TRX1(m)$ of the potential barrier $\phi TRX1$ in relation to the charge accumulation of the memory section 223 is large.

As described above, even if charges are accumulated in the memory section 223, the charges are caused to overflow (to be transferred) through the complete transfer path 350 that resists modulation compared with the intermediate transfer path 340; accordingly, it is possible to hold charges, making full use of the memory section 223. Consequently, it is possible to achieve high quality of an output image by maximizing the saturation signal amount, and by extension extending the signal range.

The reason why the barrier of the complete transfer path 350 resists modulation in relation to the accumulation of the memory section 223 compared with the barrier of the intermediate transfer path 340 is because it is biased via the first transfer gate 222 and is close to the P-type layer 233 being the dense P-type impurities, which is formed in the surface of the photodiode 221; accordingly, the capacitance component of the memory section 223 out of all the capacitances is held lower than the barrier of the intermediate transfer path 340.

Moreover, it is sufficient if the barrier of the complete transfer path 350 is formed to be higher than the barrier of the intermediate transfer path 340, and lower than the barriers other than that of the intermediate transfer path 340; accordingly, it is advantageous that there are fewer restrictions on the design of the unit pixel 320 of FIG. 67, compared with the unit pixel 220 of FIG. 57.

(Specific Example 1 to Realize Barriers of FIG. 67)

A description will be given of Specific Example 1 to form the heights of the barriers of the complete transfer path 350 and the intermediate transfer path 340 as shown in FIG. 67 with reference to FIG. 69.

Figure 69:
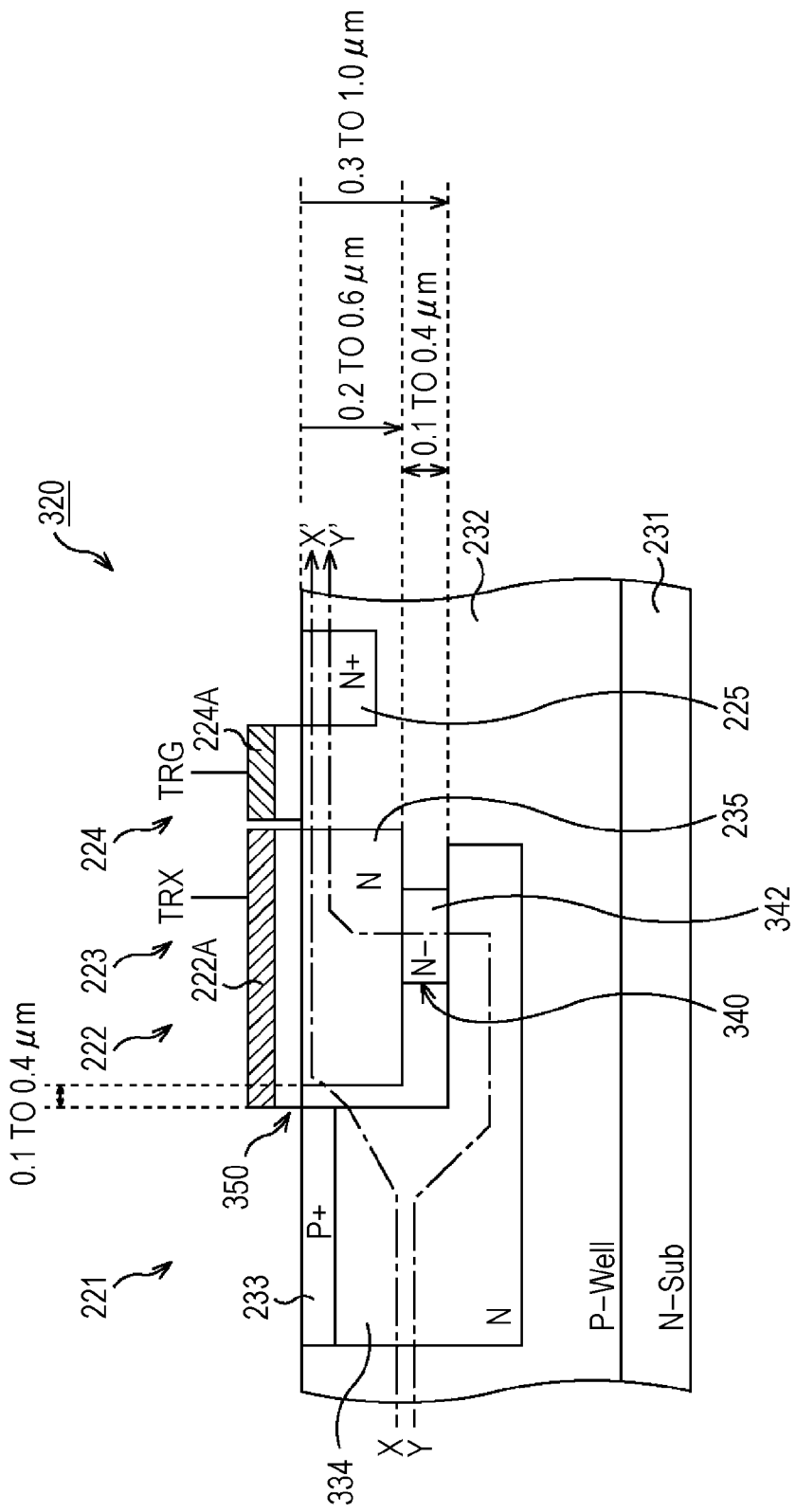
FIG. 69 is a view explaining Specific Example 1 of the unit pixel.

In the structure of the unit pixel 320 shown in FIG. 69, the distance (interval) between the impurity diffusion regions is adjusted to adjust the heights of the barriers of the complete transfer path 350 and the intermediate transfer path 340.

For example, the buried channel 235 of the memory section 223 is formed with a depth of approximately 0.2 to 0.6 μm from the substrate surface (interface) and the impurity diffusion region 342, which is the intermediate transfer path 340, is formed with a depth of approximately 0.1 to 0.4 μm from the undersurface of the buried channel 235. Therefore, the distance between the top surface of the N-type buried layer 334 formed beneath the buried channel 235 of the memory section 223 and the substrate surface (interface) is approximately 0.3 to 1.0 μm. Moreover, it is formed such that the distance in the horizontal direction between the buried channel 235 of the memory section 223 and the N-type buried layer 334 of the photodiode 221 is approximately 0.1 to 0.4 μm.

(Specific Example 2 to Realize Barriers of FIG. 67)

A description will be given of Specific Example 2 to form the heights of the barriers of the complete transfer path 350 and the intermediate transfer path 340 as shown in FIG. 67 with reference to FIG. 70.

Figure 70:
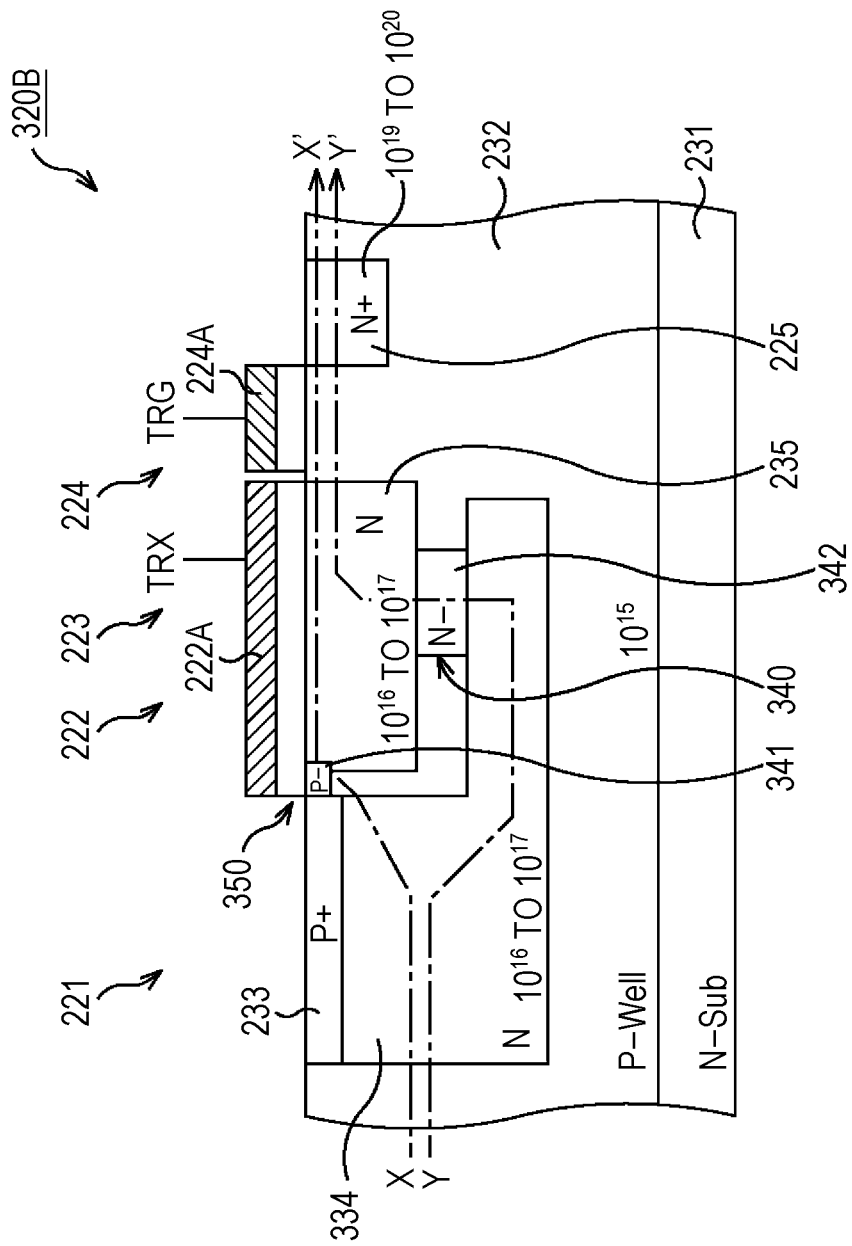
FIG. 70 is a view explaining Specific Example 2 of the unit pixel.

FIG. 70 depicts the structure of a unit pixel 320B that is a modification of the unit pixel 320.

In the unit pixel 320B of FIG. 70, an impurity diffusion region 341 is newly formed in the substrate surface between the N-type buried layer 334 and the buried channel 235. Consequently, the height of the barrier of the complete transfer path 350 is formed to be lower than the heights of the barriers of the paths other than the transfer path from the photodiode 221 to the memory section 223.

A description will be given of the density of each impurity diffusion region, which determines the heights of the barriers of the complete transfer path 350 and the intermediate transfer path 340 of the unit pixel 320B.

The photodiode 221 and the memory section 223 are formed in the density of the impurities, which brings a depletion state at the time of draining charges, and the FD section 225 is formed in the density of the impurities, which allows a wiring contact for extracting voltage to be electrically connected thereto.

More specifically, assume that the density of the P-type impurities of the P-type well layer 232 formed on the N-type substrate 231 is $10^{15}/cm^3$, for example. In this case, the N-type buried layer 334 of the photodiode 221 and the buried channel 235 of the memory section 223 are formed in the density of the N-type impurities, which brings a depletion state thereto at the time of draining charges, for example, $1\times10^{16}$ to $1\times10^{17}/cm^3$.

The impurity diffusion region 342 to serve as the intermediate transfer path 340 becomes depleted at the time of draining charges and has the density of the impurities, which can form the potential barrier φTRX2. The density of the impurities of the impurity diffusion region 342 is set to between the density of the P-type impurities and the density of the N-type impurities lower than the densities of the impurities of the N-type buried layer 334 of the photodiode 221 and the buried channel 235 of the memory section 223, depending on the height of the potential barrier φTRX2 determined from the specified charge amount.

The impurity diffusion region 341 formed on the substrate surface side for the complete transfer path 350 is formed with the density of the P-type impurities higher than that of the impurity diffusion region 342 of the intermediate transfer path 340, and for example, is set to a density of $1\times10^{18}$ to $1\times10^{19}/cm^3$. The impurity diffusion region 341 may be formed with the density of N-type impurities still lower than that of the impurity diffusion region 342 of the intermediate transfer path 340.

The FD section 225 is formed with a density of N-type impurities of $1\times10^{19}$ to $1\times10^{20}/cm^3$, for example.

As described above, at least one of the distances in the horizontal and depth directions between one another of the N-type buried layer 334, the buried channel 235 and the impurity diffusion region 342, and the density of impurities thereof is appropriately adjusted; accordingly, the barrier of the complete transfer path 350 is formed to be higher than the barrier of the intermediate transfer path 340 and lower than the barriers of other than the intermediate transfer path 340.

(Method for Manufacturing Unit Pixel 320)

Next, a description will be given of a method for manufacturing the unit pixel 320 of FIG. 64A (FIG. 69) with reference to FIG. 71.

In a first step, N-type ions are implanted by use of a resist 360-1 formed on the surface of the substrate to form a part 334' of the N-type buried layer 334. As shown in the cross-sectional view of FIG. 64A, the resist 360-1 is for forming the N-type buried layer 334 extending beneath the buried channel 335 and opens in a region corresponding to the part 334' of the N-type buried layer 334.

In a second step, a resist 360-2 is formed on the surface of the substrate. The resist 360-2 is for forming the impurity diffusion region 342 and opens in a region corresponding to the impurity diffusion region 342.

In a third step, N-type ions are implanted by use of a resist 360-2 to form the impurity diffusion region 342 in a manner of being in contact with a top surface of the part 334' of the N-type buried layer 334.

In a fourth step, N-type ions are implanted by use of a resist 360-3 formed on the surface of the substrate to form the buried channel 335 and then the memory section 223 is provided. The resist 360-3 is for forming the buried channel 335 and opens in a region corresponding to the buried channel 335.

Next, after the resist 360-3 is removed, in a fifth step, a polysilicon layer 222A' to serve as the gate electrode 222A is formed on the substrate surface. In a sixth step, a resist 360-4 is formed in a region corresponding to the gate electrode 222A of a surface of the polysilicon layer 222A', and in a seventh step, etching is performed to remove the unnecessary portion of the polysilicon layer 222A' and the gate electrode 222A is formed.

In an eighth step, N-type ions are implanted to form a part other than the part 334' formed in the first step and accordingly, the N-type buried layer 334 is formed.

It is possible to manufacture the unit pixel 320 of FIG. 64A (FIG. 69) in the above steps.

Figure 71:
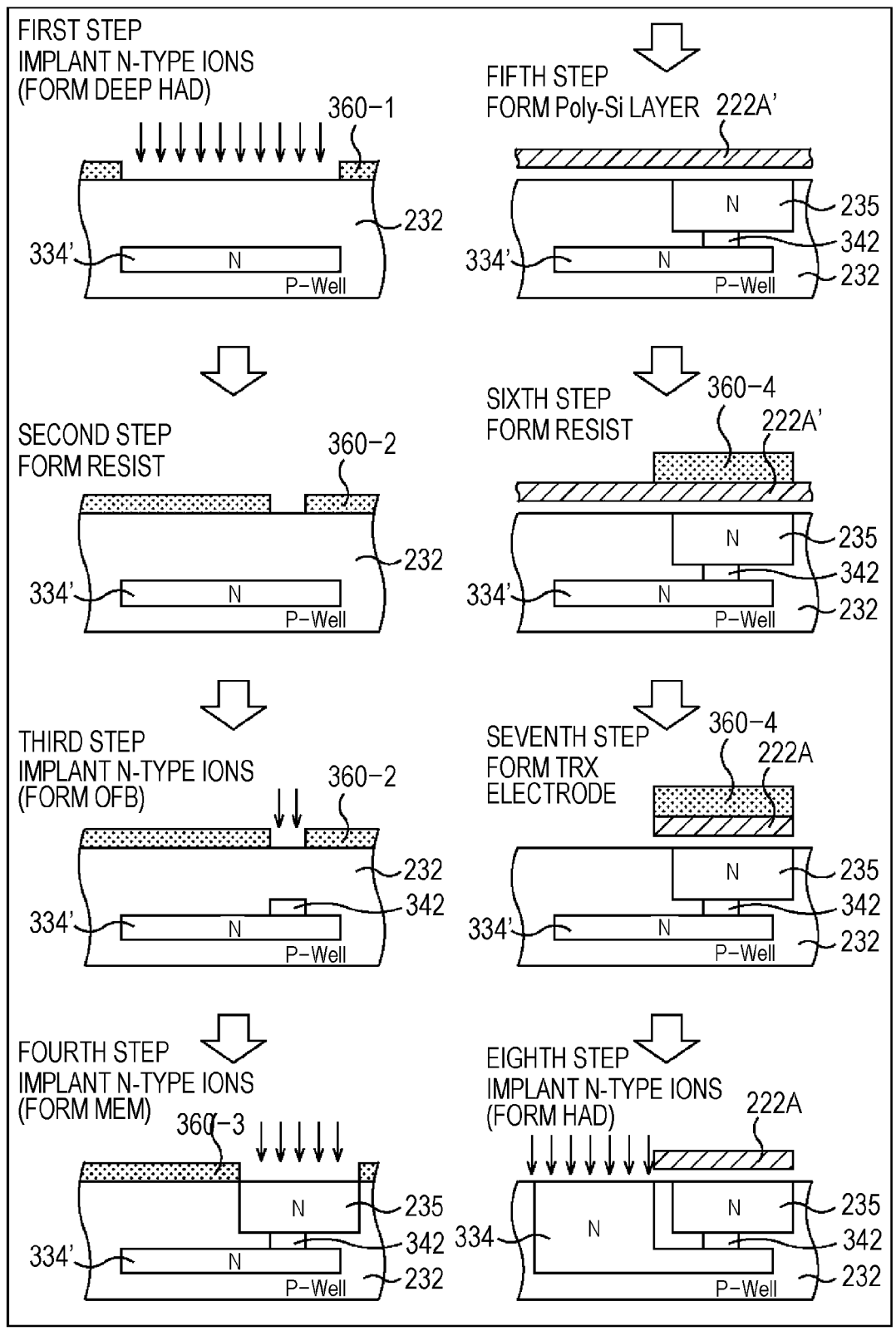
FIG. 71 is a view explaining a method for manufacturing the unit pixel.
Figure 72:
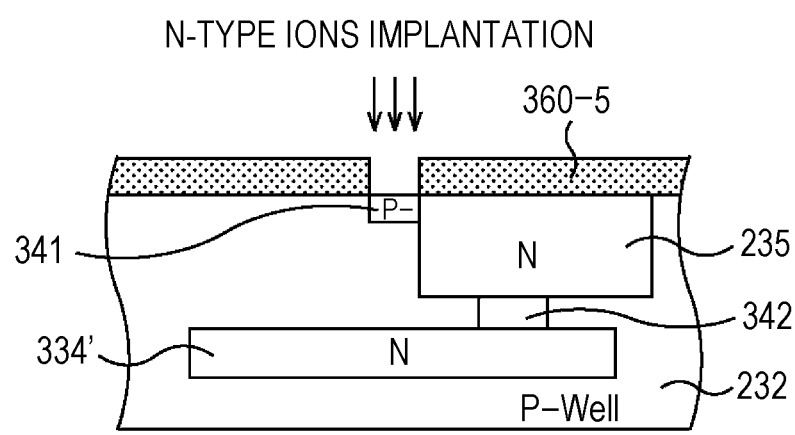
FIG. 72 is a view explaining a method for manufacturing the unit pixel.

If the unit pixel 320B of FIG. 70 is manufactured, in other words, if the impurity diffusion region 341 is formed in the substrate surface between the N-type buried layer 334 and the buried channel 235, a step shown in FIG. 72 is added between the fourth and fifth steps of FIG. 71.

In other words, as shown in FIG. 72, after a resist 360-5 is applied, a part corresponding to the impurity diffusion region 341 is opened. Subsequently, N-type ions are implanted to lower the density of the P-type impurities, and a step of forming the impurity diffusion region 341 in the substrate surface is added.

(Another Structure Example of Unit Pixel 320)

Figure 73:
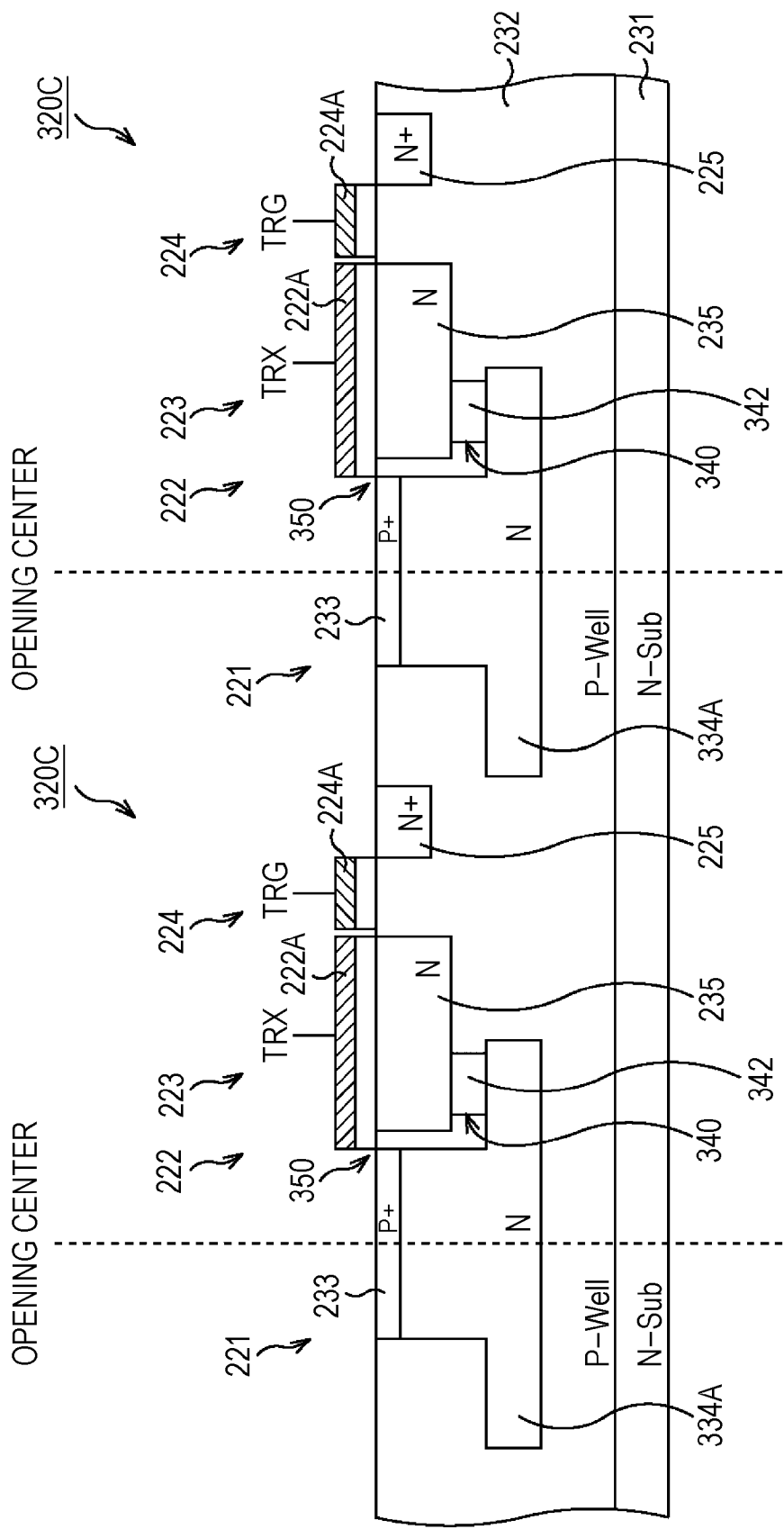
FIG. 73 is a view depicting another structure of the unit pixel.

FIG. 73 depicts the structure of a unit pixel 320C being another example of the unit pixel 320.

It is desirable that the photodiode 221 should be formed symmetrically to the center of the opening on which light is incident. This is because the sensitivity to the incident light angle of the photodiode 221 is not biased toward from any direction and is equivalent. Hence, in the unit pixel 320C shown in FIG. 73, while being formed into a shape extending beneath the memory section 223 in a manner of overlapping with a part of the memory section 223 from a plan point of view, the photodiode 221 is formed into a shape symmetrical to the center of the opening (opening center) on which light is incident. The intermediate transfer path 340 is formed in the overlapping part of the photodiode 221 and the memory section 223. Consequently, the photodiode 221 can receive light equally from any direction.

(Another Structure Example of Unit Pixel 320)

Figure 74:
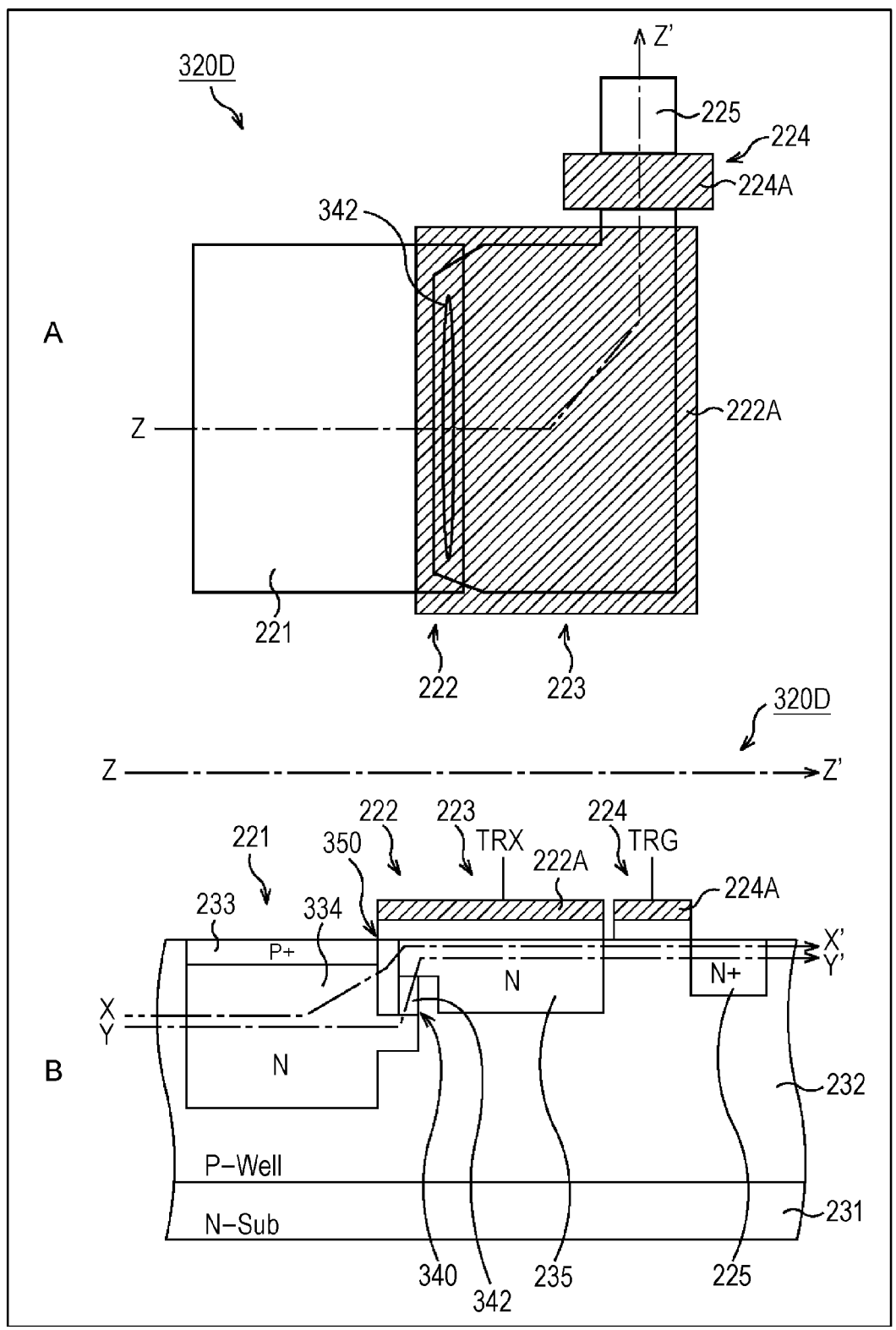
FIGS. 74A and 74B are views depicting another structure of the unit pixel.
Figure 75:
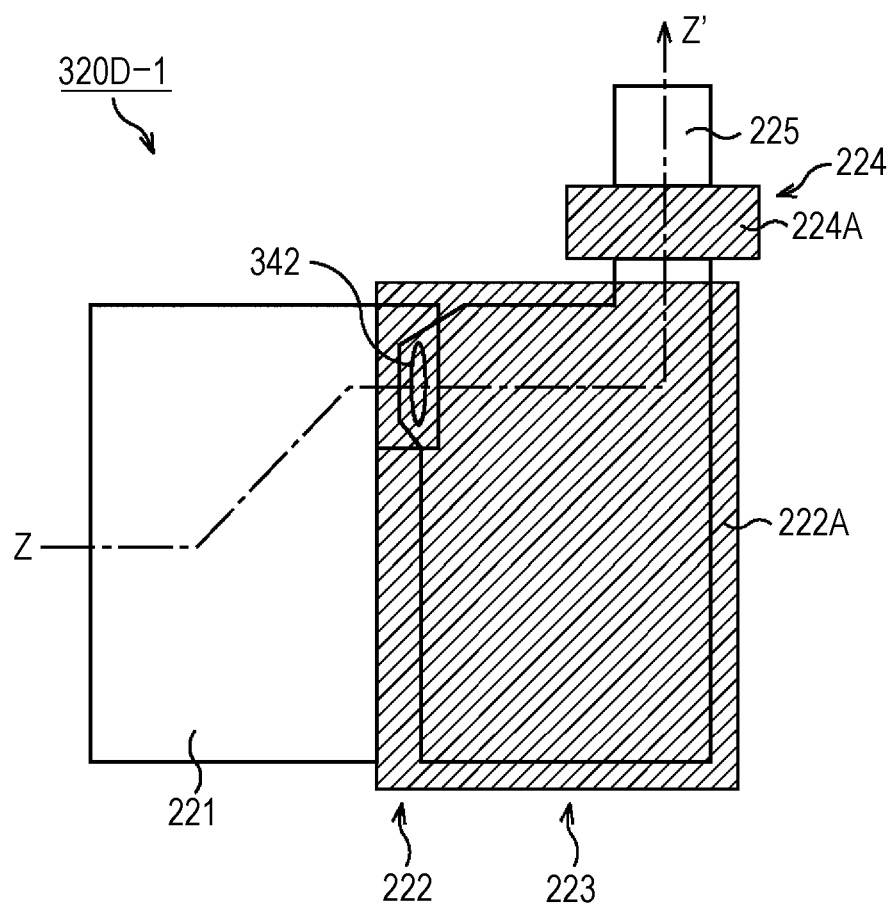
FIG. 75 is a view depicting another structure of the unit pixel.

FIGS. 74A and 74B and FIG. 75 depict the structure of a unit pixel 320D being other examples of the unit pixel 320.

FIG. 74A is a plan view depicting the structure of the unit pixel 320D, and FIG. 74B is a cross-sectional view of the unit pixel 320D, taken along arrow Z-Z' of FIG. 74A.

From a plan point of view, the N-type buried layer 334 and the buried channel 235 are formed such that a part of the N-type buried layer 334 of the photodiode 221 of and a part of the buried channel 235 of the memory section 223 of the unit pixel 320D overlap over the entire area in the width direction (the up and down direction of FIG. 74A) in the boundary area between the photodiode 221 and the memory section 223. The impurity diffusion region 342 is formed in an isolation area in the depth direction to provide the intermediate transfer path 340.

On the other hand, in terms of the complete transfer path 350, similarly to the unit pixel 320 of FIGS. 64A and 64B described above, the distance between the N-type buried layer 334 and the buried channel 235 is adjusted to adjust the height of the barrier of the complete transfer path 350.

FIG. 75 depicts a modification of the unit pixel 320D shown in FIGS. 74A and 74B.

In a unit pixel 320D-1 of FIG. 75, the area, viewed from a plan point of view, of the overlapping part of the N-type buried layer 334 of the photodiode 221 and the buried channel 235 of the memory section 223 in the boundary area between the photodiode 221 and the memory section 223 is smaller than the case of FIGS. 74A and 74B. The impurity diffusion region 342 is formed to be small by making the overlapping region small in this manner, and it is possible to suppress the phenomenon that photocharges generated by light incident on the photodiode 221 being incident on the impurity diffusion region 342 of the intermediate transfer path 340 leaks to the memory section 223.

(Method for Driving Until Pixel 320)

A description will be given of a method for driving the unit pixel 320.

The method for driving the unit pixel 320 is basically the same as the driving method shown in FIG. 61. However, although not shown in FIG. 61, in the exposure period from (1) to (3) in FIG. 61, photocharges generated in the photodiode 221 in accordance with the brightness of the incident light are transferred to the memory section 223 via the intermediate transfer path 340 in the beginning and then transferred to the memory section 223 via the compete transfer path 350 after a certain period of time. In other words, when charges accumulated in the photodiode 221 reach a first charge amount or over, the overflowing charges are transferred to the memory section 223 via the intermediate transfer path 340, and when charges accumulated in the photodiode 221 and the memory section 223 reach a second charge amount or over, the second charge amount being larger than the first charge amount, the transfer path of charges are changed from the intermediate transfer path 340 to the complete transfer path 350.

(Configuration Example of Another Unit Pixel)

The unit pixel 320 of the above-mentioned embodiment has the structure where photocharges generated in the photodiode 221 are held in two charge holding sections of the memory section 223 and the FD section 225, and beneath the memory section 223 of them, the intermediate transfer path 340 from the photodiode 221 is formed.

Figure 76:
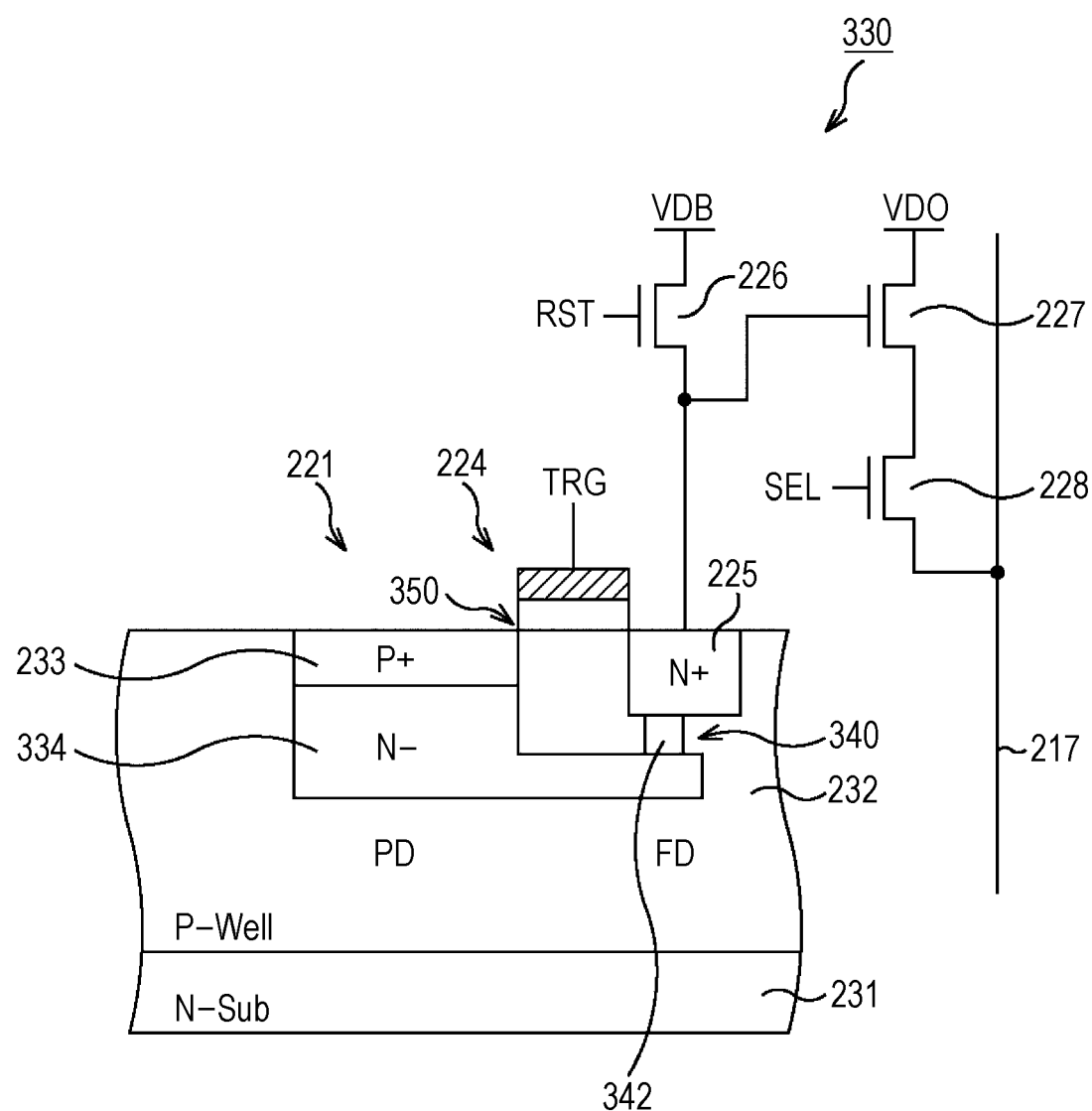
FIG. 76 is a view depicting another configuration example of the unit pixel.

However, the present technology can be similarly applied to, for example, a unit pixel 330, shown in FIG. 76, where the first transfer gate 222 and the memory section 223 in the unit pixel 320 are omitted and photocharges are held only in the FD section 225. In this case, the N-type buried layer 334 is formed extending to beneath a part or the whole of the FD section 225. The impurity diffusion region 342 is formed in the boundary area between the undersurface of the FD section 225 and the top surface of the N-type buried layer 334 extending beneath the FD section 225; accordingly, the intermediate transfer path 340 is provided. On the other hand, the complete transfer path 350 is formed on the surface side between the photodiode 221 and the FD section 225, similarly to the unit pixel 320.

8. Electronic Device

Block Diagram of Electronic Device

Figure 77:
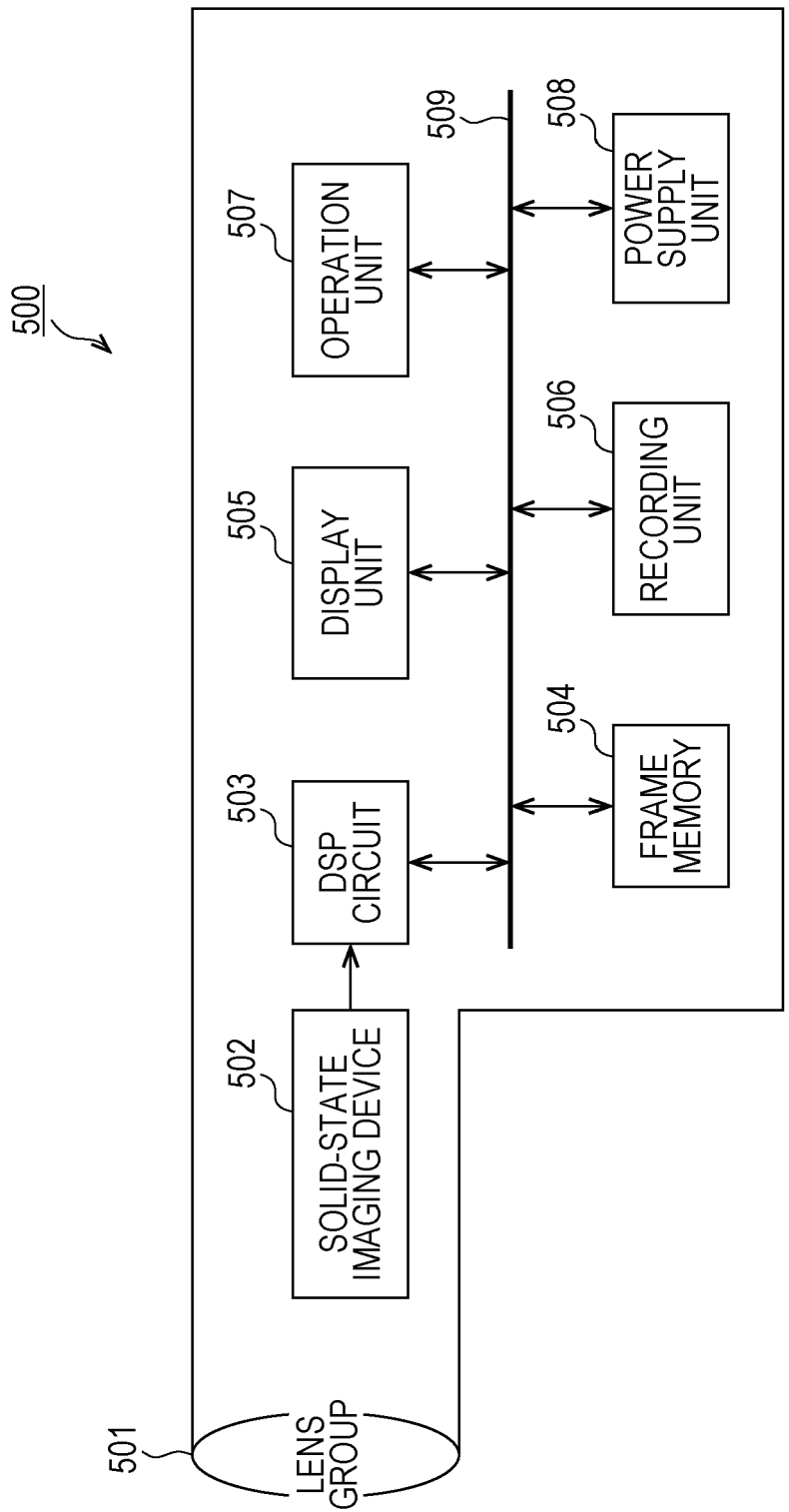
FIG. 77 is a schematic block diagram of an electronic device according to an embodiment to which the present technology is applied.

FIG. 77 is a schematic block diagram of an electronic device 500 according to an embodiment to which the present technology is applied.

The electronic device 500 of FIG. 77 includes an optical unit 501 including a lens group, a solid-state imaging device (imaging device) 502 in which the above-mentioned configurations of the unit pixel 320 are adopted, and a DSP (Digital Signal Processor) circuit 503 that is a camera signal processing circuit. Moreover, the electronic device 500 also includes a frame memory 504, a display unit 505, a recording unit 506, an operation unit 507 and a power supply unit 508. The DSP circuit 503, the frame memory 504, the display unit 505, the recording unit 506, the operation unit 507 and the power supply unit 508 are connected to one another via a bus line 509.

The optical unit 501 captures the incident light from a subject (image light) and forms an image on an image surface of the solid-state imaging device 502. The solid-state imaging device 502 converts the amount of the incident light that forms an image by the optical unit 501 on the image surface into an electric signal for each pixel and outputs the electric signal as a pixel signal. It is possible to use, as the solid-state imaging device 502, a solid-state imaging device of the CMOS image sensor 10, in other words, a solid-state imaging device that can realize imaging without distortion by the global exposure as well as can hold down a leak signal suppression ratio for each pixel of RGB.

The display unit 505 includes, for example, a panel-type display device such as a liquid crystal panel or an organic EL (Electro Luminescence) panel, and displays a moving image or still image, which is imaged by the solid-state imaging device 502. The recording unit 506 records the moving image or still image imaged by the solid-state imaging device 502 in a recording medium such as a video tape or DVD (Digital Versatile Disk).

The operation unit issues an operation instruction on various functions that the electronic device 500 has, under a user's operation. The power supply unit 508 appropriately supplies various power supplies that are operational power supplies of the DSP circuit 503, the frame memory 504, the display unit 505, the recording unit 506 and the operation unit 507 to these supply targets.

As described above, the use of the CMOS image sensor 10 according to the above-mentioned embodiment as the solid-state imaging device 502 makes it possible to realize imaging without distortion by the global exposure as well as hold down a leak signal suppression ratio for each pixel of RGB. Therefore, it is possible to promote higher quality of an imaged image in the electronic device 500 such as a video camera and a digital still camera, and further a camera module for a mobile device including a mobile phone.

Moreover, in the above-mentioned embodiment, the description has been given taking, as an example, the case of applying the present technology to a CMOS image sensor where unit pixels that detect signal charge in accordance with the amount of visible light as a physical amount are disposed in a matrix. However, the present technology is not limited to the application to a CMOS image sensor, but can be applied to a general solid-state imaging device of the column type where a column processing unit is disposed for each pixel row of a pixel array unit.

Moreover, the present technology can be applied not only to a solid-state imaging device that detects the distribution of the amount of incident visible light and images the distribution as an image, but also to a solid-state imaging device that images the distribution of the amount of incident infrared rays, X rays, particles or the like as an image, and, as a broad sense, a general solid-state imaging device (physical amount distribution detection device), such as a fingerprint detection sensor, which detects the distribution of another physical amount such as pressure and capacitance and images the distribution as an image.

The solid-state imaging device may be formed into one chip or may be formed into a module where an imaging unit and a signal processing unit or an optical system are packaged all together, the module having an imaging function.

An embodiment of the present technology is not limited to the above-mentioned embodiment, but various modifications can be made without departing from the gist of the present technology.

The present technology can take the following structures:

(1) A solid-state imaging device comprising:
a first channel portion of a first conductivity-type between a charge accumulation region of a second conductivity-type and a photodiode; and
an overflow path of the second conductivity-type between an intermediate electrode of the second conductivity-type and said charge accumulation region.

(2) The solid-state imaging device according to claim 1, wherein said intermediate electrode is electrically connected to a charge accumulation section.

(3) The solid-state imaging device according to claim 1, further comprising:
a first conductivity-type semiconductor region in a surface layer portion of said charge accumulation region, said first conductivity-type semiconductor region being between said first channel portion and said overflow path.

(4) The solid-state imaging device according to claim 1, further comprising:
a first conductivity-type semiconductor region in a surface layer portion of said first channel portion.

(5) The solid-state imaging device according to claim 1, further comprising:
a first conductivity-type semiconductor region in a surface layer portion of said photodiode.

(6) The solid-state imaging device according to claim 1, wherein said intermediate electrode is an electrode of a capacitor.

(7) The solid-state imaging device according to claim 1, wherein said charge accumulation section is a capacitor.

(8) The solid-state imaging device according to claim 1, wherein said charge accumulation section has a higher capacitance value per unit area than said charge accumulation region.

(9) The solid-state imaging device according to claim 1, wherein said second conductivity-type overflow path is in physical contact with said charge accumulation region and said intermediate electrode.

(10) The solid-state imaging device according to claim 1, further comprising:
a second channel portion of the first conductivity-type between a semiconductor region of the second conductivity-type and said charge accumulation region.

(11) The solid-state imaging device according to claim 10, wherein an impurity concentration of the second conductivity-type in semiconductor region is greater than said impurity concentration of the second conductivity-type in said charge accumulation region.

(12) The solid-state imaging device according to claim 1, wherein an impurity concentration of the second conductivity-type in said intermediate electrode is greater than an impurity concentration of the second conductivity-type in said charge accumulation region.

(13) The solid-state imaging device according to claim 12, wherein an impurity concentration of the second conductivity-type in said charge accumulation region is greater than an impurity concentration of the second conductivity-type in said overflow path.

(14) The solid-state imaging device according to claim 1, wherein said first channel portion is in physical contact with said charge accumulation region and said photodiode.

(15) The solid-state imaging device according to claim 1, wherein said overflow path in physical contact with said intermediate electrode and said charge accumulation region.

(16) The solid-state imaging device according to claim 1, wherein said first conductivity-type is P-type.

(17) The solid-state imaging device according to claim 1, wherein said second conductivity-type is N-type.

(18) An electronic device comprising:
the solid-state imaging device according to claim 1; and
an optical unit configured to capture incident light from a subject and form an image of the subject on an image surface of said solid-state imaging device.

(19) A solid-state imaging device comprising:
a photoelectric conversion section configured to generate photocharges, the photocharges accumulable in said photoelectric conversion section being equal to or smaller than a saturation charge amount of the photoelectric conversion section;
a first transfer gate section overflow path configured to overflow excess photocharges from within said photoelectric conversion section, said excess photocharges from within said photoelectric conversion section being the photocharges that exceed said saturation charge amount of the photoelectric conversion section;
a first charge accumulation region configured to accumulate said photocharges accumulable in said photoelectric conversion section and said excess photocharges from within said photoelectric conversion section, the photocharges accumulable in said first charge accumulation region being equal to or smaller than a saturation charge amount of the first charge accumulation region;
a semiconductor region overflow path configured to overflow excess photocharges from within said first charge accumulation region, said excess photocharges from within said first charge accumulation region being the photocharges that exceed said saturation charge amount of the first charge accumulation region; and
a semiconductor region configured to accumulate said excess photocharges from within said first charge accumulation region.

(20) The solid-state imaging device according to claim 19, wherein said saturation charge amount of the photoelectric conversion section is a total amount of the photocharges retainable by said photoelectric conversion section.

(21) The solid-state imaging device according to claim 19, wherein said saturation charge amount of the first charge accumulation region is a total amount of the photocharges retainable by said first charge accumulation region.

(22) The solid-state imaging device according to claim 19, wherein said first transfer gate section overflow path is between said photoelectric conversion section and said first charge accumulation region.

(23) The solid-state imaging device according to claim 19, wherein said first transfer gate section overflow path is of a first conductivity-type.

(24) The solid-state imaging device according to claim 23, wherein said first conductivity-type is P-type.

(25) The solid-state imaging device according to claim 23, wherein said first charge accumulation region, said semiconductor region and semiconductor region overflow path are of a second conductivity-type.

(26) The solid-state imaging device according to claim 25, wherein said second conductivity-type is N-type.

(27) The solid-state imaging device according to claim 25, wherein an impurity concentration of the second conductivity-type in said semiconductor region is greater than said impurity concentration of the second conductivity-type in said first charge accumulation region.

(28) The solid-state imaging device according to claim 27, wherein an impurity concentration of the second conductivity-type in said first charge accumulation region is greater than an impurity concentration of the second conductivity-type in said semiconductor region overflow path.

(29) The solid-state imaging device according to claim 19, wherein said semiconductor region overflow path is between said first charge accumulation region and said semiconductor region.

(30) The solid-state imaging device according to claim 19, wherein said semiconductor region is an intermediate electrode.

(31) The solid-state imaging device according to claim 30, wherein said intermediate electrode is an electrode of a capacitor.

(32) The solid-state imaging device according to claim 30, wherein said intermediate electrode is electrically connected to a charge accumulation section.

(33) The solid-state imaging device according to claim 32, wherein said charge accumulation section is a capacitor.

(34) The solid-state imaging device according to claim 32, wherein said charge accumulation section has a higher capacitance value per unit area than said first charge accumulation region.

(35) An electronic device comprising:
the solid-state imaging device according to claim 19; and
an optical unit configured to capture incident light from a subject and form an image of the subject on an image surface of said solid-state imaging device.

(36) A method for driving a solid-state imaging device, the method comprising:
a step of accumulating photocharges in a photoelectric conversion section, said photoelectric conversion section generating an amount of the photocharges in accordance with an amount of light received by said photoelectric conversion section;
a step of overflowing said photocharges from said photoelectric conversion section to a first charge accumulation section when an amount of the photocharges in said photoelectric conversion section exceeds a photoelectric conversion section saturation charge amount;
a step of accumulating said photocharges in a first charge accumulation section, said first charge accumulation section receiving said photocharges from said photoelectric conversion section;
a step of transferring said photocharges accumulated in said first charge accumulation section to a floating diffusion section, said floating diffusion section converting said photocharges into an electric signal.

(37) The method according to claim 36, wherein said photoelectric conversion section saturation charge amount is a total amount of the photocharges retainable by said photoelectric conversion section.

(38) The method according to claim 36, wherein said first charge accumulation section saturation charge amount is a total amount of the photocharges retainable by said first charge accumulation section.

(39) The method according to claim 36, further comprising:
a step of overflowing said photocharges from said first charge accumulation section to a second charge accumulation section when an amount of the photocharges in said first charge accumulation section exceeds a first charge accumulation section saturation charge amount.

(40) The method according to claim 39, wherein said first charge accumulation section saturation charge amount is a total amount of the photocharges retainable by said first charge accumulation section.

(41) The method according to claim 39, wherein a total amount of the photocharges retainable by said second charge accumulation section is greater than said first charge accumulation section saturation charge amount.

(42) The method according to claim 36, wherein the step of transferring includes electrically coupling said photoelectric conversion section through said first charge accumulation section to said floating diffusion section.

(43) The method according to claim 36, further comprising:
a step of overflowing said photocharges from said first charge accumulation section to said floating diffusion section when an amount of the photocharges in said first charge accumulation section exceeds a first charge accumulation section saturation charge amount.

(44) The method according to claim 43, wherein said first charge accumulation section saturation charge amount is a total amount of the photocharges retainable by said first charge accumulation section.

(45) A solid-state imaging device comprising:
a well layer of a first conductivity-type, a surface layer of the first conductivity-type being on a substrate surface side in the well layer; and
an impurity diffusion region of a second conductivity-type between a buried layer of the second conductivity-type and a buried channel of the second conductivity-type,
wherein said impurity diffusion region is in physical contact with said buried layer and said buried channel, said buried channel being in physical contact with said surface layer.

(46) The solid-state imaging device according to claim 45, wherein a portion of the well layer is between said surface layer and said buried channel.

(47) The solid-state imaging device according to claim 45, wherein a segment of the well layer is between a floating diffusion region of the second conductivity-type and said buried channel.

(48) The solid-state imaging device according to claim 45, wherein said buried channel is between said impurity diffusion region and a gate electrode.

(49) The solid-state imaging device according to claim 45, wherein said buried channel is on said substrate surface side in the well layer.

(50) The solid-state imaging device according to claim 45, wherein said first conductivity-type is P-type.

(51) The solid-state imaging device according to claim 45, wherein said second conductivity-type is N-type.

(52) An electronic device comprising:
the solid-state imaging device according to claim 45; and
an optical unit configured to capture incident light from a subject and form an image of the subject on an image surface of said solid-state imaging device.

(53) A method of forming a solid-state imaging device, the method comprising:
forming a part of a buried layer by implanting buried layer ions of a second conductivity-type into a well layer of a first conductivity-type, said buried layer ions being implanted through an opening in a buried layer resist mask;

forming an impurity diffusion region by implanting impurity diffusion region ions of the second conductivity-type into said well layer, said impurity diffusion region ions being implanted through an opening in an impurity diffusion region resist mask; and forming a buried channel by implanting buried channel ions of the second conductivity-type into said well layer, said buried channel ions being implanted through an opening in a buried channel resist mask, wherein said impurity diffusion region is between said buried channel and said part of the buried layer, said impurity diffusion region being in physical contact with said buried channel and said part of the buried layer.

(54) The method according to claim 53, wherein said opening in the impurity diffusion region resist mask is narrower than said opening in the buried channel resist mask, said opening in the buried channel resist mask being narrower than said opening in the buried layer resist mask.

(55) The method according to claim 53, wherein a segment of the well layer is between a floating diffusion region of the second conductivity-type and said buried channel.

(56) The method according to claim 53, wherein said buried channel is between said impurity diffusion region and a gate electrode.

(57) The method according to claim 53, wherein said first conductivity-type is P-type.

(58) The method according to claim 53, wherein said second conductivity-type is N-type.

(59) The method according to claim 53, further comprising:

forming a different part of the buried layer by implanting other buried layer ions of the second conductivity-type into the well layer, said different part of the buried layer extending from a surface of the well layer to said part of the buried layer.

(60) The method according to claim 59, wherein a surface layer of the first conductivity-type extends from said surface of the well layer into said different part of the buried layer.

(61) The method according to claim 59, wherein a portion of the well layer is between said surface layer and said buried channel.

REFERENCE SIGNS LIST 10, 10A, 10B CMOS image sensor
11 Pixel array unit
12 Vertical driving unit
13 Column processing unit
14 Horizontal driving unit
15 System control unit
16 Pixel driving line
17 Vertical signal line
18 Signal processing unit
19 Data storage unit
30, 66 First charge accumulation section
40, 67 Second charge accumulation section
60A to 60A2, 60B Unit pixel
61 Photodiode
62 First transfer gate section
63 Second transfer gate section
64 Third transfer gate section
65 Reset gate section
68 Amplifier transistor
69 Select transistor
70 Charge drain gate section
71 FD section (Floating diffusion section)
111a, 111b Memory
112 Addition unit
221 Photodiode
222 First transfer gate
223 Memory section
224 Second transfer gate
225 Floating diffusion region (FD section)
320 Unit pixel
340 Intermediate transfer path
341, 342 Impurity diffusion region
350 Complete transfer path
500 Imaging apparatus
502 Imaging device

What is claimed is:

1. A solid-state imaging device comprising:
a first channel portion of a first conductivity-type between a charge accumulation region and a photoelectric conversion section, the first channel portion touches the photoelectric conversion section and the charge accumulation region;
a second channel portion of the first conductivity-type between a floating diffusion section of a second conductivity-type and the charge accumulation region, the second channel portion touches the charge accumulation region and the floating diffusion section; and
an overflow path of the second conductivity-type between an intermediate electrode of the second conductivity-type and the charge accumulation region, the overflow path touches the charge accumulation region and the intermediate electrode.

2. The solid-state imaging device according to claim 1, wherein the first conductivity-type is P-type and the second conductivity-type is N-type.

3. The solid-state imaging device according to claim 1, wherein the first conductivity-type is opposite to the second conductivity-type.

4. The solid-state imaging device according to claim 1, further comprising:
a well of the first conductivity-type, a lower part of the charge accumulation region is between an upper part of the charge accumulation region and the well.

5. The solid-state imaging device according to claim 4, wherein the upper part of the charge accumulation region touches the first channel portion and the overflow path.

6. The solid-state imaging device according to claim 4, wherein the upper part of the charge accumulation region has a conductivity-type that is opposite to the lower part of the charge accumulation region.

7. The solid-state imaging device according to claim 4, wherein the upper part of the charge accumulation region is the first conductivity-type and the lower part of the charge accumulation region is of the second conductivity-type.

8. The solid-state imaging device according to claim 1, wherein the photoelectric conversion section is configured to convert incident light into an accumulated amount of photocharges and an excess amount of the photocharges, the excess amount is an amount of the photocharges that exceeds a maximum number of the photocharges accumulable in the photoelectric conversion section.

9. The solid-state imaging device according to claim 8, wherein the first channel portion is configured to transfer the excess amount from the photoelectric conversion section to the charge accumulation region.

10. The solid-state imaging device according to claim 8, wherein the overflow path is configured to transfer the excess amount from the charge accumulation region to the intermediate electrode.

11. The solid-state imaging device according to claim 8, further comprising:
   a transfer gate electrode that controls a transfer of the accumulated amount from the photoelectric conversion section to the charge accumulation region, the accumulated amount is an amount of the photocharges that is less than the excess amount.

12. The solid-state imaging device according to claim 11, wherein in a plane view of the solid-state imaging device, the transfer gate electrode is between the photoelectric conversion section and the charge accumulation region.

13. The solid-state imaging device according to claim 11, wherein the charge accumulation region is configured to accumulate the excess amount and the accumulated amount.

14. The solid-state imaging device according to claim 1, further comprising:
   a charge accumulation section electrically connected to the intermediate electrode.

15. The solid-state imaging device according to claim 1, wherein an impurity concentration of the second conductivity-type in the intermediate electrode is greater than an impurity concentration of the second conductivity-type in the overflow path.

16. An electronic device comprising:
   the solid-state imaging device according to claim 1; and
   an optical unit configured to capture incident light from a subject and form an image of the subject on an image surface of the solid-state imaging device.

* * * * *